(12) United States Patent
Fallon et al.

(10) Patent No.: US 9,792,128 B2
(45) Date of Patent: Oct. 17, 2017

(54) SYSTEM AND METHOD FOR ELECTRICAL BOOT-DEVICE-RESET SIGNALS

(71) Applicant: Realtime Data, LLC, Armonk, NY (US)

(72) Inventors: James J. Fallon, Armonk, NY (US); John Buck, Oceanside, NY (US); Paul F. Pickel, Bethpage, NY (US); Stephen J. McErlain, New York, NY (US)

(73) Assignee: Realtime Data, LLC, Bronxville, KY (US)

( * ) Notice: Subject to any disclaimer, the term of this patent is extended or adjusted under 35 U.S.C. 154(b) by 157 days.

(21) Appl. No.: 14/530,974

(22) Filed: Nov. 3, 2014

(65) Prior Publication Data

US 2015/0268969 A1  Sep. 24, 2015

Related U.S. Application Data

(63) Continuation of application No. 13/118,122, filed on May 27, 2011, now Pat. No. 8,880,862, which is a
(Continued)

(51) Int. Cl.
*G06F 9/00* (2006.01)
*G06F 15/177* (2006.01)
(Continued)

(52) U.S. Cl.
CPC .............. *G06F 9/4408* (2013.01); *G06F 1/24* (2013.01); *G06F 3/0613* (2013.01);
(Continued)

(58) Field of Classification Search
CPC .................................................. G06F 9/4401
(Continued)

(56) References Cited

U.S. PATENT DOCUMENTS

| 3,394,352 A | 7/1968 | Wernikoff et al. |
| 3,490,690 A | 1/1970 | Apple et al. |

(Continued)

FOREIGN PATENT DOCUMENTS

| DE | 4127518 | 2/1992 |
| EP | 0 164677 | 12/1985 |

(Continued)

OTHER PUBLICATIONS

English translation JP 05088793 A foreign patent document.*
(Continued)

*Primary Examiner* — Suresh Suryawanshi
(74) *Attorney, Agent, or Firm* — Sterne, Kessler, Goldstein & Fox P.L.L.C.

(57) ABSTRACT

Systems and methods for providing accelerated loading of operating system and application programs upon system boot or application launch are disclosed. In one aspect, a method for providing accelerated loading of an operating system comprises the steps of: maintaining a list of boot data used for booting a computer system; preloading the boot data upon initialization of the computer system; and servicing requests for boot data from the computer system using the preloaded boot data. In another aspect, a method for providing accelerated launching of an application program comprises the steps of: maintaining a list of application data associated with an application program; preloading the application data upon launching the application program; and servicing requests for application data from a computer system using the preloaded application data.

20 Claims, 20 Drawing Sheets

Related U.S. Application Data continuation of application No. 11/551,211, filed on Oct. 19, 2006, now Pat. No. 8,112,619, which is a continuation of application No. 09/776,267, filed on Feb. 2, 2001, now Pat. No. 7,181,608.

(60) Provisional application No. 60/180,114, filed on Feb. 3, 2000.

(51) Int. Cl.
| | | |
|---|---|---|
| *G06F 1/00* | (2006.01) | |
| *G06F 9/44* | (2006.01) | |
| *G06F 3/06* | (2006.01) | |
| *G06F 9/445* | (2006.01) | |
| *H03M 7/30* | (2006.01) | |
| *G06F 1/24* | (2006.01) | |

(52) U.S. Cl.
CPC .......... *G06F 3/0638* (2013.01); *G06F 3/0658* (2013.01); *G06F 3/0676* (2013.01); *G06F 9/4401* (2013.01); *G06F 9/445* (2013.01); *G06F 9/4406* (2013.01); *H03M 7/30* (2013.01)

(58) Field of Classification Search
USPC .......................................................... 713/2
See application file for complete search history.

(56) References Cited

U.S. PATENT DOCUMENTS

| | | |
|---|---|---|
| 3,560,639 A | 2/1971 | Centanni |
| 4,021,782 A | 5/1977 | Hoerning |
| 4,032,893 A | 6/1977 | Moran |
| 4,054,951 A | 10/1977 | Jackson et al. |
| 4,127,518 A | 11/1978 | Coy et al. |
| 4,302,775 A | 11/1981 | Widergren et al. |
| 4,325,085 A | 4/1982 | Gooch |
| 4,360,840 A | 11/1982 | Wolfrum et al. |
| 4,386,416 A | 5/1983 | Giltner et al. |
| 4,394,774 A | 7/1983 | Widergren et al. |
| 4,464,650 A | 8/1984 | Eastman |
| 4,494,108 A | 1/1985 | Langdon, Jr. et al. |
| 4,499,499 A | 2/1985 | Brickman et al. |
| 4,558,302 A | 12/1985 | Welch |
| 4,568,983 A | 2/1986 | Bobick |
| 4,574,351 A | 3/1986 | Dang et al. |
| 4,593,324 A | 6/1986 | Ohkubo et al. |
| 4,626,829 A | 12/1986 | Hauck |
| 4,646,061 A | 2/1987 | Bledsoe |
| 4,682,150 A | 7/1987 | Mathes et al. |
| 4,701,745 A | 10/1987 | Waterworth |
| 4,953,324 A | 9/1990 | Herrmann |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,027,376 A | 6/1991 | Freidman et al. |
| 5,028,922 A | 7/1991 | Huang |
| 5,034,914 A | 7/1991 | Osterlund |
| 5,045,848 A | 9/1991 | Fascenda |
| 5,045,852 A | 9/1991 | Mitchell et al. |
| 5,046,027 A | 9/1991 | Taaffe et al. |
| 5,046,119 A | 9/1991 | Hoffert et al. |
| 5,049,881 A | 9/1991 | Gibson et al. |
| 5,079,630 A | 1/1992 | Golin |
| 5,091,782 A | 2/1992 | Krause et al. |
| 5,097,261 A | 3/1992 | Langdon, Jr. et al. |
| 5,103,306 A | 4/1992 | Weiman |
| 5,109,226 A | 4/1992 | MacLean, Jr. et al. |
| 5,109,433 A | 4/1992 | Notenboom |
| 5,109,451 A | 4/1992 | Aono et al. |
| 5,113,522 A | 5/1992 | Dinwiddie, Jr. et al. |
| 5,115,309 A | 5/1992 | Hang |
| 5,121,342 A | 6/1992 | Szymborski |
| 5,126,739 A | 6/1992 | Whiting et al. |
| 5,128,963 A | 7/1992 | Akagiri |
| 5,132,992 A | 7/1992 | Yurt et al. |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,878 A | 7/1993 | Puri et al. |
| 5,227,893 A | 7/1993 | Ett |
| 5,231,492 A | 7/1993 | Dangi et al. |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 2,675,333 A | 11/1993 | Aono |
| 5,263,168 A | 11/1993 | Toms et al. |
| 5,270,832 A | 12/1993 | Balkanski et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,319,682 A | 6/1994 | Clark |
| 5,331,425 A | 7/1994 | Ozaki et al. |
| 5,333,212 A | 7/1994 | Ligtenberg |
| 5,341,440 A | 8/1994 | Earl et al. |
| 5,347,600 A | 9/1994 | Barnsley et al. |
| 5,353,132 A | 10/1994 | Katsuma |
| 5,354,315 A | 10/1994 | Armstrong |
| 5,355,498 A | 10/1994 | Provino et al. |
| 5,357,614 A | 10/1994 | Pattisam et al. |
| 5,367,629 A | 11/1994 | Chu et al. |
| 5,373,290 A | 12/1994 | Lempel et al. |
| 5,374,916 A | 12/1994 | Chu |
| 5,379,036 A | 1/1995 | Storer |
| 5,379,351 A | 1/1995 | Fandrianto et al. |
| 5,379,356 A | 1/1995 | Purcell et al. |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,402,146 A | 3/1995 | Rodriguez et al. |
| 5,403,639 A | 4/1995 | Belsan et al. |
| 5,406,278 A | 4/1995 | Graybill et al. |
| 5,406,279 A | 4/1995 | Anderson et al. |
| 5,408,542 A | 4/1995 | Callahan |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | Dicecco et al. |
| 5,454,079 A | 9/1995 | Roper et al. |
| 5,454,107 A | 9/1995 | Lehman et al. |
| 5,455,576 A | 10/1995 | Clark, II et al. |
| 5,455,578 A | 10/1995 | Bhandari |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |

(56) References Cited

U.S. PATENT DOCUMENTS

| | | |
|---|---|---|
| 5,467,134 A | 11/1995 | Laney et al. |
| 5,471,206 A | 11/1995 | Allen et al. |
| 5,475,388 A | 12/1995 | Gormish et al. |
| 5,479,210 A | 12/1995 | Cawley et al. |
| 5,479,587 A | 12/1995 | Campbell et al. |
| 5,479,633 A | 12/1995 | Wells et al. |
| 5,479,638 A | 12/1995 | Assar et al. |
| 5,483,470 A | 1/1996 | Alur et al. |
| 5,486,826 A | 1/1996 | Remillard |
| 5,488,364 A | 1/1996 | Cole |
| 5,488,365 A | 1/1996 | Seroussi et al. |
| 5,495,244 A | 2/1996 | Jeong et al. |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,521,940 A | 5/1996 | Lane et al. |
| 5,524,272 A | 6/1996 | Podowski et al. |
| 5,528,628 A | 6/1996 | Park et al. |
| 5,530,845 A | 6/1996 | Hiatt et al. |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,557,551 A | 9/1996 | Craft |
| 5,557,668 A | 9/1996 | Brady |
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,576,953 A | 11/1996 | Hugentobler |
| 5,577,248 A | 11/1996 | Chambers, IV |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |
| 5,590,306 A | 12/1996 | Watanabe et al. |
| 5,590,317 A | 12/1996 | Iguchi et al. |
| 5,596,674 A | 1/1997 | Bhandari et al. |
| 5,598,388 A | 1/1997 | Van Maren et al. |
| 5,602,764 A | 2/1997 | Eskandari-Gharnin et al. |
| 5,604,824 A | 2/1997 | Chui et al. |
| 5,606,706 A | 2/1997 | Takamoto et al. |
| 5,610,657 A | 3/1997 | Zhang |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi |
| 5,615,287 A | 3/1997 | Fu et al. |
| 5,619,995 A | 4/1997 | Lobodzinski |
| 5,621,820 A | 4/1997 | Rynderman et al. |
| 5,623,483 A | 4/1997 | Agrawal et al. |
| 5,623,623 A | 4/1997 | Kim et al. |
| 5,623,701 A | 4/1997 | Bakke et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,664,226 A | 9/1997 | Czako et al. |
| 5,666,560 A | 9/1997 | Moertl et al. |
| 5,668,737 A | 9/1997 | Iler |
| 5,671,355 A | 9/1997 | Collins |
| 5,671,389 A | 9/1997 | Saliba |
| 5,671,413 A | 9/1997 | Shipman et al. |
| 5,673,370 A | 9/1997 | Laney |
| 5,675,333 A | 10/1997 | Boursier et al. |
| 5,675,789 A | 10/1997 | Ishii et al. |
| 5,684,478 A | 11/1997 | Panaoussis |
| 5,686,916 A | 11/1997 | Bakhmutsky |
| 5,692,159 A | 11/1997 | Shand |
| 5,694,619 A | 12/1997 | Konno |
| 5,696,927 A | 12/1997 | MacDonald et al. |
| 5,703,793 A | 12/1997 | Wise et al. |
| 5,708,511 A | 1/1998 | Gandhi et al. |
| 5,710,562 A | 1/1998 | Gormish et al. |
| 5,715,477 A | 2/1998 | Kikinis |
| 5,717,393 A | 2/1998 | Nakano et al. |
| 5,717,394 A | 2/1998 | Schwartz et al. |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,740,395 A | 4/1998 | Wells et al. |
| 5,742,773 A | 4/1998 | Blomfield-Brown et al. |
| 5,748,122 A | 5/1998 | Shinagawa et al. |
| 5,748,904 A | 5/1998 | Huang et al. |
| 5,757,852 A | 5/1998 | Jericevic et al. |
| 5,764,774 A | 6/1998 | Liu |
| 5,765,027 A | 6/1998 | Wang et al. |
| 5,767,898 A | 6/1998 | Urano et al. |
| 5,768,445 A | 6/1998 | Troeller et al. |
| 5,768,525 A | 6/1998 | Kralowetz et al. |
| 5,771,340 A | 6/1998 | Nakazato et al. |
| 5,771,354 A | 6/1998 | Crawford |
| 5,774,715 A | 6/1998 | Madany et al. |
| 5,778,411 A | 7/1998 | DeMoss et al. |
| 5,781,767 A | 7/1998 | Inoue et al. |
| 5,784,572 A | 7/1998 | Rostoker et al. |
| 5,784,631 A | 7/1998 | Wise |
| 5,787,487 A | 7/1998 | Hashimoto et al. |
| 5,794,229 A | 8/1998 | French et al. |
| 5,796,864 A | 8/1998 | Callahan |
| 5,799,110 A | 8/1998 | Israelsen et al. |
| 5,805,834 A | 9/1998 | McKinley et al. |
| 5,805,932 A | 9/1998 | Kawashima et al. |
| 5,807,036 A | 9/1998 | Lostlen |
| 5,808,660 A | 9/1998 | Sekine et al. |
| 5,809,176 A | 9/1998 | Yajima |
| 5,809,299 A | 9/1998 | Cloutier et al. |
| 5,809,337 A | 9/1998 | Hannah et al. |
| 5,812,195 A | 9/1998 | Zhang |
| 5,812,789 A | 9/1998 | Diaz et al. |
| 5,812,883 A | 9/1998 | Rao |
| 5,818,368 A | 10/1998 | Langley |
| 5,818,369 A | 10/1998 | Withers |
| 5,818,530 A | 10/1998 | Canfield et al. |
| 5,819,215 A | 10/1998 | Dobson et al. |
| 5,822,781 A | 10/1998 | Wells et al. |
| 5,825,424 A | 10/1998 | Canfield et al. |
| 5,825,830 A | 10/1998 | Kopf |
| 5,832,037 A | 11/1998 | Park |
| 5,832,126 A | 11/1998 | Tanaka |
| 5,832,443 A | 11/1998 | Kolesnik et al. |
| 5,835,788 A | 11/1998 | Blumer et al. |
| 5,836,003 A | 11/1998 | Sadeh |
| 5,838,821 A | 11/1998 | Matsubara et al. |
| 5,838,927 A | 11/1998 | Gillon |
| 5,838,996 A | 11/1998 | deCarmo |
| 5,839,100 A | 11/1998 | Wegener |
| 5,841,979 A | 11/1998 | Schulhof et al. |
| 5,847,762 A | 12/1998 | Canfield et al. |
| 5,850,565 A | 12/1998 | Wightman |
| 5,856,797 A | 1/1999 | Kawauchi |
| 5,860,083 A | 1/1999 | Sukegawa |

(56) References Cited

U.S. PATENT DOCUMENTS

| | | |
|---|---|---|
| 5,861,824 A | 1/1999 | Ryu et al. |
| 5,861,920 A | 1/1999 | Mead et al. |
| 5,864,342 A | 1/1999 | Kajiya et al. |
| 5,864,678 A | 1/1999 | Riddle |
| 5,867,167 A | 2/1999 | Deering |
| 5,867,602 A | 2/1999 | Zandi et al. |
| 5,870,036 A | 2/1999 | Franaszek et al. |
| 5,870,087 A | 2/1999 | Chau |
| 5,872,530 A | 2/1999 | Domyo et al. |
| 5,874,907 A | 2/1999 | Craft |
| 5,881,104 A | 3/1999 | Akahane |
| 5,883,975 A | 3/1999 | Narita et al. |
| 5,884,269 A | 3/1999 | Cellier et al. |
| 5,886,655 A | 3/1999 | Rust |
| 5,887,165 A | 3/1999 | Martel et al. |
| 5,889,961 A | 3/1999 | Dobbek |
| 5,892,847 A | 4/1999 | Johnson |
| 5,901,278 A | 5/1999 | Kurihara et al. |
| 5,907,801 A | 5/1999 | Albert et al. |
| 5,909,557 A | 6/1999 | Betker et al. |
| 5,909,559 A | 6/1999 | So |
| 5,915,079 A | 6/1999 | Vondran, Jr. et al. |
| 5,917,438 A | 6/1999 | Ando |
| 5,918,068 A | 6/1999 | Shafe |
| 5,918,225 A | 6/1999 | White et al. |
| 5,920,326 A | 7/1999 | Rentschler et al. |
| 5,923,860 A | 7/1999 | Olarig |
| 5,930,358 A | 7/1999 | Rao |
| 5,936,616 A | 8/1999 | Torborg, Jr. et al. |
| 5,938,737 A | 8/1999 | Smallcomb et al. |
| 5,943,692 A | 8/1999 | Marberg |
| 5,945,933 A | 8/1999 | Kalkstein |
| 5,949,355 A | 9/1999 | Panaoussis |
| 5,949,968 A | 9/1999 | Gentile |
| 5,951,623 A | 9/1999 | Reynar et al. |
| 5,955,976 A | 9/1999 | Heath |
| 5,956,490 A | 9/1999 | Buchholz et al. |
| 5,960,465 A | 9/1999 | Adams |
| 5,964,842 A | 10/1999 | Packard |
| 5,968,149 A | 10/1999 | Jaquette et al. |
| 5,969,927 A | 10/1999 | Schirmer et al. |
| 5,973,630 A | 10/1999 | Heath |
| 5,974,235 A | 10/1999 | Nunally et al. |
| 5,974,387 A | 10/1999 | Kageyama |
| 5,974,471 A | 10/1999 | Belt |
| 5,978,483 A | 11/1999 | Thompson, Jr. et al. |
| 5,982,360 A | 11/1999 | Wu et al. |
| 5,982,723 A | 11/1999 | Kamatani |
| 5,982,937 A | 11/1999 | Accad |
| 5,987,022 A | 11/1999 | Geiger et al. |
| 5,987,432 A | 11/1999 | Zusman et al. |
| 5,987,590 A | 11/1999 | Wing So |
| 5,990,810 A | 11/1999 | Williams |
| 5,990,884 A | 11/1999 | Douma et al. |
| 5,991,515 A | 11/1999 | Fall et al. |
| 5,996,033 A | 11/1999 | Chiu-Hao |
| 6,000,009 A | 12/1999 | Brady |
| 6,002,411 A | 12/1999 | Dye |
| 6,003,115 A | 12/1999 | Spear et al. |
| 6,008,743 A | 12/1999 | Jaquette |
| 6,009,491 A | 12/1999 | Roppel et al. |
| 6,011,901 A | 1/2000 | Kirsten |
| 6,014,694 A | 1/2000 | Aharoni et al. |
| 6,021,433 A | 2/2000 | Payne |
| 6,023,233 A | 2/2000 | Craven et al. |
| 6,023,755 A | 2/2000 | Casselman |
| 6,026,217 A | 2/2000 | Adiletta |
| 6,028,725 A | 2/2000 | Blumenau |
| 6,031,939 A | 2/2000 | Gilbert et al. |
| 6,032,148 A | 2/2000 | Wilkes |
| 6,032,197 A | 2/2000 | Birdwell et al. |
| 6,038,346 A | 3/2000 | Ratnakar |
| 6,057,790 A | 5/2000 | Igata et al. |
| 6,058,459 A | 5/2000 | Owen et al. |
| 6,061,398 A | 5/2000 | Satoh et al. |
| 6,061,473 A | 5/2000 | Chen et al. |
| 6,065,094 A | 5/2000 | Akiyama |
| 6,070,179 A | 5/2000 | Craft |
| 6,073,232 A | 6/2000 | Kroeker et al. |
| 6,075,470 A | 6/2000 | Little et al. |
| 6,078,541 A | 6/2000 | Kitagawa et al. |
| 6,078,958 A | 6/2000 | Echeita et al. |
| 6,091,777 A | 7/2000 | Guetz et al. |
| 6,092,071 A | 7/2000 | Bolan et al. |
| 6,092,123 A | 7/2000 | Steffan et al. |
| 6,094,634 A | 7/2000 | Yahagi et al. |
| 6,097,520 A | 8/2000 | Kadnier |
| 6,097,845 A | 8/2000 | Ng et al. |
| 6,098,114 A | 8/2000 | McDonald et al. |
| 6,104,389 A | 8/2000 | Ando |
| 6,105,130 A | 8/2000 | Wu et al. |
| 6,115,384 A | 9/2000 | Parzych |
| 6,121,903 A | 9/2000 | Kalkstein |
| 6,128,412 A | 10/2000 | Satoh |
| 6,134,631 A | 10/2000 | Jennings, III |
| 6,141,053 A | 10/2000 | Saukkonen |
| 6,145,020 A | 11/2000 | Barnett |
| 6,145,069 A | 11/2000 | Dye |
| 6,158,000 A | 12/2000 | Collins |
| 6,169,241 B1 | 1/2001 | Shimizu |
| 6,169,499 B1 | 1/2001 | Cooper |
| 6,170,007 B1 | 1/2001 | Venkatraman et al. |
| 6,170,047 B1 | 1/2001 | Dye |
| 6,170,049 B1 | 1/2001 | So |
| 6,172,936 B1 | 1/2001 | Kitazaki |
| 6,173,381 B1 | 1/2001 | Dye |
| 6,175,650 B1 | 1/2001 | Sindhu et al. |
| 6,175,856 B1 | 1/2001 | Riddle |
| 6,182,125 B1 | 1/2001 | Borella et al. |
| 6,185,625 B1 | 2/2001 | Tso et al. |
| 6,185,659 B1 | 2/2001 | Milillo et al. |
| 6,192,082 B1 | 2/2001 | Moriarty et al. |
| 6,192,155 B1 | 2/2001 | Fan |
| 6,195,024 B1 | 2/2001 | Fallon |
| 6,195,125 B1 | 2/2001 | Udagawa et al. |
| 6,195,391 B1 | 2/2001 | Hancock et al. |
| 6,195,465 B1 | 2/2001 | Zandi et al. |
| 6,198,842 B1 | 3/2001 | Yeo |
| 6,198,850 B1 | 3/2001 | Banton |
| 6,208,273 B1 | 3/2001 | Dye et al. |
| 6,215,904 B1 | 4/2001 | Lavallee |
| 6,215,983 B1 | 4/2001 | Dogan et al. |
| 6,216,157 B1 | 4/2001 | Vishwanath et al. |
| 6,219,754 B1 | 4/2001 | Belt et al. |
| 6,222,886 B1 | 4/2001 | Yogeshwar |
| 6,225,922 B1 | 5/2001 | Norton |
| 6,226,667 B1 | 5/2001 | Matthews et al. |
| 6,226,740 B1 | 5/2001 | Iga |
| 6,230,223 B1 | 5/2001 | Olarig |
| 6,233,017 B1 | 5/2001 | Chaddha |
| 6,237,054 B1 | 5/2001 | Freitag, Jr. |
| 2,533,264 A1 | 6/2001 | Sebastian |
| 6,243,829 B1 | 6/2001 | Chan |
| 6,257,693 B1 | 7/2001 | Miller et al. |
| 6,272,178 B1 | 8/2001 | Nieweglowski et al. |
| 6,272,627 B1 | 8/2001 | Mann |
| 6,272,628 B1 | 8/2001 | Aguilar et al. |
| 6,282,641 B1 | 8/2001 | Christensen |
| 6,285,458 B1 | 9/2001 | Yada |
| 6,298,408 B1 | 10/2001 | Park |
| 6,308,311 B1 | 10/2001 | Carmichael et al. |
| 6,309,424 B1 | 10/2001 | Fallon |
| 6,310,563 B1 | 10/2001 | Har et al. |
| 6,317,714 B1 | 11/2001 | Del Castillo et al. |
| 6,317,818 B1 | 11/2001 | Zwiegincew et al. |
| 6,330,622 B1 | 12/2001 | Schaefer |
| 6,333,745 B1 | 12/2001 | Shimomura et al. |
| 6,336,153 B1 | 1/2002 | Izumida et al. |
| 6,345,307 B1 | 2/2002 | Booth |
| 6,356,589 B1 | 3/2002 | Gebler et al. |
| 6,356,937 B1 | 3/2002 | Montville et al. |
| 6,370,631 B1 | 4/2002 | Dye |
| 6,374,353 B1 | 4/2002 | Settsu et al. |
| 6,388,584 B1 | 5/2002 | Dorward et al. |

(56) References Cited

U.S. PATENT DOCUMENTS

| | | |
|---|---|---|
| 6,392,567 B2 | 5/2002 | Satoh |
| 6,404,919 B1 | 6/2002 | Nishigaki et al. |
| 6,404,931 B1 | 6/2002 | Chen et al. |
| 6,421,387 B1 | 7/2002 | Rhee |
| 6,434,168 B1 | 8/2002 | Kari |
| 6,434,695 B1 | 8/2002 | Esfahani et al. |
| 6,442,659 B1 | 8/2002 | Blumenau |
| 6,449,658 B1 | 9/2002 | Lafe et al. |
| 6,449,682 B1 | 9/2002 | Toorians |
| 6,452,602 B1 | 9/2002 | Morein |
| 6,452,933 B1 | 9/2002 | Duffield et al. |
| 6,459,429 B1 | 10/2002 | Deering |
| 6,463,509 B1 | 10/2002 | Teoman et al. |
| 6,487,640 B1 | 11/2002 | Lipasti |
| 6,489,902 B2 | 12/2002 | Heath |
| 6,505,239 B1 | 1/2003 | Kobata |
| 6,513,113 B1 | 1/2003 | Kobayashi |
| 6,523,102 B1 | 2/2003 | Dye et al. |
| 6,526,174 B1 | 2/2003 | Graffagnino |
| 6,529,633 B1 | 3/2003 | Easwar et al. |
| 6,532,121 B1 | 3/2003 | Rust et al. |
| 6,539,438 B1 | 3/2003 | Ledzius et al. |
| 6,539,456 B2 | 3/2003 | Stewart |
| 6,542,644 B1 | 4/2003 | Satoh |
| 6,577,254 B2 | 6/2003 | Rasmussen |
| 6,590,609 B1 | 7/2003 | Kitade et al. |
| 6,597,812 B1 | 7/2003 | Fallon et al. |
| 6,601,104 B1 | 7/2003 | Fallon |
| 6,604,040 B2 | 8/2003 | Kawasaki et al. |
| 6,604,158 B1 | 8/2003 | Fallon |
| 6,606,040 B2 | 8/2003 | Abdat |
| 6,606,413 B1 | 8/2003 | Zeineh |
| 6,609,223 B1 | 8/2003 | Wolfgang |
| 6,618,728 B1 | 9/2003 | Rail |
| 6,624,761 B2 | 9/2003 | Fallon |
| 6,633,244 B2 | 10/2003 | Avery |
| 6,633,968 B2 | 10/2003 | Zwiegincew et al. |
| 6,650,261 B2 | 11/2003 | Nelson et al. |
| 6,661,839 B1 | 12/2003 | Ishida et al. |
| 6,661,845 B1 | 12/2003 | Herath |
| 6,704,840 B2 | 3/2004 | Nalawadi et al. |
| 6,708,220 B1 | 3/2004 | Olin |
| 6,711,709 B1 | 3/2004 | York |
| 6,717,534 B2 | 4/2004 | Yokose |
| 6,723,225 B2 | 4/2004 | Scheps |
| 6,731,814 B2 | 5/2004 | Zeck et al. |
| 6,735,195 B1 | 5/2004 | Mehta |
| 6,744,926 B1 | 6/2004 | Nishigaki |
| 6,745,282 B2 | 6/2004 | Okada et al. |
| 6,748,457 B2 | 6/2004 | Fallon et al. |
| 6,756,922 B2 | 6/2004 | Ossia |
| 6,768,749 B1 | 7/2004 | Osler et al. |
| 6,792,151 B1 | 9/2004 | Barnes et al. |
| 6,810,434 B2 | 10/2004 | Muthujumaraswathy et al. |
| 6,813,689 B2 | 11/2004 | Baxter, III |
| 6,819,271 B2 | 11/2004 | Geiger et al. |
| 6,822,589 B1 | 11/2004 | Dye et al. |
| 6,856,651 B2 | 2/2005 | Singh |
| 6,862,278 B1 | 3/2005 | Chang et al. |
| 6,868,500 B1 * | 3/2005 | Kutz .................. G06F 1/24 323/266 |
| 6,879,266 B1 | 4/2005 | Dye et al. |
| 6,885,316 B2 | 4/2005 | Mehring |
| 6,885,319 B2 | 4/2005 | Geiger et al. |
| 6,888,893 B2 | 5/2005 | Li et al. |
| 6,909,383 B2 | 6/2005 | Shokrollahi et al. |
| 6,909,745 B1 | 6/2005 | Puri et al. |
| 6,938,073 B1 | 8/2005 | Mendhekar et al. |
| 6,944,740 B2 | 9/2005 | Abali et al. |
| 6,952,409 B2 | 10/2005 | Jolitz |
| 6,959,005 B1 | 10/2005 | Osler et al. |
| 6,959,110 B1 | 10/2005 | Danskin et al. |
| 6,959,359 B1 | 10/2005 | Suzuki et al. |
| 6,963,608 B1 | 11/2005 | Wu |
| 6,990,247 B2 | 1/2006 | Schwartz |
| 6,993,597 B2 | 1/2006 | Nakagawa et al. |
| 7,007,099 B1 | 2/2006 | Donati et al. |
| 7,024,460 B2 | 4/2006 | Koopmas et al. |
| 7,050,639 B1 | 5/2006 | Barnes et al. |
| 7,054,493 B2 | 5/2006 | Schwartz |
| 7,069,342 B1 | 6/2006 | Biederman |
| 7,079,051 B2 | 7/2006 | Storer et al. |
| 7,089,391 B2 | 8/2006 | Geiger et al. |
| 7,096,481 B1 | 8/2006 | Forecast et al. |
| 7,102,544 B1 | 9/2006 | Liu |
| 7,127,518 B2 | 10/2006 | Vange et al. |
| 7,129,860 B2 | 10/2006 | Alvarez, II |
| 7,130,913 B2 | 10/2006 | Fallon |
| 7,161,506 B2 | 1/2007 | Fallon |
| 7,181,608 B2 | 2/2007 | Fallon et al. |
| 7,190,284 B1 | 3/2007 | Dye et al. |
| 7,245,636 B1 | 7/2007 | Hans et al. |
| 7,319,667 B1 | 1/2008 | Biederman |
| 7,321,937 B2 | 1/2008 | Fallon |
| RE40,092 E | 2/2008 | Kang |
| 7,327,287 B2 | 2/2008 | Martinian et al. |
| 7,330,912 B1 | 2/2008 | Fox et al. |
| 7,352,300 B2 | 4/2008 | Fallon |
| 7,358,867 B2 | 4/2008 | Fallon |
| 7,376,772 B2 | 5/2008 | Fallon |
| 7,378,992 B2 | 5/2008 | Fallon |
| 7,386,046 B2 | 6/2008 | Fallon et al. |
| 7,395,345 B2 | 7/2008 | Fallon |
| 7,400,274 B2 | 7/2008 | Fallon et al. |
| 7,415,530 B2 | 8/2008 | Fallon |
| 7,417,568 B2 | 8/2008 | Fallon et al. |
| 7,496,586 B1 | 2/2009 | Bonwick et al. |
| 7,548,657 B2 | 6/2009 | Deaven |
| 7,552,069 B2 | 6/2009 | Kepecs |
| 7,565,441 B2 | 7/2009 | Romanik et al. |
| 7,711,938 B2 | 5/2010 | Wise et al. |
| 7,714,747 B2 | 5/2010 | Fallon |
| 7,777,651 B2 | 8/2010 | Fallon et al. |
| 8,004,431 B2 | 8/2011 | Reznik |
| 8,054,879 B2 | 11/2011 | Fallon et al. |
| 8,073,047 B2 | 12/2011 | Fallon et al. |
| 8,090,936 B2 | 1/2012 | Fallon et al. |
| 8,112,619 B2 | 2/2012 | Fallon et al. |
| 8,275,897 B2 | 9/2012 | Fallon |
| 8,502,707 B2 | 8/2013 | Fallon |
| 8,504,710 B2 | 8/2013 | Fallon |
| 8,553,759 B2 | 10/2013 | Fallon et al. |
| 8,643,513 B2 | 2/2014 | Fallon |
| 8,692,695 B2 | 4/2014 | Fallon et al. |
| 8,717,203 B2 | 5/2014 | Fallon |
| 8,717,204 B2 | 5/2014 | Fallon et al. |
| 8,719,438 B2 | 5/2014 | Fallon |
| 8,723,701 B2 | 5/2014 | Fallon et al. |
| 8,742,958 B2 | 6/2014 | Fallon et al. |
| 8,756,332 B2 | 6/2014 | Fallon |
| 8,867,610 B2 | 10/2014 | Fallon et al. |
| 8,880,862 B2 | 11/2014 | Fallon et al. |
| 8,929,442 B2 | 1/2015 | Fallon et al. |
| 8,933,825 B2 | 1/2015 | Fallon |
| 8,934,535 B2 | 1/2015 | Fallon et al. |
| 9,054,728 B2 | 6/2015 | Fallon |
| 9,116,908 B2 | 8/2015 | Fallon |
| 9,141,992 B2 | 9/2015 | Fallon et al. |
| 9,143,546 B2 | 9/2015 | Fallon et al. |
| 2001/0019630 A1 | 9/2001 | Johnson |
| 2001/0031092 A1 | 10/2001 | Zeck et al. |
| 2001/0032128 A1 | 10/2001 | Kepecs |
| 2001/0047473 A1 | 11/2001 | Fallon |
| 2001/0052038 A1 | 12/2001 | Fallon et al. |
| 2001/0054131 A1 | 12/2001 | Alvarez, II et al. |
| 2002/0037035 A1 | 3/2002 | Singh |
| 2002/0069354 A1 | 6/2002 | Fallon et al. |
| 2002/0078241 A1 | 6/2002 | Vidal et al. |
| 2002/0080871 A1 | 6/2002 | Fallon et al. |
| 2002/0097172 A1 | 7/2002 | Fallon |
| 2002/0101367 A1 | 8/2002 | Geiger et al. |
| 2002/0104891 A1 | 8/2002 | Otto |
| 2002/0126755 A1 | 9/2002 | Li et al. |
| 2002/0169950 A1 | 11/2002 | Esfahani et al. |

(56) References Cited

U.S. PATENT DOCUMENTS

| | | |
|---|---|---|
| 2002/0191692 A1 | 12/2002 | Fallon et al. |
| 2002/0196166 A1 | 12/2002 | Satoh et al. |
| 2003/0030575 A1 | 2/2003 | Frachtenberg et al. |
| 2003/0034905 A1 | 2/2003 | Anton et al. |
| 2003/0058873 A1 | 3/2003 | Geiger et al. |
| 2003/0084238 A1 | 5/2003 | Okada et al. |
| 2003/0090397 A1 | 5/2003 | Rasmussen |
| 2003/0142874 A1 | 7/2003 | Schwartz |
| 2003/0191876 A1 | 10/2003 | Fallon |
| 2004/0042506 A1 | 3/2004 | Fallon et al. |
| 2004/0056783 A1 | 3/2004 | Fallon |
| 2004/0073710 A1 | 4/2004 | Fallon |
| 2004/0073746 A1 | 4/2004 | Fallon |
| 2006/0015650 A1 | 1/2006 | Fallon |
| 2006/0181441 A1 | 8/2006 | Fallon |
| 2006/0181442 A1 | 8/2006 | Fallon |
| 2006/0184687 A1 | 8/2006 | Fallon |
| 2006/0184696 A1 | 8/2006 | Fallon |
| 2006/0190644 A1 | 8/2006 | Fallon |
| 2006/0195601 A1 | 8/2006 | Fallon |
| 2007/0043939 A1 | 2/2007 | Fallon et al. |
| 2007/0050514 A1 | 3/2007 | Fallon |
| 2007/0050515 A1 | 3/2007 | Fallon |
| 2007/0067483 A1 | 3/2007 | Fallon |
| 2007/0083746 A1 | 4/2007 | Fallon et al. |
| 2007/0096954 A1 | 5/2007 | Boldt et al. |
| 2007/0109154 A1 | 5/2007 | Fallon |
| 2007/0109155 A1 | 5/2007 | Fallon |
| 2007/0109156 A1 | 5/2007 | Fallon |
| 2007/0174209 A1 | 7/2007 | Fallon |
| 2008/0232457 A1 | 9/2008 | Fallon et al. |
| 2009/0125698 A1 | 5/2009 | Dye |
| 2009/0154545 A1 | 6/2009 | Fallon et al. |
| 2009/0287839 A1 | 11/2009 | Fallon et al. |
| 2010/0011012 A1 | 1/2010 | Rawson |
| 2010/0316114 A1 | 12/2010 | Fallon et al. |
| 2010/0318684 A1 | 12/2010 | Fallon |
| 2010/0332700 A1 | 12/2010 | Fallon |
| 2011/0037626 A1 | 2/2011 | Fallon |
| 2011/0199243 A1 | 8/2011 | Fallon et al. |
| 2011/0208833 A1 | 8/2011 | Fallon |
| 2011/0231642 A1 | 9/2011 | Fallon et al. |
| 2011/0235697 A1 | 9/2011 | Fallon et al. |
| 2011/0285559 A1 | 11/2011 | Fallon |
| 2012/0194362 A1 | 8/2012 | Fallon et al. |
| 2012/0239921 A1 | 9/2012 | Fallon |
| 2013/0297575 A1 | 11/2013 | Fallon et al. |
| 2014/0022098 A1 | 1/2014 | Fallon |
| 2014/0022099 A1 | 1/2014 | Fallon et al. |
| 2014/0022100 A1 | 1/2014 | Fallon et al. |
| 2014/0023135 A1 | 1/2014 | Fallon et al. |
| 2014/0028480 A1 | 1/2014 | Fallon et al. |
| 2014/0105270 A1 | 4/2014 | Fallon et al. |
| 2014/0105271 A1 | 4/2014 | Fallon et al. |
| 2014/0218220 A1 | 8/2014 | Fallon |
| 2015/0009051 A1 | 1/2015 | Fallon |
| 2015/0012507 A1 | 1/2015 | Fallon |
| 2015/0113182 A1 | 4/2015 | Fallon |
| 2015/0270849 A1 | 9/2015 | Fallon |
| 2015/0334390 A1 | 11/2015 | Fallon et al. |
| 2016/0029018 A1 | 1/2016 | Fallon et al. |
| 2016/0127512 A1 | 5/2016 | Fallon et al. |
| 2016/0127513 A1 | 5/2016 | Fallon et al. |
| 2016/0162505 A1 | 6/2016 | Fallon |
| 2016/0261278 A1 | 9/2016 | Fallon |

FOREIGN PATENT DOCUMENTS

| | | |
|---|---|---|
| EP | 0 185098 | 6/1986 |
| EP | 0283798 | 9/1988 |
| EP | 0405572 | 1/1991 |
| EP | 0493130 | 7/1992 |
| EP | 0587437 | 3/1994 |
| EP | 0595406 | 5/1994 |
| EP | 0718751 | 6/1996 |
| EP | 0 928 070 A2 | 7/1999 |
| GB | 2162025 | 1/1986 |
| JP | 04-241681 | 8/1992 |
| JP | 05088793 A * | 4/1993 |
| JP | 6051989 | 2/1994 |
| JP | 9188009 | 7/1997 |
| JP | 11149376 | 6/1999 |
| WO | WO 9414273 | 6/1994 |
| WO | WO 9429852 | 12/1994 |
| WO | WO 9502873 | 1/1995 |
| WO | WO 95/29437 A1 | 11/1995 |
| WO | WO 97/39421 | 10/1997 |
| WO | WO 9748212 | 12/1997 |
| WO | WO 98/19450 | 5/1998 |
| WO | WO9839699 A2 | 9/1998 |
| WO | WO 9908186 | 2/1999 |
| WO | WO0036754 A1 | 6/2000 |
| WO | WO 00/46688 | 8/2000 |
| WO | WO 01/50325 | 7/2001 |
| WO | WO 01/57659 | 8/2001 |
| WO | WO 01/63772 | 8/2001 |
| WO | WO 02/39591 | 5/2002 |
| WO | WO 2008/087466 A1 | 7/2008 |

OTHER PUBLICATIONS

Complaint for Patent Infringement, filed in *Realtime Data, LLC d/b/a/ IXO* v. *Microsoft Corporation, et al.*, Case No. 4:14-cv-00827 (E.D. Texas), Dec. 19, 2014, 17 pages.
Complaint for Patent Infringement, filed in *Realtime Data, LLC d/b/a/ IXO* v. *Actian Corporation, et al.*, Case No. 6:15-cv-00463 (E.D. Texas), May 8, 2015, 18 pages.
Complaint for Patent Infringement, filed in *Realtime Data, LLC d/b/a/ IXO* v. *Dropbox, Inc.*, Case No. 6:15-cv-00465 (E.D. Texas), May 8, 2015, 14 pages.
Complaint for Patent Infringement, filed in *Realtime Data, LLC d/b/a/ IXO* v. *Echostar Corporation, et al.*, Case No. 6:15-cv-00466 (E.D. Texas), May 8, 2015, 15 pages.
Complaint for Patent Infringement, filed in *Realtime Data, LLC d/b/a/ IXO* v. *Riverbed Technology, Inc. et al.*, Case No. 6:15-cv-00468 (E.D. Texas), May 8, 2015, 26 pages.
Complaint for Patent Infringement, filed in *Realtime Data, LLC d/b/a/ IXO* v. *BMC Software, Inc.*, Case No. 6:15-cv-00464 (E.D. Texas), May 8, 2015, 17 pages.
Complaint for Patent Infringement, filed in *Realtime Data, LLC d/b/a/ IXO* v. *Oracle America, Inc., et al.*, Case No. 6:15-cv-00467 (E.D. Texas), May 8, 2015, 41 pages.
Complaint for Patent Infringement, filed in *Realtime Data, LLC d/b/a/ IXO* v. *SAP America, Inc., et al.*, Case No. 6:15-cv-00469 (E.D. Texas), May 8, 2015, 34 pages.
Complaint for Patent Infringement, filed in *Realtime Data, LLC d/b/a/ IXO* v. *Teradata Corporation, et al.*, Case No. 6:15-cv-00470 (E.D. Texas), May 8, 2015, 17 pages.
First Amended Complaint for Patent Infringement, filed in *Realtime Data, LLC d/b/a IXO* v. *SAP America, Inc., et al.*, No. 6:15-cv-00469 (E.D. Texas), Jun. 2, 2015, 50 pages.
Defendants Actian Corporation and Pervasive Software Inc.'s Motion to Dismiss Complaint, filed in *Realtime Data, LLC d/b/a IXO* v. *Actian Corporation, et al.*, Case No. 6:15-cv-00463-RWS-JDL (E.D. Tex.), filed Jul. 24, 2015; 22 pages.
Defendant Dropbox, Inc.'s Motion, to Dismiss for Failure to State a Claim, filed in *Realtime Data, LLC d/b/a IXO* v. *Actian Corporation, et al.*, Case No. 6:15-cv-00463-RWS-JDL (E.D. Tex.), filed Jul. 24, 2015; 3 pages.
Defendants SAP America Inc., Sybase, Inc., Hewlett-Packard Company, HP Enterprise Services, LLC, Dell Inc., BMC Software, Inc., Echostar Corporation, and Hughes Network Systems, LLC's Motion to Dismiss First Amended Complaint, filed in *Realtime Data, LLC d/b/a IXO* v. *Actian Corporation, et al.*, Case No. 6:15-cv-00463-RWS-JDL (E.D. Tex.), filed Jul. 24, 2015; 37 pages.
Defendant Riverbed Technology's Motion to Dismiss for Failure to State a Claim, filed in *Realtime Data, LLC d/b/a IXO* v. *Actian Corporation, et al*, Case No. 6:15-cv-00463-RWS-JDL (E.D. Tex.), filed Jul. 27, 2015; 3 pages.

(56) References Cited

OTHER PUBLICATIONS

Dell Inc.'s Motion to Dismiss, filed in *Realtime Data, LLC d/b/a IXO* v. *Action Corporation, et al.*, Case No. 6:15-cv-00463-RWS-JDL (E.D. Tex.), filed Jul. 28, 2015; 3 pages.
First Amended Complaint for Patent Infringement, filed in *Realtime Data, LLC d/b/a IXO* v. *Actian Corporation, et al*, Case No. 6:15-cv-00463-RWS-JDL (E.D. Tex.), filed Jul. 29, 2015; 42 pages.
Realtime Data LLC d/b/a IXO's Answer to Hewlett-Packard Company and HP Enterprise Services, LLC's Counterclaim, filed in *Realtime Data, LLC d/b/a IXO* v. *Actian Corporation, et al.*, Case No. 6:15-cv-00463-RWS-JDL (E.D. Tex.), filed Aug. 3, 2015; 8 pages.
Defendant's Reply Brief on their Motion to Dismiss First Amended Complaint, filed in *Realtime Data LLC d/b/a IXO* v. *Actian Corporation, et al.*, Case No. 6:15-cv-00463-RWS-JDL, filed Sep. 11, 2015; 15 pages.
Defendants Actian Corporation and Pervasive Software Inc.'s Motion to Dismiss First Amended Complaint, filed in *Realtime Data LLC d/b/a IXO* v. *Actian Corporation, et al.*, Case No. 6:15-cv-00463-RWS-JDL, filed Sep. 29, 2015; 32 pages.
Defendants Hewlett-Packard Company and HP Enterprise Services, LLC's Answer and Counterclaims to Plaintiffs Second Amended Complaint for Patent Infringement Against Oracle America, Inc., filed in *Realtime Data LLC d/b/a IXO* v. *Actian Corporation, et al.*, filed Oct. 1, 2015; 23 pages.
Defendant Oracle America, Inc.'s Answer to Realtime Data LLC's Second Amended Complaint and Counterclaims, filed in *Realtime Data LLC d/b/a IXO* v. *Actian Corporation, et al.*, Case No. 6:15-cv-00463-RWS-JDL, filed Oct. 1, 2015; 30 pages.
Defendants SAP America Inc., Sybase, Inc., Hewlett-Packard Company, HP Enterprise Services, LLC, Dell Inc., Echostar Corporation, Hughes Network Systems, LLC, Dropbox, Inc., and Riverbed Technology, Inc.'s Motion to Dismiss Amended Complaints, filed in *Realtime Data LLC d/b/a* v. *Actian Corporation, et al.*, Case.No. 6:15-cv-00463-RWS-JDL, filed Oct. 1, 2015; 11 pages.
Defendant Teradata Operations, Inc.'s Answer, Affirmative Defenses, and Counterclaims to Plaintiff Realtime Data LLC's Amended Complaint, filed in *Realtime Data LLC d/b/a IXO* v. *Actian Corporation, et al.*, Case No. 6:15-cv-00463-RWS-JDL, filed Oct. 2, 2015; 23 pages.
Complaint for Patent Infringement, filed in *Realtime Data LLC d/b/a IXO* v. *Apple, Inc.*, Case No. 6:15-cv-00885, filed Oct. 6, 2015; 17 pages.
Non-Final Office Action for U.S. Appl. No. 14/305,692, dated Feb. 10, 2015, 9 pages.
Non-Final Office Action for U.S. Appl. No. 14/303,276, dated Mar. 12, 2015, 5 pages.
Supplemental Notice of Allowability for U.S. Appl. No. 14/495,574, dated Apr. 7, 2015; 5 pages.
Notice of Allowance for U.S. Appl. No. 14/303,276, dated Jun. 5, 2015; 8 pages.
Notice of Allowance for U.S. Appl. No. 09/969,987, dated Jul. 2, 2015; 10 pages.
Notice of Allowance for U.S. Appl. No. 14/727,309, dated Sep. 30, 2015; 7 pages.
Non-Final Office Action for U.S. Appl. No. 14/733,565, dated Oct. 19, 2015; 8 pages.
Notice of Intent to Issue a Reexamination Certificate in Inter Partes Reexamination of U.S. Pat. No. 6,604,158, Control No. 95/001,923, dated Mar. 9, 2015, 7 pages.
Inter Partes Reexamination Certificate, in Inter Partes Reexamination of U.S. Pat. No. 6,604,158, Control No. 95/001,923, issued Apr. 17, 2015; 3 pages.
U.S. Appl. No. 14/733,565, Fallon et al., "System and Methods for Video and Audio Data Distribution," filed Jun. 8, 2015.
U.S. Appl. No. 14/794,201, Fallon, "System and Methods for Accelerated Data Storage and Retrieval,", filed Jul. 8, 2015.
U.S. Appl. No. 14/844,973, Fallon, "System and Method for Data Feed Acceleration and Encryption ," filed Sep. 3, 2015.

U.S. Appl. No. 14/853,581, Fallon, "Data Feed Acceleeration," filed Sep. 14, 2015.
U.S. Appl. No. 14/876,276, Fallon, "Video Data Compression Systems," filed Oct. 6, 2015.
Plaintiff Realtime Data LLC d/b/a IXO's Opposition to Defendant's Motions to Dismiss Amended Complaints with associated attachments, filed in *Realtime Data, LLC d/b/a IXO* v. *Action Corporation, et al.*, Case No. 6:15-cv-00463-RWS-JDL (E.D. Texas), filed Oct. 19, 2015; 9 pages.
Realtime Data LLC, d/b/a IXO's Answer to Hewlett-Packard Company and HP Enterprise Services, LLC's Counterclaimes to Second Amended Complaint, filed in *Realtime Data LLC, d/b/a IXO* v. *Action Corporation, et al.*, Case No. 6:15-cv-00463-RWS-JDL (E.D. Texas), filed Oct. 19, 2015; 9 pages.
Realtime Data LLC, d/b/a IXO's Answer to Oracle America, Inc's Counterclaims to Second Amended Complaint, filed in *Realtime Data, LLC d/b/a IXO* v. *Action Corporation, et al.*, Case No. 6:15-cv-00463-RWS-JDL (E.D. Texas), filed Oct. 19, 2015; 8 pages.
Realtime Data LLC, d/b/a IXO's Answer to Teradata Operations, Inc.'s Counterclaims to First Amended Complaint, filed in *Realtime Data, LLC d/b/a IXO* v. *Action Corporation, et al.*, Case No. 6:15-cv-00463-RWS-JDL (E.D. Texas), filed Oct. 19, 2015; 9 pages.
Defendants SAP America Inc., SyBawse, Inc., Hewlett-Packard Company, HP Enterprise Services, LLC, Dell Inc., Echostart Corporation, Hughes Network Systems, LLC Dropbox, Inc., and Riverbed Technology, Inc.'s Reply Brief on their Motion to Dismiss Amended Complaints, filed in *Realtime Data, LLC d/b/a IXO* v. *Action Corporation, et al.*, Case No. 6:15-cv-00463-RWS-JDL (E.D. Texas), filed Oct. 30, 2015; 15 pages.
Reply in Support of Defendants Actian Corporation and Pervasive Software Inc.'s Motion to Dismiss First Amended Complaint, filed in *Realtime Data, LLC d/b/a IXO* v. *Action Corporation, et al.*, Case No. 6:15-cv-00463-RWS-JDL (E.D. Texas), filed Nov. 6, 2015; 14 pages.
Plaintiff Realtime Data, LLC d/b/a IXO's Sur-Reply to SAP Defendants' Motions to Dismiss, filed in *Realtime Data, LLC d/b/a IXO* v. *Action Corporation, et al.*, Case No. 6:15-cv-00463-RWS-JDL (E.D. Texas), filed Nov. 9, 2015; 13 pages.
Reply in Support of Defendants Actian Corporation and Pervasive Software Inc.'s Motion to Dismiss First Amended Complaint, filed in *Realtime Data, LLC d/b/a IXO* v. *Action Corporation, et al.*, Case No. 6:15 cv-00463-RWS-JDL (E.D. Texas), filed Nov. 10, 2015; 13 pages.
Plaintiff Realtime Data LLC d/b/a IXO's Sur-Reply to SAP Defendants' Motions to Dismiss, filed in *Realtime Data, LLC d/b/a IXO* v. *Action Corporation, et al.*, Case No. 6:15-cv-00463-RWS-JDL (E.D. Texas), filed Nov. 10, 2015; 13 pages.
Report and Recommendation of United States Magistrate Judge regarding Defendant Dell, Inc.'s Motion to Dismiss Failure to State a Claim pursuant to Fed. R. Civ. P. 12(b)(6), filed in *Realtime Data, LLC d/b/a IXO* v. *Action Corporation, et al.*, Case No. 6:15-cv-00463-RWS-JDL (E.D. Texas), filed Nov. 30, 2015; 12 pages.
Defendants' Objections to the Report and Recommendation of Magistrate Judge (ECF No. 184), filed in *Realtime Data, LLC d/b/a IXO* v. *Action Corporation, et al.*, Case No. 6:15-cv-00463-RWS-JDL (E.D. Texas), filed Dec. 15, 2015; 13 pages.
Defendant Apple, Inc.'s Answer and Affirmative Defenses to Plaintiff's Complaint for Patent Infringement, filed in *Realtime Data, LLC d/b/a IXO* v. *Apple, Inc.*, Case No. 6:15-cv-RWS-JDL (E.D. Texas), filed Dec. 17, 2015; 10 pages.
Plaintiff Realtime Data LLC's Response to SAP Defendants' Objections to Magistrate Judge Love's Report and Recommendation on Defendants' Motion to Dismiss, filed in *Realtime Data, LLC d/b/a IXO* v. *Action Corporation, et al.*, Case No. 6:15-cv-00463-RWS-JDL (E.D. Texas), filed Jan. 4, 2016; 11 pages.
Order Adopting Report and Recommendation of United States Magistrate Judge, filed in *Realtime Data, LLC d/b/a IXO* v. *Actian Corporation, et al.*, Case No. 6:15-cv-00463-RWS-JDL (E.D. Texas), filed Jan. 21, 2016; 4 pages.

(56) References Cited

OTHER PUBLICATIONS

Defendants' Preliminary Invalidity Contentions, submitted in *Realtime Data, LLC d/b/a IXO v. Actian Corporation, et al.*, Case No. 6:15-cv-0063-RWS-JDL (E.D. Texas), served Dec. 4, 2015; 138 pages.
Non-Confidential Exhibits A1-A7 and A9-A10 to Defendants' Preliminary Invalidity Contentions, submitted in *Realtime Data, LLC d/b/a IXO v. Actian Corporation, et, al.*, Case No. 6:15-cv-RWS-JDL (E.D. Texas), served Dec. 4, 2015; 743 pages.
Non-confidential Exhibits B1-B17 and B19 to Defendants' Preliminary Invalidity Contentions, submitted in *Realtime Data, LLC d/b/a IXO v. Actian Corporation, et al.*, Case No. 6:15-cv-0063-RWS-JDL (E.D. Texas), served Dec. 4, 2015; 506 pages.
Non-Confidential Exhibits C1-C36 to Defendants' Preliminary Invalidity Contentions, submitted in *Realtime Data, LLC d/b/a IXO v. Actian Corporation, et al.*, Case No. 6:15-cv-0063-Rws-Jdl (E.D. Texas), served Dec. 4, 2015; 1,445 pages.
Non-Confidential Exhibits D1-D14 and D16 to Defendants' Preliminary Invalidity Contentions, submitted in *Realtime Data, LLC d/b/a IXO v. Actian Corporation, et al.*, Case No. 6:15-cv-0063-RWS-JDL (E.D. Texas), served Dec. 4, 2015; 1,052 pages.
Non-Confidential Exhibits E1-E36 to Defendants' Preliminary Invalidity Contentions, submitted in *Realtime Data, LLC d/b/a IXO v. Actian Corporation, et al.*, Case No. 6:15-cv-0063-RWS-JDL (E.D. Texas), served Dec. 4, 2015; 1,205 pages.
Katz, et al., "The Bay Area Research Wireless Access Network (BARWAN)," Proceedings of COMPCON '96, 1996; pp. 15-20.
U.S. Appl. No. 60/100,671, "Hybrid Compression Method with Compression Ratio Control," filed Sep. 16, 1998; 50 pages.
Welch, T., "A Technique for High-Performance Data Compression," Computer, vol. 18, Issue 6, 1984; pp. 8-19.
Internet Archive version of the web page www.imatix.com/index. htm, dated May 20, 1998, available at http://web.archive.org/web/19980520033922/http://imatix.com/index.htm; 1 page.
Internet Archive version of the web page www.imatix.com/index. htm, dated Jan. 10, 1998, available at http://web.archive.org/web/19980110141513/http://imatix.com/index.htm; 1 page.
Internet Archive version of the web page www.imatix.com/ dated Jan. 9, 1998, available at https://web.archive.org/web/19980109064903/http://imatix.com/; 1 page.
Internet Archive version of the web page www.imatix.com/, dated Oct. 14, 1997, available at https://web.archive.org/web/19971014195839/http://www.imatix.com/; 1 page.
Internet Archive version of the web page www.imatix.com/, dated Jun. 29, 1997, available at https://web.archive.org/web/19970629063852/http://www.imatix.com/; 2 pages.
Internet Archive version of the web page www.imatix.com/, dated Apr. 16, 1997, available at https://web.archive.org/web/19970416061218/http://imatix.com/; 2 pages.
Internet Archive version of the web page www.imatix.com/, dated Dec. 21, 1996, available at https://web.archive.org/web/19961221064553/http://imatix.com/; 2 pages.
Internet Archive version of the web page www.imatix.com/, dated Nov. 6, 1996, available at https://web.archive.org/web/19961106161211/http://imatix.com/; 2 pages.
"Liberetto, The iMatix Newsletter," vol. III, issue 9, Sep. 1998, available at http://legacy.imatix.com/html/libero/doc/news9809.txt; 9 pages.
"Liberetto, The iMatix Newsletter", vol. III, issue 4, Apr. 1998, available at http://legacy.imatix.com/html/libero/docinews9804.txt; 8 pages.
"Liberetto, The iMatix Newsletter," vol. III, issue 1, Jan. 1998, available at http://legacy.imatix.com/html/libero/doc/news9801.txt; 7 pages.
"Liberetto, The iMatix Newsletter," vol. II, issue 8, Aug. 1997, available at http://legacy.imatix.com/html/libero/doc/news9708.txt; 8 pages.
"Liberetto, The iMatix Newsletter," vol. II, issue 6, Jun. 1997, available at http://legacy.imatix.com/html/libero/doc/news9706.txt; 6 pages.

"Liberetto, The iMatix Newsletter," vol. II, issue 2, Feb. 1997, available at http://legacy.imatix.corn/html/libero/doc/news9702.txt; 9 pages.
Internet Archive version of the web page www.seas.uperm.edu/~liefke/, dated Oct. 5, 1999, available at https://web.archive.org/web/19991005050552/http:/www.seas.upenn.edu/~liefke/; 2 pages.
Internet Archive version of the web page www.seas.upenn.edu/~liefke/research.html, dated Jan. 18, 2000, available at https://web.archive.org/web/20000118224540/http:/www.seas.upenn.edu/~liefke/research.html; 2 pages.
Internet Archive version of the web page www.seas.upenn.edu/~liefice/xmlzip.html, dated Jan. 19, 2000, available at https://web.archive.org/web/20000119051403/http:/www.seas.upenn.edu/~liefke/xmlzip.html; 4 pages.
Internet Archive version of the web page www.research.att.com/~suciu/stradel/external/NodeExternal,internal.genoid_3.html, dated Mar. 10, 2000, available at https://web.archive.org/web/20000310042016/http:/www.research.att.com/~suciu/strudel/external/NodeExternal,internal.genoid_3.html; 12 pages.
Internet Archive version of the web page www.research.att.com/sw/tools/xmill/, dated Aug. 31, 2000, available at https://web.archive.org/web/20000831200854/http:/www.research.att.com/sw/tools/xmill/; 2 pages.
Internet Archive version of the web page www.research.att.com/sw/tools/xmill/download.html, dated Sep. 25, 2000, available at https://web.archive.org/web/20000925084557/http://www.research.att.com/sw/tools/xmill/download.html; 1 page.
Liefke, et al., "Xmill: an Efficient Compressor for XML Data," Proceedings of the 2000 ACM SIGMOD International Conference on the Management of Data, 2000; pp. 153-164.
Final Office Action for U.S. Appl. No. 14/305,692, dated Nov. 12, 2015; 10 pages.
Non-Final Office Action for U.S. Appl. No. 14/876,276, dated Jan. 28, 2016; 7 pages.
Dicision on Appeal No. 2015-007686, in Inter Partes Reexamination of U.S. Pat. No. 7,378,992, Control No. 95/001,533, mailed Oct. 29, 2015; 16 pages.
Decision on Appeal No. 2015-007706, in Inter Partes Reexamination of U.S. Pat. No. 7,777,651, Control No. 95/001,581, mailed Oct. 29, 2015; 16 pages.
Decision on Appeal No. 2015-007687, in Inter Partes Reexamination of U.S. Pat. No. 7,400,274, Control No. 95/001,544, mailed Oct. 29, 2015; 15 pages.
Petition for Inter Partes Review of Claim 48 of U.S. Pat. No. 7,378,992, filed in *Oracle America, Inc. v. Realtime Data, LLC*, Case No. IPR2016-00373 (P.T.A.B.), filed Dec. 22, 2015; 69 pages.
Petition for Inter Partes Review of Claims 1, 2, 4, 6, 11-16, 18-20, 22 of U.S. Pat. No. 8,643,512, filed in *Oracle America, Inc. v. Realtime Data, LLC*, Case No. IPR2016-00374 (P.T.A.B.), filed Dec. 22, 2015; 68 pages.
Petition for Inter Partes Review of Claims 1-2, 4, 10-12, 18-20 of U.S. Pat. No. 7,415,530, filed in *Oracle America, Inc. v. Realtime Data, LLC*, Case No. IPR2016-00375 (P.T.A.B.), filed Dec. 22, 2015; 62 pages.
Petition for Inter Partes Review of Claim 24 of U.S. Pat. No. 7,415,530, filed in *Oracle America, Inc. v. Realtime Data, LLC*, Case No. IPR2016-00376 (P.T.A.B.), filed Dec. 22, 2015; 68 pages.
Petition for Inter Partes Review of Claims 1-2, 9, 11, 21-22, 24-25 of U.S. Pat. No. 9,116,908, filed in *Oracle America, Inc. v. Realtime Data, LLC*, Case No. IPR2016-00377 (P.T.A.B.), filed Dec. 22, 2015; 65 pages.
Declaration of Professor James A. Storer, filed in *Oracle America, Inc. v. Realtime Data, LLC*, Case No. IPR2016-00273 (P.T.A.B.), filed Dec. 22, 2015; 102 pages.
Hsu, et al., "Automatic Synthesis of Compression Techniques for Heterogeneous Files," Software—Practice and Experience, vol. 25, Issue 10, Oct. 1995; pp. 1097-1116.
Storer, J., Data Compression Methods and Theory, Rockville, MD: Computer Science Press, 1988.
Huffman, D., "A Method for the Construction of Minimum-Redundancy Codes," Proceedings of the I.R.E., Sep. 1952, pp. 1098-1101.

(56) References Cited

OTHER PUBLICATIONS

Ziv, et al., "A Universal Algorithm for Sequential Data Compression," IEEE Transactions on Information Theory, vol. IT-23, No. 3, May 1977; 337-343.
Ziv, et al., "Compression of Individual Sequences via Variable-Rate Coding," IEEE Transactions on Information Theory, vol. IT-24, No, 5, Sep. 1978; 530-536.
First Amended Complaint for Patent Infringement, filed in *Realtime Data, LLC d/b/a IXO* v. *MetroPCS Texas, LLC, et al.*, Case No. 6:10-cv-00493-LED (E.D. Texas), filed Apr. 11, 2011; 15 pages.
Joint Motion to Stay All Pending Deadlines Between Plaintiff *Realtime Data, LLC d/b/a IXO* and *Defendant Cellco Partnership d/b/a Verizon Wireless*, filed in *Realtime Data, LLC d/b/a IXO* v. *MetroPCS Texas, LLC, et al.*, Case No. 6:10-cv-00493-LED (E.D. Texas.
Joint Motion for Dismissal with Prejudice of Defendant Cellco Partnership d/b/a Verizon Wireless, filed in *Realtime Data, LLC d/b/a IXO* v. *MetroPCS Texas, LLC, et al*, Case No. 6:10-cv-00493-LED (E.D. Texas), filed Oct. 17, 2012; 2 pages.
Order regarding Joint Motion for Dismissal with Prejudice, filed in *Realtime Data, LLC d/b/a IXO* v. *MetroPCS Texas, LLC, et al.*, Case No. 6:10-cv-00493-LED (E.D. Texas), filed Oct. 19, 2012; 1 page.
Declaration of Professor James A. Storer, filed in *Oracle America, Inc.* v. *Realtime Data, LLC*, Case No. IPR2016-00374 (P.T.A.B.), filed Dec. 22, 2015; 118 pages.
Submission Under 37 C.F.R. 1.114(c) and Preliminary Amendment Under 37 C.F.R. 1.115, filed Oct. 10, 2013, in the prosecution of U.S. Appl. No. 13/154,211; 10 pages.
Declaration of Professor James A. Storer, filed in *Oracle America, Inc.* v. *Realtime Data, LLC*, Case No. IPR2016-00375 (P.T.A.B.), filed Dec. 28, 2015; 82 pages.
Declaration of Professor James A. Storer, filed in *Oracle America, Inc.* v. *Realtime Data, LLC*, Case No. IPR2016-00376 (P.T.A.B.), filed Dec. 28, 2015; 86 pages.
Definition of "bandwidth", Random House Computer & Internet Dictionary, Third Edition, New York: Random House, 1999; p. 45.
Declaration of Professor James A. Storer, filed in *Oracle America, Inc.* v. *Realtime Data, LLC*, Case No. IPR2016-00377 (P.T.A.B.), filed Dec. 28, 2015; 83 pages.
Third Party Requester's Comments to Patent Owner's Response of Jun. 25, 2012 Pursuant to 37 C.F.R. 1.947, Inter Partes Reexamination of U.S. Pat. No. 7,378,992, Control No. 95/001,928, filed Jul. 25, 2012; 21 pages.
Court Docket History for *Realtime Data, LLC d/b/a IXO* v. *Microsoft Corporation, et al.*, Case No. 4:14-cv-00827 (E.D. Texas), downloaded Oct. 28, 2015, 5 pages.
Court Docket History for *Realtime Data, LLC d/b/a IXO* v. *Actian Corporation, et al.*, Case No. 6:15-cv-00463 (E.D. Texas), downloaded Oct. 28, 2015, 19 pages.
Court Docket History for *Realtime Data, LLC d/b/a IXO* v. *Dropbox, Inc.*, Case No. 6:15-cv-00465 (E.D. Texas), downloaded Oct. 28, 2015, 4 pages.
Court Docket History for *Realtime Data, LLC d/b/a IXO* v. *Echostar Corporation et al.*, Case No. 6:15-cv-00466 (E.D. Texas), downloaded Oct. 28, 2015, 3 pages.
Court Docket History for *Realtime Data, LLC d/b/a IXO* v. *Riverbed Technology, Inc., et al.*, Case No. 6:15-cv-00468 (E.D. Texas), downloaded Oct. 28, 2015, 3 pages.
Court Docket History for *Realtime Data, LLC d/o/a IXO* v. *BMC Software, Inc.*, Case No. 6:15-cv-00464 (E.D. Texas), downloaded Oct. 28, 2015, 3 pages.
Court Docket History for *Realtime Data, LLC d/b/a IXO* v. *Oracle America, Inc., et al.*, Case No. 6:15-cv-00467 (E.D. Texas), downloaded Oct. 28, 2015, 4 pages.
Court Docket History for *Realtime Data, LLC d/b/a IXO* v. *SAP America, Inc., et al.*, Case No. 6:15-cv-00469 (E.D. Texas), downloaded Oct. 28, 2015, 5 pages.
Court Docket History for *Realtime Data, LLC d/b/a IXO* v. *Teradata Corporation, et al.*, Case No. 6:15-cv-00470 (E.D. Texas), downloaded Oct. 28, 2015, 5 pages.
Court Docket History for *Realtiime Data, LLC d/b/a IXO* v. *Apple, Inc.*, Case No. 6:15-cv-00885 (E.D. Texas), downloaded Oct. 28, 2015, 2 pages.
"User Manual for XMill," XMill Version 0.7 (1999); 16 pages.
U.S. Appl. No. 14/936,312, Fallon, "Data Compression Systems and Method," filed Nov. 9, 2015.
Joint Claim Construction and Prehearing Statement, filed in *Realtime Data LLC d/b/a IXO* v. *Actian Corporation, et al.*, Case No. 6:15-cv-00463-RWS-JDL (E.D. Texas), filed Apr. 18, 2016; 26 pages.
Complaint for Patent Infringement against Teradata Operations, Inc., filed in *Realtime Data LLC d/b/a IXO* v. *Teradata Operations, Inc.*, Case No. 2:16-cv-02743 (C.D. Cal.), filed Apr. 21, 2016; 31 pages.
Defendant Oracle America, Inc.'s Answer to Realtime Data LLC's Complaint and Counterclaims, filed in *Realtime Data LLC d/b/a IXO* v. *Oracle America, Inc.*, Case No. 6:16-cv-00088-RWS-JDL (E.D. Tex.), filed May 3, 2016; 22 pages.
Defendants' Letter Requesting Permission to File a Motion for Partial Summary Judgment of Invalidity, filed in *Realtime Data LLC d/b/a IXO* v. *Actian Corporation et al.*, Case No. 6:15-cv-00463-RWS-JDL (E.D. Tex.) filed Apr. 20, 2016; 6 pages.
Plaintiff's Letter in Opposition to Moving Defendants' Letter Requesting Permission to File a Motion for Partial Summary Judgement, filed in *Realtime Data LLC d/b/a IXO* v. *Actian Corporation, et al.*, Case No. 6:15-cv-00463-RWS-JDL (E.D. Tex.) filed May 9, 2016; 6 pages.
Amended Complaint for Patent Infringement Against Teradata Operation, Inc., filed *Realtime Data LLC d/b/a IXO* v. *Teradata Operations, Inc.*, Case No. 2:16-cv-02743-AG-FFM (C.D. Cal.), filed May 17, 2016; 58 pages.
Defendents Hewlett Packard Enterprise Co., and IIP Enterprise Services, LLC's Answer to Plaintiff's Complaint for Patent Infringement and Counterclaims, filed in *Realtime Data LLC d/b/a IXO* v. *Hewlett Packard Enterprise Co., et al.*, Case No. 6:16-cv-00086-RWS-JDL (E.D. Tex.), filed May 20, 2016; 20 pages.
Plaintiff Realtime Data LLC's Opening Claim Construction Bried, filed in *Realtime Data LLC d/b/a/ IXO* v. *Actian Corporation, et al.*, Case No. 6:15-cv-463-RWS-JDL (E.D. Texas), filed May 23, 2016; 37 pages.
The Agreed and Disputed Constructions, as of May 23, 2016, Exhibit 12 to Plantiff Realtime Data LLC's Opening Claim Construction Brief, filed in *Realtime Data LLC d/b/a/ IXO* v. *Actian Corporation, et al.*, Case No. 6:15-cv-463-RWS-JDL (E.D. Texas), filed May 23, 2016; 4 pages.
Plaintiff Realtime Data LLC's Expert Declaration of Dr. Kenneth Zeger, filed in *Realtime Data LLC d/b/a/ IXO* v. *Actian Corporation, et al.*, Case No. 6:15-cv-463-RWS-JDL (E.D. Texas), filed May 23, 2016; 21 pages.
Answer, Defenses, and Counterclaims to Plaintiff's Complaint for Patent Infringement, filed in *Realtime Data LLC d/b/a IXO* v. *Hewlett Packard Enterprise Co., et al.*, Case No. 6:16-cv-00086 (E.D. Texas), filed Jun. 3, 2016; 23 pages.
Defendant Veritas Technologies LLC's Answer, Affirmative Defenses, and Counterclaims, filed in *Realtime Data LLC d/b/a IXO* v. *Centurylink, Inc., et al.*, Case No. 6:16-cv-00087-RWS-JDL (E.D. Texas), filed Jun. 6, 2016; 30 pages.
Amended Complaint for Patent Infringement Against Dell Inc. and EMC Corporation, filed in *Realtime Data LLC d/b/a/ IXO* v. *Dell Inc., et al.*, Case No. 6:16-cv-00089-RWS-JDL (E.D. Texas), filed Jun. 9, 2016; 47 pages.
Savvis Communications Corporations' Answer, Affirmative Defenses, and Counterclaims, filed in *Realtime Data LLC d/b/a IXO* v. *Savvis Communications Corporation, et al.*, Case No. 6:16-cv-00087-RSW-JDL (E.D. Texas), filed Jun. 13, 2016; 16 pages.
Defendants' Responsive Claim Construction Brief, filed in *Realtime Data LLC d/b/a IXO* v. *Actian Corporation, et al.*, Case No. 6:16-cv-00463-RWS-JDL (E.D. Texas), filed Jun. 13, 2016; 39 pages.
Declaration of Dr. Charles D. Creusere in Support of Defendants' Motion for Partial Summary Judgment of Indefiniteness, filed in

(56) References Cited

OTHER PUBLICATIONS

*Realtime Data LLC d/b/a IXO* v. *Actian Corporation, et al.*, Case No. 6:16-cv-00463-RWL-JDL (E.D. Texas), filed Jun. 13, 2016; 10 pages.
Excerpt from Modern Dictionary of Electronics, Seventh Edition, Boston: Newnes, 1999, Exhibit 1 to Defendants' Responsive Claim Construction Brief, filed in *Realtime Data LLC d/b/a IXO* v. *Actian Corporation, et al.*, Case No. 6:16-cv-00463-RWS-JDL (E.D. Texas), filed Jun. 13, 2016; 5 pages.
Motion for Partial Summary Judgment of Indefiniteness By Defendats Dell Inc., Echostar Corporation, Hughes Network Systems LLC, Hewlett Packard Enterprise Co., HP Enterprise Services, LLC, Riverbed Technology, Inc., SAP America Inc., and Sybase, Inc., filed in *Realtime Data LLC d/b/a IXO* v. *Actian Corporation, et al.*, Case No. 6:16-cv-00463-RWS-JDL (E.D. Texas), filed Jun. 13, 2016; 15 pages.
U.S. Appl. No. 60/136,561, filed May 28, 1999, Exhibit C to Motion for Partial Summary Judgment of Indefiniteness By Defendants Dell Inc., Echostar Corporation, Hughes Network Systems LLC, Hewlett Packard Enterprise Co., HP Enterprise Services, LLC, Riverbed Technology, Inc., SAP America Inc., and Sybase, Inc., filed in *Realtime Data LLC d/b/a IXO* v. *Actian Corporation, et al.*, Case No. 6:16-cv-00463-RWS-JDL (E.D. Texas), filed Jun. 13, 2016; 24 pages.
Declaration of James A. Storer, Ph.D., Exhibit 5 to Defendants' Responsive Claim Construction Brief, filed in *Realtime Data LLC d/b/a IXO* v. *Actian Corporation, et al.*, Case No. 6:16-cv-00463-RWS-JDL (E.D. Texas), filed Jun. 13, 2016; 37 pages.
Dell Inc.'s Answer, Defenses, Counterclaims to Plaintiff Amended Complaint, filed in *Realtime Data LLC d/b/a IXO* v. *Dell Inc., et al.*, Case No. 6:16-cv-00089-RWS-JDL (E.D. Texas), filed Jun. 23, 2016; 17 pages.
Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 12 pages.
Invalidity Chart for U.S. Pat. No. 7,415,530 based on U.S. Pat. No. 5,247,646 ("Osterlund"), filed as Exhibit A to Defendants' Motion for Leave to Supplement Their Invalidity Contentions, filed in *Realtime Data LLC d/b/a IXO* v. *Actian Corporation, et. al.*, Case No. 6:15-cv-00463-RWS-JDL (E.D. Texas), filed Jun. 24, 2016; 19 pages.
Invalidity Chart for U.S. Pat. No. 7,415,530 based on U.S. Pat. No. 5,479,638 ("Assar"), filed as Exhibit B to Defendants' Motion for Leave to Supplement Their invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 5 pages.
Invalidity Chart for U.S. Pat. No. 7,415,530 based on U.S. Pat. No. 5,771,354 ("Crawford"), filed as Exhibit C to Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 20 pages.
Invalidity Chart for U.S. Pat. No. 7,415,530 based on U.S. Pat. No. 5,319,682 ("Clark"), filed as Exhibit D to Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 20 pages.
513 v. PCT Publication No. WO 00/46688 to Wang et al., filed as Exhibit E to Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 53 pages.
Invalidity Chart for U.S. Pat. No. 9,116,908 Based on U.S. Pat. No. 5,247,646 ("Osterlund"), filed as Exhibit F to Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 16 pages.
Defendant Dell Inc's Preliminary Election of Prior Art, filed as Exhibit M to Defendants' Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jun. 24, 2016; 20 pages.
Plantiff Realtime Data LLC's Reply Claim Construction Brief, filed in *Realtime Data LLC d/b/a IXO* v. *Actian Corporation, et al.*, Case No. 6:15-cv-00463-RWS-JDL (E.D. Texas), filed Jun. 27, 2016; 15 pages.
Plantiff Realtime Data LLC's Response to Moving Defendants' Motion for Partial Summary Judgment of Indefiniteness, filed in *Realtime Data LLC d/b/a IXO* v. *Actian Corporation, et al.*, Case No. 6:15-cv-00463-RWS-JDL (E.D. Texas), filed Jun. 27, 2016; 20 pages.
Moving Defendants' Reply Brief in Support of Their Motion for Partial Summary Judgment of Indefiniteness, filed in *Realtime Data LLC d/b/a IXO* v. *Actian Corporation, et al.*, Case No. 6:15-cv-00463-RWS-JDL (E.D. Texas), filed Jun. 30, 2016; 9 pages.
Joint Claim Construction Chart—Exhibit A, filed in *Realtime Data LLC d/b/a IXO* v. *Actian Corporation, et al.*, Case No. 6:15-cv-00463-RWS-JDL (E.D. Texas), filed Jun. 30, 2016; 3 pages.
Joint Claim Construction Chart—Exhibit B, filed in *Realtime Data LLC d/b/a IXO* v. *Actian Corporation, et al.*, Case No. 6:15-cv-00463-RWS-JDL (E.D. Texas), filed Jun. 30, 2016; 18 pages.
Plantiff's Notice of Supplemental Facts, filed in *Realtime Data LLC d/b/a IXO* v. *Actian Corporation, et al.*, Case No. 6:15-cv-00463-RWS-JDL (E.D. Texas), filed Jul. 5, 2016; 3 pages.
Defendants' Motion to Supplement the Claim Construction Record, filed in *Realtime Data LLC d/b/a IXO* v. *Actian Corporation, et al.*, Case No. 6:15-cv-00463-RWS-JDL (E.D. Texas), and *Realtime Data LLC d/b/a IXO* v. *Oracle America Inc.*, Case No. 6:16-cv-00088-RWS-JDL (E.D. Texas), filed Jul. 11, 2016; 10 pages.
Joint Claim Construction and Prehearing Statement, filed in *Realtime Data LLC d/b/a IXO* v. *Oracle America Inc.*, Case No. 6:16-cv-00088-RWS-JDL (E.D. Texas), filed Jul. 13, 2016; 5 pages.
Exhibit A to Joint Claim Construction and Prehearing Statement, filed in *Realtime Data LLC d/b/a IXO* v. *Oracle America Inc.*, Case No. 6:16-cv-00088-RWS-JDL (E.D. Texas), filed Jul. 11, 2016; 5 pages.
Plantiff Realtime Data LLC's Response to Defendant's Motion to Supplement the Claim Construction Record, filed in *Realtime Data LLC d/b/a IXO* v. *Actian Corporation et al.*, Case No. 6:15-cv-00463-RWS-JDL (E.D. Texas), and *Realtime Data LLC d/b/a IXO* v. *Oracle America, Inc.*, Case No. 6:15-cv-00088-RWS-JDL (E.D. Texas), filed Jul. 14, 2016; 14 pages.
Complaint for Patent Infringement Against Rackspace US, Inc., Netapp, Inc., and Solidfire, Inc., filed in *Realtime Data LLC d/b/a IXO* v. *Rackspace US, Inc., et al.*, Case No. 6:16-cv-00961 (E.D. Texas), filed Jun. 29, 2016; 216 pages.
Complaint for Patent Infringement Against Fujitsu America, Inc. and Quantum Corporation, filed in *Realtime Data LLC d/b/a IXO* v. *Fujitsu America, Inc. et al.*, No. 6:16-cv-01035 (E.D. Texas), filed Jul. 21, 2016; 137 pages.
Complaint for Patent Infringement Against Vembu Technologies, Inc., filed in *Realtime Data LLC d/b/a IXO* v. *Vembu Technologies, Inc.*, No. 6:16-cv-01037 (E.D. Texas), filed Jul. 22, 2016; 86 pages.
Memorandum Opinion and Order, issued in *Realtime Data LLC* v. *Actian Corporation, et al.*, Case No. 6:16-cv-00088-RWS-JDL (E.D. Texas), issued Jul. 28, 2016; 40 pages.
Defendants' Reply on Their Motion for Leave to Supplement Their Invalidity Contentions, filed in *Realtime Data LLC d/b/a IXO* v. *Actian Corporation, et al.*, Case No. 6:15-cv-00463-RWS-JDL (E.D. Texas), filed Jul. 25, 2016; 9 pages.
Plaintiff Realtime Data LLC's Opening Claim Construction Brief, filed in *Realtime Data d/b/a IXO* v. *Oracle America, Inc.*, Case No. 6:16-cv-00088-RWS-JDL (E.D. Texas), filed Jul. 25, 2016; 12 pages.
Expert Declaration of Dr. Kenneth Zeger, filed as Exhibit 1 to Plaintiff Realtime Data LLC's Opening Claim Construction Brief, filed in *Realtime Data d/b/a IXO* v. *Oracle America, Inc.*, Case No. 6:16-cv-00088-RWS-JDL (E.D. Texas), filed Jul. 25, 2016; 30 pages.

(56) References Cited

OTHER PUBLICATIONS

Report and Recommendation of United States Magistrate Judge, issued in *Realtime Data LLC d/b/a IXO v. Actian Corporation et al.*, Case No. 6:15-cv-00463-RWS-JDL (E.D. Texas), issued Jul. 28. 2016; 12 pages.
Defendants Teradata Operations, Inc.'s Answer to Complaint and Counterclaims, filed in *Realtime Data LLC d/b/a IXO v. Teradata Operations, Inc.*, Case No. 2:16-cv-02743-AG-FFM (C.D. Cal.), filed Aug. 3, 2016; 34 pages.
Defendants Hewlett Packard Enterprise Co. and HP Enterprise Serivces, LLC's Objections to Report and Recommendation of Magistrate Judge, filed in *Realtime Data LLC d/b/a IXO v. Oracle America, Inc.*, Case No. 6:16-cv-00088-RWS-JDL (E.D. Texas), filed Aug. 11, 2016; 6 pages.
Defendants' Objections to Memorandum Opinion and Order on Claim Constructions and Motion to Reconsider, filed in *Realtime Data LLC d/b/a IXO v. Actian Corporation, et al.*, Case No. 6:15-cv-00463-RWS-JDL (E.D. Texas), filed Aug. 12, 2016; 10 pages.
Defendants' Responsive Claim Construction Brief, filed in *Realtime Data LLC d/b/a IXO v. Oracle America, Inc.*, Case No. 6:16-cv-088-RWS-JDL (E.D. Texas), filed Aug. 12, 2016; 8 pages.
Declaration of James A. Storer, Ph.D, filed in *Realtime Data LLC d/b/a IXO , v. Oracle America, Inc.*, Case No. 6:16-cv-00088-RWS-JDL (E.D. Texas), filed Aug. 12, 2016; 11 pages.
Plaintiff Realtime Data LLC's Reply Claim Construction Brief, filed in *Realtime LLC d/b/a IXO v. Oracle America, et al.*, Case No. 6:16-cv-00088-RWs-JDL (E.D. Texas), filed Aug. 19, 2016; 6 pages.
Plaintiff Realtime Data LLC's Joint Claim Construction Chart, filed in *Realtime Data LLC d/b/a IXO v. Oracle America, Inc.*, Case No. 6:16-cv-00088-RWS-JDL (E.D. Texas), filed Aug. 26, 2016; 4 pages.
Plantiff Realtime Data LLC's Exhibit A, filed in *Realtime Data LLC d/b/a IXO v. Oracle America, Inc.*, Case No. 6:16-cv-00088-RWS-JDL (E.D. Texas), filed Aug. 26, 2016; 1 page.
Plaintiff Realtime Data LLC's Exhibit B, filed in *Realtime Data LLC d/b/a IXO v. Oracle America, Inc.*, Case No. 6:16-cv-00088-RWS-JDL (E.D. Texas), filed Aug. 26, 2016; 4 pages.
Defendant Dell, Inc.'s Answer and Defenses to Plaintiff's Second Amended Complaint, filed in *Realtime Data LLC d/b/a IXO , v. Dell Inc.*, Case No. 6:16-cv-89 (E.D. Texas), filed Aug. 20, 2016; 21 pages.
Defendant EMC Corporation's Answer and Defenses to Plaintiff's Second Amended Complaint, filed in *Realtime Data LLC d/b/a IXO , v. Dell Inc.*, Case No. 6:16-cv-89-RWS-JDL (E.D. Texas), filed Aug. 30, 2016; 23 pages.
Plaintiff Realtime Data LLC's Response in Opposition To Defendants' Objections to Memorandum Opinion and Order on Claim Construction and Motion to Reconsider, filed in *Realtime Data LLC d/b/a IXO v. Actian Corporation, et al.*, Case No. 6:15-cv-463-RWS-JDL (E.D. Texas), filed Aug. 29, 2016; 8 pages.
Dell Inc.'s Answer to Defenses to Plaintiff's Second Amended Complaint, filed in *Realtime Data LLC d/b/a IXO v. Dell Inc. and EMC Corporation*, Case No. 6:16-cv-89-RWS-JDL (E.D. Texas), filed Aug. 30, 2016; 21 pages.
EMC Corporation's Answer and Defenses to Plaintiff's Second Amended Complaint, filed in *Realtime Data LLC d/b/a IXO v. Dell Inc. and EMC Corporation*, Case No. 6:16-cv-89-RWS-JDL (E.D. Texas), filed Aug. 30, 2016; 23 pages.
Defendants Hewlett Packard Enterprise Co. and Hp Enterprise Services, LLC's Answer to Plaintiff's Amended Complaint for Patent Infringement and Counterclaims, filed in *Realtime Data LLC d/b/a IXO v. Hewlett Packard Enterprise Co. et al.*, Case No. 6:16-cv-00086-RWS-JDL (E.D. Texas), filed Sep. 1, 2016; 26 pages.
Answer, Defenses, and Counterclaims to Plaintiff's Amended Complaint for Patent Infringement, filed in *Realtime Data LLC d/b/a IXO v. Hewlett Packard Enterprise Co. et al.*, Case No. 6:16-cv-00086-RWS-JDL (E.D. Texas), filed Sep. 1, 2016; 29 pages.

Savvis Communications Corporation's Answer, Defenses, and Counterclaims to Realtime's Amended Complaint, filed in *Realtime Data LLC d/b/a IXO v. Savvis Communications Corporation, and Veritas Technologies LLC*, Case No. 6:16-cv-00087-RWS-JDL (E.D. Texas), filed Sep. 2, 2016; 18 pages.
Defendant Veritas Technologies LLC's Answer, Affirmative Defenses, and Counterclaims, filed in *Realtime Data LLC d/b/a IXO v. Centurylink, Inc. and Veritas Technologies*, Case No. 6:16-00087-RWS-JDL, filed Sep. 2, 2016; 35 pages.
Notice of Allowance for U.S. Appl. No. 14/727,309, dated Apr. 26, 2016; 7 pages.
Notice of Allowance for U.S. Appl. No. 14/876,276, dated Apr. 26, 2016; 8 pages.
Notice of Allowance for U.S. Appl. No. 14/733,565, dated May 6, 2016; 6 pages.
Non-Final Office Action for U.S. Appl. No. 14/844,973, dated May 17, 2016; 18 pages.
Non-Final Office Action for U.S. Appl. 14/727,309, dated Jun. 7, 2016; 15 pages.
Non-Final Office Action for U.S. Appl. No. 14/794,201, dated Aug. 10, 2016; 4 pages.
Non-Final Office Action for U.S. Appl. No. 13/875,884, dated Jun. 3, 2015; 10 pages.
Final Office Action for U.S. Appl. No. 13/875,884, dated Mar. 9, 2016; 8 pages.
Notice of Intent to Issue Inter Partes Reexamination Certificate, in Inter Partes Reexamination of U.S. Pat. No. 7,777,651, Control No. 95/001,581, mailed Jun. 2, 2016; 5 pages.
Notice of Intent to Issue Inter Partes Reexamination Certificate, in Inter Partes Reexamination of U.S. Pat. No. 7,417,568, Control No. 95/001,533, mailed Jun. 14, 2016; 6 pages.
Inter Partes Reexamination Certificate, in Inter Partes Reexamination of U.S. Pat. No. 7,777,651, Control No. 95/001,581, issued Jul. 8, 2016; 2 pages.
Notice of Intent to Issue Inter Partes Reexamination Certificate, in Inter Partes Reexaxinination of U.S. Pat. No. 7,400,274, Control No. 95/001,544, mailed Jul. 15, 2016; 5 pages.
Inter Partes Reexamination Certificate, in Inter Partes Reexamination of U.S. Pat. No. 7,417,568, Control No. 95/001,533, issued Jul. 22, 2016; 2 pages.
Inter Partes Reexamination Certificate, in Inter Partes Reexamination of U.S. Pat. No. 7.400,274, Control No. 95/001,544, issued Aug. 1, 2016; 2 pages.
Petition for Inter Partes Review of U.S. Pat. No. 7,415,530, filed in *Dell Inc., et al. v. Realtime Data LLC d/b/a IXO*, Case No. IPR2016-00878 (P.T.A.B.), filed Apr. 22, 2016; 69 pages.
Declaration of Charles D. Creusere, filed in *Dell Inc., et al. v. Realtime Data LLC d/b/a IXO*, Case No. IPR2016-00878 (P.T.A.B.), filed Apr. 22, 2006; 124 pages.
Sobh, et al., "A Comparison of Compressed and Uncompressed Transmission Modes," University of Pennsylvania Department of Computer and Information Science Technical Report No. MS-CIS-91-41, May 1991; 15 pages.
9704 Data Compression Coprocessor Data Sheet, Stac Electronics, Sep. 1991; 56 pages.
Petition for Inter Partes Review of U.S. Pat. No. 8,643,513, filed in *Riverbed Technology, Inc., et al. v. Realtime Data, LLC*, Case No. IPR2016-00978 (P.T.A.B.), filed Apr. 29, 2016; 65 pages.
Declaration of Charles D. Creusere, Ph.D. Under 37 C.F.R. § 1.68, filed in *Riverbed Technology, Inc., et al. v. Realtime Data, LLC*, Case No. IPR2016-00978 (P.T.A.B.), filed Apr. 29, 2016; 139 pages.
Petition for Inter Patres Review of U.S. Pat. No. 9,116,908, filed in *Dell Inc. al. v. Realtime Data, LLC*, Case No. IPR2016-01002 (P.T.A.B.), filed May 5, 2016; 68 pages.
Declaration of Charles D. Creusere, Ph.D., filed in *Dell Inc. al. v. Realtime Data, LLC*, Case No. IPR2016-01002 (P.T.A.B.), filed May 5, 2016; 105 pages.
Petition for Inter Partes Review of U.S. Pat. No. 7,415,530, filed in *Dell Inc. al. v. Realtime Data, LLC*, Case No. IPR2016-00972 (P.T.A.B.), filed Apr. 29, 2016; 69 pages.
Declaration of Charles D. Creusere, Ph.D., filed *Dell Inc. al. v. Realtime Data, LLC*, Case No. IPR2016-00972 (P.T.A.B.), filed Apr. 29, 2016; 124 pages.

(56) References Cited

OTHER PUBLICATIONS

Petition for Inter Partes Review of U.S. Pat. No. 7,378,992, filed *Riverbed Technology, Inc.* v. *Realtime Data, LLC*, Case No. IPR2016-00980 (P.T.A.B.), filed Apr. 29, 2016; 57 pages.
Declaration of Charles D. Creusere, Ph.D., filed in *Dell Inc. al.* v. *Realtime Data, LLC*, Case No. IPR2016-00980 (P.T.A.B.), filed Apr. 29, 2016; 105 pages.
Institution Decision, mailed in *Oracle America, Inc. et al.* v. *Realtime Data LLC*, Case No. IPR2016-00373 (P.T.A.B.), mailed Jun. 27, 2016; 32 pages.
Institution Decision, mailed in *Oracle America, Inc. et al,* v. *Realtime Data LLC*, Case No. IPR2016-00374 (P.T.A.B.), mailed Jun. 27, 2016; 28 pages.
Decision Denying Institution, mailed in *Oracle America, Inc. et al.* v. *Realtime Data LLC*, Case No. IPR2016-00375 (P.T.A.B.), mailed Jul. 1, 2016; 13 pages.
Decision Denying Institution, mailed in *Oracle America, Inc. et al.* v. *Realtime Data LLC*, Case No. IPR2016-00376 (P.T.A.B.), maiiled Jul. 1, 2016; 18 pages.
Decision Denying Institution, mailed in *Oracle America, Inc. et al.* v. *Realtime Data LLC*, Case No. IPR2016-00377 (P.T.A.B.), maiiled Jul. 1, 2016; 16 pages.
Petition for Inter Partes Review of U.S. Pat. No. 7,181,608 Pursuant to 35 U.S.C. 311-319, 37 C.F.R. 42, filed in *Apple Inc.* v. *Realtime Data LLC*, Case No. IPR2016-01365 (P.T.A.B.), filed Jul. 8, 2016; 77 pages.
File History of U.S. Pat. No. 7,181,608, U.S. Appl. No. 09/776,267, filed Feb. 2, 2001; 507 pages.
Declaration of Dr. Charles J. Neuhauser, filed in *Apple Inc.* v. *Realtime Data LLC*, Case No. IPR2016-01365 (P.T.A.B.), filed Jul. 8, 2016; 174 pages.
Burrows, et al., "On-Line Data Compression in a Log-structured File System," Fifth International Conference on Architectural Support for Programming Languages and Operating Systems, Oct. 12-15, 1992; 27 pages.
Excerpt from Hennessy, et al., Computer Architecture—A Quantitative Approach, San Mateo, CA: Morgan Kaufmann Publishers, 1990; p. 403-425, 535-538.
Prosise, J., "DOS 6: The Ultimate Software Bundle?", PC Magazine, vol. 12, No. 7, Apr. 13, 1993; 29 pages. (Submitted in 2 parts).
Excerts from Microsoft Press Computer Dictionary, Third Edition, Redmond, WA: Microsoft Press, 1997; pp. 194-196.
Exceprts from Shanley, et al., PCI System Architecture, Fourth Edition, New York: Addison Wesley, 1999; pp. 7-13.
Storer, et al., "Data Compression via Textual Substitution," Journal of the Association for Computing Machinery, vol. 29, No. 4, Oct. 1982; 24 pages.
Petition for Inter Partes Review of U.S. Pat. No. 8,090,936 Pursuant to 35 U.S.C. 311-319 C.F.R. 42, filed in *Apple Inc.* v. *Realtime Data LLC*, Case No. IPR2016-01366 (P.T.A.B.), filed Jul. 8, 2016; 77 pages.
File History of U.S. Pat. No. 8,090,936, U.S. Appl. No. 11/551,204, filed Oct. 19, 2006; 970 pages.
Declaration of Dr. Charles J. Neuhauser, filed in *Apple Inc.* v. *Realtime Data LLC*, Case No. IPR2016-01366 (P.T.A.B.), filed Jul. 8, 2016; 157 pages.
Defendant Oracle America's Exchange of Preliminary Claim Constructions and Extrinisic Evidence, filed in *Realtime Data LLC d/b/a IXO* v. *Actian Corporation, et al.*, Case No. 6:15-cv-0463-RWS-JDL (E.D. Texas), filed Mar. 21, 2016; 8 pages.
Roshal, E., "User's Manual RAR 2.50 32-bit Consol version (Unix and Windows)," 1999; 15 pages.
Aramvith, et al., "MPEG-1 and MPEG-2 Video Standard," Academic Press, 1999; 25 pages.
Vrc 5074 System Controller Data Sheeet, Revision 1.0, NEC, Jun. 1998; 3 pages.
NEC VRC5074 System Controller Data Sheet, Revision 1.0, Jun. 1998; 3 pages.

Petition for Inter Partes Review of U.S. Pat. No. 7,415,530, filed in *Oracle America Inc.* v. *Realtime Data LLC*, Case No. IPR2016-01671 (P.T.A.B.), filed Sep. 6, 2016; 67 pages.
Petition for Inter Partes Review of U.S. Pat. No. 9,116,908, filed in *Oracle America Inc.* v. *Realtime Data LLC*, Case No. IPR2016-01671 (P.T.A.B.), filed Sep. 6, 2016; 69 pages.
Absolute Astonomy, "Hard Disk," Absolutcastronomy.com, accessed at http://www.absolutcastronomy.com/topics/Hard_disk on May 23, 2013; 13 pages.
Fitchard, Kevin, "The Future of Mobile Networks: Beyong 4G," Businessweek.com, accessed at http://www.businessweek.com/articles/2012-12-19/the-future-of-mobile-networks-beyond-4g on May 23, 2014; 6 pages.
Quick Turn Flash, "USB Flash Drive Facts," Quickturnflash.com, accessed at http://quickturnflash.com/Flash-Drive-Resources/usb-flash-drive-facts.html on May 23, 2013; 4 pages.
Wikibooks, "Communication Networks/History of Networking," Wikibooks.org, accessed at http://en.wikibooks.org/wiki/Communication-Networks/History_of_Networking on May 23, 2013; 2 pages.
Wikipedia, "4G," Wikipedia.org, accessed at http://en.wikipedia.org/wiki/4G on May 23, 2013; 17 pages.
Wikipedia, "Central Processing Unit," Wikipedia.org, accessed at http://en.wikipedia.org/wiki/Central_processing_unit on May 23, 2013; 14 pages.
Wikipedia, "Computer Data Storage," Wikipedia.org, accessed at http://en.wikipedia.org/wiki/Computer_data_storage on May 23, 2013; 14 pages.
Wikipedia, "Database," Wikipedia.org, accessed at http://en.wikipedia.org/wiki/Database_System on May 23, 2013; 19 pages.
Wikipedia, "Orthogonal Frequency-Division Multiplexing," Wikipedia.org, accessed at http://en.wikipedia.org/wiki/Orthogonal_frequency-division_multiplexing on May 23, 2013; 13 pages.
Wikipedia, "Removable Media," Wikipedia.org, accessed at http://en.wikipedia.org/wiki/Removable_media on May 23, 2013; 2 pages.
Wikipedia, "USB Flash Drive," Wikipedia.org, accessed at http://en.wikipedia.org/wiki/USB_flash_drive on May 23, 2013; 17 pages.
Court Docket History for *Realtime Data LLC d/b/a IXO* v. *Teradata Operations, Inc.*, Case No. 2:16-cv-02743 (C.D. Cal), downloaded Apr. 26, 2016; 2 pages.
Court Docket History for *Realtime Data LLC d/b/a IXO* v. *Rackspace US, Inc. et al.*, Case No. 6:16-cv-00961 (E.D. Texas), downloaded Jun. 30, 2016; 2 pages.
Court Docket History for *Realtime Data LLC d/b/a IXO* v. *Fujitsu America, Inc., et al.*, Case No. 6:16-cv-01035 (E.D. Texas), downloaded Jul. 27, 2016; 2 pages.
Court Docket History for *Realtime Data LLC d/b/a IXO* v. *Vembu Technologies, Inc.*, Case No. 6:16-cv-01037 (E.D. Texas), downloaded Jul. 27, 2016; 2 pages.
Defendants Oracle America, Inc., Hewlett-Packard Company, and HP Enterprise Services, LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 62 pages.
Non-Confidential Exhibits A3-A4 to Defendants Oracle America, Inc., Hewlett-Packard Company, and HP Enterprise Services, LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 296 pages.
Non-Confidential Exhibits B3-B4 to Defendants Oracle America, Inc., Hewlett-Packard Company, and HP Enterprise Services, LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 1,179 pages.
Non-Confidential Exhibits C4-C7 and C9 to Defendants Oracle America, Inc., Hewlett-Packard Company and HP Enterprise Services, LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 3,029 pages.
Non-Confidential Exhibits D4-D7 and D9 to Defendants Oracle America, Inc,, Hewlett-Company, and HP Enterprise Services,

(56) References Cited

OTHER PUBLICATIONS

LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 3,125 pages.
Non-Confidential Exhibits E1-E4 to Defendants Oracle America, Inc., Hewlett-Packard Company, and HP Enterprise Services, LLC's Invalidity Contentions, submitted in *Realtime Data, LLC d/b/a IXO* v. *Actian Corporation, et al.*, Case No. 6:15-cv-00463-RWS-JDL (E.D. Texas), served Dec. 4, 2015; 1,657 pages.
"Adaptive Lossless Data Compression Algorithm," ECMA Standard ECMA-222, Jun. 1995; 20 pages.
"ALDC1-405 Adaptive Lossless Data Compression," IBM Microelectronics Data Compression Technologies, May 1994; 2 pages.
Amir, et al., "An Application Level Video Gateway," ACM Multimedia, San Francisco, Nov. 1995; 11 pages.
Andrews, et al., "A Mean-Removed Variation of Weighted Universal Vector Quantization for Image Coding," IEEE Data Compression Conference, 1993; pp. 302-309.
AX.25 Link Access Protocol for Amateur Packet Radio, Version 2.2, Tuscon Amateur Packet Radio Corporation, Revisioin: Jul. 1998; 143 pages.
Baker, et al., "Lossless Data Compression for Short Duration 3D Frames in Positron Emission Tomography," IEEE Nuclear Science Symposium and Medical Imaging Conference, 1993; pp. 1831-1834.
Bassiouni, et al., "A Scheme for Data Compression in Supercomputers," IEEE Supercomputing '88, 1988; pp. 272-278.
Bruckmann, et al., "Selective Medical Image Compression Using Wavelet TecLniques," Journal of Computing and Information Technology, vol. 6, No. 2 (1998); 23 pages.
Cheng, et al., "A fast, highly reliable data compression chip and algorithm for storage systems," IBM Journal of Research and Development, vol. 40, No. 6, Nov. 1996; pp. 603-613.
Zhang, et al., "Content-based video retrieval and compression: a unified solution," IEEE Proceedings of the International Conference on Image Processing, Oct. 1997; pp. 13-16.
Craft, D., "A fast hardware data compression algorithm and some algorithmic extensions," IBM Journal of Research and Development, vol. 42, No. 6, Nov. 1998; pp. 723-745.
Sattler, M., Internet TV with CU-SeeMe, Indianapolis, IN: sams.net, 1995; 172 pages. (Submitted in 2 parts).
Danskin, J., "Compressing The X Graphics Protocol," Dissertation, Princeton University Department of Computer Science, Jan. 1995; 147 pages.
Fox, et al., "Adapting to Network and Client Variability via On-Demand Dynamic Distillation," Proceedings of the Seventh International Conference on Architectural Support for Programming Languages and Operating Systems, 1996; pp. 160-170.
Fox, et al., "Adapting to Network and Client Variability Using Infrastructional Proxies: Lessons and Perspectives," Abstract, IEEE Personal Communications, vol. 5, No. 4, Aug. 1998; 2 pages.
Bottou, et al. , "High Quality Document Image Compression wotj DjVu," Journal of Electronic Imaging, vol. 7, No. 3, 1998; pp. 410-425.
Howard, et al., "Parallel Lossless Image Compression Using Huffman and Arithmetic Coding," IEEE Data Compression Conference, Mar. 1992; pp. 299-308.
"Hewlett-Packard Journal," Hewlett-Packard Corporation, Jun. 1989; 84 pages.
Hsu, et al., "Automatic Synthesis of Compression Techniques for Heterogeneous Files," Software—Practice and Experience, vol. 25, No. 10, Oct. 1995; pp. 1097-1116.
"Guide to Sharing and Partitioning IBM Tape Library Dataservers," IBM International Technical Support Organization, San Jose Center, Nov. 1996; 276 pages. (Submitted in 2 parts.)
"Add-On Options for the XpressFiles," Intelligent Compression Technologies, 1998, accessible at <http://web.archive.org/web/19980518053418/ictcompress.com/options_X.html>; 2 pages.
"Introducing XpressFiles," Intelligent Compression Technologies, 1998, accessible at <http://web.archive.org/web/19980518053310/ictcompress.com/xpressfiles.html>; 1 page.
"The Technology Behind XpressFiles," Intelligent Compression Technologies, 1998, accessible at <http://web.archive.org/web/19980518053634/ictcompress.com/technical_X.html>; 1 page.
XpressFiles White Papter, Intelligent Compression Technologies, 1999; 3 pages.
"XML-Xpress Product Overview," Intelligent Compression Technologies, 2001, accessible at <http://web.archive.org/web/20020818002535/www.ictcompress.com/products_xmlxpress.html>; 2 pages.
"ICT's XML-Xpress," Intelligent Compression Technologies, Dec. 2000; 6 pages.
Larmouth, J., "ASN. 1 Complete," Open Systems Solutions, 1999; 387 pages. (Submitted in 4 parts.).
"Magstar and IBM 3590 High Performance Tape Subsystem Technical Guide," IBM International Technical Support Orgainzation, San Jose Center, Nov. 1996; 287 pages. (Submitted in 2 parts.).
McGregor, et al., "Performance Impact of Data Compression on Virtual Private Network Transactions," IEEE Proceedings of the 25th Annual Conference on Local Computer Networks, 2000; 11 pages.
Summers, B., "Official Microsoft Microsoft NetMeeting Book," Redmond, WA: Microsoft Press, 1998; 374 pages. (Submitted in 5 parts.).
Britton, et al., Discover Desktop Conferencing with NetMeeting 2.0, Foster City, CA: IDG Books Worldwide, Inc., 1998; 304 pages. (Submitted in 4 parts.).
Ranganathan, N., "High-Speed VLSI Designs for Lempel-Ziv-Based Data Compression," IEEE Transactions on Circuits and Systems—II: Analog and Digital Signal Processing, vol. 40, No. 2, Feb. 1993; pp. 96-106.
User's Guide, Sidewinder 50 AIT-1 Tape Drive, Seagate Technology, Inc., 1997; 19 pages.
Prosise, J., "Understanding Data Compression," PC Magazine, May 25, 1993; pp. 305-308.
Welch, T., Source Code, University of California, 1985; 23 pages.
Abali, et al., "Memory Expansion Technology (MXT): Software Support and Performance," IBM Journalist of Research and Development vol. 45, No. 2, Mar. 2001; pp. 287-301.
Anderson, et al., "Codec Squeezes Color Teleconferencing Through Digital Telephone Lines," Electronics, Jan. 26, 1984; pp. 113-115.
Coene, et al., "A Fast Route For Application of Rate-Distortion Optimal Quantization in MPEG Encoder," IEEE Proceedings of the International Conference on Image Processing, 1996; pp. 825-828.
Franaszek, et al., "Algorithms and Data Structures for Compressed-Memory Machines," IBM Journal of Research and Development, vol. 45, No. 2, Mar. 2001; pp. 245-258.
Franaszek, et al., "On Internal Organization in Compressed Random-Access Memories," IBM Journal of Research and Development, vol. 45, No. 2, Mar. 2001; pp. 259-270.
IBM Technical Disclourse Bulletin, vol. 38, No. 2, Feb. 1995; 3 pages.
"IBM Boosts Your Memory," Geek.com, accessible at <http://www.geek.com/ibm-boosts-your-memory/>, Jun. 26, 2000; 3 pages.
"IBM Research Breakthrough Doubles Computer Memory Capacity," IBM Press Release, Jun. 26, 2000; 3 pages.
IBM Technical Disclosure Bulletin, vol. 37, No. 2B, Feb. 1994; 3 pages.
International Search Reports directed to International Patent Application Nos. PCT/US01/03711 and PCT/US01/03712, dated Jan. 28, 2001 and dated May 10, 2002; 9 pages.
Murashita, et al., "High-Speed Statistical Compression Using Self-Organized Rules and Predetermined Code Tables," IEEE Proceedings of Data Compression Conference, 1996; p. 449.
Rice, et al., "Lossless Coding Standards for Space Data Systems," IEEE Conference Record of the Thirtieth Asilomar Conference on Signals, Systems and Computers, 1996; pp. 577-585.
Rice, R., "Some Practical Universal Noiseles Coding Techniques," National Aeronautics and Space Administration, JPL Publication 79-22, 1979; 149 pages.

(56) References Cited

OTHER PUBLICATIONS

"ServerWorks to Deliver IBM's Memory eXpansion Technology in Next-Generation Core Logic for Servers," ServerWorks press release, accessible at <http://www.serverworks.com/news/press/000627.html>, Jun. 27, 2000; 1 page.
Smith, et al., "Memory Expansion Technology (MXT): Competitive Impact," IBM Journal of Research and Development, vol. 45, No. 2, Mar. 2001; pp. 303-309.
Tremaine, et al., "IBM Memory Expansion Technology (MXT)," IBM Journal of Research and Development, vol. 45, No. 2, Mar. 2001; pp. 271-285.
Venbrux, et al., "A VLSI Chip Set for High-Speed Lossless Data Compression," IEEE Transactions on Circuits and Systems for Video Technology, vol. 2, No. 4, Dec. 1992; pp. 381-391.
Yeh, P., "The CCSDS Lossless Data Compression Recommendation for Space Applications," Chapter 16, Lossless Compression Handbook, Sayood, K., ed., Academic Press, 2003; pp. 311-326.
Martin, J., "HP drive offers data compression," Computerworld, May 9, 1988; p. 76.
Millman, H., "Image and Video Compression," Computerworld, Jan. 18, 1999; p. 78.
"MegaRam Disc Emulator: Revolutionary, Non-rotating, Solid-state Replacement Fixed and Moving Head Discs," Imperial Technology, Inc., Oct. 1985; 4 pages.
"MegaRam-PC: Solid-State Disk Emulator for the IBM and IBM Compatible Personal Computers," Imperial Technology, Inc., Oct. 1985; 2 pages.
"MegaRam Solid State Disks," Imperial Technology, Inc., accessible via the Internet Archive at <https://web.archive.org/web/19990501183337/http://imperialtech.com/SolidState.html<, May 1, 1999; 3 pages.
"Quantum Rushmore Solid State Disk Drives," Quantum Corporation, accessible via the Internet Archive at <http://web.archive.org/web/19990508051125/http://www.quantum.com/products/ssd/>, May 8, 1999, 3 pages.
"Lucent Opts for Hi/fn Compression and Encryption in Latest Portmaster Products," PR Newswire, May 11, 1999; 2 pages.
7711 to 7751 Migration Application Note, Hi/fn Network Security Processors, Application Note AN-0002-00, Oct. 1, 1998; 8 pages.
9705 Network Software Design Guide Application Note, Stac Electronics, Inc., APP-0012 Revision 1.0, May 1993; 30 pages.
9705/9705A Data Compression Coprocessor Data Sheet, Hi/fn, May 1996; 87 pages.
9700 to 7711 Migration Application Note, Hi/fn Network Security Processors, Application Note AN-0007-00, Oct. 1, 1998; 7 pages.
9732AM Data Compression Coprocessor Data Shet, Hi/fn, PRS-0055 Revision 0.1, May 1999; 58 pages.
Blelloch, G., "Algorithms in the Real World: Lecture Notes (Fall 1997)," Lecture Notes, UC Berkeley, Apr. 23, 1998; 303 pages. (Submitted in 2 parts.).
LeCun, et al., "DjVu: a Compression Method for Distributing Scanned Documents in Color over the Internet," AT&T Labs-Research, Jan. 1999; 2 pages.
9732A Data Compression Coprocessor Data Sheet, Hi/fn, Oct. 1999; 50 pages.
7711 Encryption Processor Data Sheet, Hi/fn Network Security Processors, Jun. 1999; 77 pages.
7751 Encryption Processor Data Sheet, Hi/fn Network Security Processors, Jun. 1999; 84 pages.
9751 Data Compression Processor Data Sheet, Hi/fn, Jun. 1999; 66 pages.
"Hi/fn Encryption Products Power Network Alchemy's Revolutionary VPN Products," Business Wire, Jan. 26, 1999; 2 pages.
"Hi/fn Provides Hardware Encryption for Xedia's New Access Point QPVN Internet Access Platform," Business Wire, Oct. 19, 1998; 2 pages.
"LZW Data Compression," Dr. Dobb's, Oct. 1, 1989; 14 pages.
"New Accelerator Chip From Hi/fn to Speed-Up Virtual Private Networks—'VPNs'," Business Wire, Jan. 26, 1999; 3 pages.

Programming the 7711 for IPSEC Applications Application Note, Hi/fn Network Security Processors, Application Note AN-0002-00, Oct. 1, 1998; 15 pages.
Friend, R., "IP Payload Compression Using LZS, Request for Comments" The Internet Society, Network Working Group, Hi/fn, Inc., Dec. 1998; 9 pages.
Screenshot of hifn.com, accessible via the Internet Archive at <http://web.archive.org/web/19981212025553/http://www.hifn.com/>, Dec. 12, 1998, 1 page.
Wirbel, L., "Volume shipment Hi/fn encryption processor," Electronic Engineering Times, Issue 1005, May 4, 1998; 2 pages.
"Intelligent Compression Technologies: Intelligent Compression Technologies releases XML compressor, XML-Xpress," M2 Presswire, Jan. 30, 2001; 5 pages.
Form 10—General Form for Registration Securities, hi/fn, inc., United States Securities and and Exchange Commission, filed Dec. 8, 1998; 387 pages. (Submitted in 3 parts.).
Form S-3—Registration Statement Under the Securities Act of 1913, hi/fn, inc., United States Securities and Exchange Commission, filed Feb. 17, 1999; 151 pages.
HP 7979A/7980A/7980XC Tape Drive User's Guide, Hewlett-Packard Corporation, HP Computer Museum, Oct. 1988; 76 pages.
7980A Tape Drive—Documentation, HP Computer Museum, accessible at <http://www.hpmuseum.net/exhibit.php?hwdoc=390>, Sep. 22, 2015; 1 page.
The HP 7980A/7979A ½-inch Tape Drives, Hewlett-Packard Product Specifications, Jun. 1, 1987; 2 pages.
9145A Tape Drive—Documentation, HP Computer Museum, accessible at <http://www.hpmuseum.net/exhibit.php?hwdoc=258>, Sep. 22, 2015; 1 page.
HP 9145A Tape Drive User's Manual, Edition 1, Hewlett-Packard Corporation, Jul. 1988; 61 pages.
Peripheral Products, HP Computer Museum, accessible at <http://www.hpmuseum.net/exhibit.php?class=4&cat=85>, Sep. 22, 2015; 3 pages.
Pall, G., "Microsoft Point-To-Point Compression (MPPC) Protocol, Request for Comments," The Internet Society, Network Working Group, Hi/fn, Inc., Dec. 1998; 9 pages.
"Cisco IOS Data Compression," Cisco Systems White Paper, 1997; 10 pages.
"Reference Software 7751 Encryption Processor," Hi/fn Network Security Processors, Reference Software RS-0001-00, Oct. 1, 1998; 38 pages.
Screenshot of hifn.com, accessible via the Internet Archive at <https://web.archive.org/web/19981205163011/http://www.hifn.com>, Dec. 5, 1998; 1 page.
TESS Record for Serial No. 78040025, filed Dec. 20, 2000, "Typed Drawing," accessed Nov. 10, 2015; 1 page.
"Compaq Professional Workstation AP500 Key Technologies White Paper," Compaq Computer Corporation, Aug. 1998; 21 pages.
Langdon, G., "An Introduction to Arithmetic Coding," IBM Journal of Research and Development, vol. 28, No. 2, Mar. 1984; pp. 135-149.
"Connecting Your HP SureStore CD-Writer Plus Drive: Windows 95 and Windows NT 4.0," Hewlett-Packard Corporation, 1997; 50 pages.
"Quantum Rushmore Solid State Disk Drives," Quantum Corporation, accessible via the Internet Archive at <http://web.archive.org/web/19980220122303/http://www.quantum.com/products/ssd/>, Feb. 20, 1998; 2 pages.
"MegaRam Solid State Disks," Imperial Technology, Inc., accessible via the Internet Archive at <https://web.archive.org/web/19980206055558/http://imperialtech.com/SolidState.html>, Feb. 6, 1998; 2 pages.
"Replica—The Fastest, Most Reliable Data Protection For Servers," accessible via the Internet Archive at <http://web.archive.org/web/19970226213335/http://www1.stac.com/soft/replfct.html>, Feb. 26, 2997; 4 pages.
"Object Replication: A Revolutionary Advance in Distributed Data Protection and Recovery," Stac White Paper, 1999; 7 pages.
"Features and Benefits for Replica," Replica for NetWare, 1999; 3 pages.

(56) References Cited

OTHER PUBLICATIONS

DjVu 2.2 Reference Library, Aug. 2000 (submitted on compact disc).
"Replica—The Fastest, Most Reliable Data Protection for Servers," accessible via the Internet Archive at <http://web.archive.org/web/19970226213335/http:/www1.stac.com/soft/replcont.html>, Feb. 26, 1997; 1 page.
"Stac Products & Technology," accessible via the Internet Archive at <http://web.archive.org/web/19970226213054/http:/www1.stac.com/soft/softprod.html>, Feb. 26, 1997; 1 page.
"Hi/fn Product Catalog," accessible via the Internet Archive at <http://web.atchive.org/19971010233632/http:/www.hifn.com/products/product/index.htm>, Oct. 10, 1997; 1 page.
"Hi/fn Products," accessible via the Internet Archive at <http://web.archive.org/19971010233115/http:/www.hifn.com/products/indexhtm>, Oct. 10, 1997; 1 page.
"Replica Family," accessible via the Internet Archive at <http://web.archive.org/19980212174817/http:/www.stac.com/replica/rep_overievv.html>, Feb. 12, 1998; 1 page.
"Stac Web Site Cotents," accessible via the Internet Archive at <http://web.archive.org/19990827224836/http:/www.stac.com/subcontents/sitemap.asp?sitemap>, Aug. 27, 1999; 4 pages.
"Data Compression Procedures for Data Circuit Terminating Equipment (DCE) Using Error Correcting Procedures," International Telecommunication Union Recommendation V.42 bis, 1990; 29 pages.
Stac, Inc., News Articles, dated Mar. 10, 1997 to Feb. 2, 1999; 41 pages.
Orost Archive of Welch Source Code, University of California, 1985; 54 pages.
Sidewinder 50 Product Manual, Rev. A, Seagate Technology, Inc., 1997; 189 pages. (Submitted in 3 parts).
Form 10-Q Quarterly Report Pursuant to Section 13 or 15(d) of the Security Exchange Act of 1934, Stac Software, Inc., filed Aug. 13, 1999; 16 pages.
"Hi/Fn™ 7711 Encryption Processor™ Shipping in Volume," PR Newswire, Apr. 20, 1998; 2 pages.
"Lucent Technologies Selects," PR Newswire, Mar. 1, 1999; 2 pages.
"Stac backs it up with Replica," INFOSTOR, May 1, 1998; 2 pages.
Standard Function Library (SFL) Code' Version 1.4, written Mar. 29, 1993, revised Jan. 2, 1997; 190 pages.
Standard Function Library Documentation, written Jun. 4, 1997, revised Nov. 17, 1997; 1,102 pages. (Submitted in 6 parts.).
Second Amended Complaint for Patent Infringement Against Riverbed Technology, Inc. and Dell, Inc., filed in *Realtime Data LLC d/b/a IXO v. Actian Corporation, et al.*, Case No. 6:15-cv-00463-RWS-JDL (E.D. Texas), filed Feb. 2, 2016; 37 pages.
Defendant Dropbox's Answer to Plaintiff Realtime Data LLC d/b/a IXO's Amended Complaint, filed in *Realtime Data LLC d/b/a IXO v. Actian Corporation, et al.*, Case No. 6:15-cv-00463-RWS-JDL (E.D. Texas), filed Feb. 4, 2016; 10 pages.
Defendants Echostart Corporation and Hughes Network Systems, LLC's Answer, Affirmative Defenses, and Counterclaims to Plaintiff Realtime Data LLC d/b/a IXO's Amended Complaint, filed in *Realtime Data LLC d/b/a IXO v. Actian Corporation, et al.*, Case No. 6:15-cv-00463-RWS-JDL (E.D. Texas), filed Feb. 4, 2016; 23 pages.
Defendants SAP America Inc. and SyBase, Inc.'s Answer, Affirmative Defenses, and Counterclaims to Plaintiff's Second Amended Complaint, filed in *Realtime Data LLC d/b/a IXO v. Actian Corporation et al.*, Case No. 6:15-cv-00463-RWS-JDL (E.D. Texas), filed Feb. 4, 2016; 35 pages.
Dell Inc.'s Answer, Defenses, and Counterclaims to Plaintiff's Amended Complaint, filed in *Realtime Data LLC d/b/a IXO v. Actian Corporation, et al.*, Case No. 6:15-cv-00463-RWS-JDL (E.D. Texas), filed Feb. 4, 2016; 28 pages.
Dell Inc.'s Answer, Defenses, and Counterclaims to Plaintiff's Second Amended Complaint, filed in *Realtime Data, LLC d/b/a IXO v. Actian Corporation, et al.*, Case No. 6:15-cv-00463-RWS-JDL (E.D. Tex.), filed Feb. 19, 2016; 18 pages.
Riverbed Technology's Answer, Defenses, and Counterclaims, filed in *Realtime Data, LLC d/b/a IXO v. Actian Corporation, et al.*, Case No. 6:15-cv-00463-RWS-JDL (E.D. Tex.), filed Feb. 19, 2016; 26 pages.
Realtime Data LLC d/b/a IXO's Answer to Echostart Corporation's and Hughes Network Systems, LLC's Counterclaims, filed *Realtime Data LLC d/b/a IXO v. Actian Corporation, et al.*, Case No. 6:15-cv-000463-RWS-JDL (E.D. Texas), filed Feb. 25, 2016; 8 pages.
Realtime Data LLC d/b/a IXO's Answer to SAP America Inc.'s and Sybase, Inc.'s Counterclaims, filed *Realtime Data LLC d/b/a IXO v. Actian Corporation et al.*, Case No. 6:15-cv-000463-RWS-JDL (E.D. Texas), filed Feb. 25, 2016; 5 pages.
Realtime Data LLC d/b/a IXO's Answer to Dell, Inc.'s Counterclaims, filed *Realtime Data LLC d/b/a IXO v. Actian Corporation, et al.*, Case No. 6:15-cv-00463-RWS-JDL (E.D. Texas), filed Feb. 25, 2016; 5 pages.
Complaint Infringement for Patent Infringement Against Dell Inc., EMC Corporation, iland Internet Solutions Corporation, and Veeam Software Corporation, filed in *Realtime Data d/b/a IXO v. Dell Inc., et al.*, Case No. 6:16-cv-00089 (E.D. Texas), filed Feb. 26, 2016; 67 pages.
Complaint for Patent Infringement Against Hewlett Packard Enterprise Co., HP Enterprise Services, LLC, and Silver Peak Systems, Inc., filed in *Realtime Data d/b/a IXO v. Hewlett Packard Enterprise, Co.*, Case No. 6:16-cv-00086 (E.D. Texas), filed Feb. 26, 2016; 49 pages.
Complaint for Patent Infringement Against CenturyLink, Inc. and Veritas Technologies LLC, filed in *Realtime Data d/b/a IXO v. CenturyLink, Inc., et al.*, Case No. 6:16-cv-00087 (E.D. Texas), filed Feb. 26, 2016; 46 pages.
Complaint for Patent Infringement Against Oracle America, Inc., filed in *Realtime Data d/b/a IXO v. Oracle America, Inc.*, Case No. 6:16-cv-00088 (E.D. Texas), filed Feb. 26, 2016; 40 pages.
Non-Final Office Action for U.S. Appl. No. 14/853,581, dated Mar. 15, 2016; 5 pages.
Notice of Allowance for U.S. Appl. No. 14/733,565, dated Mar. 25, 2016; 8 pages.
Petition for Inter Partes Review of Claims 1-4, 8,14-17, 21 and 28 of U.S. Pat. No. 6,597,812, filed in *SAP America Inc., et al. v. Realtime Data, LLC d/b/a IXO*, Case No. IPR2016-00783 (P.T.A.B.), filed Apr. 1, 2016; 67 pages.
Declaration of Scott Bennett, Ph.D., filed in *SAP America Inc., et al. v. Realtime Data LLC d/b/a IXO*, Case No. IPR2016-00783 (P.T.A.B.), filed Apr. 1, 2016; 45 pages.
Declaration of Charles D. Creusere in Support of Petition for Inter Partes Review of Claims 1-4, 8, 14-17, 21 and 28 of U.S. Pat. No. 6,597,812, filed in *SAP America Inc., et al. v. Realtime Data LLC d/b/a IXO*, Case No. IPR2016-00783 (P.T.A.B.), filed Apr. 1, 2016; 82 pages.
Nelson, M., The Data Compression Book, 1st Edition, San Mateo, CA: M&T Books, 1992; 534 pages.
Randell, B., "Hardware/Software Tradeoffs: A General Design Principle?", Computing Laboratory, The University of Newcastle Upon Tyne, Jan. 25, 1985; 2 pages.
Definition of "consecutive", Random House Webster's College Dictionary, 2nd Edition, New York: Random House, 1998; p. 281.
Robinson, et al., "Results of a Prototype Television Bandwidth Compression Scheme," Proceedings of the IEEE, vol. 55, No. 3, Mar. 1967; pp. 356-364.
Court Docket History for *Realtime Data, LLC d/b/a IXO v. Actian Corporation, et al.*, Case No. 6:15-cv-00463 (E.D. Texas), downloaded Feb. 17, 2016, 29 pages.
Court Docket History for *Realtime Data, LLC d/b/a IXO v. Dropbox, Inc.*, Case No. 6:15-cv-00465 (E.D. Texas), downloaded Feb. 17, 2016, 6 pages.
Court Docket History for *Realtime Data, LLC d/b/a IXO v. Echostar Corporation, et al.*, Case No. 6:15-cv-00466 (E.D. Texas), downloaded Feb. 17, 2016, 3 pages.

(56) References Cited

OTHER PUBLICATIONS

Court Docket History for *Realtime Data, LLC d/b/a IXO v. Riverbed Technology, Inc., et al.*, Case No. 6:15-cv-00468 (E.D. Texas), downloaded Feb. 17, 2016, 3 pages.
Court Docket History for *Realtime Data, LLC d/b/a IXO v. BMC Software, Inc.*, Case No. 6:15-cv-00464 (E.D. Texas), downloaded Feb. 17, 2016, 3 pages.
Court Docket History for *Realtime Data, LLC d/b/a IXO v. Oracle America, Inc, et al.*, Case No. 6:15-cv-00467 (E.D. Texas), downloaded Feb. 17, 2016, 4 pages.
Court Docket History for *Realtime Data LLC d/b/a IXO v. SAP America, Inc., et al.*, Case No. 6:15-cv-00469 (E.D. Texas), downloaded Feb. 17, 2016, 5 pages.
Court Docket History for *Realtime Data LLC d/b/a IXO v. Teradata Corporation, et al.*, Case No. 6:15-cv-00470 (E.D. Texas), downloaded Feb. 17, 2016, 6 pages.
Court Docket History for *Realtime Data LLC d/b/a IXO v. Apple, Inc.*, Case No. 6:15-cv-00885 (E.D. Texas), downloaded Feb. 17, 2016, 6 pages.
Court Docket Histoty for *Realtime Data LLC d/b/a IXO v. Hewlett Packard Enterprise Co., et al.*, No. 6:16-cv-00086 (E.D. Texas), downloaded Mar. 1, 2016, 2 pages.
Court Docket History for *Realtime Data LLC d/b/a IXO v. Oracle America, Inc.*, No. 6:16-cv-00088 (E.D. Texas), downloaded Mar. 1, 2016; 2 pages.
Court Docket History for *Realtime Data LLC d/b/a IXO v. CenturyLink, Inc., et al.*, No. 6:16-cv-00087 (E.D. Texas), downloaded Mar. 1, 2016; 2 pages.
Court Docket History for *Realtime Data LLC d/b/a IXO v. Dell, Inc., et al.*, No. 6:16-cv-00089 (E.D. Texas), downloaded Mar. 1, 2016; 2 pages.
Joint Claim Construction and Prehearing Statement, filed in *Realtime Data LLC d/b/a IXO v. Actian Corporation, et al.*, Case No. 6:15-cv-00463-RWS-JDL (E.D. Tex), filed Apr. 18, 2016; 26 pages.
Inter Partes Reexamination of U.S. Pat. No. (Control No. 95/000,486), Inter Partes Reexamination Certificate issued Oct. 10, 2012.
Inter Partes Reexamination of U.S. Pat. No. 7,321,937 (Control No. 95/000,466), Inter Partes Reexamination Certificate issued May 15, 2012.
Inter Partes Reexamination of U.S. Pat. No. 6,604,158 (Control No. 95/000,453), Terminated.
Ex Parte Reexamination of U.S. Pat. No. 6,601,104 (Control No. 90/009,428), Ex Parte Reexamination Certificate issued Feb. 28, 2012.
Inter Partes Reexamination of U.S. Pat. No. 7,378,992 (Control No. 95/000,478), Inter Partes Reexamination Certificate issued Oct. 4, 2012.
Inter Partes Reexamination of U.S. Pat. No. 6,624,761 (Control No. 95/000,464), Inter Partes Reexamination Certificate issued Jun. 12, 2012.
Inter Partes Reexamination of U.S. Pat. No. 7,161,506 (Control No. 95/000,479), Inter Partes Reexamination Certificate issued May 22, 2012.
Inter Partes Reexamination of U.S. Pat. No. 7,714,747 (Control No. 95/001,517), Appeal of Court of Appeals for the Federal Circuit dismissed Jun. 4, 2015.
Inter Partes Reexamination of U.S. Pat. No. 7,417,568 (Control No. 95/001,533), Decision on Appeal mailed Oct. 29, 2015.
Inter Partes Reexamination of U.S. Pat. No. 7,777,651 (Control No. 95/001,581), Decision on Appeal mailed Oct. 29, 2015.
Inter Partes Reexamination of U.S. Pat. No. 7,400,274 (Control No. 95/001,544), Decision on Appeal mailed Oct. 29, 2015.
Inter Partes Reexamination of U.S. Pat. No. 7,321,937 (Control No. 95/001,922), Inter Partes Reexamination Certificate issued Dec. 5, 2013.
Inter Partes Reexamination of U.S. Pat. No. 6,604,158 (Control No. 95/001,923), Inter Partes Reexamination Certificate issued Apr. 17, 2015.
Inter Partes Reexamination of U.S. Pat. No. 7,352,300 (Control No. 95/001,924), Inter Partes Reexamination Certificate issued Aug. 4, 2014.
Inter Partes Reexamination of U.S. Pat. No. 7,395,345 (Control No. 95/001,925), Inter Partes Reexamination Certificate issued Nov. 3, 2014.
Inter Partes Reexamination of U.S. Pat. No. 7,161,506 (Control No. 95/001,926), Inter Partes Reexamination Certificate issued Jan. 8, 2014.
Inter Partes Reexamination of U.S. Pat. No. 7,415,530 (Control No. 95/001,927), Inter Partes Reexamination Certificate issued Aug. 16, 2013.
Inter Partes Reexamination of U.S. Pat. No. 7,378,992 (Control No. 95/001,928), Inter Partes Reexamination Certificate issued Jan. 8, 2014.
*Oracle America, Inc. v. Realtime Data, LLC*, IPR2016-00373, U.S. Pat. No. 7,378,992, Petition filed Dec. 22, 2015.
*Oracle America, Inc. v. Realtime Data, LLC*, IPR2016-00374, U.S. Pat. No. 8,643,513, Petition filed Dec. 22, 2015.
*Oracle America, Inc. v. Realtime Data, LLC*, IPR2016-00375, U.S. Pat. No. 7,415,530, Petition filed Dec. 28, 2015.
*Oracle America, Inc. v. Realtime Data, LLC*, IPR2016-00376, U.S. Pat. No. 7,415,530, Petition filed Dec. 28, 2015.
*Oracle America, Inc. v. Realtime Data, LLC*, IPR2016-00377, U.S. Pat. No. 9,116,908, Petition filed Dec. 28, 2015.
*SAP America Inc., et al. v. Realtime Data, LLC d/b/a IXO*, IPR2016-00783, U.S. Pat. No. 6,597,812, Petition filed Apr. 1, 2016.
*Realtime Data LLC d/b/a IXO v. Packeteer, Inc. et al.*, No. 6:08-cv-00144-LED (E.D. Texas), Dismissed.
*Realtime Data LLC d/b/a IXO v. Thomson Reuters Corporation et al.*, No. 1:11-cv-06698-RJH (S.D. New York) (transferred from E.D. Texas; 6:09-cv-00333-LED), Case Terminated Nov. 9, 2012; Opinion of the Court of Appeals for the Federal Circuit received Jan. 27, 2014.
*Realtime Data LLC d/b/a IXO v. Morgan Stanley et al.*, No. 1:11-cv-06696-RJH (S.D. New York) (transferred from E.D. Texas; 6:09-cv-00326-LED), Case Terminated Nov. 9, 2012; Opinion of the Court of Appeals for the Federal Circuit received Jan. 27, 2014.
*Realtime Data LLC d/b/a IXO v. CME Group Inc. et al.*, No. 1:11-cv-06697-RJH (S.D. New York) (transferred from E.D. Texas; No. 6:09-cv-00327-LED), Case Terminated Nov. 9, 2012; Opinion of the Court of Appeals for the Federal Circuit received Jan. 27, 2014.
*Chicago Board Options Exhange, Inc., v. Realtime Data LLC d/b/a IXO*, No. 09-cv-4486 (N.D. Ill.), Dismissed.
*Thomson Reuters Corporation v. Realtime Data, LLC d/b/a IXO*, No. 1:09-cv-07868-RMB (S.D.N.Y), Consolidated with Case No. 2.
*Realtime Data, LLC d/b/a IXO v. CME Group Inc. et al.* (II), No. 6:10-cv-246 (E.D. Texas), Consolidated with Case No. 4.
*Realtime Data, LLC d/b/a IXO v. Thomson Reuters Corporation et al.* (II), No. 6:10-cv-247 (E.D. Texas) Consolidated with Case No. 2.
*Realtime Data, LLC d/b/a IXO v. Morgan Stanley, et al.* (II), No. 6:10-cv-248 (E.D. Texas) Consolidated with Case No. 3.
*Realtime Data, LLC d/b/a IXO v. MetroPCS Texas, LLC et al.*, No. 6:10-cv-00493 (E.D. Texas), Appeal Terminated.
*Realtime Data, LLC d/b/a IXO v. Microsoft Corporation, et al.*, No. 4:14-cv-00827 (E.D. Texas), Dismissed May 1, 2015.
*Realtime Data, LLC d/b/a IXO v. Actian Corporation, et al.*, No. 6:15-cv-00463 (E.D. Texas), Amended Complaints for Patent Infringement filed Sep. 14, 2015.
*Realtime Data, LLC d/b/a IXO v. Dropbox, Inc.*, No. 6:15-cv-00465 (E.D. Texas), Dismissed Feb. 22, 2016.
*Realtime Data, LLC d/b/a IXO v. Echostar Corporation, et al.*, No. 6:15-cv-00466 (E.D. Texas), Consolidated with Case No. 12; Answer to Amended Complaint filed Feb. 4, 2016.
*Realtime Data, LLC d/b/a IXO v. Riverbed Technology, Inc., et al.*, No. 6:15-cv-00468 (E.D. Texas), Consolidated with Case No. 12; Second Amended Complaint for Infringement filed Feb. 2, 2016.
*Realtime Data, LLC d/b/a IXO v. BMC Software, Inc.*, No. 6:15-cv-00464 (E.D. Texas), Terminated Oct. 5, 2015.
*Realtime Data, LLC d/b/a IXO v. Orcale America, Inc., et al.*, No. 6:15-cv-00467 (E.D. Texas), Consolidated with Case No. 12.

(56) References Cited

OTHER PUBLICATIONS

*Realtime Data, LLC d/b/a IXO v. SAP America, Inc., et al.*, No. 6:15-cv-00469 (E.D. Texas), Consolidated with Case No. 12; Answers to Amended Complaint filed Feb. 4, 2016.
*Realtime Data, LLC d/b/a IXO v. Teradata Corporation, et al.*, No. 6:15-cv-00470 (E.D. Texas), Transferred to the Northern District of California, Jan. 19, 2016.
*Realtime Data, LLC d/b/a IXO v. Apple, Inc.*, No. 6:15-cv-00885 (E.D. Texas), Transferred to the Northern District of California, Apr. 18, 2016.
*Realtime Data, LLC d/b/a IXO v. Hewlett Packard Enterprise Co., et al.*, No. 6:16-cv-00086 (E.D. Texas), Complain filed Feb. 26, 2016.
*Realtime Data, LLC d/b/a IXO v. Orcale America, Inc.*, No. 6:16-cv-00088 (E.D. Texas), Complaint filed Feb. 26, 2016.
*Realtime Data, LLC d/b/a IXO v. CenturyLink, Inc., et al.*, No. 6:16-cv-00087 (E.D. Texas), Complaint filed Feb. 26, 2016.
*Realtime Data, LLC d/b/a IXO v. Dell, Inc., et al.*, No. 6:16-cv-00089 (E.D. Texas), Complaint filed Feb. 26, 2016.
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, dated Jul. 27, 2009, 15 pages.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/IXO v. Packeteer, Inc. et al.*, Civil Action No. 6:08-cv-00144-LED; U.S. District Court for the Eastern District of Texas, Jul. 31, 2009; 3 pgs.
Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, dated Aug. 3, 2009, 3 pages.
"A-T Financial Offers Manipulation, Redistribution of Ticker III", Inside Market Data, vol. 4 No. 14, Sep. 5, 1989, 1 page.
"Add-on Options for the XpressFiles", Intelligent Compression Technologies http://web.archive.org/web/19980518053418/ictcompress.com/options_X.html, 1998, 2 pages.
Andrews et al., "A Mean-Removed Variation of Weighted Universal Vector Quantization for Image Coding", IEEE, 1993, pp. 302-309.
Asserted Claims Chart for U.S. Pat. No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 4 pages.
Asserted Claims Chart for U.S. Pat. No. 7,161,506,*Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 5 pages.
Asserted Claims Chart for U.S. Pat. No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 6 pages.
Asserted Claims Chart for U.S. Pat. No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 13 pages.
Asserted Claims Chart for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Barton, Rich, S&P ComStock Network Character Set Definition, 19.2 KB Network, Version 1.7.0, Feb. 10, 1995, 29 pages.
Beech, W. A., et al., "AX.25 Link Access Protocol for Amateur Packet Radio," Version 2.2, Revision: Jul. 1998, 143 pages.

Bormann, Carsten, "Providing Integrated Services over Low-bitrate Links," Network Working Group Request for Comments: 2689, Category: Informational, Sep. 1999, 14 pages.
ComStock Services Pamphlet, McGraw-Hill Financial Services Company, purportedly published by Jul. 19, 1995, 6 pages.
Cormack, Gordon V., "Data Compression on a Database System", Communications of the ACM, vol. 28, No. 12, Dec. 1985, pp. 1336-1342.
Danskin, John Moffatt, "Compressing the X Graphics Protocol: A Dissertation Presented to the Facult of Princeton University in Candidacy for the Degree of Doctor of Philosophy," Jan. 1995, 147 pages.
"Data Networks and Open System Communications," Information Technology—Abstract Syntax Notation One (ASN. 1) Specification of Basic Notation, International Telecommunication Union, ITU-T Telecommunication Standardization Sector of ITU X.680, Jul. 1994.
Defendants' Invalidity Contentions, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Degermark, Mikael, "IP Header Compression", Network Working Group Request for Comments: 2507, Category: Standards Track, Feb. 1999, 47 pages.
Developer's Guide, Version 1.0.2, S&P ComStock, Feb. 15, 1994, 186 pages.
Domanski, Dr. Bernie, "All the news you can eat, Department: Dr. Bernie's Digestions and Digressions", Demand Technology's Capacity Management Review, vol. 25, No. 7, Jul. 1997, pp. 24, 18-22.
Effros, Michelle and Philip A. Chou, "Weighted Universal Transform Coding: Universal Image Compression with the Karhunen-Loeve Transform", IEEE, 1995, pp. 61-64.
Engan, Mathias, "IP Header Compression over PPP", Network Working Group Request for Comments: 2509, Category: 2509, Feb. 1999, 10 pages.
Exhibit A, Invalidity Claim Charts A1-A45 for U.S. Pat. No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 616 pages.
Exhibit B, Invalidity Claim Charts B1-1345 for U.S. Pat. No. 7,161,506, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 1513 pages.
Exhibit C, Invalidity Claim Charts C1-C7, C9-C31, C33-C45 for U.S. Pat. No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division Oct. 19, 2010, 1528 pages.
Exhibit D, Invalidity Claim Charts D1-D7, D9-D45 for U.S. Pat. No. 7,417,568, *Realtime Data, LLC D/B/A IXO v. CME Group Inc., et al.*, 6:09-cv-327-LED-JDL, 6:10-cv-246- LED-JDL, United States District Court for the Eastern District of Texas Tyler Division, Oct. 19, 2010, 2458 pages.
Exhibit E, Invalidity Claim Charts E1-E7, E9, E11, E13-E15, E17-E30, E32-E45 for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 3312 pages.
Greene, Tim, "Squeeze your 'Net links", NetworkWorld, vol. 14, No. 28, Jul. 14, 1997, pp. 1 and 56.
Helck, Christopher J., "Encapsulated Ticker: Ver 1.0," Jul. 14, 1993, 22 pages.
"High-performance schema-specific compression for XML data formats," XML-Xpress: Product Overview, Intelligent Compression Technologies, http://web.archive.org/web/20020818002535/www.ictcompress.com/product_xmlxpress, 2001, 2 pages.
Hsu, William H. and Amy E. Zwarico, "Automatic Synthesis of Compression Techniques for Heterogeneous Files," Software—Practice and Experience, vol. 25 (10), Oct. 1995, pp. 1097-1116.

(56) References Cited

OTHER PUBLICATIONS

"ICT's XML-Xpress", Intelligent Compression Technologies, Dec. 2000, 6 pages.
"Information processing systems—Data communication—High-level data link control procedures—Frame structure", UNI ISO 3309, 1984, 11 pages.
Installing and Administering PPP, Edition 1, Hewlett-Packard Company, 1997, 169 pages.
"Introducing XpressFiles", Intelligent Compression Technologies, http://web.archive.org/web/19980518053310/ictcompress.com/xpressfiles.html, 1998, 1 page.
"Ion's RemoteScript speeds transmission", Seybold Report on Publishing Systems, vol. 22 No. 5, Nov. 9, 1992, pp. 21-23.
Jacobson, V., "Compressing TCP/IP Headers for Low-Speed Serial Links," Feb. 1990, 45 pages.
Kulkosky, Victor, "Upping the Ante", Wall Street & Technology, vol. 11 No. 5, Oct. 1993, pp. 8-11.
Liefke, Hartmut and Dan Suciu, "An Efficient Compressor for XML Data." SIGMOD Record, vol. 29, No. 1, Mar. 2000, pp. 57-62.
Liefke, Hartmut and Dan Suciu, "XMill: an Efficient Compressor for XML Data," 2000, pp. 153-164.
Liefke, Hartmut and Dan Suciu, Xmill: an Efficient Compressor for XML Data, Oct. 18, 1999, 25 pages.
McGregor, Glenn, "The PPP Internet Protocol Control Protocol (IPCP)", Network Working Group Request for Comments: 1332, Obsoletes: RFC 1172, May 1992, 14 pages.
Obviousness Chart for U.S. Pat. No. 6,624,761, *Realtime Data, LLC D/B/A IXO* v. *CME Group Inc., et al.* , 6:09-cv-327-LED-JDL, 6:10-cv-246-LED-JDL, United States District Court for the Eastern District of Texas Tyler Division, Oct. 19, 2010, 19 pages.
Obviousness Chart for U.S. Pat. No. 7,161,506, *Realtime Data, LLC D/B/A IXO* v. *CME Group Inc.*, et al. , 6:09-cv-327-LED-JDL, 6:10-cv-246-LED-JDL, United States District Court for the Eastern District of Texas Tyler Division, Oct. 19, 2010, 49 pages.
Obviousness Chart for U.S. Pat. No. 7,400,274, *Realtime Data, LLC D/B/A IXO* v. *CME Group Inc., et al.* , 6:09-cv-327-LED-JDL, 6:10-cv-246-LED-JDL, United States District Court for the Eastern District of Texas Tyler Division, Oct. 19, 2010, 41 pages.
Obviousness Chart for U.S. Pat. No. 7,417,568, *Realtime Data, LLC D/B/A IXO* v. *CME Group Inc., et al.* , 6:09-cv-327-LED-JDL, 6:10-cv-246-LED-JDL, United States District Court for the Eastern District of Texas Tyler Division, Oct. 19, 2010, 75 pages.
Obviousness Chart for U.S. Pat. No. 7,714,747, *Realtime Data, LLC D/B/A IXO* v. *CME Group Inc., et al.* , 6:09-cv-327-LED-JDL, 6:10-cv-246-LED-JDL, United States District Court for the Eastern District of Texas Tyler Division, Oct. 19, 2010, 97 pages.
Open Financial Exchange Specification 2.0, Intuit Inc., Microsoft Corp., Apr. 28, 2000, 537 pages.
Rand, Dave, "The PPP Compression Control Protocol (CCP)", Network Working Group Request for Comments: 1962, Category: Standards Track, Jun. 1996, 9 pages.
Rogers, Amy, "Bandwidth Bargain IT hot on products that squeeze more out of the pipe", No. 673, Jul. 21, 1997, pp. 1 and 65.
Roth, Mark A. and Scott J. Van Horn, "Database Compression", SIGMOD Record, vol. 22, No. 3, Sep. 1993, pp. 31-39.
Schmerken, Ivy, "Time Running Out for Old Technologies", Wall Street Computer Review, Apr. 1990, pp. 14-16, 23-2,; 28, 56.
"Scrolling News", Inside Market Data, Feb. 27, 1995, 2 pages.
Simpson, W., "PPP in HDLC-like Framing", Network Working Group Request for Comments: 1662, STD 51, Obsoletes 1549, Category: Standards Track, Jul. 1994, 26 pages.
Suciu, Dan, Data Management on the Web, AT&T Labs, Apr. 4, 2000, 52 slides.
Suciu, Dan, "Data Management on the Web: Abstract," University of Washington Computer Science & Engineering, Apr. 4, 2000, 1 page.
"Telekurs Buys S&P Trading Systems and Its Ticker III Feed", Inside Market Data, vol. 4, No. 11, Jul. 10, 1989, 1 page.
"Telekurs May Debut 128 KPS Ticker by Year's End", Inside Market Data, Jul. 18, 1994, 2 pages.
"Telekurs Now Carries All Dow Jones' News on 56-Kbps Ticker," Inside Market Data, Dec. 20, 1993, 2 pages.
"Telekurs Sells No. American Division in Mgmt. Buyout", Inside Market Data, Oct. 23, 1995, 2 pages.
"Telekurs to Launch New Int'l Feed/Internet Server", Wall Street & Technology, vol. 15, No. 1, Jan. 1997, p. 14.
"The Technology Behind XpressFiles", Intelligent Compression Technologies, http://web.archive.org/web/19980518053634/ictcompress.com/technical_X.html, 1998, 1 page.
TID Information: Revisions to TID Program Since the Dawn of Time!!! Version 1.0, 23 pages; TID Codes 1, 1 page; TID Codes 2, 1 page, purportedly by Jul. 19, 1995.
Type World: The First and Only Newspaper for Electronic Publishing, vol. 16 No. 9, Jun. 17, 1992, 3 pages.
"XpressFiles White Paper", Intelligent Compression Technologies, 1999-2001, 3 pages.
U.S. Appl. No. 60/309,218, filed Jul. 31, 2001.
Telekurs Manual, Jan. 11, 1993, 184 pages.
Danskin, et al., "Fast Higher Bandwidth X," Dartmouth College, Hanover, NH, 1995, 8 pages.
Hoffman, Roy, "Data Compression in Digital Systems," Digital Multimedia Standards Series, Chapman & Hall, 1997, 426 pages.
Defendants' Invalidity Contentions, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6: 10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 34 pages.
Appendix A, Obviousness Chart for U.S. Pat. No. 7,777,651, not dated, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 466 pages.
Appendix B, § 112 Invalidity Arguments for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Easters District of Texas Tyler Division, Feb. 4, 2011, 75 pages.
Exhibit 1, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Easters District of Texas Tyler Division, Feb. 4, 2011, 161 pages, citing Aakre et al., U.S. Pat. No. 4,956,808.
Exhibit 2, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 206 pages, citing Albert et al., U.S. Pat. No. 5,907,801.
Exhibit 3, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-

(56) References Cited

OTHER PUBLICATIONS

LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 95 pages, citing B. Andrews, P. Chou, M. Effros and R. Gray "A Mean-Removed Variation of Weighted Universal Vector Quantization for Imaze Coding," IEEE 0-8186-3392-1/93, 302-309 (1993).

Exhibit 4, Prior Art Chart for U.S. Pat. No. 7,777,651, 144 pages, *Realtme Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, Llc D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Barnes et al., U.S. Pat. No. 6,792,151.

Exhibit 5, Prior Art Chart for U.S. Pat. No. 7,777,651, 216 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Birdwell et al., U.S. Pat. No. 6,032,197.

Exhibit 6, Prior Art Chart for U.S. Pat. No. 7,777,651, 257 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, Realtime Lata, LLC D/B/A IXO v. Thomson Reuters Corp., et al., 6:09-cv-333-LED-JDL, 6:10-cv-247-LED-JDL, 6:10-cv-425-LED-JDL, United States District Court for the Eastern District of Texas Tyler Division, Feb. 4, 2011, citing Bledsoe, U.S. Pat. No. 4,646,061.

Exhibit 7, Prior Art Chart for U.S. Pat. No. 7,777,651, 169 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Brickman et al., U.S. Pat. No. 4,499,499.

Exhibit 8, Prior Art Chart for U.S. Pat. No. 7,777,651, 396 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing C. Bormann et al., "Robust Header Compression (ROHC)," Network Working Group Internet-Draft Sep. 18, 2000.

Exhibit 9, Prior Art Chart for U.S. Pat. No. 7,777,651, 253 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Carr, U.S. Pat. No. 5,293,379.

Exhibit 10, Prior Art Chart for U.S. Pat. No. 7,777,651, 205 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cellier et al., U.S. Pat. No. 5,884,269.

Exhibit 11, Prior Art Chart for U.S. Pat. No. 7,777,651, 181 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Chu, U.S. Pat. No. 5,374,916 & U.S. Pat. No. 5,467,087.

Exhibit 12, Prior Art Chart for U.S. Pat. No. 7,777,651, 175 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cisco IOS Data Compression White Paper (Cisco Systems Inc., 1997).

Exhibit 13, Prior Art Chart for U.S. Pat. No. 7,777,651, 590 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Comstock—S&P ComStock Developers Guides (McGraw-Hill, 1994); Rich Barton, "S&P ComStock Network Character Set Definition" (Feb. 10, 1995).

Exhibit 14, Prior Art Chart for U.S. Pat. No. 7,777,651, 186 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing D.J. Craft. "A fast hardware data compression algorithm and some algorithmic extenstions," IBM J. Res. Develop. vol. 42, No. 6 (Nov. 1998).

Exhibit 15, Prior Art Chart for U.S. Pat. No. 7,777,651, 142 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Deering, U.S. Pat. No. 6,459,429.

Exhibit 16, Prior Art Chart for U.S. Pat. No. 7,777,651, 284 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Dye et al., U.S. Pat. No. 7,190,284 and International Publication No. WO 00/45516.

(56) References Cited

OTHER PUBLICATIONS

Exhibit 17, Prior Art Chart for U.S. Pat. No. 7,777,651, 269 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Earl et al., U.S. Pat. No. 5,341,440.
Exhibit 18, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Eastman et al., U.S. Pat. No. 4,464,650.
Exhibit 19, Prior Art Chart for U.S. Pat. No. 7,777,651, 125 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Elgamal et al., U.S. Pat. No. 5,410,671.
Exhibit 20, Prior Art Chart for U.S. Pat. No. 7,777,651, 122 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Enari et al., EP 0493103.
Exhibit 21, Prior Art Chart for U.S. Pat. No. 7,777,651, 379 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Fascenda, U.S. Pat. No. 5,045,848.
Exhibit 22, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Frachtenberg et al., U.S. Patent. Pub. 2003/0030575.
Exhibit 23, Prior Art Chart for U.S. Pat. No. 7,777,651, 247 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Franaszek et al., U.S. Pat. No. 5,870,036.

Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing French et al., U.S. Pat. No. 5,794,229.
Exhibit 25, Prior Art Chart for U.S. Pat. No. 7,777,651, 225 pages, Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gieger et al., U.S. Pat. No. 5,987,022.
Exhibit 26, Prior Art Chart for U.S. Pat. No. 7,777,651, 219 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gentile, U.S. Pat. No. 5,504,842.
Exhibit 27, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 167 pages, citing Giltner et al., U.S. Pat. No. 4,386,416.
Exhibit 28, Prior Art Chart for U.S. Pat. No. 7,777,651, 156 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gooch, U.S. Pat. No. 4,325,085.
Exhibit 29, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hauck, U.S. Pat. No. 4,626,829.
Exhibit 30, Prior Art Chart for U.S. Pat. No. 7,777,651, 161 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Heath, U.S. Pat. No. 5,955,976.
Exhibit 31, Prior Art Chart for U.S. Pat. No. 7,777,651, 359 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*,

(56) References Cited

OTHER PUBLICATIONS

6:09-cv-333-LED-JDL, 6:10-cv-247-LED-JDL, 6:10-cv-425-LED-JDL, United States District Court for the Eastern District of Texas Tyler Division, Feb. 4, 2011, citing Hewlett-Packard Company, "Installing and Administering PPP," B2355-90137, HP 9000 Networking, E0948 (1st Ed. 1997).
Exhibit 32, Prior Art Chart for U.S. Pat. No. 7,777,651, 229 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hsu & Zwarico, Automatic Synthesis of Compression Techniques for Heterogeneous Files, Software-Practice & Experience, vol. 25(10), pp. 1097-1116 (Oct. 1995).
Exhibit 33, Prior Art Chart for U.S. Pat. No. 7,777,651, 206 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XML-Xpress White Paper (Intelligent Compression Technologies Inc., 2000) & website.
Exhibit 34, Prior Art Chart for U.S. Pat. No. 7,777,651, 138 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XpressFiles White Paper (Intelligent Compression Technologies Inc., 1999) & website.
Exhibit 35, Prior Art Chart for U.S. Pat. No. 7,777,651, 128 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Iseda et al., E.P. 0405572 A2.
Exhibit 36, Prior Art Chart for U.S. Pat. No. 7,777,651, 205 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing J. Danskin. "Compressing the X Graphics Protocol," Princeton University (Jan. 1995).
Exhibit 37, Prior Art Chart for U.S. Pat. No. 7,777,651, 159 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kalkstein, U.S. Pat. No. 5,945,933.
Exhibit 38, Prior Art Chart for U.S. Pat. No. 7,777,651, 402 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kari, U.S. Pat. No. 6,434,168; International Publication No. WO97/48212 A1.
Exhibit 39, Prior Art Chart for U.S. Pat. No. 7,777,651, 209 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Koopmas et al., U.S. Pat. No. 7,024,460.
Exhibit 40, Prior Art Chart for U.S. Pat. No. 7,777,651, 214 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Pat. No. 5,825,830.
Exhibit 41, Prior Art Chart for U.S. Pat. No. 7,777,651, 281 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Pat. No. 5,825,830.
Exhibit 42, Prior Art Chart for U.S. Pat. No. 7,777,651, 340 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lane et al., U.S. Pat. No. 5,521,940.
Exhibit 43, Prior Art Chart for U.S. Pat. No. 7,777,651, 164 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Langdon, Jr. et al., U.S. Pat. No. 4,494,108.
Exhibit 44, Prior Art Chart for U.S. Pat. No. 7,777,651, 211 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lavallee, U.S. Pat. No. 6,215,904.
Exhibit 45, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas

(56) References Cited

OTHER PUBLICATIONS

Tyler Division, Feb. 4, 2011, citing M. Effros, P. Chou & R.M. Gray. "Variable Dimension Weighted Universal Vector Quantization and Noiseless Coding," IEEE 1068-0301/94 (1994).

Exhibit 46, Prior Art Chart for U.S. Pat. No. 7,777,651, 414 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing MacCrisken, U.S. Pat. No. 4,730,348.

Exhibit 47, Prior Art Chart for U.S. Pat. No. 7,777,651, 319 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Madany et al., U.S. Pat. No. 5,774,715.

Exhibit 48, Prior Art Chart for U.S. Pat. No. 7,777,651, 228 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Mark A. Roth and Scott J. Van Horn, "Database Compression" SIGMOD Record, vol. 22, No. 3 (1993).

Exhibit 49, Prior Art Chart for U.S. Pat. No. 7,777,651, 235 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Miller et al., U.S. Pat. No. 4,814,746.

Exhibit 50, Prior Art Chart for U.S. Pat. No. 7,777,651, 172 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing O'Brien, U.S. Pat. No. 4,929,946.

Exhibit 51, Prior Art Chart for U.S. Pat. No. 7,777,651, 30 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Osler et al., U.S. Pat. No. 6,768,749.

Exhibit 52, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing P.G. Howard, F. Kossenti, S. Forchammer, and W. J. Rucklidge [1998]. "The Emerging JBIG2 Standard", IEEE Transactions on Circuits and Systems for Video Technology 8:7, 838-848.

Exhibit 53, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Panaoussis, U.S. Pat. No. 5,949,355.

Exhibit 54, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Payne et al, U.S. Pat. No. 6,021,433.

Exhibit 55, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Reynar et al, U.S. Pat. No. 5,951,623.

Exhibit 56, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1144: V. Jacobson, "Compressing TCP/IP Headers for Low-Speed Serial Links," Network Working Group, Request for Comments: 1144 (Feb. 1990).

Exhibit 57, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1661: Point-to-Point Protocol Working Group, "The Point-to-Point Protocol," RFC 1661 (William Simpson ed., Internet Engineering Task Force 1994); RFC 1662: Point-to-Point Protocol Working Group, "PPP in HDLC-like Framing," RFC 1662 (William Simpson ed., Internet Engineering Task Force 1994); RFC 1962: Dave Rand, "The PPP compression Control Protocol (CCP)," RFC 1962 (Internet Engineering Task Force 1996); RFC 1332: Glenn McGregor, "The PPP Internet Protocol Control Protocol (IPCP)," RFC 1332 (Internet Engineering Task Force 1992); RFC 2509: Mathias Engan et al., "IP Header Compression over IP," RFC 2509 (Internet Society 1999).

Exhibit 58, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*,

(56) References Cited

OTHER PUBLICATIONS

6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 2507: Mikael Degermark et al., "IP Header Compression," RFC 2507 (Internet Society 1999).
Exhibit 59, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Roper et al., U.S. Pat. No. 5,454,079.
Exhibit 60, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Sebastian, U.S. Pat. No. 6,253,264 and International Publication No. WO/1998/039699.
Exhibit 61, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Pat. No. 5,243,341.
Exhibit 62, Prior Art Chart for U.S. Pat. No. 7,777,651, 322 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Pat. No. 5,389,922.
Exhibit 63, Prior Art Chart for U.S. Pat. No. 7,777,651, 102 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Shin, U.S. Pat. No. 5,455,680.
Exhibit 64, Prior Art Chart for U.S. Pat. No. 7,777,651, 126 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Taaffe et al., U.S. Pat. No. 5,179,651.
Exhibit 65, Prior Art Chart for U.S. Pat. No. 7,777,651, 313 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Telekurs Ticker—"Telekurs Ticker Service: Programmer's Reference," Telekurs (North America), Inc. (Jan. 11, 1993); C. Helck. "Encapsulated Ticker: Ver. 1.0," Telekurs NA, 1-22 (Jul. 14, 1993); A-T Financial Offers Manipulation, Redistribution of Ticker III, Micro Ticker Report, v 4, n 14 (Sep. 5, 1989); V. Kulkosky, "Upping the Ante" Wall Street & Technology, v11 n5 pp. 8-11 (Oct. 1993); "Telekurs to Launch New Int'l Feed/Internet Server," Wall Street & Technology, v15 n1 pp. 14 (Jan. 1997); I. Schmerken, "Time running out for old technologies", Street Computer Review, v7 n7 p. 14(7) (Apr. 1990); Scrolling News, Inside Market Data, v 10, n 11 (Feb. 27, 1995); Telekurs Buys S&P Trading Systems and Its Ticker III Feed, Micro Ticker Report, v 4, n 11 (Jul. 10, 1989); Telekurs May Debut 128 KPS Ticker by Year's End, Inside Market Data, v 9, n 21 (Jul. 18, 1994); Telekurs Now Carries All Dow Jones' News on 56-KBPS Ticker, Inside Market Data, v9, n7 (Dec. 20, 1993); Telekurs Sells No. American Division in Mgmt. Buyout, Inside Market Data, v11, n3 (Oct. 23, 1995).
Exhibit 66, Prior Art Chart for U.S. Pat. No. 7,777,651, 265 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Tyler et al, U.S. Pat. No. 5,638,498.
Exhibit 67, Prior Art Chart for U.S. Pat. No. 7,777,651, 86 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing UNI International Standard ISO 3309-1984 (E) [1984]. "Information Processing Systems—Data Communication—High-level Data Link Control Procedures—Frame Structure," 1-6 (1984).
Exhibit 68, Prior Art Chart for U.S. Pat. No. 7,777,651, 236 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Unwired Planet, EP 0928070 A2.
Exhibit 69, Prior Art Chart for U.S. Pat. No. 7,777,651, 80 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Vange et al., U.S. Pat. No. 7,127,518.
Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Wernikoff et al., U.S. Pat. No. 3,394,352.

(56) References Cited

OTHER PUBLICATIONS

Exhibit 71, Prior Art Chart for U.S. Pat. No. 7,777,651, 253 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Willis et al., U.S. Pat. No. 4,745,559; Boilen, U.S. Pat. No. 4,750,135.
Exhibit 72, Prior Art Chart for U.S. Pat. No. 7,777,651, 277 pages, Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing XMill—Hartmut Liefke & Dan Suciu, "XMill: an Efficient Compressor for XML Data," University of Pennsylvania, Philadelphia, Pennsylvania, MS-CIS-99-26 (Oct. 18, 1999); Hartmut Liefke & Dan Suciu, "XMill: an Efficient Compressor for XML Data," Proceedings of SIGMOD, 2000; Hartmut Liefke & Dan Suciu, "An Extensible Compressor for XML Data," SIGMOD Record, vol. 29, No. 1 (Mar. 2000); Dan Suciu, "Data Management on the Web," Presentaton at University of Washington College of Computer Science & Engineering, Seattle, WA (Apr. 4, 2000).
Bormann et al., "Robust Header Compression (ROHC)," Network Working Group Internet-Draft, Sep. 18, 2000, 111 pages.
Effros, M., P.A. Chou and R.M. Gray, "Variable Dimension Weighted Universal Vector Quantization and Noiseless Coding," IEEE 1068-0314/94, 1994, pp. 2-11.
Defendant Bloomberg L.P.'s Invalidity Contentions Pursuant to Patent Local Rule 3-3, *Realtime Data, LLC d/b/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 17 pages.
Appendix A: U.S. Pat. No. 6,624,761 (The "761 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 37 pages.
Appendix B: U.S. Pat. No. 7,161,506 (The "506 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6: 2010-cv-00425 LED-JDL, Oct. 29, 2010, 63 pages.
Appendix C: U.S. Pat. No. 7,400,274 (The 274 Patent), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 95 pages.
Appendix D: U.S. Pat. No. 7,417,568 (The 568 Patent), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL 6:2010-cv-00425 LED-JDL, Oct. 29, 2010, 147 pages.
Appendix E: U.S. Pat. No. 7,714,747 (The "747 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL 6:2010-cv-00425 LED-JDL, Oct. 29, 2010, 137 pages.
Appendix F: Comparision of FAST to the Prior Art, from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL 6:2010-cv-00425 LED-JDL, Oct. 29, 2010, 7 pages.
Defendant Bloomberg L.P.'s Invalidity Contentions Pursuant to Patent Local Rule 3-3 Regarding U.S. Pat. No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 21 pages.
Appendix G: U.S. Pat. No. 7,777,651 (The 651 Patent), Defendant Bloomberg L.P.'s Invalidity Contentions Pursuant to Patent Local Rule 3-3 Regarding U.S. Pat. No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 480 pages.
Rice, Robert F., "Some Practical Universal Noiseless Coding Techniques", Jet Propulsion Laboratory, Pasadena, California, JPL Publication 79-22, Mar. 15, 1979; 140 pgs.
Anderson, J., et al. "Codec squeezes color teleconferencing through digital telephone lines," Electronics 1984, pp. 13-15.
Venbrux, Jack, "A VLSI Chip Set for High-Speed Lossless Data Compression", IEEE Trans. on Circuits and Systems for Video Technology, vol. 2, No. 4, Dec. 1992, pp. 381-391.
"Fast Dos Soft Boot", IBM Technical Disclosure Bulletin, Feb. 1994, vol. 37, Issue No. 2B, pp. 185-186.
"Operating System Platform Abstraction Method", IBM Technical Disclosure Bulletin, Feb. 1995, vol. 38, Issue No. 2, pp. 343-344.
Murashita, K., et al., "High-Speed Statistical Compression using Self-Organized Rules and Redetermined Code Tables", IEEE, 1996 Data Compression Conference.
Coene, W., et al. "A Fast Route for Application of Rate-distortion Optimal Quantization in an MPEG Video Encoder" Proceedings of the International Conference on Image Processing, US., New York, IEEE, Sep. 16, 1996, pp. 825-828.
Rice, Robert, "Lossless Coding Standards for Space Data Systems", IEEE 1058-6393197, Nov. 3-6, 1996, pp. 577-585.
Millman, Howard, "Image and video compression", Computerworld, vol. 33, Issue No. 3, Jan. 18, 1999, pp. 78.
"IBM boosts your memory", Geek.com [online], Jun. 26, 2000 [retrieved on Jul. 6, 2007, www.geek.com/ibm-boosts-your-memory/, 7 pages.
"IBM Research Breakthrough Doubles Computer Memory Capacity", IBM Press Release [online], Jun. 26, 2000 [retrieved on Jul. 6, 20071, www-03.ibm.com/press/us/en/pressrelease/1653.wss, 3 pages.
"ServerWorks to Deliver IBM's Memory expansion Technology in Next-Generation Core Logic for Servers", ServerWorks Press Release [online], Jun. 27, 2000 [retrieved on Jul. 14, 20001, http://www.serverworks.com/news/press/000627.html, 1 page.
Abali, B., et al., "Memory Expansion Technology (MXT) Software support and performance", IBM Journal of Research and Development, vol. 45, Issue No. 2, Mar. 2001, pp. 287-301.
Franaszek, P. A et al., "Algorithms and data structures for compressed-memory machines", IBM Journal of Research and Development, vol. 45, Issue No. 2, Mar. 2001, pp. 245-258.
Franaszek, P. A, et al., "On internal organization in compressed random-access memories", IBM Journal of Research and Development, vol. 45, Issue No. 2, Mar. 2001, pp. 259-270.
Smith, T.B., et al., "Memory Expansion Technology (MXT) Competitive impact", IBM Journal of Research and Development, vol. 45, Issue No. 2, Mar. 2001, pp. 303-309.
Tremaine, R. B., et al., "IBM Memory Expansion Technology (MXT)", IBM Journal of Research and Development, vol. 45, Issue No. 2, Mar. 2001, pp. 271-285.
Yeh, Pen-Shu, "The CCSDS Lossless Data Compression Recommendation for Space Applications", Chapter 16, Lossless Compression Handbook, Elsevier Science (USA), 2003, pp. 311-326.
Expand Networks Accelerator 4000 Series User's Guide, 1999, 101 pgs.
Tridgell, Andrew; "Efficient Algorithms for Sorting and Synchronization"; A thesis submitted for the degree of Doctor of Philosophy at the Australian National University; Feb. 1999; pp. iii-106.
Jung, et al.; "Performance optimization of wireless local area networks through VLSI data compression"; Wireless Networks, vol. 4, 1998; pp. 27-39.

(56) References Cited

OTHER PUBLICATIONS

Baker, K. et al., "Lossless Data Compression for Short Duration 3D Frames in Positron Emission Tomography," 0-7803-1487, May 1994, pp. 1831-1834.
Maier, Mark W.; "Algorithm Evaluation for the Synchronous Data Compression Standard"; University of Alabama: 1995, pp. 1-10.
Bassiouni, et al.; "A Scheme for Data Compression in Supercomputers"; IEEE; 1988; pp. 272-278.
Welch, Terry A.; "A Technique for High-Performance Data Compression"; IEEE; Jun. 1984; pp. 8-19.
ALDC: Adaptive Lossless Data Compression; IBM; 1994, 2 pgs.
ALDC-Macro: Adaptive Lossless Data Compression; IBM Corporation; 1994, 2 pgs.
ALDC1-20S: Adaptive Lossless Data Compression; IBM Corporation; 1994, 2 pgs.
ALDC1-40S: Adaptive Lossless Data Compression; IBM Corporation; 1994, 2 pgs.
ALDC1-5S: Adaptive Lossless Data Compression; IBM Corporation; 1994, 2 pgs.
Craft, David J.; "Data Compression Choice No Easy Call"; Computer Technology Review; vol. XIV, No. 1; Jan. 1994, 2 pgs.
Costlow, Terry; "Sony designs faster, denser tape drive"; Electronic Engineering Times; May 20, 1996, pp. 86-87.
Wilson, Ron; "IBM ups compression ante"; Electronic Engineering Times; Aug. 16, 1993; pp. 1-94.
"IBM Announces New Feature for 3480 Subsystem"; Tucson Today; vol. 12, No. 337, Jul. 25, 1989, 1 pg.
Syngress Media, Inc.; "CCA Citrix Certified Administrator for MetaFrame 1.8 Study Guide"; 2000, 568 pgs.
International Telecommunication Union; "Data Compression Procedures for Data Circuit Terminating Equipment (DCE) Using Error Correction Procedures"; Geneva, 1990, 29 pgs.
Cheng, et al.; "A fast, highly reliable data compression chip and algorithm for storage systems"; IBM J. Res. Develop.; vol. 40, No. 6, Nov. 1996; pp. 603-613.
Cisco Systems; "Cisco IOS Data Compression"; 1997; pp. 1-10.
Craft, D. J.; "A fast hardware data compression algorithm and some algorithmic extensions"; IBM J. Res. Develop.; vol. 42; No. 6; Nov. 6, 1998; pp. 733-746.
Rustici, Robert; "Enhanced CU-SeeMe"1995, Zero in Technologies, Inc., 308 pgs.
White Pine Software; "CU-SeeMe Pro: Quick Start Guide"; Version 4.0 for Windows; 1999, 86 pgs.
"CU-SeeMe Reflector"; www.geektimes.com/michael/CU-SeeMe/faqs/reflectors.html; accessed on Dec. 2, 2008, 5 pgs.
Daniels, et al.; "Citrix WinFrame 1.6 Beta"; May 1, 1996; license. icopyright.net/user/downloadLicense.act?lic=3.7009-9123; accessed Dec. 2, 2008, 4 pgs.
Held, et al.; "Data Compression"; Third Edition; John Wiley & Sons Ltd.; 1991, 150 pgs.
Data Compression Applications and Innovations Workshop; Proceedings of a Workshop held in Conjunction with the IEEE Data Compression Conference; Snowbird, Utah; Mar. 31, 1995, 64 pgs.
Britton, et al.; "Discovery Desktop Conferencing with NetMeeting 2.0"; IDG Books Worldwide, inc.; 1997, 244 pgs.
Sattler, Michael; "Internet TV with CU-SeeMe"; Sams.Net Publishing; 1995; First Edition, 80 pgs.
IBM Microelectronics Comdex Fall '93 Booth Location, 1 pg.
Disz, et al.; "Performance Model of the Argonne Voyager Multimedia Server"; IEEE; 1997; pp. 316-327.
"Downloading and Installing NetMeeting"; www.w4mq.comlhelplh3.htm; accessed on Dec. 2, 2008; 6 pgs.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perspectives"; IEEE Personal Communications, Aug. 1998; pp. 10-19.
Han, et al.; "CU-SeeMe VR Immersive Desktop Teleconferencing"; Department of Computer Science; Cornell University; To appear in ACM Multimedia 1996, 9 pgs.
Howard, et al.; "Parallel Lossless Image Compression Using Huffman and Arithmetic Coding"; 1992; pp. 1-9.
Howard, Paul G.; "Text Image Compression Using Soft Pattern Matching"; The Computer Journal; vol. 40, No. 213; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007, 3 pgs.
Converse, et al.; "Low Bandwidth X Extension"; Protocol Version 1 .O; X Consortium; Dec. 21, 1996, 55 pgs.
Magstar and IBM 3590 High Performance Tape Subsystem Technical Guide; Nov. 1996; IBM International Technical Support Organization, 288 pgs.
MetaFrame Administration Student Workbook; Jun. 1998; Citrix Professional Courseware; Citrix Systems, Inc, 113 pgs.
NCD Wincenter 3.1 : Bringing Windows to Every Desktop, 1998; 2 pgs.
Overview NetMeeting 2.1; Microsoft TechNet; technet.microsoft.com1en-usllibrarylcc767141 (printer).aspx; accessed Dec. 2, 2008; 7 pgs.
NetMeeting 2.1 Resource Kit; Microsoft TechNet; technet.microsoft.com1en-usllibrarylcc767142(printer).aspx; accessed on Dec. 2, 2008, 34 pgs.
Conferencing Standards: NetMeeting 2.1 Resource Kit: Microsoft TechNet; technet.microsoft.com/--us/library/cc767150(printer).aspx; accessed Dec. 2, 2008, 14 pgs.
Summers, Bob; "Official Microsoft NetMeeting Book," Microsoft Press, 1998, 374 pgs.
Zebrose, Katherine L.; "Integrating Hardware Accelerations into Internetworking Switches"; Telco Systems, 1995, 10 pages.
Simpson, et al.; "A Multiple Processor Approach to Data Compression"; ACM; 1998; pp. 641-649, 9 pgs.
"IBM Technology Products Introduces New Family of High-Performance Data Compression Products"; IBM; Aug. 16, 1993, 6 pgs.
ReadMe; PowerQuest Drive Image Pro; Version 3.00; 1994-1999; PowerQuest Corporation; p. 1-6.
Schulzrinne, et al., "RTP Profile for Audio and Video Conferences with Minimal Control," Jan. 1996, www.ietf.org/rfc/rfc1890.txt, accessed on Dec. 3, 2008; 17 pgs.
Zhu, C., "RTP Payload Format H.263 Video Streams," Standards Track, Sep. 1997, pp. 1-12.
Simpson, W., "The Point-To-Point (PPP)," Standards Track, Jul. 1994, pp. i-52.
Reynolds, et al., "Assigned Numbers," Standards Track, Oct. 1994, pp. 1-230.
Deutsch, et al., "ZLIB Compressed Data Format Specification version 3.3," Informational, May 1996, pp. 1-10.
Deutsch, P., "DEFLATE Compressed Data Format Specification version 1.3," Informational, May 1996, pp. 1-15.
Rand, D., "The PPP Compression Control Protocol (CCP)," Standards Track, Jun. 1996, pp. 1-9.
Schneider, et al., "PPP LZS-DCP Compression Protocol (LZS-DCP)," Informational, Aug. 1996, pp. 1-18.
Friend, et al., "PPP Stac LZS Compression Protocol," Informational, Aug. 1996; pp. 1-20.
Schneider, et al., "PPP for Data Compression in Data Circuit-Terminating Equipment (DCE)," Informational, Aug. 1996, pp. 1-10.
Atkins, et al., "PGP Message Exchange Formats," Informational, Aug. 1996, pp. 1-21.
Castineyra, et al., "The Nimrod Routing Architecture," Informational, Aug. 1996, pp. 1-27.

(56) References Cited

OTHER PUBLICATIONS

Freed, et al., "Multipurpose Internet Mail Extensions (MIME) Part Four: Registration Procedures," Best Current Practice, Nov. 1996, pp. 1-21.
Shacham, et al., "IP Payload Compression Protocol (IPComp)," Standards Track, Dec. 1998, pp. 1-10.
Sidewinder 50 Product Manual, Seagate Technology, Inc., 1997, 189 pgs.
IBM RAMAC Virtual Array, IBM, Jul. 1997, 490 pgs.
Bruni, et al., "DB2 for OS/390 and Data Compression" IBM Corporation, Nov. 1998, 172 pgs.
Smith, Mark, "Thin Client/Server Computing Works," WindowsITPro, Nov. 1, 1998, pp. 1-13, license.icopyeght.net/user/downloadLicense.act?lic=3.7009-8355, accessed Dec. 2, 2008.
International Telecommunication Union, "Information Technology—Digital Compression and Coding of Continuous-Tone Still Images—Requirements and Guidelines," 1993, 186 pgs.
International Telecommunications Union, "Information technology—Lossless and near-lossless compression of continuous-tone still images—Baseline," 1999, 75 pgs
Davis, Andrew W., "The Video Answering Machine: Intel Proshare's Next Step," Advanced Imaging, vol. 12, No. 3, Mar. 1997, pp. 28, 30.
Abbott, IIII, Walter D., "A Simple, Low Overhead Data Compression Algorithm for Converting Lossy Compression Processes to Lossless," Naval Postgraduate School Thesis; Dec. 1993, 93 pgs.
Thomborson. Clark, "V.42bis and Other Ziv-Lemoel Variants," IEEE, 1991, p. 460.
Thomborson, Clark, "The V.42bis Standard for Data-Compressing Modems," IEEE, Oct. 1992, pp. 41-53.
Sun, Andrew, "Using and Managing PPP," O'Reilly & Associates, Inc., 1999, 89 pgs.
"What is the V42bis Standard?," www.faqs.org/faqs/compression-faq/partl/section-10.html, accessed on Dec. 2, 2008, 2 pgs.
"The WSDC Download Guide: Drive Image Professional for DOS, OS/2, and Windows," wsdcds01 .watson.ibm.com/WSDC.nsf/Guides/Download/Applications-DriveImage.htm, Accessed Nov. 22, 1999, 4 pgs.
"The WSDC Download Guide: Drive Image Professional," wsdcds01.watson.ibm.com/wsdc.nsf/Guides/Download/Applications-DriveImage.htm, accessed on May 3, 2001, 5 pgs.
APPNOTE-TXT from pkware.txt, Version 6.3.2, PKWARE Inc., 1989, 52 pgs.
CU-SeeMe readme.txt, Dec. 2, 1995, 9 pgs.
CU-seeme txt from indstate.txt, readme.txt for CU-SeeMe version 0.90b1, Mar. 23, 1997, 5 pgs.
Cuseeme txt 19960221 .txt; cuseeme.txt, Feb. 21, 1996, 9 pgs.
Citrix Technology Guide, 1997, 413 pgs.
Lettieri, et al., "Data Compression in the V.42bis Modems," 1992, pp. 398-403.
High Performance x2/V.34+N.42bis 56K BPS Plug & Play External Voice/FAX/Data Modem User's Manual, 1997, 27 pgs.
H.323 Protocols Suite, www.protocols.com/pbook~h323.htm, 26 pages (referenced in Expert Report of Dr. James A. Storer on Invalidity filed on behalf of some of the defendants, filed in *Realtime Data, LLC d/b/A IXO v. Packeteer, Inc. et al.*, Civil Action No. 6:08-cv-00144-LED, U.S. District Court for the Eastern District of Texas, Jun. 10, 2009, and indicated as being last accessed in 2008, see e.g., Exhibit E, p. 12).
LBX X Consortium Algoethms; rzdocs.uni-hohenheim.de/aix~4.33/ext~doc/usr/share/man/info/en~US/a~doc~lib./.x."1;1 X I 1R 6 Technical Specifications, Dec. 1996, 3 pgs.
Basics of Images; www.geom.uiuc.edu/events/courses/1996/cmwh/Stills/basics.html, 1996, 5 pgs.
Parties' Joint Claim Construction and Prehearing Statement Pursuant to P.R. 4-3, filed in *Realtime Data, LLC d/b/a/IXO v. Packeteer, Inc. et al.*, Civil Action No. 6:08-cv-00144-LED; U.S. District Court for the Eastern District of Texas, Feb. 18, 2009, 168 pages.
Declaration of Professor James A. Storer, Ph.D., relating to U.S. Pat. No. 6,604,158, Mar. 18, 2009, 10 pgs.
Declaration of Professor James A. Storer, Ph.D., relating to U.S. Pat. No. 6,601,104, Mar. 18, 2009, 8 pgs.
Declaration of Professor James A. Storer, Ph.D., relating to U.S. Pat. No. 7,321,937, May 4, 2009, 15 pgs.
Declaration of Professor James A. Storer, Ph.D., relating to U.S. Pat. No. 6,624,761, May 4, 2009, 6 pgs.
Declaration of Professor James A. Storer, Ph.D., relating to U.S. Pat. No. 7,378,992, May 20, 2009, 6 pgs.
Declaration of Professor James A. Storer; Ph.D., relating to U.S. Pat. No. 7,161,506, May 26, 2009, 5 pgs.
"Video Coding for Low Bit Rate Communication", International Telecommunication Union (ITU), Recommendation H.263, §3.4 (Mar. 1996) ("ITU H.263"), 52 pgs.
Order Adopting Report and Recommendation of United States Magistrate Judge, *Realtime Data, LLC D/B/A Ixo v. Packeteer, Inc., et al.*, District Court for the Eastern District of Texas, No. 6:08cv144, Aug. 24, 2009, 2 pgs.
Second Amended Answer filed on behalf of Citrix Systems, Inc, (includes allegations of inequitable conduct on at least pp. 24-43) filed in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 45 pgs.
Expert Report of James B. Gambrell on Inequitable Conduct filed on behalf of some of the defendants [Includes Appendices—Exhibits A-I] filed in *Realtime Data LLC d/b/a/IXO v. Packeteer, Inc. et al.*, Civil Action No. 6:08-cv-00144-LED; U.S. District Court for the Eastern District of Texas, Jun. 10, 2009, 199 pgs.
Expert Report of Dr. James A. Storer on Invalidity filed on behalf of some of the defendants [Includes Appendices—Exhibits A-K (Exhibit A has been redacted pursuant to a protective order)] filed in *Realtime Data, LLC d/b/a IXO v. Packeteer, Inc. et al.*, Civil Action No. 6:08-cv-00144-LED; U.S. District Court for the Eastern District of Texas, Jun. 10, 2009, 1090 pgs.
Supplemental Expert Report of Dr. James A. Storer on Invalidity filed on behalf of some of the defendants [Includes Appendices—Exhibits 1-8] filed in *Realtime Data, LLC d/b/a/IXO v. Packeteer, Inc. et al.*, Civil Action No. 6:08-cv-00144-LED; U.S. District Court for the Eastern District of Texas, Jun. 19, 2009, 301 pgs.
Deposition of Dr. James A. Storer conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 27, 2009, 242 pgs.
Deposition of Brian Von Herzen conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 26, 2009, 241 pgs.
Second Amended Complaint filed on behalf of the Plaintiff in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 28 pgs.
Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 46 pgs.
Answers to the Second Amended Complaint and Counterclaims fled by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 37 pgs.
Answers to the Second Amended Complaint and Counterclaims filed by Expand Networks, Inc, Interstate Battery System of America, Inc., and O'Reilly Automotive, Inc. in *Realtime Data,*

(56) References Cited

OTHER PUBLICATIONS

LLC d/b/a/IXO v. Packeteer, Inc. et al., Civil Action No. 6:08-cv-00144-LED; U.S. District Court for the Eastern District of Texas, Feb. 17, 2009, 21 pgs.
Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in Realtime Data, LLC d/b/a/IXO v. Packeteer, Inc. et al., Civil Action No. 6:08-cv-00144-LED; U.S. District Court for the Eastern District of Texas, Feb. 18, 2009, 84 pgs.
Plaintiff's Response to the Answers to the Second Amended Complaint and Counterclaims filed by Citrix Systems, Inc, in Realtime Data, LLC d/b/a/IXO v. Packeteer, Inc. et al., Civil Action No. 6:08-cv-00144-LED; U.S. District Court for the Eastern District of Texas, Mar. 4, 2009, 24 pgs.
Plaintiff's Responses to the Answers to the Second Amended Complaint and Counterclaims filed by F5 Networks, Inc, in Realtime Data, LLC d/b/a/IXO v. Packeteer, Inc. et al., Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by Averitt Express, Inc, in Realtime Data, LLC d/b/a/IXO v. Packeteer, Inc. et al., Civil Action No. 6:08-cv-00144-LED; U.S. District Court for the Eastern District of Texas, Mar. 4. 2009, 5 pgs.
Plaintiff's Responses to the Answers to the Second Amended Complaint and Counterclaims filed by DHL Express, Inc, in Realtime Data, LLC d/b/a/IXO v. Packeteer, Inc. et al., Civil Action No. 6:08-cv-00144-LED; U.S. District Court for the Eastern District of Texas, Mar. 4, 2009, 17 pgs.
Plaintiff's Responses to the Answers to the Second Amended Complaint and Counterclaims filed by Expand Networks, Inc, Interstate Battery System of America, Inc., and O'Reilly Automotive, Inc. in Realtime Data, LLC d/b/a/IXO v. Packeteer, Inc, et al., Civil Action No. 6:08-cv-00144-LED; U.S. District Court for the Eastern District of Texas, Mar. 4, 2009, 15 pgs.
Plaintiff's Responses to the Answers to the Second Atnended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in Realtime Data, LLC d/b/a/IXO v. Packeteer, Inc. et al., Civil Action No. 6:08-cv-00144-LED: U.S. District Court for the Eastern District of Texas Mar. 4, 2009, 34 pgs.
Opening Claim Construction Brief filed in Realtime Data, LLC d/b/a/IXO v. Packeteer, Inc. et al., Civil Action No. 6:08-ov-00144-LED; U.S. District Court for the Eastern District of Texas, Mar. 5, 2009, 36 pgs.
Declaration of Jordar Adler in support of the Opening Claim Construction Brief filed in Realtime Data, LLC d/b/a/IXO v. Packeteer, Inc. et al., Civil Action No. 6:08-cv-00144-LED; U.S. District Court for the Eastern District of Texas, Mar. 5, 2009, 214 pgs.
Motion for Partial Summary Judgment for Invalidity of some of the Patents in Suit for Indefiniteness, including the '104 patent, filed on behalf of the defendants in Realtime Data, LLC d/b/a/IXO v. Packeteer, Inc. et al., Civil Action No. 6:08-cv-00144-LED; U.S. District Court for the Eastern District of Texas, Mar. 16, 2009, 22 pgs.
Declaration of Michele E. Moreland in support Motion for Partial Summary Judgment for Invalidity of some of the Patents in Suit for Indefiniteness, including the '104 patent, filed on behalf of the defendants in Realtime Data, LLC d/b/a/IXO v. Packeteer, Inc. et al., Civil Action No. 6:08-cv-00144-LE, Mar. 16, 2009, 168 pgs.
Declaration of James A. Storer in support Motion for Partial Summary Judgment for Invalidity of some of the Patents in Suit for Indefiniteness, including the '104 patent, filed on behalf of the defendants in Realtime Data, LLC d/b/a/IXO v. Packeteer, Inc. et al., Civil Action No. 6:08-cv-00144-LE, Mar. 16, 2009, 27 pgs.

Joint Defendants Reply regarding Motion for Partial Summary Judgment for Invalidity of some of the Patents in Suit for Indefiniteness, including the '104 patent, filed on behalf of the defendants in Realtime Data, LLC d/b/a/IXO v. Packeteer, Inc. et al., Civil Action No. 6:08-cv-00144-LE, Apr. 2, 2009, 20 pgs.
Responsive Briefs in Support of Claim Construction filed by Blue Coats Systems, Inc., Packeteer, Inc., 7-Eleven, Inc., ABM Industries, Inc., ABM Janitorial Services-South Central, Inc. and Build-A-Bear Workshop, Inc. in Realtime Data, LLC d/b/a/IXO v. Packeteer, Inc. et al., Civil Action No. 6:08-cv-00144-LED; U.S. District Court for the Eastern District of Texas, Mar. 19, 2009, 451 pgs.
Responsive Briefs in Support of Claim Construction filed by F5 Networks, Inc. and Averitt Express, Inc. in Realtime Data, LLC d/b/a/IXO v. Packeteer, Inc. et al., Civil Action No. 6:08-cv-00144-LED: U.S. District Court for the Eastern District of Texas, Mar. 19, 2009, 20 pgs.
Responsive Briefs in Support of Claim Construction filed by Citrix Systems, Inc., Expand Networks, Inc, DHL Express (USA), Inc., Interstate Battery System of America Inc., and O'Reilly Automotive Inc. in Realtime Data, LLC d/b/a/IXO v. Packeteer, Inc. et al., Civil Action No. 6:08-cv-00144-LED; U.S. District Court for the Eastern District of Texas, Mar. 19, 2009, 377 pgs.
Declaration of Dr. James A. Storer filed in Support of the Brief in Support of Claim Construction filed on behalf of F5 Networks, Inc. in Realtime Data LLC d/b/a/IXO v. Packeteer, Inc. et al., Civil Action No. 6:08-cv-00144-LED; U.S. District Court for the Eastern District of Texas, Mar. 19, 2009, 778 pgs.
Defendant Citrix Systems, Inc.'s Motion to Exclude Dr. Brian Von Herzen's Opinions Regarding Claim Construction filed in Realtime Data LLC d/b/a/IXO v. Packeteer, Inc. et al., Civil Action No. 6:08-cv-00144-LED; U.S. District Court for the Eastern District of Texas, Mar. 20, 2009, 244 pgs.
Plaintiff's Opposition to Defendant Citrix Systems, Inc.'s Motion to Exclude Dr. Brian Von Herzen's Opinions Regarding Claim Construction filed in Realtime Data, LLC d/b/a/IXO v. Packeteer, Inc. et al., Civil Action No. 6:08-cv-00144-LED; U.S. District Court for the Eastern District of Texas, Apr. 6, 2009, 20 pgs.
Declaration of Karim Oussayef submitted in support of the Opposition of Plaintiffs Opposition to Defendant Citrix Systems, Inc.'s Motion to Exclude Dr. Brian Von Herzen's Opinions Regarding Claim Construction filed in Realtime Data, LLC d/b/a/IXO v. Packeteer, Inc. et al., Civil Action No. 6:08-cv-00144-LED; U.S. District Court for the Eastern District of Texas, Apr. 6, 2009, 119 pgs.
Order of the Court Denying Defendant Citrix Systems, Inc.'s Motion to Exclude Dr. Brian Von Herzen's Opinions Regarding Claim Construction, Realtime Data, LLC D/B/A Ixo v. Packeteer, Inc., et al., District Court for the Eastern District of Texas, No. 6:08cv144, Apr. 6, 2009, 1 pg.
Parties Joint Submission of Terms to be Heard at the Markman Hearing filed in Realtime Data, LLC d/b/a/IXO v. Packeteer, Inc. et al., Civil Action No. 6:08-cv-00144-LED; U.S. District Court for the Eastern District of Texas, Mar. 24, 2009, 5 pgs.
Order of the Court Regarding the terms to be heard at the Markman Hearing in Realtime Data, LLC d/b/a/IXO v. Packeteer, Inc. et al., Civil Action No. 6:08-cv-00144-LED; U.S. District Court for the Eastern District of Texas, Mar. 24, 2009, 2 pgs.
Transcript of the Markman Hearing held on Apr. 9, 2009 in Realtime Data, LLC d/b/a/IXO v. Packeteer, Inc. et al., Civil Action No. 6:08-cv-00144-LED; U.S. District Court for the Eastern District of Texas, 174 pgs.
Plaintiff's Reply Claim Construction Brief filed in Realtime Data, LLC d/b/a/IXO v. Packeteer, Inc. et al., Civil Action No. 6:08-cv-00144-LED; U.S. District Court for the Eastern District of Texas, Mar. 30, 2009, 30 pgs.
Declaration of Brian von Herzen in Support of the Plaintiff's Reply Claim Contruction Brief filed in Realtime Data, LLC d/b/a/IXO v. Packeteer, Inc. et al., Civil Action No. 6:08-cv-00144-LED; U.S. District Court for the Eastern District of Texas, Mar. 30, 2009, 25 pgs.
F5 Sur-Reply to Plaintiff's Claim Construction Brief filed by some of the defendants in Realtime Data, LLC d/b/a/IXO v. Packeteer,

(56) References Cited

OTHER PUBLICATIONS

*Inc. et al.*, Civil Action No. 6:08-cv-00144-LED; U.S. District Court for the Eastern District of Texas, Apr. 3, 2009, 12 pg.
Citrix Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 13 pgs
Blue Coat Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 12 pgs
Declaration of Michele Moreland in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 8 pgs.
Declaration of James Storer in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 7, 2009, 6 pgs.
Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Apr. 8, 2009, 123 pgs.
Motion for Reconsideration of the Court's Order Denying Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 3 pgs.
Citrix Systems' Opposition to Realtime Data's Motion for Reconstructrion of Realtime's Motion for Leave to Supplement the Parties' Joint Claim Construction, filed in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 6 pgs.
Notice of Agreement to Claim Term between Plaintiff and Defendant filed in *Realtime Data, LLC d/b/a/IXO v. Packeteer, Inc. et al.*, Civil Action No. 6:08-cv-00144-LED; U.S. District Court for the Eastern District of Texas, Apr. 22, 2009, 3 pgs.
Provisional Claim Construction Order issued by the Court on Jun. 2, 2009 in *Realtime Data, LLC d/b/a/IXO v. Packeteer, Inc. et al.*, Civil Action No. 6:08-cv-00144-LED; U.S. District Court for the Eastern District of Texas, 28 pgs.
Citrix Citrix Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 9, 2009, 22 pgs.
Blue Coat Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED, U.S. District Court for the Eastern District of Texas, Jul. 10, 2009, 9 pgs.
F5 Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 10, 2009, 15 pgs.
Comtech AHA Corporation's Complaint in Intervention against the Plaintiff filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 8 pgs.
Report and Recommendation of United States Magistrate Judge on Motion for Partial Summary Judgment issued on Jun. 23, 2009, in *Realtime Data, LLC d/b/a/IXO v. Packeteer, Inc. et al.*, Civil Action No. 6:08-cv-00144-LED; U.S. District Court for the Eastern District of Texas, 22 pgs.
Blue Coat Defendants' Report and Recommendations Regarding Motion for Partial Summary Judgment of Invalidity for Indefiniteness in *Realtime Data, LLC d/b/a/IXO v. Packeteer, Inc. et al.*, Civil Action No. 6:08-cv-00144-LED; U.S. District Court for the Eastern District of Texas, Jul. 8, 2009, 18 pgs.
Plaintiff's Objections to and Partially Unopposed Motion for Reconsideration of United States Magistrate Judge's Claim Construction Memorandum and Order, in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 11 pgs.
Defendant Citrix Opposition to Realtime's Objections to and Partially Unopposed Motion for Reconsideration of Magistrate Love's Claim Construction Memorandum and Order filed by Citrix Systems, Inc., filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 8 pgs.
Defendant F5 Networks, Inc.'s Opposition to Plaintiff's Objections and Partially Unopposed Motion for Reconsideration of Magistrate Love's Claim Construction and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 4 pgs.
Defendants' Response in Opposition to Realtime Data's Objections to and Partially Unopposed Motion for Reconsideration of Magistrate Judge Love's Claim Construction Memorandum and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Realtime Data's Response in Opposition to Defendant Citrix Systems Objections to and Request for Reconsideration of Magistrate's Order Regarding Claim Construction, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 13 pgs.
Plaintiff Realtime Data's Response in Opposition to Blue Coat Defendants' Objection to Magistrate's Memorandum Opinion and Order Regarding Claim Construction, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Plaintiff's selected Responses to Defendant Citrix Systems's Interrogatories and First Set of Requests for Admission filed in *Realtime Data, LLC d/b/a/IXO v. Packeteer, Inc. et al.*, Civil Action No. 6:08-cv-00144-LED; U.S. District Court for the Eastern District of Texas, Jul. 15, 2009, 151 pgs.
Script for Defendants' Joint Claim Construction Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008, and terminated Feb. 2, 95 pgs.
Preliminary Data Sheet, 9600 Data Compressor Processor, Hi/fn, 1997-99, HIFN 000001-68, 68 pgs.
Data Sheet, 9751 Data Compression Processor, 1997-1999, HIFN 000069-187, 119 pgs.
Signal Termination Guide, Application Note, Hi/fn, 1997-1998, HIFN 000188-194, 7 pgs
How LZS Data Compression Works, Application Note, Hi/fn, 1997-1999, HIFN 000195-207, 13 pgs.
Reference Hardware, 9751 Compression Processor, Hi/fn, 1997-99, HIFN 000208-221, 14 pgs.
Using 9751 in Big Endian Systems, Application Note, Hi/fn, 1997-99, HIFN 000222-234, 13 pgs.
Specification Update. 9751 Compression Processor, Hi/fn, 1997-2000, HIFN 000235-245, 11 pgs.
9732AM Product Release, Hi/fn, 1994-99, Fi HIFN 000246-302, 57 pgs.

(56) References Cited

OTHER PUBLICATIONS

Data Sheet, 9732A Data Compression Processor, Hi/fn, 1997-99, HIFN 000303-353, 51 pgs.
9711 to 7711 Migration, Application Note, Hi/fn, 1997-99, HIFN 000354-361, 8 pgs.
Specification Update, 9711 Data Compression Processor, Hi/fn, 1997-99, HIFN 000362-370, 9 pgs.
Differences Between the 9710 & 9711 Processors, Application Note, Hi/fn, 1997-99, HIFN 000371-77, 7 pgs.
Specification Update, 9710 Data Compression Processor, Hi/fn, 1997-99, HIFN 000378-388, 11 pgs.
9706/9706A Data Compression Coprocessor Data Sheet, Stac Electronics, 1991-97, HIFN 000389-473, 85 pgs.
9705/9705A Data Compression Coprocessor, Stac Electronics, 1988-96, HIFN 000474-562, 88 pgs.
9705/9705A Data Compression Coprocessor Data Sheet, Stac Electronics, 1988-96, HIFN 000563-649, 87 pgs.
9700/9701 Compression Coprocessors, Hi/fn, 1997, HIFN 000650-702, 53 pgs.
Data Sheet 9610 Data Compression Processor, Hi/fn, 1997-98, HIFN 000703-744, 42 pgs.
Specification Update 9610 Data Compression Processor, Hi/fn, 1997-99, HIFN 000745-751, 7 pgs.
9705 Data Compression Coprocessor, Stac Electronics, 1988-92, HIFN 000752-831, 80 pgs.
9705 Network Software Design Guide, Application Note, Stac Electronics, 1990-91, HIFN 000832-861, 30 pgs.
Data Sheet 9601 Data Compression Processor, Hi/fn, May 21, 1998, HIFN 000862-920, 59 pgs.
7751 Encryption Processor Reference Kit, Hi/fn, Apr. 1999, HIFN 000921-1114, 194 pgs.
Hardware Data Book, Hi/fn, Nov. 1998, HIFN 001115-1430, 316 pgs.
Data Compression Data Book, Hi/fn, Jan. 1999 HIFN 001431-1889, 459 pgs.
Reference Software 7751 Encryption Processor, Hi/fn, Nov. 1998, HIFN 002164-2201, 38 pgs.
Interface Specification for Synergize Encoding/Decoding Program, JPB, Oct. 10, 1997, HIFN 002215-2216, 2 pgs.
Anderson, Chip, Extended Memory Specification Driver, 1998, HIFN 002217-2264, 48 pgs.
Whiting, Doug, LZS Hardware API, Mar. 12, 1993, HIFN 002265-68, 4 pgs.
Whiting, Doug, Encryption in Sequoia, Apr. 28, 1997, HIFN 002309-2313, 5 pgs.
LZS221-C Version 4 Data Compression Software, Data Sheet, Hi/fn, 1994-97, HIFN 002508-2525, 18 pgs.
eXtended Memory Specification (XMS), ver. 2.0, Microsoft, Jul. 19, 1988, HIFN 002670-2683, 14 pgs.
King, Stanley, Just for Your Info—From Microsoft 2, May 4, 1992, HIFN 002684-2710, 27 pgs.
eXtended Memory Specification (XMS), ver. 2.0, Microsoft, Jul. 19, 1988, HIFN 002711-2724, 14 pgs.
Advanced LZS Technology (ALZS), Whitepaper, Hi/fn, Jun. 1, 1998, HIFN 002725-2727, 3 pgs.
Secure Tape Technology (STT) Whitepaper, Hi/fn, Jun. 1, 1998, HIFN 002728-2733, 6 pgs.
SSLRef 3.0 API Details, Netscape, Nov. 19, 1996, HIFN 002734-2778, 45 pgs.
LZS221-C Version 4 Data Compression Software Data Sheet , Hi/fn, 1994-97, HIFN 002779-2796, 18 pgs.
MPPC-C Version 4 Data Compression Software Data Sheet, Hi/fn, 1994-1997, HIFN 002797-2810, 14 pgs.
Magstar MP Hardware Reference B Series Models Document GA32-0365-01, 1996-1997, [IBM_1_601 pp. 1-338], 338 pages.
Magstar MP 3570 Tape Subsystem, Operator Guide, B-Series Models, 1998-1999, [IBM_1_601 pp. 339-525], 188 pages.
Preview, IBM Magstar 3590 Tape System Enhancements, Hardware Announcement, Feb. 16, 1999, [IBM_1_601 pp. 526-527], 2 pgs.
New IBM Magstar 3590 Models E11 and E1A Enhance Tape Drive Performance, Hardware Announcement, Apr. 20, 1999, [IBM_1_601 pp. 528-540] 13 pgs.
New IBM Magstar 3590 Model A60 Dramatically Enhances Tape Drive Performance, Hardware Announcement Jul. 27, 1999, [IBM_1_601 pp. 541-550] 10 pgs.
The IBM Magstar MP Tape Subsystem R.ovides Fast Access to Data, Sep. 3, 1996; Announcement No. 196-176, [IBM_1_601 pp. 551-563] 13 pgs.
IBM 3590 High Performance Tape Subsystem, Apr. 10, 1995, Announcement 195-106, [IBM_1_601 pp. 564-581] 18 pgs.
Standard ECMA-222 (Jun. 1995): ECMA—Standardizing Information and Communications Systems, Adaptive Lossless Data Compression Algorithm, [IBM_1_601 pp. 582-601] 20 pgs.
IBM 3590 and 3494 Revised Availability, Hardware Announcement Aug. 8, 1995, [IBM_743_1241 p. 1] 1 pg.
Direct Delivery of IBM 3494, 3466, and 3590 Storage Products, Hardware Announcement, Sep. 30, 1997, Announcement 197-297, [IBM_743_1241 pp. 2-3] 2 pgs.
IBM Magstar 3590 Enhances Open Systems, Hardware Announcement Feb. 9, 1996, Announcement 198-014, [IBM_743_1241 pp. 4-7] 4 pgs.
Hardware Withdrawal: IBM Magstar 3590 A00 Controller—Replacement Available, Announcement No. 197-267, Withdrawal Announcement, Dec. 9, 1997, [IBM_743_1241 p. 9] 1 pg.
IBM Magstar 3590 Tape Subsystem, Introduction and Planning Guide, Document No. GA32-0329007, [IBM_743_1241 pp. 10-499] 490 pgs.
NetMeeting 2.0 Reviewers Guide, Apr. 1997, [MSCS_298_339] 42 pgs.
Microsoft NetMeeting Compatible Products and Services Directory, Apr. 1997, [MSCS_242_297] 56 pgs.
Microsoft NetMeeting "Try This!" Guide, 1997, [MSCS_340_345] 6 pgs.
The Professional Companion to NetMeeting 2—The Technical Guide to Installing, Configuring, and Supporting NetMeeting 2.0 in Your Organization—Microsoft NetMeeting 2.0, 1996-97, [MSCS_2_241] 240 pgs.
CUSeeMe 3.1.2 User Guide, Nov. 1998, [RAD_1_220] 220 pgs.
MeetingPoint Conference Server Users Guide 3.0, Nov. 1997, [RAD_221_548] 328 pgs.
MeetingPoint Conference Server Users Guide 4.0.2, Dec. 1999, [RAD_549 _818] 270 pgs.
MeetingPoint Conference Service Users Guide 3.5.1, Dec. 1998, [RAD_819_1062] 244 pgs.
Enhanced CUSeeMe—Authorized Guide, 1995-1996, [RAD_1063_1372] 310 pgs.
Meeting Point Reader File, Jun. 1999, [RAD_1437_1445] 9 pgs.
Press Release—White Pine Announces Launch of MeetingPoint Conferences Server, Oct. 9, 1997, [RAD_1738_1739] 2 pgs.
Press Release—Leading Network Service Providers Line Up to Support White Pine's MeetingPoint Conference Server Technology, Oct. 9, 1997, [RAD_1740_1743] 4 pgs.
BYTE—A New MeetingPoint for Videoconferencing, Oct. 9, 1997, [RAD_1744_1750] 7 pgs.
Declaration of Patrick Gogerty, *Realtime Data, LLC D/B/A Ixo v. Packeteer, Inc, et al.*, District Court for the Eastern District of Texas, No. 6:08cv144, executed May 8, 2009, 3 pgs.
Other Responses to Interrogatories, Requests for Admission, and Objections to Requests for Admission filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Deposition Transcript of persons involved in litigation, including inventor James Fallon, and third-party witnesses Jim Karp, Ke-Chiang Chu, and Frank V. DeRosa filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Office of Rebuttal Expert Reports of Dr. Brian Von Herzen, Lester L. Hewitt and Dr. James A. Storer, and Expert Reports of Dr. James

(56) References Cited

OTHER PUBLICATIONS

A. Storer and Dr. Nathaniel Polish filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).

Proposed Amended Infringement Contentions filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).

Documents Concerning Agreements for Meiations and Mediation Proceedings Between Plaintiffs and Some of the Defendants filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).

Plaintiff's Opposition to Joint Defendants' Motion for Parital Summary Judgment of Invalidity of some of the patents in Suit for indefiniteness, including the '104 patent, Blue Coat's response to this objection, Blue Coat's Reply to Plaintiff's response and Plaintiff's Sur-Reply to Blue Coat's Reply filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document not submitted).

Plaintiff's Amended P.R. 3-1 Disclosure and Infringement Contentions, Defendants' Motions to Strike unauthorized portions of these disclosures, and Sur-Replies to these Motions filed in *Realtime Data, LLC d/b/a/IXO v. Packeteer, Inc., et al.*, Civil Action No. 6:08-cv-00144-LED; District Court for the Eastern District of Texas, filed Apr. 18, 2008 and terminated Feb. 2, 2010. (PTO Notified—Document not submitted)

Expert Report of Dr. James A. Storer Regarding Non-Infringement that contains positions related to the validity of the patents in suit filed in *Realtime Data, LLC d/b/a/IXO v. Packeteer, Inc., et al.*, Civil Action No. 6:08-cv-00144-LED; District Court for the Eastern District of Texas, filed Apr. 18, 2008 and terminated Feb. 2, 2010. (PTO Notified—Document not submitted).

*Thomson Reuters Corporation v. Realtime Data, LLC D/B/A IXO*, No. 09 CV 7868 (S.D.N.Y.) Sep. 23, 2009 Order Dismissing Case in Favor of Texas Action, 1 pg.

*Thomson Reuters Corporation v. Realtime Data, LLC D/B/A IXO*, No. 09 CV 7868 (S.D.N.Y.) Sep. 30, 2009 Response to Order re Transfer, 103 pgs.

*Thomson Reuters Corporation v. Realtime Data, LLC D/B/A IXO*, No. 09 CV 7868 (S.D.N.Y.) Oct. 7, 2009 Reply Letter regarding Judge Berman Sep. 23, 2009 Order re Transfer, 182 pgs.

*Thomson Reuters Corporation v. Realtime Data, LLC D/B/A IXO*, No. 09 CV 7868 (S.D.N.Y.) Oct. 15, 2009 Order Staying Case Until TX Action Decided, 3 pgs

*Thomson Reuters Corporation v. Realtime Data, LLC D/B/A IXO*, No. 09 CV 7868 (S.D.N.Y.) Sep. 11, 2009 Complaint—DJ SD NY, 41 pgs.

*Thomson Reuters Corporation v. Realtime Data, LLC D/B/A IXO*, No. 09 CV 7868 (S.D.N.Y.) Sep. 11, 2009 Rule 7.1 Disclosure Statement for Thomson Reuters, 1 pg.

*Thomson Reuters Corporation v. Realtime Data, LLC D/B/A IXO*, No. 09 CV 7868 (S.D.N.Y.) Order—Stay Pending Transfer Motion Confirmed Oct. 15, 2009, 3 pgs.

Opinion and Order of United States Magistrate Judge regarding Claim Construction, *Realtime Data, LLC D/B/A Ixo v. Packeteer, Inc., et al.*, District Court for the Eastern District of Texas, No. 6:08cv144, issued Jun. 22, 2009, 75 pgs.

Script for Realtimes' Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 69 pgs.

Opinion and Order of United States Magistrate Judge regarding Plaintiff's Motion to Strike Unauthorized New Invalidity Theories from Defendant Citrix's Opening and Reply Briefs in Support of its Motion for Summary Judgment of Invalidity, *Realtime Data, LLD/B/A Ixo v. Packeteer, Inc., et al.*, District Court for the Eastern District of Texas, No. 6:08cv144, issued Dec. 8, 2009, 10 pgs.

Defendant Citrix Systems, Inc.'s Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.

Expand Networks' 35 U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.

Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.

Order of United States Magistrate Judge regarding Motion to Limit the Number of Prior Art References to be Asserted at Trial, *Realtime Data, LLC D/B/A Ixo v. Packeteer, Inc., et al.*, District Court for the Eastern District of Texas, No. 6:08cv144, filed Dec. 21, 2009, 6 pgs.

Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.

Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 38 pgs.

Defendant Citrix Systems, Inc.'s Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 29, 2009, 6 pgs.

Docket Listing downloaded Mar. 10, 2010 for *Realtime Data, LLC D/B/A Ixo v. Packeteer, Inc., et al.*, District Court for the Eastern District of Texas, No. 6:08cv144, filed Apr. 18, 2008, 165 pgs.

CCITT Draft Recommendation T.4, RFC 804, Jan. 1981, 12 pgs

SNA Formats, IBM Corporation, 14th Ed., Nov. 1993, 3 pgs.

Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.

Forchhammer and Jensen, "Data Compression of Scanned Halftone Images," IEEE Trans. Commun., vol. 42, Feb.-Apr. 1994, pp. 1881-1893.

Christopher Eoyang et al., "The Birth of the Second Generation: The Hitachi S-820/80," Proceedings of the 1998 ACM/IEEE Conference on Supercomputing, pp. 296-303 (1998).

Transcript for Hearing on Motions for Summary Judgment, *Realtime Data, LLC d/b/a IXO v. Packeteer, Inc., et al.*, Civil Action No. 6:08-cv-00144-LED; U.S. District Court for the Eastern District of Texas, 133 pgs, Nov. 8, 2009.

Transcript for Motions Hearing (Including Supplemental Claim Construction Hearing), *Realtime Data, LLC d/b/a IXO v. Packeteer, Inc., et al.*, Civil Action No. 6:08-cv-00144-LED; U.S. District Court for the Eastern District of Texas, 88 pgs, Nov. 10, 2009.

Nelson, "The Data Compression Book," M&T Books (2nd Ed. 1996), 283 pgs.

"The Authoritative Dictionary of IEEE Standards Terms," 7th Ed. 2000, p. 273.

Larousse Dictionary of Science and Technology, 1st Ed., 1995, p. 916.

Plaintiff Realtime Data's Motion to Strike Unauthorized New Invalidity Theories from Defendant Citrix's Opening and Reply Briefs in Support Its Motion for Summary Judgment of Invalidity of U.S. Pat. No. 7,352,300 (Sep. 22, 2009),14 pgs.

(56) References Cited

OTHER PUBLICATIONS

Realtime Data's Reply in Support of Its Motion to Strike Unauthorized New Invalidity Theories from Defendant Citrix's Opening and Reply Briefs in Support of Its Motion for Summary Judgment of Invalidity of U.S. Pat. No. 7,352,300 (Oct. 19, 2009), 17 pgs.
Defendant Citrix Systems, Inc.'s Sur-Reply in Opposition to Realtime Data LLC's Motion to Strike Unauthorized New Invalidity Theories from Citrix's Opening and Reply Briefs in Support of Its Motion for Summary Judgment of Invalidity of U.S. Pat. No. 7,352,300 (Oct. 30, 2009), 9 pgs.
Blue Coat Defendants' Response to Realtime Data, LLC's Notice Re Proposed Construction of "Data Storage Rate" (Nov. 11, 2009), 3 pgs.
Order for Supplemental Briefing on Blue Coat 7-11 Motion for Partial SJ on Non-infringement of U.S. Pat. No. 6,601,104 (Nov. 13, 2009), 6 pgs.
Memorandum Opinion and Order (Nov. 23, 2009), 15 pgs.
Memorandum Opinion and Order (Dec. 8, 2009), 10 pgs.
Expand's Conclusions of Fact and Law Regarding Defense of Inequitable Conduct Concerning the Unenforceability of U.S. Pat. No. 7,321,937 (Nov. 12, 2009), 3 pgs.
Realtime Data's Sur-reply Supplemental Claim Construction Brief Concerning Whether the Asserted Claims of the '104 Patent are Product Claims (Dec. 23, 2009), 6 pgs.
Order regarding Defendant Citrix Systems, Inc's Notice of Other Prior Art References Within the Scope of the References Discussed at the Dec. 17, 2009 Hearing (Dec. 30, 2009), 3 pgs.
Network Working group RFC 2068 (Jan. 1997), 163 pgs.
Network Working group RFC 2616 (Jun. 1999), 114 pgs.
Network Working group RFC 1945 (May 1996), 61 pgs.
Network Working group RFC 1950 (May 1996), 10 pgs.
Network Working group RFC 1951 (May 1996), 15 pgs.
Network Working group RFC 1952 (May 1996), 12 pgs.
Notice of Plaintiff Realtime Data LLC's Proposed Supplemental Construction of "Data Storage Rate" in Response to the Court's Comments During the Nov. 10, 2009 Supplemental Claim Construction Hearing (Nov. 10, 2009), 4 pgs.
Citrix's Amended Invalidity Contentions, Including Appendices G2-G8 (Dec. 15, 2009), 509 pgs.
"Plaintiff Realtime Data's Opposition to Defendant F5 Networks' Motion for Summary Judgment that Claims 18-20 of U.S. Pat. No. 7,321,937 are Invalid (Aug. 25, 2009)" Civil Action No. 6:08-cv-00144-LED Jury Trial Demanded Filed Under Seal; In the United States District Court for the Eastern District of Texas Tyler Division. [Under Seal—Document Not Submitted].
Declaration of Dr. James W. Modestino relating to U.S. Pat. No. 7,161,506, Mar. 15, 2010, 49 pgs.
Second Declaration of Dr. George T. Ligler under 37 C.F.R. §1.132 relating to U.S. Pat. No. 6,601,104, executed May 5, 2010, 3 pgs.
Realtime Data, LLC Complaint for Patent Infringement, *Realtime Data, LLC D/B/A IXO* v. *CME Group Inc.*, et al. (II), District Court for the Eastern District of Texas, No. 6:10-cv-246, filed May 11, 2010, 24 pages.
Realtime Data, LLC Complaint for Patent Infringement, *Realtime Data, LLC D/B/A IXO* v. *Thompson Reuters Corporation, et al.* (II), District Court for the Eastern District of Texas, No. 6:10-cv-247, filed May 11, 2010, 15 pages.
Realtime Data, LLC Complaint for Patent Infringement, *Realtime Data, LLC D/B/A IXO* v.*Morgan Stanley, et al.* (II), District Court for the Eastern District of Texas, No. 6:10-cv-248, filed May 11, 2010, 27 pages.
Declaration of Padmaja Chinta in Support of Realtime Data's Reply Claim Construction Brief (including Exhibits A-S), *Realtime Data, LLC D/B/A IXO* v. *Packeteer, Inc., et al.*, District Court for the Eastern District of Texas, No. 6:08-cv-00144-LED, dated Mar. 30, 2009, 217 pages.
Extended European search report issuing from European Patent Application 09150508.1, Aug. 3, 2010, 5 pgs.

Complaint, *Thomson Reuters Corporation* v. *Realtime Data, LLC D/B/A IXO*, Southern District of New York, No. 2:09-cv-7868-RMB, filed Sep. 11, 2009, 6 pages.
Realtime Data, LLC Complaint for Patent Infringement, *Realtime Data, LLC D/B/A IXO* v. *MetroPCS Texas, LLC et al.*, District Court for the Eastern District of Texas, No. 6:10-cv-00493, filed Sep. 23, 2010, 14 pages.
Complaint and Demand for Jury Trial, *Chicago Board Options Exchange, Incorporated* v. *Realtime Data, LLC D/B/A IXO*, United States District Court for the Northern District of Illinois, No. 09 CV 4486, filed Jul. 24, 2009, 6 pages.
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 15 pgs.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas, Jul. 31, 2009, 3 pgs.
Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO* v. *Packeteer, Inc. et al.*, Civil Action No. 6:08-cv-00144-LED; U.S. District Court for the Eastern District of Texas, Aug. 3, 2009, 3 pgs.
Defendants' Invalidity Contentions, *Realtime Data, LLC d/b/a IXO*, vs. *MetroPCS Texas, LLC, et al.*, Case No. 6:10-CV-00493-LED, in the United States District Court Eastern District of Texas Tyler Division, Jun. 17, 2011, 138 pages.
Appendix A, Claim Charts A-1 to A-25, from Invalidity Contentions, *Realtime Data LLC* v. *MetroPCS Texas, LLC, et al.*, Case No. 6:10-CV-00493-LED, Jun. 17, 2011, 173 pages.
Appendix B, Claim Charts B-1 to B-23, from *Realtime Data LLC* v. *MetroPCS Texas, LLC et al.*, Case No. 6:10-CV-00493-LED, Jun. 17, 2011, 809 pages.
Appendix C, Claim Charts C-1 to C-22, from *Realtime Data LLC* v. *MetroPCS Texas, LLC et al.*, Case No. 6:10-CV-00493-LED, Jun. 17, 2011, 530 pages.
Appendix D, Claim Charts D-1 to D-16, from *Realtime Data LLC* v. *MetroPCS Texas, LLC et al.*, Case No. 6:10-CV-00493-LED, Jun. 17, 2011, 253 pages.
Appendix E, Claim Charts E-1 to E-20, from *Realtime Data LLC* v. *MetroPCS Texas, LLC et al.*, Case No. 6:10-CV-00493-LED, Jun. 17, 2011, 397 pages.
Apnendix F. Claim Charts F-1 to F-19, from *Realtime Data LLC* v. *MetroPCS Texas, LLC et al.*, Case No. 6:10-CV-00493-LED, Jun. 17, 2011, 462 pages.
Appendix G, Claim Charts G-1 to G-18, from *Realtime Data LLC* v. *MetroPCS Texas, LLC et al.*, Case No. 6:10-CV-00493-LED, Jun. 17, 2011, 548 pages.
Appendix H, Claim Charts H-1 to H-22, from *Realtime Data LLC* v. *MetroPCS Texas, LLC et al.*, Case No. 6:10-CV-00493-LED, Jun. 17, 2011, 151 pages.
Amir et al., "An Application Level Video Gateway," 1995, 11 pages.
Katz, Randy H. and Eric A. Brewer, "The Bay Area Research Wireless Access Network: Towards a Wireless Overlay Internetworking Architecture," Computer Science Division, EECS Department, U.C. Berkeley, 1995, 56 pages.
Katz, R.H. and E.A. Brewer, "The Bay Area Research Wireless Access Network (BARWAN)," UC Berkeley, 1995, 68 pages.
Bruckman, Alfred and Andreas UHL, "Selective Medical Image Compression Using Wavelet Techniques," Jun. 1998, 23 pages.
Crowley et al., "Dynamic Compression During System Save Operations," May 1, 1984, 3 pages.
Hershkovits, "Universal Data Compression with Finite-Memory," Feb. 1995, 99 pages.
Katz et al., "The Bay Area Research Wireless Access Networks (BARWAN)," 1996, 6 pages.

(56) References Cited

OTHER PUBLICATIONS

Klein, "Compression and Coding in Information Retrieval Systems," Jun. 1987, pp. vii-viii, 1-4, 10-15, 22-30, 43-48, 62-66, 86-89, 108-111.

Reghbati, "An Overview of Data Compression Techniques," Apr. 1981, pp. 71-75.

Defendants' Joint Preliminary Invalidity Contentions filed in *Realtime Data, LLC D/B/A IXO v. Packeteer, Inc., et al.*, Civil Action No. 6:08-cv-144-LED, United States District Court for the Eastern District of Texas Tyler Division, Dec. 8, 2008, 19 pages.

Appendix A, Claim Charts A-1 to A-46, from *Realtime Data, LLC v. Packeteer, Inc., et al.*, Civil Action No. 6:08-cv-144-LED, Dec. 8, 2008, 345 pages.

Appendix B, Claim Charts B-1 to B-17, from *Realtime Data, LLC v. Packeteer, Inc., et al.*, Civil Action No. 6:08-cv-144-LED, Dec. 8, 2008, 1893 pages.

Appendix C, Claim Charts C-1 to C-34, from *Realtime Data, LLC v. Packeteer, Inc., et al.*, Civil Action No. 6:08-cv-144-LED, Dec. 8, 2008, 1,055 pages.

Appendix D, Claim Charts D-1 to D-14, from *Realtime Data, LLC v. Packeteer, Inc., et al.*, Civil Action No. 6:08-cv-144-LED, Dec. 8, 2008, 197 pages.

Appendix E, Claim Charts E-1 to E-11, from *Realtime Data, LLC v. Packeteer, Inc., et al.*, Civil Action No. 6:08-cv-144-LED, Dec. 8, 2008, 735 pages.

Appendix F, Claim Charts F-1 to F-11, from *Realtime Data, LLC v. Packeteer, Inc., et al.*, Civil Action No. 6:08-cv-144-LED, Dec. 8, 2008, 775 pages.

Appendix G Claim Charts G-1 to G-8 from *Realtime Data, LLC v. Packeteer, Inc., et al.*, Civil Action No. 6:08-cv-144-LED, Dec. 8, 2008, 567 pages.

Appendix H, Claim Charts H-1 to H-18, from *Realtime Data, LLC v. Packeteer, Inc., et al.*, Civil Action No. 6:08-cv-144-LED, Dec. 8, 2008, 97 pages.

Appendix I, Claim Charts I-1 to I-18, from *Realtime Data, LLC v. Packeteer, Inc., et al.*, Civil Action No. 6:08-cv-144-LED, Dec. 8, 2008, 146 pages.

Appendix J, Prior Art Chart, from *Realtime Data, LLC v. Packeteer, Inc., et al.*, Civil Action No. 6:08-cv-144-LED, Dec. 8, 2008, 25 pages.

Realtime Data, LLC's [Corrected] P.R. 3-1 Disclosures and Preliminary Infringement Contentions filed in *Realtime Data, LLC D/B/A/IXO v. Packeteer, Inc., et al.*, Civil Action No. 6:08-cv-00144-LED, United States District Court for the Eastern District of Texas Tyler Division, Oct. 8, 2008, 591 pages.

Amended Answer and Counterclaims of Defendants Blue Coat Systems, Inc., Packeteer, Inc., 7-Eleven, Inc., ABM Industries, Inc., ABM Janitorial Services—South Central, Inc., and Build-A-Bear Workshop, Inc. to Plaintiff's First Amended Complaint for Patent Infringement filed in *Realtime Data, LLC d/b/a/IXO v. Packeteer, Inc., et al.*, Civil Action No, 6:08cv144-LED, United States District Court for the Eastern District to Texas Tyler Division, Oct. 28, 2008, 81 pages.

"Packeteer iShaper, PacketShaper and iShared Appliances Drive Intelligent Application Acceleration Across Coogee Resources Wide Area Network", Business Wire, accessed on Aug. 25, 2008, 2 pages.

Whiting, Doug, "Deflate vs. LZS", Nov. 2000, 2 pages.

"The Packeteer Q4 2005 Financial Conference Call", Jan. 26, 2006, 9 pages.

"Data Compression Ratio", Wikipedia, the free encyclopedia, accessed on Aug. 10, 2011 from http://en.wikipedia.org/wiki/Data_compression_ratio, 2 pages.

"Hard Disk Data Control Method", IBM Technical Disclosure Bulletin NN9302301, vol. 36, No. 2, Feb. 1993, pp. 301-302.

Defendants' Supplemental Invalidity Contentions, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed May 17, 2012, 54 pages.

Expert Report of Michael Brogioli Regarding Asserted Claims of U.S. Pat. No. 7,417,568 and 7,777,651, with Exhibit A: List of Materials Reviewed, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 26 pages.

Exhibit 1, Curriculum Vitae of Michael C. Brogioli, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 9 pages.

Exhibit 2, [Proposed] Order Adopting the Parties' Agreed Claim Constructions, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc, et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.

Exhibit 3, The Parties' Disputed Claim Constructions, revised May 3, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.

Exhibit 4, E-Mail Correspondence between James Shalek and Brett Cooper, dated May 17 and 18, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.

Exhibit 5, Source Code Chart for U.S. Pat. No. 7,417,568 comparing representative elements of the NQDSLIB source code (Apr. 29, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.

Exhibit 6, Source Code Chart for U.S. Pat. No. 7,417,568 comparing representative elements of the NQDSLIB source code (May 2, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.

Exhibit 7, Source Code Chart for U.S. Pat. No. 7,777,651 comparing representative elements of the NQDSLIB source code (Apr. 29, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 21 pages.

Exhibit 8, Source Code Chart for U.S. Pat. No. 7,777,651 comparing representative elements of the NQDSLIB source code (May 2, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil

(56) References Cited

OTHER PUBLICATIONS

Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 21 pages.

Invalidity Expert Report of Dr. James A. Storer (Redacted), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 227 pages.

Defendants' Claim Construction Tutorial, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 54 pages.

Opinion and Order (Markman), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 22, 2012, 41 pages.

Opinion and Order (Partial Motion for Summary Judgment re Written Descriptiom "Data Packets"), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 26, 2012, 8 pages.

Opinion and Order (Partial Motion for Summary Judgment re Data Decompression) filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 27, 2012, 21 pages.

Technology Tutorial (.exe file), presentation filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 2012 (submitted on accompanying CD-ROM).

Lilley, J., et al., "A Unified Header Compression Framework for Low-Bandwidth Links," MobiCom 2000, Aug. 6-11, 2000. Boston, MA, 12 pages.

"WAN Link Compression on HP Routers," Hewlett Packard Application Note, May 1995, 7 pages.

"User Manual for XMill," 2001, 21 pages.

"High Speed Network, Developer's Guide," Standard & Poor's Comstock, Version 1.1, 1994, pp. 1-42, and 53-124.

Larmouth, J., "ASN.1 Complete", Academic Press, 2000, pp. xxi-xxvii, 1-45, 115-130, 168-172, 174, 270-276, and 443-472.

Petty, J., "PPP Hewlett-Packard Packet-by-Packet Compression (HP PPC) Protocol," draft-ietf-ppext-hpppc-00.txt., Oct. 1993, 7 pages.

Friend, R., et al., "IP Payload Compression Using LZS," Network Working Group, Request for Comments: 2395, Category: Informational. Dec. 1998; 9 pages.

"Information technology—Abstract Syntax Notation One (ASN.1): Specification of basic notation," Series X: Data Networks and Open System Communications, OSI networking and system aspects— Abstract Syntax Notation One (ASN.1), International Telecommunication Union, ITU-T Recommendation X.680, Dec. 1997, 109 pages.

Information technology—ASN.1 encoding rules—Specification of Packed Encoding Rules (PER), Series X: Data Networks and Open System Communications, OSI networking and system aspects— Abstract Syntax Notation One (ASN.1), International Telecommunication Union, ITU-T Recommendation X.691, Dec. 1997, 51 pages.

Opinion and Order, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Sep. 24, 2012, 48 pages.

Memorandum Opinion and Order, filed in *Realtime Data, LLC d/b/a IXO, v. MetroPCS Texas, LLC, et al.*, Civil Action No. 6:10-cv-00493, United States District Court for the Eastern District of Texas, filed Oct. 1, 2012, 22 pages.

T-Mobile's Motion for Leave to Supplement Trial Witness List & Invalidity Contentions, filed in *Realtime Data, LLC d/b/a IXO, v. MetroPCS Texas, LLC, et al.*, Civil Action No. 6:10-cv-00493, United States District Court for the Eastern District of Texas filed Dec. 17, 2012, 16 pages.

Exhibit 2, Defendant T-Mobile's Supplemental Invalidity Contentions, filed in *Realtime Data, LLC d/b/a IXO, v. MetroPCS Texas, LLC, et al.*, Civil Action No. 6: 10-cv-00493, United States District Court for the Eastern District of Texas, filed Dec. 17, 2012, 13 pages.

Exhibit 3, FNLTD-74478, Flash Networks: Commercial Part Written by Flash Networks for Cegetel, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 6 pages.

Exhibit 4, FNLTD-74444, Response to Cegetel RFP: Technical Section, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 5 pages.

Exhibit 5, FNLTD-74926,Flash Networks Optimization Products Selected by AT&T Wireless, Flash Networks, Inc. Press Release, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 3 pages.

Exhibit 6, Flash Networks: Harmony, filed in *Realtime Data LLC d/b/a IXO, v. MetroPCS Texas, LLC, et al.*, Civil Action No. 6:10-cv-00493, United States District Court for the Eastern District of Texas, filed Dec. 17, 2012, 6 pages.

Exhibit 7, Declaration, of Adi Weiser, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 8, Declaration of Yoav Weiss, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 9, Declaration of Richard Luthi, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 13, Declaration of Gali Weiss, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.

Exhibit 17, P.R. 3-1 Claim Chart for T-Mobile, U.S. Pat. No. 7,161,506, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 33 pages.

"Flash Networks Introduces NettGain 1100, New Products for Carrriers & Enterprises that Enables Immediate Deployment of Wireless Data Solutions," Press Release, dated Mar. 20, 2001, 2 pages.

Amended Expert Report of Dr. Cliff Reader, filed in *Realtime Data, LLC d/b/a IXO, v. MetroPCS Texas, LLC, et al.*, Civil Action No. 6:10-cv-00493, United States District Court for the Eastern District of Texas, filed Jul. 30, 2012, 205 pages.

(56) References Cited

OTHER PUBLICATIONS

Final Judgment, filed in *Realtime Data, LLC, d/b/a IXO*, v. *T-Mobile USA, Inc.*, Civil Action No. 6:10-cv-00493, United States District Court for the Eastern District of Texas, filed Mar. 28, 2013, 1 page.
Final Judgment Pursuant to Fed. R. Civ. P. 45(b), filed in *Realtime Data LLC, d/b/a IXO*, v. *CME Group Inc., et al.*, Civil Action No. 1:11-cv-06697, United States District Court Southern District of New York, dated Nov. 9, 2012, 10 pages.
Final Judgment Pursuant to Fed. R. Civ. P. 45(b), filed in *Realtime Data LLC, d/b/a IXO*, v. *Morgan Stanley, et al.*, Civil Action No. 1:11-cv-06696, United States District Court Southern District of New York, dated Nov. 9, 2012, 10 pages.
Final Judgment Pursuant to Fed. R. Civ. P. 45(b), fled in *Realtime Data LLC, d/b/a IXO*, v. *Thomson Reuters Corporation, et al.*, Civil Action No. 1:11-cv-06698, United States District Court Southern District of New York, dated Nov. 9, 2012, 6 pages.
Opinion and Order (Motion 10), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Nov. 9, 2012, 13 pages.
Supplemental Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Nov. 9, 2012, 5 pages.
Memorandum & Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Aug. 2, 2012, 13 pages.
Amended Opinion & Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Nov. 15, 2012, 48 pages.
Non-Confidential Brief for Plaintiff-Appellant Realtime Data, LLC d/b/a IXO, filed in *Realtime Data, LLC d/b/a IXO* v. *Morgan Stanley et al.*, Case Nos. 2013-1092, -1093, -1095, -1097, -1098, -1099, -1100, -1101, and -1103, United States Court of Appeals for the Federal Circuit, filed Mar. 6, 2013, 80 pages.
Non-Confidential Brief for Defendants —Appellees Cme Group, Inc., Board of Trade of the City of Chicago, Inc., The New York Mercantile Exchange, Inc., BATS Trading, Inc.', and NASDAQ OMX Group, Inc. and NASDAQ OMX PHLX, Inc., filed in *Realtime Data, LLC d/b/a IXO* v. *CME Group, Inc., et al.*, Case Nos. 13-1093, -1097, and -1100, United States Court of Appeals for the Federal Circuit, filed May 20, 2013, 74 pages.
Non-Confidential Reply Brief for Plaintiff-Appellant Realtime Data, LLC d/b/a IXO, filed in *Realtime Data, LLC d/b/a IXO* v. *Morgan Stanley, et al.*, Case Nos. 13-1092, -1093, -1095, -1097, -1098, -1099, -1100, -1101, and -1103, United States Court of Appeals for the Federal Circuit, filed Jun. 19, 2013, 53 pages.
ChangeLog file for zlib, zlibliet/ChangeLog.txt file, accessed on May 23, 2013, with date references Apr. 11, 1995-Apr. 28, 2013, 26 pages.
2.0.39 Kernel Release History, accessed at lwn.net/2001/1018/a/hist-2.0.39.php3, dated Oct. 14, 2001, 8 pages.
"Linux Kernel," Wikipedia—the Free Encyclopedia, accessed at en.wikipedia.org/wiki/Linux_kernel, accessed on May 9, 2013, 20 pages.
Rubini, A., "Booting the Kernel," accessed at www.linux.iti~rubini/docs/boot/, Jun. 1997, 6 pages.

Zadok, E., et al., "Fast Indexing: Support for Size-Changing Algorithms in Stackable File Systems," Proceedings of the 2001 Annual USENIX Technical Conference, Jun. 2001, 16 pages.
Court Docket History for 6:10-cv-00493-LED *Realtime Data, LLC d/b/a IXO*, v. *MetroPCS Texas, LLC et al.*, downloaded Aug. 9, 2013, 78 pages.
Court Docket History for 1:09-cv-04486 Chicago Board Options Exchange, *Incorporated* v. *Realtime Data, LLC*, downloaded Aug. 9, 2013, 7 pages.
Court Docket History for 6:08-cv-00144-LED-JDL *Realtime Data, LLC d/b/a IXO* v. *Packeteer, Inc. et al.*, downloaded Aug. 9, 2013, 119 pages.
Court Docket History for 6:09-cv-00326-LED-JDL *Realtime Data, LLC d/b/a IXO*, v. *Morgan Stanley et al.*, downloaded Aug. 9, 2013, 45 pages.
Court Docket History for 6:09-cv-00327-LED-JDL *Realtime Data, LLC d/b/a IXO*, v. *CME Group Inc. et al.*, downloaded Aug. 9, 2013, 56 pages.
Court Docket History for 6:09-cv-00333-LED-JDL *Realtime Data, LLC d/b/a IXO* v. *Thomson Reuters et al.*, downloaded Aug. 9, 2013, 30 pages.
Court Docket History for 1:09-cv-07868-RMB *Thomson Reuters Corporation* v. *Realtime Data, LLC*, downloaded Aug. 9, 2013, 3 pages.
Notice of Allowance in Commonly-Assigned U.S. Appl. No. 11/651,366, dated Apr. 10, 2009, 7 pgs.
Non-Final Office Action for U.S. Appl. No. 12/684,624, dated Nov. 10, 2010, 5 pgs.
Notice of Allowance for U.S. Appl. No. 12/123,081, dated Feb. 17, 2011, 7 pgs.
Non-Final Office Action for U.S. Appl. No. 12/688,413, dated Sep. 27, 2010, 13 pgs.
Notice of Allowance for U.S. Appl. No. 11/551,211, dated Jan. 31, 2011, 4 pgs.
Notice of Allowance for U.S. Appl. No. 11/551,211, dated Sep. 22, 2010, 4 pgs.
Notice of Allowance for U.S. Appl. No. 11/551,204, dated Jan. 11, 2011, 4 pgs.
Notice of Allowance for U.S. Appl. No. 11/553,419, dated Sep. 22, 2010, 4 pgs.
Non-Final Office Action for U.S. Appl. No. 11/400,008, dated Nov. 23, 2010, 7 pgs.
Notice of Allowance for U.S. Appl. No. 11/651,365, dated Feb. 4, 2010, 8 pgs.
Notice of Allowance for U.S. Appl. No. 11/651,365, dated Nov. 19, 2009, 8 pgs.
Non-Final Office Action for U.S. Appl. No. 09/969,987, dated Aug. 27, 2010, 13 pgs.
Final Office Action for U.S. Appl. No. 09/969,987, dated Jan. 28, 2010, 11 pgs.
Notice of Allowance for U.S. Appl. No. 12/131,631, dated Jun. 22, 2010, 5 pgs.
Final Office Action for U.S. Appl. No. 11/400,008, dated Oct. 30, 2009, 7 pgs.
Final Office Action for U.S. Appl. No. 11/400,008, dated May 11, 2010, 7 pgs.
Notice of Allowance for U.S. Appl. No. 11/551,204, dated Sep. 30, 2010; 4 pages.
Non-Final Office Action for U.S. Appl. No. 11/551,204, dated Jun. 16, 2009, 5 pgs.
Notice of Allowance for U.S. Appl. No. 11/551,204, dated Jun. 21, 2010, 4 pgs.
Non-Final Office Action for U.S. Appl. No. 11/551,204, dated Sep. 22, 2008, 9 pgs.
Notice of Allowance for U.S. Appl. No. 11/551,204, dated Jan. 27, 2010, 4 pgs.
Non-Final Office Action for U.S. Appl. No. 12/690,125, dated Sep. 21, 2010, 12 pgs.
Notice of Allowance for U.S. Appl. No. 11/553,427, dated Mar. 24, 2011, 5 pages.
Notice of Allowance for U.S. Appl. No. 12/703,042, dated May 5, 2011, 8 pages.

(56) References Cited

OTHER PUBLICATIONS

Notice of Allowance for U.S. Appl. No. 11/551,211, dated May 6, 2011, 5 pages.
Notice of Allowance for U.S. Appl. No. 11/553,419, dated May 20, 2011, 5 pages.
Final Office Action for U.S. Appl. No. 09/969,987, dated May 24, 2011, 17 pgs.
Notice of Allowance for U.S. Appl. No. 11/553,427, dated May 31, 2011, 5 pages.
Final Office Action for U.S. Appl. No. 12/690,125, dated Jun. 7, 2011, 11 pages.
Final Office Action for U.S. Appl. No. 12/688,413, dated Jun. 7, 2011, 15 pages.
Final Office Action for U.S. Appl. No. 11/400,008, dated Jun. 27, 2011, 6 pages.
Notice of Allowance for U.S. Appl. No. 11/551,204, dated Jul. 11, 2011, 5 pages.
Notice of Allowance for U.S. Appl. No. 12/684,624, dated Jul. 25, 2011, 5 pages.
Non-Final Office Action for U.S. Appl. No. 12/703,042, dated Jul. 28, 2011, 5 pages.
Non-Final Office Action for U.S. Appl. No. 12/857,238, dated Aug. 10, 2011, 6 pages.
Non-Final Office Action for U.S. Appl. No. 13/101,994, dated Aug. 16, 2011, 10 pages.
Notice of Allowance for U.S. Appl. No. 11/551,211, dated Aug. 24, 2011, 5 pages.
Notice of Allowance for U.S. Appl. No. 12/684,624, dated Sep. 1, 2011, 9 pages.
Notice of Allowance for U.S. Appl. No. 12/123,081, dated Sep. 26, 2011, 9 pages.
Notice of Allowance for U.S. Appl. No. 11/551,204, dated Sep. 28, 2011, 5 pages.
Notice of Allowance for U.S. Appl. No. 11/551,211, dated Oct. 18, 2011, 5 pages.
Non-Final Office Action for U.S. Appl. No. 13/154,239, dated Nov. 2, 2011, 6 pages.
Notice of Allowance for U.S. Appl. No. 12/703,042, dated Nov. 15, 2011, 8 pages.
Non-Final Office Action for U.S. Appl. No. 12/688,413, dated Nov. 28, 2011, 14 pages.
Notice of Allowance for U.S. Appl. No. 12/857,238, dated Dec. 30, 2011, 5 pages.
Notice of Allowance for U.S. Appl. No. 11/400,008, dated Feb. 6, 2012, 8 pages.
Non-Final Office Action for U.S. Appl. No. 12/690,125, dated Mar. 8, 2012, 7 pages.
Notice of Allowance for U.S. Appl. No. 12/703,042, dated Mar. 30, 2012, 8 pages.
Non-Final Office Action for U.S. Appl. No. 09/969,987, dated Apr. 11, 2012, 6 pages.
Notice of Allowance for U.S. Appl. No. 11/553,419, dated Apr. 23, 2012, 6 pages.
Notice of Allowance for U.S. Appl. No. 11/553,427, dated May 7, 2012, 7 pages.
Non-Final Office Action for U.S. Appl. No. 13/118,122, dated May 16, 2012, 9 pages.
Non-Final Office Action for U.S. Appl. No. 13/101,994, dated May 23, 2012, 12 pages.
Notice of Allowance for U.S. Appl. No. 12/857,238, dated May 29, 2012, 5 pages.
Notice of Allowance for U.S. Appl. No. 11/400,008, dated Jun. 21, 2012, 8 pages.
Final Office Action for U.S. Appl. No. 13/154,239, dated Jun. 26, 2012, 14 pages.
Notice of Allowance for U.S. Appl. No. 12/857,238, dated Jul. 12, 2012, 5 pages.
Notice of Allowance for U.S. Appl. No. 12/703,042, dated Jul. 16, 2012, 8 pages.
Non-Final Office Action for U.S. Appl. No. 13/482,800, dated Jul. 20, 2012, 14 pages.
Notice of Allowance for U.S. Appl. No. 11/553,427, dated Nov. 6, 2012, 5 pages.
Notice of Allowance for U.S. Appl. No. 12/703,042, dated Nov. 15, 2012, 9 pages.
Non-Final Office Action for U.S. Appl. No. 12/857,238, dated Nov. 29, 2012, 17 pages.
Final Office Action for U.S. Appl. No. 09/969,987, dated Dec. 4, 2012, 7 pages.
Final Office Action for U.S. Appl. No. 13/101,994, dated Dec. 13, 2012, 5 pages.
Supplemental Notice of Allowability for U.S. Appl. No. 12/703,042, dated Dec. 18, 2012, 6 pages.
Notice of Allowance for U.S. Appl. No. 12/690,125, dated Dec. 28, 2012, 5 pages.
Final Office Action for U.S. Appl. No. 13/118,122, dated Jan. 9, 2013, 11 pages.
Non-Final Office Action for U.S. Appl. No. 11/553,419, dated Jan. 15, 2013, 4 pages.
Non-Final Office Action for U.S. Appl. No. 13/482,800, dated Feb. 19, 2013, 15 pages.
Notice of Allowance for U.S. Appl. No. 12/703,042, dated Mar. 4, 2013, 9 pages.
Non-Final Office Action for U.S. Appl. No. 12/690,125, dated Apr. 15, 2013, 11 pages.
Notice of Allowance for U.S. Appl. No. 13/154,239, dated Apr. 24, 2013, 10 pages.
Notice of Allowance for U.S. Appl. No. 11/553,427, dated May 14, 2013, 6 pages.
Supplemental Notice of Allowance for U.S. App. No. 11/553,427, dated May 15, 2013, 6 pages.
Notice of Allowance for U.S. Appl. No. 12/857,238, dated Jun. 17, 2013, 6 pages.
Supplemental Notice of Allowance for U.S. Appl. No. 12/703,042, dated Jun. 18, 2013, 6 pages.
Supplemental Notice of Allowance for U.S. Appl. No. 11/533,427, dated Jul. 2, 2013, 2 pages.
Non-Final Office Action for U.S. Appl. No. 09/969,987, dated Jul. 3, 2013, 8 pages.
Notice of Allowance for U.S. App. No. 13/154,211, dated Jul. 11, 2013, 10 pages.
Non-Final Office Action for U.S. App. No. 13/118,122, dated Jul. 19, 2013, 12 pages.
Notice of Allowance for U.S. App. No. 13/154,239, dated Aug. 2, 2013, 9 pages.
Notice of Allowance for U.S. Appl. No. 13/118,122, dated Sep. 19, 2013, 6 pages.
Notice of Allowance for U.S. Appl. No. 11/553,419, dated Oct. 17, 2013, 7 pages.
Notice of Allowance for U.S. Appl. No. 12/857,238, dated Oct. 23, 2013, 7 pages.
Notice of Allowance for U.S. Appl. No. 13/154,211, dated Oct. 24, 2013, 9 pages.
Final Office Action for U.S. Appl. No. 13/482,800, dated Oct. 25, 2013, 21 pages.
International Search Report for PCT/US00/42018, dated Jul. 31, 2001, 3 pages.
International Search Report for PCT/US01/03712, dated May 10, 2002, 2 pages.
International Search Report for PCT/US01/03711, dated Jan. 28, 2001, 5 pages.
Submission of prior art under 37 CFR 1.501, for U.S. Pat. No. 6,604,158, Mar. 3, 2011, 5 pgs.
Submission of prior art under 37 CFR 1.501, for U.S. Pat. No. 7,415,530, Mar. 3, 2011, 14 pgs.
Submission of prior art under 37 CFR 1.501, for U.S. Pat. No. 6,601,104, Mar. 3, 2011, 5 pgs.
Submission of prior art under 37 CFR 1.501, for U.S. Pat. No. 7,161,506, Mar. 3, 2011, 12 pgs.
Submission of prior art under 37 CFR 1.501, for U.S. Pat. No. 7,395,345, Mar. 3, 2011, 14 pgs.

(56) References Cited

OTHER PUBLICATIONS

Submission of prior art under 37 CFR 1.501, for U.S. Pat. No. 7,321,937, Mar. 3, 2011, 14 pgs.
Submission of prior art under 37 CFR 1.501, for U.S. Pat. No. 7,352,300, Mar. 3, 2011, 14 pgs.
Submission of prior art under 37 CFR 1.501, for U.S. Pat. No. 7,378,992, Mar. 3, 2011, 14 pgs.
Ex Parte Reexamination Interview Summary, mailed Dec. 3, 2009, for U.S. Reexam App. No. 90/009,428, 4 pgs.
Request for Inter Partes Reexamination of U.S. Pat. No. 7,714,747, Control No. 95/001,517, filed Dec. 30, 2010, 696 pages.
Replacement Request for Inter Partes Reexamination of U.S. Pat. No. 7,417,568, Control No. 95/001,533, filed Mar. 1, 2011, 357 pages.
L. Gannoun, "RTP Payload Format for X Protocol Media Streams," Audio-Visual Transport WG Internet Draft, Internet Engineering Task Force, Mar. 11, 1998,15 pgs.
Official Order Granting Request for Inter Partes Reexamination of U.S. Pat. No. 6,624,761, Control No. 95/000,464, issued Jul. 24, 2009, 29 pgs.
Non-Final Office Action in Inter Partes Reexamination of U.S. Pat. No. 6,624,761, Control No. 95/000,464, dated Dec. 15, 2009, 20 pgs.
Non-Final Office Action in Inter Partes Reexamination of U.S. Pat. No. 7,321,937, Control No. 95/000,466, dated Jun. 22, 2009, 11 pgs.
Official Order Granting Request for Inter Partes Reexamination of U.S. Pat. No. 7,321,937, Control No. 95/000,466, issued Jun. 22, 2009, 16 pgs.
Official Action Closing Prosecution for Inter Partes Reexamination of U.S. Pat. No. 7,321,937, Control No. 95/000,466, dated Dec. 22, 2009, 20 pgs.
Comments by Third Party Requester to Patent Owner's Response Inter Partes Reexamination of U.S. Pat. No. 7,321,937, Control No. 95/000,466, filed Nov. 10, 2009, 30 pgs.
Supplemental Declaration of Professor James A. Storer, Ph.D. under 37 C.F.R. §1.132 in Inter Partes Reexamination of U.S. Pat. No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, issued Dec. 3, 2009, 3 pgs.
Non-Final Office Action in Ex Parte Reexamination of U.S. Pat. No. 6,601,104, Control No. 90/009,428, dated Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.
Declaration of Dr. George T. Ligler under 37 C.F.R. §1.132 in Inter Partes Reexamination of U.S. Pat. No. 7,321,937, Control No. 95/000,466, executed Aug. 24, 2009, 30 pgs.
Official Order Granting Request for Inter Partes Reexamination of U.S. Pat. No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, dated Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S. Pat. No. 7,378,992, Control No. 95/000,478, dated Dec. 15, 2009, 27 pgs.
Official Order Granting Request for Inter Partes Reexamination of U.S. Pat. No. 6,604,158 Control No. 95/000,486, issued Aug. 14, 2009, 35 pgs.
Non-Final Office Action in Inter Partes Reexamination of U.S. Pat. No. 6,604,158, Control No. 95/000,486, dated Nov. 12, 2009, 199 pgs.
Right of Appeal Notice in Inter Partes Reexamination of U.S. Pat. No. 6,624,761, Control No. 95/000,464, issued Jan. 6, 2011, 15 pgs.
Action Closing Prosecution in Inter Partes Reexamination of U.S. Pat. No. 6,624,761, Control No. 95/000,464, dated Aug. 27, 2010, 25 pgs.
Right of Appeal Notice in Inter Partes Reexamination of U.S. Pat. No. 7,321,937, Control No. 95/000,466, issued May 24, 2010, 23 pgs.
Final Office Action in Ex Parte Reexamination of U.S. Pat. No. 6,601,104, Control No. 90/009,428, issued Feb. 5, 2010, 16 pgs.
Right of Appeal Notice for inter Partes Reexamination of U.S. Pat. No. 7,161,506, Control No. 95/000,479 issued Jan. 6, 2011, 18 pgs.
Action Closing Prosecution in Inter Partes Reexamination of U.S. Pat. No. 7,161,506, Control No. 95/000,479, dated Aug. 27, 2010, 34 pgs.
Right of Appeal Notice for Inter Partes Reexamination of U.S. Pat. No. 7,378,992, Control No. 95/000,478, issued Jan. 6, 2011, 15 pgs.
Action Closing Prosecution in Inter Partes Reexamination of U.S. Pat. No. 7,378,992, Control No. 95/000,478, dated Aug. 23, 2010, 31 pgs.
Action Closing Prosecution in Inter Partes Reexamination of U.S. Pat. No. 6,604,158 Control No. 95/000,486, dated Mar. 7, 2011, 257 pgs.
Patent Owner's reply to Office Action in Inter Partes Reexamination of U.S. Pat. No. 7,378,992, mailed Mar. 15, 2010, 23 pages.
Patent Owner's Reply to Office Action in Inter Partes Reexamination of U.S. Pat. No. 7,161,506, mailed Mar. 15, 2010, 23 pages.
Patent Owner's Reply to Action Closing Prosecution of Aug. 23, 2010 in Inter Partes Reexamination of U.S. Pat. No. 7,378,992, mailed Sep. 23, 2010, 23 pages.
Patent Owner's Reply to Action Closing Prosecution of Aug. 27, 2010 in Inter Partes Reexamination of U.S. Pat. No. 7,161,506, mailed Sep. 27, 2010, 26 pages.
Patent Owner's reply to Action Closing Prosecution of Aug. 27, 2010 in Inter Partes Reexamination of U.S. Pat. No. 6,624,761, mailed Sep. 27, 2010, 20 pages.
Corrected Request for Inter Partes Reexamination of U.S. Pat. No. 6,624,761, filed Jun. 15, 2009, 241 pages.
Request for Inter Partes Reexamination of U.S. Pat. No. 7,378,992, filed May 21, 2009, 255 pages.
Request for Inter Partes Reexamination of U.S. Pat. No. 7,161,506, filed May 28, 2009, 455 pages.
Request for Inter Partes Reexamination of U.S. Pat. No. 7,777,651, Control No. 95/001,581, filed Mar. 21, 2011, 2,136 pages.
Request for Inter Partes Reexamination of U.S. Pat. No. 7,400,274, Control No. 95/001,544, filed Feb. 14, 2011, 420 pages.
Action Closing Prosecution in Inter Partes Reexamination of U.S. Pat. No. 7,321,937, Control No. 95/000,466 dated Dec. 22, 2009, 20 pages.
Order Granting request for inter partes reexamination of U.S. Pat. No. 7,400,274 and Non-Final Office Action in Inter Partes reexam of U.S. Pat. No. 7,400,274, Control No. 95/001,544, issued Mar. 25, 2011, 47 pages.
Non-Final Office Action in Inter Partes Reexamination of U.S. Pat. No. 7,400,274, Control No. 95/001,544, dated May 20, 2011, 47 pages.
Order Granting Request for Inter Partes Reexamination of U.S. Pat. No. 7,777,651, Control No. 95/001,581, mailed Jun. 15, 2011, 22 pages.
Non-Final Office Action in Inter Partes Reexamination of U.S. Pat. No. 7,417,568, Control No. 95/001,553, dated May 6, 2011, 105 pages.
Order Granting Reexamination of U.S. Pat. No. 7,714,747, Control No. 95/001,517, mailed Mar. 9, 2011, 21 pages.
Appeal Brief filed in Inter Partes Reexamination of U.S. Pat. No. 6,601,104, Control No. 90/009,428, mailed Sep. 2, 2010, 28 pages.
Examiner's Answer to Appeal Brief in Inter Partes Reexamination of U.S. Pat. No. 7,321,937, Control No. 95/000,466, mailed Jul. 18, 2011, 33 pages.

(56) References Cited

OTHER PUBLICATIONS

Non-Final Office Action in Inter Partes Reexamination of U.S. Pat. No. 7,777,651, Control No. 95/001,581, dated Jul. 25, 2011, 274 pages.
Non-Final Action Closing Prosecution in Inter Partes Reexamination of U.S. Pat. No. 7,714,747, Control No. 95/001,517, dated Sep. 21, 2011, 29 pages.
Definition of "data packet", Academic Press Dictionary of Science and Technology, Copyright 1992, 1996, in Inter Partes Reexamination of U.S. Pat. No. 7,714,747, Control No. 95/001,517, mailed Sep. 21, 2011, 2 pages.
Patent Owner's Reply to Office Action in Inter Partes Reexamination of U.S. Pat. No. 7,777,651, Control No. 95/001,581, mailed Sep. 26, 2011, 44 pages.
Examiner's Answer to Appeal Brief in Inter Partes Reexamination of U.S. Pat. No. 7,161,506, Control No. 95/000,479, mailed Sep. 28, 2011, 25 pages..
Examiner's Answer to Appeal Brief in Inter Partes Reexamination of U.S. Pat. No. 7,161,506, Control No. 95/000,479, mailed Sep. 28, 2011, 25 pages.
Examiner's Answer to Appeal Brief in Inter Partes Reexamination of U.S. Pat. No. 7,378,992, Control No. 95/000,478, mailed Sep. 29, 2011, 27 pages.
Decision on Appeal in Ex parte Reexamination of U.S. Pat. No. 6,601,104 B1, Control No. 90/009,428, dated Mar. 18, 2011, 14 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No, 6,624,761, Control No. 95/000,464, dated Oct. 28, 2011, 9 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No, 7,378,992, Control No. 95/000,478, dated Oct. 28, 2011, 10 pages.
Patent Owner's Rebuttal Brief Under 37 C.F.K § 41.71 Retracting the Arguments Made to Overcome the Claim Rejections and Thereby Eliminating the Issues on Appeal in Inter Partes Reexamination of U.S. Patent No, 7,161,506, Control No. 95/000,479, dated Oct. 28, 2011, 9 pages.
Non-Final Action Closing Prosecution in Inter Partes Reexamination of U.S. Pat. No. 7,400,274, Control No. 95/001,544, dated Nov. 18, 2011, 39 pages.
Non-Final Action Closing Prosecution in Inter Partes Reexamination of U.S. Pat. No. 7,417,568, Control No. 95/001,533, dated Dec. 9, 2011, 42 pages.
Patent Owner's Reply to Action Closing Prosecution of Nov. 18, 2011 in Inter Partes Reexamination of U.S. Pat. No. 7,400,274, Control No. 95/001,544, mailed Dec. 19, 2011, 9 pages.
Patent Owner's Reply to Action Closing Prosecution of Dec. 9, 2011 in Inter Partes Reexamination of U.S. Pat. No. 7,417.568, Control No. 95/001,533, mailed Dec. 29, 2011, 14 pages.
Notice of Intent to Issue Ex Parte Reexamination Certificate in Ex Parte Reexamination of U.S. Pat. No. 6,601,104, Control No. 90/009,428, mailed Jan. 13, 2012, 5 pages.
Decision on Appeal in Inter Partes Reexamination of U.S. Pat. No. 6,624,761, Control No. 95/000,464, mailed Jan. 18, 2012, 5 pages.
Decision on Appeal in Inter Partes Reexamination of U.S. Pat. No. 7,321,937, Control No. 95/000,466, mailed Jan. 18, 2012, 8 pages..
Decision on Appeal in Inter Partes Reexamination of U.S. Pat. No. 7,378,992, Control No. 95/000,478, mailed Jan. 18, 2012, 5 pages.
Decision on Appeal in Inter Partes Reexamination of U.S. Pat. No. 7,161,506, Control No. 95/000,479, mailed Jan. 18, 2012, 6 pages.
Non-Final Office Action in Inter Partes Reexamination of U.S. Pat. No. 7,777,651, Control No. 95/001,581, dated Jan. 27, 2012, 152 pages.
Patent Owner's Respondent Brief on Appeal Under 37 C.F.R. § 41.68 in Inter Partes Reexamination of U.S. Pat. No. 7,714,747, Control No. 95/001,517, filed Feb. 17, 2012, 20 pages.

Patent Owner's Reply to Second Non-Final Office Action of Jan. 27, 2012 in Inter Partes Reexamination of U.S. Pat. No. 7,777,651, Control No. 95/001,581, filed Feb. 24, 2012, 30 pages.
Ex Parte Reexamination Certificate in Ex Parte Reexamination of U.S. Pat. No. 6,601,104, Control No. 90/009,428, issued Feb. 28, 2012, 2 pages.
Examiner's Answer to Appeal Brief in Inter Partes Reexamination of U.S. Pat. No. 7,714,747, Control No. 95/001,517, mailed Mar. 1, 2012, 4 pages.
Right of Appeal Notice in Inter Partes Reexamination of U.S. Pat. No. 7,417,568, Control No. 95/001,533, mailed Mar. 1, 2012, 8 pages.
Right of Appeal Notice in Inter Partes Reexamination of U.S. Pat. No. 7,400,274, Control No. 95/001,544, mailed Mar. 6, 2012, 7 pages.
Request for Inter Partes Reexamination of U.S. Pat. No. 7,321,937, Control No. 95/001,922, filed Mar. 2, 2012, including accompanying Exhibits PA-A to PA-D, PAT-A to PAT-C, CC-A to CC-D, Oth-A, and Form PTO/SB/08a, 2865 pages.
Request for Inter Partes Reexamination of U.S. Pat. No. 6,604,158, Control No. 95/001,923, filed Mar. 2, 2012, including accompanying Exhibits PA-A TO PA-D, PAT-A to PAT-B, CC-A to CC-F, Oth-A, and Form PTO/SB/08a, 560 pages.
Request for Inter Partes Reexamination of U.S. Pat. No. 7,352,300, Control No. 95/001,924, filed Mar. 2, 2012, including accompanying Exhibits PA-A to PA-H, PAT-A to PAT-B, CC-A to CC-F, Oth-A, and Form PTO/SB/08a, 1012 pages.
Request for Inter Partes Reexamination of U.S. Pat. No. 7,395,345, Control No. 95/001,925, filed Mar. 2, 2012, including accompanying Exhibits PA-A to PA-C, PAT-A, CC-A to CC-C, Oth-A, and Form PTO/SB/08a, 204 pages.
Request for Inter Partes Reexamination of U.S. Pat. No. 7,161,506, Control No. 95/001,926, filed Mar. 2, 2012, with accompanying Exhibits PA-A to PA-C, PAT-A to PAT-C, CC-A to CC-B, Oth-A to Oth-B, and Form PTO/SB/08a, 2651 pages.
Request for Inter Partes Reexamination of U.S. Pat. No. 7,415,530, Control No. 95/001,927, filed Mar. 2, 2012, including accompanying Exhibits PA-A to PA-F, PAT-A to PAT-B, CC-A to CC-O, Oth-A, and Form PTO/SB/08a, 700 pages.
Request for Inter Partes Reexamination of U.S. Pat. No. 7,378,992, Control No. 95/001,928, filed Mar. 2, 2012, including Exhibits PA-A to PA-D, PAT-A to PAT-C, CC-A to CC-B, Oth-A, and Form PTO/SB/08a, 2316 pages.
Official Order Granting Request for Inter Partes Reexamination of U.S. Pat. No. 7,395,345, Control No. 95/001,925, mailed Mar. 19, 2012, 11 pages.
Non-Final Office Action in Inter Partes Reexamination of U.S. Pat. No. 7,395,345, Control No. 95/001,925, dated Mar. 19, 2012, 20 pages.
Notice of Intent to Issue Inter Partes Reexamination Certificate in Inter Partes Reexamination of U.S. Pat. No. 7,321,937, Control No. 95/000,466, mailed Mar. 21, 2012, 7 pages.
Right of Appeal Notice for Inter Partes Reexamination of U.S. Pat. No. 6,604,158, Control No. 95/000,486, mailed Mar. 26, 2012, 253 pages.
Notice of Intent to Issue Inter Partes Reexamination Certificate in inter Partes Reexamination of U.S. Pat. No. 6,624.761, Control No. 95/000,464, mailed Apr. 3, 2012, 7 pages.
Notice of Intent to Issue Inter Partes Reexamination Certificate in Inter Partes Reexamination of U.S. Pat. No. 7,161,506, Control No. 95/000,479, mailed Apr. 4, 2012, 15 pages.
Notice of Intent to Issue Inter Partes Reexamination Certificate in Inter Partes Reexamination of U.S. Pat. No. 7,378,992, Control No. 95/000,478, mailed Apr. 6, 2012, 5 pages.
Official Order Granting Request for Inter Partes Reexamination of U.S. Pat. No. 7,321,937, Control No. 95/001,922, mailed Apr. 20, 2012, 17 pages.
Non-Final Office Action in Inter Partes Reexamination of U.S. Pat. No. 7,321.937, Control No. 95/001,922, dated Apr. 20, 2012, 8 pages.
Official Order Granting Request for Inter Partes Reexamination of U.S. Pat. No. 7,161,506, Control No. 95/001,926, mailed Apr. 25, 2012, 9 pages.

(56) References Cited

OTHER PUBLICATIONS

Non-Final Office Action in Inter Partes Reexamination of U.S. Pat. No. 7,161,506, Control No. 95/001,926, dated Apr. 25, 2012, 7 pages.
Official Order Granting Request for Inter Partes Reexamination of U.S. Pat. No. 7,378,992, Control No. 95/001,928, mailed Apr. 25, 2012, 8 pages.
Non-Final Office Action in Inter Partes Reexamination of U.S. Pat. No. 7,378,992, Control No. 95/001,928, dated Apr. 25, 2012, 8 pages.
Official Order Denying Request for Inter Partes Reexamination of U.S. Pat. No. 7,415,530, Control No. 95/001,927, mailed Apr. 27, 2012, 52 pages.
Official Order Granting Request for Inter Partes Reexamination of U.S. Pat. No. 6,604,158, Control No. 95/001,923, mailed May 7, 2012, 14 pages.
Non-Final Office Action in Inter Partes Reexamination of U.S. Pat. No. 6,604,158, Control No. 95/001,923, dated May 7, 2012, 8 pages.
Petition Under 37 C.F.R. §§ 1.181 and 1.182 for Correction of Notice of Intent to Issue Reexamination Certificate in Inter Partes Reexamination of U.S. Pat. No. 7,378,992, Control No. 95/000,478, filed May 9, 2012, 8 pages.
Inter Partes Reexamination Certificate in Inter Partes Reexamination of U.S. Pat. No. 7,321,937, Control No. 95/000,466, issued May 15, 2012, 2 pages.
Official Order Granting Request for Inter Partes Reexamination of U.S. Pat. No. 7,352,300, Control No. 95/001,924, mailed May 17, 2012, 12 pages.
Non-Final Office Action in Inter Partes Reexamination of U.S. Pat. No. 7,352,300, Control No. 95/001,924, dated May 17, 2012, 18 pages.
Patent Owner's Response to Office Action of Mar. 19, 2012 in Inter Partes Reexamination of U.S. Pat. No. 7,395,345, Control No. 95/001,925, filed May 21, 2012, 21 pages.
Inter Partes Reexamination Certificate in Inter Partes Reexamination of U.S. Pat. No. 7,161,506, Control No. 95/000,479, issued May 22, 2012, 2 pages.
Inter Partes Reexamination Certificate in Inter Partes Reexamination of U.S. Pat. No. 6,624,761, Control No. 95/000,464, issued Jun. 12, 2012, 2 pages.
Action Closing Prosecution in Inter Partes Reexamination of U.S. Pat. No. 7,777,651, Control No. 95/001,581, mailed Jun. 18, 2012, 45 pages.
Patent Owner's Response to Office Action of Apr. 20, 2012 in Inter Partes Reexamination of U.S. Pat. No. 7,321,937, Control No. 95/001,922, filed Jun. 20, 2012, 11 pages.
Patent Owner's Response to Office Action of Apr. 25, 2012 in Inter Partes Reexamination of U.S. Pat. No. 7,161,506, Control No. 95/001,926, filed Jun. 25, 2012, 20 pages.
Patent Owner's Response to Office Action of Apr. 25, 2012 in Inter Partes Reexamination of U.S. Pat. No. 7,378,992, Control No. 95/001,928, filed Jun. 25, 2012, 20 pages.
Patent Owner's Response to Office Action of May 7, 2012 in Inter Partes Reexamination of U.S. Pat. No. 6,604,158, Control No. 95/001,923, filed Jul. 9, 2012, 19 pages.
Patent Owner's Response to Office Action of May 17, 2012 in Inter Partes Reexamination of U.S. Pat. No. 7,352,300, Control. No. 95/001,924, filed Jul. 17, 2012, 31 pages.
New Decision on Appeal after Board Decision in Inter Partes Reexamination of U.S. Pat. No. 7,714,747, Control. No. 95/001,517, mailed Jul. 24, 2012, 24 pages.
Right of Appeal Notice for Inter Partes Reexamination of U.S. Pat. No. 7,777,651, Control No. 95/001,581, mailed Aug. 3, 2012, 7 pages.
Notice of Intent to Issue Inter Partes Reexamination Certificate in Inter Partes Reexamination of U.S. Pat. No. 6,604,158, Control No. 95/000,486, mailed Aug. 30, 2012, 5 pages.
Notice of Intent to Issue Inter Partes Reexamination Certificate in Inter Partes Reexamination of U.S. Pat. No. 7,378,992, Control No. 95/000,478, mailed Aug. 31, 2012, 6 pages.
Decision on Petition for Supervisory Review of Refusal to Order Reexamination for Claims 1-2, 16-21, and 23 (37 CFR §§ 1.927 and 1.181) in Inter Partes Reexamination of U.S. Pat. No. 7,415,530, Control No. 95/001,927, mailed Aug. 31, 2012, 10 pages.
Decision on Petition Under 37 C.F.R. §§ 1.181 and 1.182 for Correction of Notice of Intent to Issue Reexamination Certificate in Inter Partes Reexamination of U.S. Pat. No. 7,378,992, Control No. 95/000,478, mailed Sep. 10, 2012, 6 pages.
Decision on Petition for Supervisory Review of Refusal to Order Reexamination of Claims 5-7, 14-16, and 18-19 (37 CFR §§ 1.927 and 1.181) in Inter Partes Reexamination of U.S. Pat. No. 7,321,937, Control No. 95/001,922, mailed Sep. 10, 2012, 12 pages.
Decision on Petition for Supervisory Review of Refusal to Order Reexamination for Claims 86, 89, 90, 92-96, and 98 (37 CFR §§ 1.927 and 1.181) in Inter Partes Reexamination of U.S. Pat. No. 7,161,506, Control No. 95/001,926, mailed Sep. 21, 2012, 10 pages.
Non-Final Office Action in Inter Partes Reexamination of U.S. Pat. No. 7,415,530, Control No. 95/001,927, dated Sep. 21, 2012, 15 pages.
Patent Owner's Request to Reopen Prosecution Before the Examiner Under 37 C.F.R. § 41.77(b) in Inter Partes Reexamination of U.S. Pat. No. 7,714,747, Control No. 95/001,517, filed Sep. 24, 2012, 29 pages.
Examiner's Answer to Appeal Brief in Ex Parte Reexamination of U.S. Pat. No. 7,400,274, Control No. 95/001,544, mailed Oct. 1, 2012, 17 pages.
Inter Partes Reexam Certificate in Inter Partes Reexamination of U.S. Pat. No. 7,378,992, Control No. 95/000,478, issued Oct. 4, 2012, 2 pages.
Inter Partes Reexam Certificate in Inter Partes Reexamination of U.S. Pat. No. 6,604,158, Control No. 95/000,486, issued Oct. 10, 2012, 2 pages.
Examiner's Answer to Appeal Brief in Inter Partes Reexamination of U.S. Pat. No. 7,417,568, Control No. 95/001,533, mailed Oct. 15, 2012, 44 pages.
Non-Final Office Action in Inter Partes Reexamination of U.S. Pat. No. 7,321,937, Control No. 95/001,922, dated Oct. 18, 2012, 10 pages.
Patent Owner's Rebuttal Brief Under 37 C.F.R § 41.71 in Inter Partes Reexamination of U.S. Pat. No. 7,417,568, Control No. 95/001,533, filed Nov. 15, 2012, 15 pages.
Patent Owner's Response to Office Action of Oct. 18, 2012 in Inter Partes Reexamination of U.S. Pat. No. 7,321,937, Control No. 95/001,922, filed Nov. 19, 2012, 30 pages.
Patent Owner's Supplemental Amendment Subsequent to Timely Submission of Response to Office Action of Oct. 18, 2012 in Inter Partes Reexamination of U.S. Pat. No. 7,321,937, Control No. 95/001,922, filed Nov. 27, 2012, 6 pages.
Patent Owner's Response to Office Action of Sep. 21, 2012 in Inter Partes Reexamination of U.S. Pat. No. 7,415,530, Control No. 95/001,927, filed Dec. 21, 2012, 51 pages.
Action Closing Prosecution in Inter Partes Reexamination of U.S. Pat. No. 7,161,506, Control No. 95/001,926, dated Mar. 5, 2013, 23 pages.
Action Closing Prosecution in Inter Partes Reexamination of U.S. Pat. No. 7,378,992, Control No. 95/001,928, dated Mar. 5, 2013, 29 pages.
Examiner's Answer to Appeal Brief in Inter Partes Reexamination of U.S. Pat. No. 7,777,651, Control No. 95/001,581, mailed Mar. 14, 2013, 21 pages.
Decision on Petition to Strike Patent Owner's Rebuttal Brief in Inter Partes Reexamination of U.S. Pat. No. 7,417,568, Control No. 95/001,533, mailed Mar. 15, 2013, 7 pages.
Order Remanding Inter Partes Reexamination Under 37 C.F.R § 41.77(d) to the Examiner in Inter Partes Reexamination of U.S. Pat. No. 7,714,747, Control No. 95/001,517, mailed Mar. 18, 2013, 3 pages.
Decision on Petition Under 37 C.F.R. § 1.183 to Request Examiner Enter Evidence in Inter Partes Reexamination of U.S. Pat. No. 7,417,568, Control No. 95/001,533, mailed Mar. 20, 2013, 7 pages.

(56) References Cited

OTHER PUBLICATIONS

Action Closing Prosecution in Inter Partes Reexamination of U.S. Pat. No. 7,415,530, Control No. 95/001,927, dated Apr. 3, 2013, 24 pages.
Patent Owner's Reply to Action Closing Prosecution of Mar. 5, 2013 in Inter Partes Reexamination of U.S. Pat. No. 7,161,506, Control No. 95/001,926, filed Apr. 5, 2013, 19 pages.
Patent Owner's Reply to Action Closing Prosecution of Mar. 5, 2013 in Inter Partes Reexamination of U.S. Pat. No. 7,378,992, Control No. 95/001,928, filed Apr. 5, 2013, 23 pages.
Action Closing Prosecution in Inter Partes Reexamination of U.S. Pat. No. 7,321,937, Control No. 95/001,922, dated Apr. 9, 2013, 59 pages.
"Data Transfer Rate (DTR)," accessed at http://searchunifiedcommunications.techtarget.com/definition/data-transfer-rate, published May 18, 2011, 1 page.
"Bandwidth—technical definition," accessed at http://computer.yourdictionary.com/bandwidth, accessed on Mar. 7, 2013, 4 pages.
"Bandwidth—Definition," accessed at http://www.yourdictionary.com/bandwidth, accessed on Mar. 7, 2013, 2 pages.
"Bandwidth," accessed at http://searchenterprisewan.techtarget.com/definitions/bandwidth, published Mar. 24, 2010, 1 page.
Action Closing Prosecution in Inter Partes Reexamination of U.S. Pat. No. 7,352,300, Control No. 95/001,924, dated Apr. 9, 2013, 30 pages.
Examiner's Determination Under 37 C.F.R. § 41.77(d) in Inter Partes Reexamination of U.S. Pat. No. 7,714,747, Control No. 95/001,517, mailed Apr. 10, 2013, 7 pages.
Patent Owner's Supplemental Response to Office Action of May 7, 2012 in Inter Partes Reexamination of U.S. Pat. No. 6,604,158, Control No. 95/001,923, filed Apr. 29, 2013, 20 pages.
Patent Owner's Supplemental Response to Office Action of Mar. 19, 2012 in Inter Partes Reexamination of U.S. Pat. No. 7,395,345, Control No. 95/001,925, filed May 6, 2013, 24 pages.
Patent Owner's Response to Action Closing Prosecution of Apr. 9, 2013 in Inter Partes Reexamination of U.S. Pat. No. 7,321,937, Control No. 95/001,922, filed May 9, 2013, 13 pages.
Patent Owner's Response to Action Closing Prosecution of Apr. 9, 2013 in Inter Partes Reexamination of U.S. Pat. No. 7,352,300, Control No. 95/001,924, filed May 9, 2013, 29 pages.
Patent Owner's Comments in Response to Examiner's Determination Under 37 C.F.R. § 41.77(e) in Inter Partes Reexamination of U.S. Pat. No. 7,714,747, Control No. 95/001,517, filed May 10, 2013, 20 pages.
Patent Owner's Supplemental Response to Action Closing Prosecution of Apr. 9, 2013 in Inter Partes Reexamination of U.S. Pat. No. 7,321,937, Control No. 95/001,922, filed May 15, 2013, 13 pages.
Right of Appeal Notice in Inter Partes Reexamination of U.S. Pat. No. 7,415,530, Control No. 95/001,927, mailed May 31, 2013, 26 pages.
Petition Under 37 C.F.R. § 1.181 to Expunge Third Party Requester's Improper Submission of Declarations Under 37 C.F.R. § 1.132 and Strike Comments Directed to Examiner's Determination in Inter Partes Reexamination of U.S. Pat. No. 7,714,747, Control No. 95/001,517, filed Jun. 26, 2013, 6 pages.
Notice of Intent to Issue a Reexam Certificate in Inter Partes Reexamination of U.S. Pat. No. 7,415,530, Control No. 95/001,927, issued Jul. 19, 2013, 5 pages.
Right of Appeal Notice in Inter Partes Reexamination of U.S. Pat. No. 7,321,937, Control No. 95/001,922, mailed Aug. 15, 2013, 12 pages.
Right of Appeal Notice in Inter Partes Reexamination of U.S. Pat. No. 7,161,506, Control No. 95/001,926, mailed Aug. 16, 2013, 11 pages.
Inter Partes Reexamination Certificate in Inter Partes Reexamination of U.S. Pat. No. 7,415,530, Control No. 95/001,927, issued Aug. 16, 2013, 2 pages.
Right of Appeal Notice in Inter Partes Reexamination of U.S. Pat. No. 7,378,992, Control No. 95/001,928, mailed Aug. 16, 2013, 11 pages.
Right of Appeal Notice in Inter Partes Reexamination of U.S. Pat. No. 7,352,300, Control No. 95/001,924, mailed Aug. 29, 2013, 23 pages.
Action Closing Prosecution in Inter Partes Reexamination of U.S. Pat. No. 7,395,345, Control No. 95/001,925, dated Sep. 20, 2013, 47 pages.
Decision on Petition(s) Decided Under 37 C.F.R. 1.181 in Inter Partes Reexamination of U.S. Pat. No. 7,714,747, Control No. 95/001,517, mailed Sep. 23, 2013, 3 pages.
Action Closing Prosecution in Inter Partes Reexamination of U.S. Pat. No. 6,604,158, Control No. 95/001,923, dated Oct. 2, 2013, 18 pages.
Patent Owner's Reply to Action Closing Prosecution of Sep. 20, 2013 in Inter NPL835 Partes Reexamination of U.S. Pat. No. 7,395,345, Control No. 95/001,925, filed Oct. 21, 2013, 9 pages.
Decision on Appeal in Inter Partes Reexamination of U.S. Pat. No. 7,417,568, Control No. 95/001,533, mailed Nov. 1, 2013, 18 pages.
Decision on Appeal in Inter Partes Reexamination of U.S. Pat. No. 7,400,274, Control No. 95/001,544, mailed Nov. 1, 2013, 12 pages.
Decision on Appeal in Inter Partes Reexamination of U.S. Pat. No. 7,777,651, Control No. 95/001,581, mailed Nov. 1, 2013, 15 pages.
Patent Owner's Reply to Action Closing Prosecution of Oct. 2, 2013 in Inter Partes Reexamination of U.S. Pat. No. 6,604,158, Control No. 95/001,923, filed Nov. 4, 2013, 9 pages.
Notice of Intent to Issue a Reexam Certificate in Inter Partes Reexamination of U.S. Pat. No. 7,321,937, Control No. 95/001,922, mailed Nov. 13, 2013, 8 pages.
Supplemental Notice of Allowability for U.S. Appl. No. 13/154,211, dated Nov. 26, 2013, 4 pages.
Notice of Allowance for U.S. Appl. No. 13/101,994, dated Dec. 2, 2013, 7 pages.
Notice of Allowance for U.S. Appl. No. 11/553,419, dated Dec. 18, 2013, 6 pages.
Supplemental Notice of Allowability for U.S. Appl. No. 13/154,211, dated Dec. 19, 2013, 4 pages.
Non-Final Office Action for U.S. Appl. No. 14/035,716, dated Dec. 20, 2013, 12 pages.
Notice of Allowance for U.S. Appl. No. 14/035,712, dated Dec. 20, 2013, 8 pages.
Non-Final Office Action for U.S. Appl. No. 14/035,719, dated Dec. 20, 2013, 11 pages.
Final Office Action for U.S. Appl. No. 12/690,125, dated Dec. 27, 2013, 12 pages.
Corrected Notice of Allowability for U.S. Appl. No. 11/553,419, mailed 2 pages.
Notice of Allowance for U.S. Appl. No. 14/035,561, dated Jan. 16, 2014, 9 pages.
Corrected Notice of Allowability for U.S. Appl. No. 11/553,419, dated Jan. 31, 2014, 2 pages.
Non-Final Office Action for U.S. Appl. No. 13/118,122, dated Feb. 19, 2014, 23 pages.
Notice of Allowance for U.S. Appl. No. 13/101,994, dated Feb. 20, 2014, 5 pages.
Supplemental Notice of Allowance for U.S. Appl. No. 12/857,238, dated Feb. 25, 2014, 2 pages.
Non-Final Office Action for U.S. Appl. No. 14/134,933, dated Feb. 25, 2014, 7 pages.
Non-Final Office Action for U.S. Appl. No. 14/033,245, dated Feb. 26, 2014, 11 pages.
Non-Final Office Action for U.S. Appl. No. 14/134,926, dated Feb. 27, 2014, 16 pages.
Final Office Action for U.S. Appl. No. 09/969,987, dated Apr. 8, 2014, 8 pages.
Non-Final Office Action for U.S. Appl. No. 13/403,785, dated May 9, 2014, 5 pages.
Final Office Action for U.S. Appl. No. 13/118,122, dated Jun. 18, 2014, 14 pages.
Notice of Allowance for U.S. Appl. No. 14/251,453, dated Jun. 25, 2014; 8 pages.
Final Office Action for U.S. Appl. No. 14/134,933, dated Jun. 27, 2014; 9 pages.
Notice of Allowance for U.S. Appl. No. 14/134,926, dated Jul. 8, 2014, 9 pages.

(56) References Cited

OTHER PUBLICATIONS

Notice of Allowance for U.S. Appl. No. 14/033,245, dated Jul. 22, 2014, 13 pages.
Non-Final Office Action for U.S. Appl. No. 14/495,574, dated Oct. 23, 2014; 10 pages.
Non-Final Office Action for U.S. Appl. No. 09/969,987, dated Oct. 23, 2014; 11 pages.
Non-Final Office Action for U.S. Appl. No. 13/403,785, daetd Dec. 18, 2014, 17 pages.
Notice of Intent to Issue an Inter Partes Reexamination Certificate in Inter Partes Reexamination of U.S. Pat. No. 7,378,992, Control No. 95/001,928, mailed Nov. 21, 2013, 10 pages.
Notice of Intent to Issue an Inter Panes Reexamination Certificate in Inter Partes Reexamination of U.S. Pat. No. 7,161,506, Control No. 95/001,926, mailed Nov. 27, 2013, 10 pages.
Declaration of Dr. James W. Modestino under 37 C.F.R. § 1.132 in Inter Partes Reexamination of U.S. Pat. No. 7,417,568, Control No. 95/001,533, executed Nov. 29, 2013; 51 pages.
Declaration of Dr. James W. Modestino under 37 C.F.R. § 1.132 in Inter Partes Reexamination of U.S. Pat. No. 7,400,274, Control No. 95/001,544, executed Nov. 29, 2013; 49 pages.
Declaration of Dr. James W. Modestino under 37 C.F.R. § 1.132 in Inter Partes Reexamination of U.S. Pat. No. 7,777,651, Control No. 95/001,581, executed Nov. 29, 2013; 50 pages.
Patent Owner's Request to Reopen Prosecution Before the Examiner under 37 C.F.R. § 41.77(b) in Inter Partes Reexamination of U.S. Pat. No. 7,417,568, Control No. 95/001,533, filed Dec. 2, 2013, 41 pages.
Patent Owner's Request to Reopen Prosecution Before the Examiner under 37 C.F.R. § 41.77(b) in Inter Partes Reexamination of U.S. Pat. No. 7,777,651, Control No. 95/001,581, filed Dec. 2, 2013, 57 pages.
Patent Owner's Request to Reopen Prosecution Before the Examiner under 37 C.F.R. § 41.77(b) in Inter Partes Reexamination of U.S. Pat. No. 7,400,274, Control No. 95/001,544, filed Dec. 2, 2013, 33 pages.
Inter Partes Reexamination Certificate in Inter Partes Reexamination of U.S. Pat. No. 7,321,937, Control No. 95/001,922, mailed Dec. 5, 2013, 2 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,417,568, Control No. 95/001,533, mailed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,400,274, Control No. 95/001,544, mailed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,777,651, Control No. 95/001,581, mailed Jan. 2, 2014, 10 pages.
Inter Partes Reexamination Certificate in Inter Partes Reexamination of U.S. Pat. No. 7,161,506, Control No. 95/001,926, mailed Jan. 8, 2014, 2 pages.
Inter Partes Reexamination Certificate in Inter Partes Reexamination of U.S. Pat. No. 7,378,992, Control No. 95/001,928, mailed Jan. 8, 2014, 3 pages.
Examiner's Determination Under 37 C.F.R. § 41.77(d) in Inter Partes Reexamination of U.S. Pat. No. 7,714,747, Control No. 95/001,517, mailed Jan. 14, 2014, 11 pages.
Patent Owner's Petition Under 37 C.F.R. § 1.181 to Strike Third Party Requester's Improper Response Under 37 C.F.R. § 41.77(c), in Inter Partes Reexamination of U.S. Pat. No. 7,417,568, Control No. 95/001,533, mailed Jan. 22, 2014, 3 pages.
Patent Owner's Petition Under 37 C.F.R. § 1.181 to Strike Third Party Requester's Improper Response Under 37 C.F.R. § 41.77(c), in Inter Partes Reexamination of U.S. Pat. No. 7,400,274, Control No. 95/001,544, mailed Jan. 22, 2014, 3 pages.
Patent Owner's Petition Under 37 C.F.R. § 1.181 to Strike Third Party Requester's Improper Response Under 37 C.F.R. .§ 41.77(c), in Inter Partes Reexamination of U.S. Pat. No. 7,777,651, Control No. 95/001,581, mailed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,417,568, Control No. 95/001,533, mailed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,400,274, Control No. 95/001,544, mailed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,777,651, Control No. 95/001,581, mailed Jan. 22, 2014, 3 pages.
Patent Owner's Request for Rehearing Under 37 C.F.R. § 41.79, in Inter Partes Reexamination of U.S. Pat. No. 7,714,747, Control No. 95/001,517, filed Feb. 14, 2014, 11 pages.
Patent Owner's Supplemental Reply to Action Closing Prosecution in Inter Partes Reexamination of U.S. Pat. No. 6,604,158, Control No. 95/001,923, filed Feb. 27, 2014, 10 pages.
Patent Owner's Supplemental Reply to Action Closing Prosecution in Inter Partes Reexamination of U.S. Pat. No. 7,395,345, Control No. 95/001,925, filed Feb. 27, 2014, 9 pages.
Corrected Request to Reopen Prosecution Before the Examiner under 37 C.F.R. § 41.77(b) in Inter Partes Reexamination of U.S. Pat. No. 7,417,568, Control No. 95/001,533, mailed Mar. 11, 2014, 48 pages.
Corrected Request to Reopen Prosecution Before the Examiner under 37 C.F.R. § 41.77(b) in Inter Partes Reexamination of U.S. Pat. No. 7,400,274, Control No. 95/001,544, mailed Mar. 11, 2014, 39 pages.
Corrected Request to Reopen Prosecution Before the Examiner under 37 C.F.R. § 41.77(b) in Inter Partes Reexamination of U.S. Pat. No. 7,777,651, Control No. 95/001,581, mailed Mar. 11, 2014, 67 pages.
Right of Appeal Notice Utder 37 C.F.R. § 1.953 in Inter Partes Reexamination of U.S. Pat. No. 6,604,158, Control No. 95/001,923, mailed Jun. 9, 2014, 14 pages.
Right of Appeal Notice Under 37 C.F.R. § 1.953 in Inter Partes Reexamination of U.S. Pat. No. 7,395,345, Control No. 95/001,925 mailed Jun. 10, 2014, 10 pages.
Notice of Intent to Issue a Reexamination Certificate in Inter Partes Reexamination of U.S. Pat. No. 7,352,300, Control No. 95/001,924, mailed Jun. 27 ,2014, 7 pages.
Inter Partes Reexamination Certificate in Inter Partes Reexamination of U.S. Pat. No. 7,352,300, Control No. 95/001,924, mailed Aug. 4, 2014, 4 pages.
Examiner's Determination Under 37 C.F.R. 41.77(d), in Inter Partes Reexamination of U.S. Pat. No. 7,417,568, Control No. 95/001,533, mailed Oct. 3, 2014; 10 pages.
Examiner's Determination Under 37 C.F.R. 41.77(d), in Inter Partes Reexamination of U.S. Pat. No. 7,400,274, Control No. 95/001,544, mailed Oct. 10, 2014; 10 pages.
Examiner's Determination Under 37 C.F.R. 41.77(d), in Inter Partes Reexamination of U.S. Pat. No. 7,777,651, Control No. 95/001,581, mailed Oct. 10, 2014; 12 pages.
Comments in Response to Examiner's Determination Under 37 C.F.R. 41.77(e) in Inter Partes Reexamination of U.S. Pat. No. 7,417,568, Control No. 95/001,533, filed Nov. 3, 2014; 30 pages.
Inter Partes Reexamination Certificate in Inter Partes Reexamination of U.S. Pat. No. 7,395,345, Control No. 95/001,925, mailed Nov. 3, 2014; 2 pages.
Comments in Response to Examiner's Determination under 37 C.F.R. 41.77(e) in Inter Partes Reexamination of U.S. Pat. No. 7,400,274, Control No. 95/001,544, filed Nov. 10, 2014; 19 pages.
Comments in Response to Examiner's Determination under 37 C.F.R. 41.77(e) in Inter Partes Reexamination of U.S. Patent No. 7,777,651, Control No. 95/001,581, filed Nov. 10, 2014; 19 pages.
Patent Owner's Reply to Third Party Requester's Comments Under 37 C.F.R. 41.77(e) in Inter Partes Reexamination of U.S. Pat. No. 7,417,568, Control No. 95/001,533, filed Dec. 3, 2014, 6 pages.

(56) References Cited

OTHER PUBLICATIONS

Patent Owner's Reply to Third Party Requester's Comments Under 37 C.F.R. 41.77(e) in Inter Partes Reexamination of U.S. Pat. No. 7,400,274, Control No. 95/001,544, filed Dec. 10, 2014, 6 pages.
Patent Owner's Reply to Third Party Requester's Comments Under 37 C.F.R. 41.77(e) in Inter Partes Reexamination of U.S. Pat. No. 7,777,651, Control No. 95/001,581, filed Dec. 10, 2014, 6 pages.
Decision on Request for Rehearing in Inter Partes Reexamination of U.S. Pat. No. 7,714,747, Control No. 95/001,517, mailed Jan. 6, 2015, 7 pages.
Right of Appeal Notice in Inter Partes Reexamination of U.S. Pat. No. 6,604,158, Control No. 95/001,923, mailed Jan. 9, 2015, 14 pages.
Court Docket History for 6:10-cv-00493-LED-JDL, *Realtime Data, LLC d/b/a IXO, v. T-Mobile, USA Inc.*, downloaded Jan. 30, 2014, 78 pages.
Court Docket History for 1:11-cv-06696-RJH, *Realtime Data, LLC d/b/a IXO, v. Morgan Stanley et al.*, downloaded Jan. 30, 2014, 80 pages.
Court Docket History for 1:11-cv-06697-UA, *Realtime Data, LLC d/b/a/ IXO, v. CME Group Inc. et al.*, downloaded Jan. 30, 2014, 105 pages.
Court Docket History for 1:11-cv-06698-UA, *Realtime Data, LLC d/b/a/ IXO, v. Thomson Reuters et al.*, downloaded Jan. 30, 2014, 59 pages.
Opinion, with Errata, filed in *Realtime Data, LLC d/b/a/ IXO v. Morgan Stanley et al.*, Case Nos. 13-1092, -1093, -1095, -1097, -1098, -1099, -1100, -1101, and -1103, United States Court of Appeals for the Federal Circuit, filed Jan. 27, 2014, 41 pages.
U.S. Appl. No. 14/305,692, James J. Fallon, "System and Methods for Data Storage and Retrieval," filed Jun. 16, 2014.
U.S. Appl. No. 14/577,286, Fallon et al., "Systems and Methods for Video and Audio Data Distribution," filed Dec. 19, 2014.
NetApp, Inc.'s and Solidfire, LLC's Answer to Amended Complaint, filed in *Realtime Data d/b/a IXO v. Rackspace US, Inc. et al.*, Case No. 6:16-cv-961 (E.D. Texas), filed Sep. 6, 2016; 61 pages.
Rackspace US Inc.'s Answer to Amended Complaint, filed in *Realtime Data LLC d/b/a IXO v. Rackspace US, Inc. et al.*, Case No. 6:16-cv-961 (E.D. Texas), filed Oct. 25, 2016; 39 pages.
NetApp, Inc.'s and Solidfire, LLC's Answer to Amended Complaint, filed in *Realtime Data LLC d/b/a IXO v. Rackspace US, Inc. et al.*, Case No. 6:16-cv-961 (E.D. Texas), filed Oct. 28, 2016; 66 pages.
Joint Claim Construction and Prehearing Statement, filed in *Realtime Data LLC d/b/a IXO v. Apple Inc.*, Case No. 16-cv-02595-JD (N.D. California), filed Jan. 6, 2017; 6 pages.
Joint Claim Construction and Prehearing Statement Exhibit A, filed in *Realtime Data LLC d/b/a IXO v. Apple Inc.*, Case No. 16-cv-02595-JD (N.D. California), filed Jan. 6, 2017; 27 pages.
Joint Claim Construction and Prehearing Statement Exhibit B, filed in *Realtime Data LLC d/b/a IXO v. Apple Inc.*, Case No. 16-cv-02595-JD (N.D. California), filed Jan. 6, 2017; 17 pages.
Joint Claim Construction and Prehearing Statement Exhibit C, filed in *Realtime Data LLC d/b/a IXO v. Apple Inc.*, Case No. 16-cv-02595-JD (N.D. California), filed Jan. 6, 2017; 28 pages.
Joint Claim Construction and Prehearing Statement, filed in *Realtime Data LLC d/b/a IXO v. Teradata Operations, Inc.*, Case No. 2:16-cv-02743-AG-FFM (C.D. California), filed Jan. 24, 2017; 56 pages.
Joint Claim Construction and Prehearing Statement with attached Exhibit A, filed in *Realtime Data LLC d/b/a IXO v. Hwelett Packard Enterprise Co. et al.*, Case No. 6:16-cv-00086-pages. (E.D. Texas), filed Jan. 17, 2017; 46 pages.
Joint Claim Construction and Prehearing Statement with attached Exhibit A, filed in *Realtime Data LLC d/b/a IXO v. Hwelett Packard Enterprise Co. et al.*, Case No. 6:16-cv-00087-RWS-JDL (E.D. Texas), filed Jan. 17, 2017; 46 pages.
Joint Claim Construction and Prehearing Statement with attached Exhibit A, filed in *Realtime Data LLC d/b/a IXO v. Hwelett Packard Enterprise Co. et al.*, Case No. 6:16-cv-00089-RWS-JDL (E.D. Texas), filed Jan. 17, 2017; 46 pages.
Complaint for Patent Infringement Against Oracle America, Inc., filed in *Realtime Data d/b/a IXO v. Oracle America, Inc.*, Case No. 6:17-cv-00046 (E.D. Texas), filed Jan. 23, 2017; 58 pages.
Defendant Teradata Operations, Inc.'s Opening Claim Construction Brief, filed in *Realtime Data LLC d/b/a IXO v. Teradat Operations, Inc.*, Case No. 2:16-cv-02743 (C.D. California), filed Feb. 7, 2017; 40 pages.
Exhibit D Accompanying Declaration of Jamie R. Lynn, filed in *Realtime Data LLC d/b/a IXO v. Teradat Operations, Inc.*, Case No. 2:16-cv-02743 (C.D. California), filed Feb. 7, 2017; 43 pages.
Exhibit E Accompanying Declaration of Jamie R. Lynn, filed in *Realtime Data LLC d/b/a IXO v. Teradat Operations, Inc.*, Case No. 2:16-cv-02743 (C.D. California), filed Feb. 7, 2017; 46 pages.
Exhibit H Accompanying Declaration of Jamie. R. Lynn, filed in *Realtime Data LLC d/b/a IXO v.Teradat Operations, Inc.*, Case No. 2:16-cv-02743 (C.D. California), filed Feb. 7, 2017; 15 pages.
Exhibit U Accompanying Declaration of Jamie R. Lynn, filed in *Realtime Data LLC d/b/a IXO v. Teradat Operations, Inc.*, Case No. 2:16-cv-02743 (C.D. California), filed Feb. 7, 2017; 7 pages.
Exhibit 10 Accompanying Declaration of Kenneth Zeger, filed in *Realtime Data LLC d/b/a IXO v. Teradat Operations, Inc.*, Case No. 2:16-cv-02743 (C.D. California), filed Feb. 7, 2017; 12 pages.
Plaintiff Realtime Data LLC's Opening Claim Construction Brief, filed in *Realtime Data LLC d/b/a IXO v. Teradata Operations, Inc.*, Case No. 2:16-cv-02743 (C.D. Cal.), filed Feb. 10, 2017; 36 pages.
Expert Declaration of Kenneth Zeger, filed in *Realtime Data LLC d/b/a IXO v. Teradata Operations, Inc.*, Case No. 2:16-cv-02743 (C.D. Cal.), filed Feb. 10, 2017; 49 pages.
Complaint for Patent Infringement, filed in *Realtime Data LLC d/b/a IXO v. Echostar Corporation et al.*, Case No. 6:17-cv-00084 (E.D. Texas), filed Feb. 14, 2017; 39 pages.
Realtime's Opening Claim Construction Brief, filed in *Realtime Data LLC d/b/a IXO v. Apple Inc.*, Case No. 3;16-cv-02595 (N.D. California), filed Feb. 21, 2017; 26 pages.
Complaint for Patent Infringement Against Arconis, Inc., filed in *Realtime Data LLC d/b/a IXO v. Acronis, Inc.*,Case No. 6:17-cv-00118 (E.D. Texas), filed Feb. 27, 2017; 26 pages.
Complaint for Patent Infringement Against Array Networks Inc., filed in *Realtime Data LLC d/b/a IXO v. Array Networks Inc.*,Case No. 6:17-cv-00119 (E.D. Texas), filed Feb. 27, 2017; 33 pages.
Complaint for Patent Infringement Against Barracuda Networks Inc., filed in *Realtime Data LLC d/b/a IXO v. Barracuda Networks Inc.*,Case No. 6:17-cv-00120 (E.D. Texas), filed Feb. 27, 2017; 99 pages.
Complaint for Patent Infringement Against Carbonite Networks Inc. and Evault Inc., filed in *Realtime Data LLC d/b/a IXO v. Carbonite, Inc. et al.*,Case No. 6:17-cv-00121 (E.D. Texas), filed Feb. 27, 2017; 45 pages.
Complaint for Patent Infringement Against Circadence Networks Inc., filed in *Realtime Data LLC d/b/a IXO v. Circadence Corporation*,Case No. 6:17-cv-00122 (E.D. Texas), tiled Feb. 27, 2017; 33 pages.
Complaint for Patent Infringement Against Commvault Systems, Inc. and Spectra Logic Corporation, filed in *Realtime Data LLC d/b/a IXO v. CommVault Systems, Inc. et al.*,Case No. 6:17-cv-00123 (E.D. Texas), filed Feb. 27, 2017; 58 pages.
Complaint for Patent Infringement Against Exinda Networks Inc., filed in *Realtime Data LLC d/b/a IXO v. Exinda Inc.*,Case No. 6:17-cv-00124 (E.D. Texas), filed Feb. 27, 2017; 26 pages.
Complaint for Patent Infringement Against Netgear, Inc., filed in *Realtime Data LLC d/b/a IXO v. NETGEAR, Inc.*,Case No. 6:17-cv-00125 (E.D. Texas), filed Feb. 27, 2017; 33 pages.
Complaint for Patent Infringement Against Synacor, Inc., filed in *Realtime Data LLC d/b/a IXO v. Synacor Inc.*,Case No. 6:17-cv-00126 (E.D. Texas), filed Feb. 27, 2017; 23 pages.
Joint Claim Constuction and Prehearing Statement and attached Exhibit A, filed in *Realtime Data LLC d/b/a IXO v. Rackspace USA, Inc. et al.*, Case No. 6:16-cv-00961 (E.D. Texas), filed Mar. 7, 2017; 42 pages.

(56) References Cited

OTHER PUBLICATIONS

Defendant Apple Inc.'s Responsive Claim Construction Brief, filed in *Realtime Data LLC d/b/a IXO v. Apple Inc.*, Case No. 3:16-cv-02595 (N.D. California), filed Mar. 10, 2017; 25 pages.
Declaration of Craig Wills, filed in *Realtime Data LLC d/b/a IXO v. Apple Inc.*, Case No. 3:16-cv-02595 (N.D. California), filed Mar. 10, 2017; 10 pages.
Realtime's Reply Claim Construction Brief, filed in *Realtime Data LLC d/b/a IXO v. Apple Inc.*, Case No. 3:16-cv-02595 (N.D. California), filed Mar. 17, 2017; 12 pages.
Proposed Joint Pretrial Order, filed in *Realtime Data LLC v. Actian Corporation et al.*, Case No. 6:15-cv-00463 (E.D. Texas), filed Mar. 30, 2017; 103 pages.
Realtime's Opening Claim Construction Brief; filed in *Realtime Data LLC d/b/a IXO v. Rackspace US, Inc. et al.*, Case No. 6:16-cv-00961 (E.D. Texas), filed Mar. 31, 2017; 32 pages.
Exhibit 10 to Realtime's Opening Claim Construction Brief: Expert Declaration of Dr. Kenneth Zeger, filed in *Realtime Data LLC d/b/a IXO v. Rackspace US, Inc. et al.*, Case No. 6:16-cv-00961 (E.D. Texas), filed Mar. 31, 2017; 47 pages.
Exhibit 14 to Realtime's Opening Claim Construction Brief: Excerpt from the Hutchinson Dictionary of Computing Multimedia and the Internet, filed in *Realtime Data LLC d/b/a IXO v. Rackspace US, Inc. et al.*, Case No. 6:16-cv-00961 (E.D. Texas), filed Mar. 31, 2017; 4 pages.
Complaint for Patent Infringement, filed in *Realtime Data LLC d/b/a IXO v. Riverbed Technology, Inc.*, Case No. 6:17-cv-00198 (E.D. Texas), filed Apr. 3, 2017; 19 pages.
Notice of Allowance for U.S. Appl. No. 14/727,309, dated Nov. 16, 2016; 9 pages.
Non-Final Office Action for U.S. Appl. No. 14/936,312 dated Jan. 19, 2017; 13 pages.
Non-Final Office Action for U.S. Appl. No. 13/875,884 dated Nov. 10, 2016; 7 pages.
Notice of Allowance for U.S. Appl. No. 14/876,276, dated Dec. 15, 2016; 5 pages.
Final Office Action for U.S. Appl. No. 14/844,973, dated Feb. 14, 2017; 22 pages.
Notice of Allowance for U.S. Appl. No. 14/727,309, dated Feb. 27, 2017; 6 pages.
Non-Final Office Action for U.S. Appl. No. 15/391,240, dated Feb. 17, 2017; 12 pages.
Non-Final Office Action for U.S. Appl. No. 14/305,692, dated Feb. 10, 2017; 10 pages.
Notice of Allowance for U.S. Appl. No. 14/733,565, dated Feb. 14, 2017; 7 pages.
Notice of Allowance for U.S. Appl. No. 14/876,276, dated Feb. 23, 2017; 7 pages.
Notice of Allowance for U.S. Appl. No. 14/853,581, dated Mar. 30, 2017; 5 pages.
Petition for Inter Partes Review of U.S. Pat. No. 8,880,862, filed in *Apple, Inc. v. Realtime Data LLC*, Case No. IPR2016-01737 (P.T.A.B.), filed Sep. 9, 2016; 83 pages.
Declaration of Dr. Charles J. Neuhauser, filed in *Apple Inc. v. Realtime Data LLC*, Case No. IPR2016-01737 (P.T.A.B.), filed Sep. 9, 2016; 347 pages.
Excerpt from Microsoft Press Computer Dictionary, Third Edition, Redmond, WA: Microsoft Press, 1997; p. 384.
Excerpt from Microsoft Press Computer Dictionary, Third Edition, Redmond, WA: Microsoft Press, 1997; p. 148.
Excerpt from Microsoft Press Computer Dictionary, Third Edition, Redmond, WA: Microsoft Press, 1997; p. 395.
Excerpt from Microsoft Press Computer Dictionary, Third Edition, Redmond, WA: Microsoft Press, 1997; p. 137.
Excerpts from Loudon, K., Mastering Algorithms with C, Sebastopol, CA: O'Reilley Media, Inc., 1999; pp. 365-421.
Excerpts from Barr, M., Programming Embedded Systems in C and C++, Sebastol, CA: O'Reilley & Associates, Inc., 1999; pp. 57-83.
Excerpts from Pearce, E., Windows NT in a Nutshell, Sebastol, CA: O'Reilley & Associates, Inc., 1997; pp. 8-9, 52-55, 317-327.
Excerpts from O'Reilley, et al., Windows 98 in a Nutshell, Sebasto, CA: O'Reilley & Associates, Inc., 1999; pp. 109-112.
Excerpts from Microsoft Press Computer Dictionary, Third Edition, Redmond, WA: Microsoft Press, 1997; p. 72, 27-28, 341, 384-386.
Petition for Inter Partes Review of U.S. Pat. No. 8,880,862, filed in *Apple, Inc. v. Realtime Data LLC*, Case No. IPR2016-01738 (P.T.A.B.), filed Sep. 9, 2016; 82 pages.
Declaration of Dr. Charles J. Neuhauser, filed in *Apple Inc. v. Realtime Data LLC*, Case No. IPR2016-01739 (P.T.A.B.), filed Sep. 9, 2016; 101 pages.
Petition for Inter Partes Review of U.S. Pat. No. 8,880,862, filed in *Apple, Inc. v. Realtime Data LLC*, Case No. IPR2016-01739 (P.T.A.B.), filed. Sep. 9, 2016; 77 pages.
Patent Owner Response, filed in *Oracle America, Inc. v. Realtime Data LLC*, Case No. IPR2016-00374 (P.T.A.B.), filed Sep. 15, 2016; 71 pages.
Declaration of Kenneth A. Zeger, Ph.D., filed in *Oracle America, Inc. v. Realtime Data LLC*, Case No. IPR2016-00374 (P.T.A.B.), filed Sep. 15, 2016; 115 pages.
Excerpt from IBM Dictionary of Computing, International Business Machines Corporation, 1994; p. 27.
Storer, A., "An Introduction to Data Structures and Algorithms," Waltham, MA: Springer Science & Business Media, LLC, 2012; pp. 1-27, 76-80, 91, 164.
Freedman, A., "The Computer Glossary: The Complete Illustrated Dictionary, Ninth Edition," New York, NY: AMACOM, 2001; pp. 140, 147.
IEEE 100: The Authoritative Dictionary of IEEE Standards Terms, Seventh Edition, New York, NY: Institute of Electrical and Electronics Engineers, Inc., 2000; pp. 455, 860, 861.
Excerpts from Microsoft Computer Dictionary, Fifth Edition, Redmond, WA, Microsoft Corporation: 2002; pp. 30, 417.
Deposition of James A. Storer, Ph.D., filed in *Oracle America, Inc. v. Realtime Data LLC*, Case Nos. IPR2016-00373 and IPR2016-00374 (P.T.A.B.), filed Sep. 15, 2016; 63 pages.
Excerpts from Pfaffenberger, B., "Webster's New World Dictionary of Computer Terms, Sixth Edition," New York, NY: Simon & Schuster, Inc., 1997; pp. 29, 186, 195, 411.
Internet Archive version of the web page www.nist.gov/dads/HTML/prefix.html, dated Jun. 20, 2001, available at https://web.archive.org/web/20090130084909/http://nist.gov/dads/HTML/prefix.html; 1 page.
Internet Archive version of the web page www.nist.gov/dads/, dated Feb. 3, 2009, available at https://web.archive.org/web/20090130084909/http://nist.gov/dads/; 26 pages.
Excerpt from Webster's New World College Dictionary, Fourth Edition, Foster City, CA: IDG Books Worldwide, Inc., 2001; p. 1133.
Excerpt from Webster's II New College Dictionary, Boston, MA: Houghton Mifflin Company, 1995; p. 871.
Patent Owner Response, filed in *Oracle America, Inc. v. Realtime Data LLC*, Case No. IPR2016-00373 (P.T.A.B.), filed Sep. 15, 2016; 69 pages.
Declaration of Kenneth A. Zeger, Ph.D., filed in *Oracle America, Inc. v. Realtime Data LLC*, Case No. IPR2016-00373 (P.T.A.B.), filed Sep. 15, 2016; 99 pages.
Petition for Inter Partes Review of U.S. Pat. No. 8,880,862, filed in *Oracle America, Inc. v. Realtime Data LLC*, Case No. IPR2017-00108 (P.T.A.B.), filed Oct. 24, 2016; 72 pages.
Declaration of Dr. James A. Storer, filed in *Oracle America, Inc. v. Realtime Data LLC*, Case No. 1PR2017-00108 (P.T.A.B.), filed Oct. 24, 2016; 107 pages.
Defendants' Technology Tutorial Reference Book, filed in *Realtime Data LLC d/b/a IXO v, Actian Corporation, et al.*, Case No. 6:16-cv-00463-RWS-JDL (E.D. Texas), filed May 19, 2016; 85 pages.
Decision Granting Institution of Inter Partes Review, filed in *Dell, Inc. et al. v. Realtime Data LLC*, Case No. IPR2016-00972 (P.T.A.B.), filed Nov. 1, 2016; 21 pages.
Decision Institution of Inter Partes Review, filed in *Riverbed Technology, Inc. et al. v. Realtime Data LLC*, Case No. IPR2016-00978 (P.T.A.B.), filed Nov. 1, 2016; 31 pages.

(56) References Cited

OTHER PUBLICATIONS

Decision Institution of inter Partes Review, filed in *Riverbed Technology, Inc. et al. v. Realtime Data LLC*, Case No. IPR2016-00980 (P.T.A.B.), filed Nov. 1, 2016; 29 pages.
Petition for Inter Partes Review of U.S. Pat. No. 6,597,812 to Fallon, filed in *Oracle America, Inc. v. Realtime Data LLC*, Case No. IPR2017-00167 (P.T.A.B.), filed Nov. 2, 2016; 65 pages.
Declaration of Professor James A. Storer, Ph.D, filed in *Oracle America, Inc. v. Realtime Data LLC*, Case No. 1PR2017-00167 (P.T.A.B.), filed Nov. 2, 2016; 93 pages.
Petition for Inter Partes Review of U.S. Pat. No. 6,597,812 to Fallon, filed in *Oracle America, Inc. v. Realtime Data LLC*, Case No. IPR2017-00168 (P.T.A.B.), filed Nov. 2, 2016; 84 pages.
Declaration of Professor James A. Storer, Ph.D, filed in *Oracle America, Inc. v. Realtime Data LLC*, Case No. IPR2017-00168 (P.T.A.B.), filed Nov. 2, 2016; 111 pages.
Decision Institution of Inter Partes Review, filed in *Dell, Inc. et al. v. Realtime Data LLC*, Case No. IPR2016-01002 (P.T.A.B.), filed Nov. 4, 2016; 19 pages.
Decision Granting Institution of Inter Partes Review, filed in *Apple, Inc. v. Realtime Data LLC*, Case No. IPR2016-01366 (P.T.A.B.), filed Jan. 12, 2017; 17 pages.
Internet Archive version of the web page http://www.faqs.org/faqs/compression-faq/part1/section-7.html, dated Nov. 28, 1999, available at https://web.archive.org/web/19991128233045/http://www.faqs.org/faqs/compression-faq/part1/section-7.html; 14 pages.
Declaration of Leonard Laub, filed in *Hewlett-Packard Enterprise Company et al. v. Realtime Data LLC d/b/a IXO*, Case No. IPR2016-00783 (P.T.A.B.), filed Jan. 5, 2017; 96 pages.
Petition for Inter Partes Review of U.S. Pat. No. 7,358,867, filed in *Teradata Operations, Inc. v. Realtime Data LLC d/b/a IXO*, Case No. IPR2017-00557 (P.T.A.B.), filed Dec. 30, 2016; 76 pages.
Declaration of Charles D. Creusere, Ph.D., filed in *Teradata Operations, Inc. v. Realtime Data LLC d/b/a IXO*, Case No. IPR2017-00557 (P.T.A.B.), filed Dec. 30, 2016; 137 pages.
Excerpt from McGraw-Hill Dictionary of Scientific and Technical Terms, Fifth Edition, McGraw-Hill 1994; p. 616.
Excerpts from Microsoft Press Computer Dictionary, Third Edition, Microsoft Corporation 1997; pp. 71, 162, 485.
Declaration of Scott Bennett, Ph.D., filed in *Teradata Operations, Inc. v. Realtime Data LLC d/b/a IXO*, Case No. IPR2017-00557 (P.T.A.B.), filed Dec. 30, 2016; 158 pages.
Underwood, "Extensions of the UNIX File Command and Magic File for File Type Identification," Georgia Tech Research Institute 2009; 25 pages.
AT&T UNIX System V User's Manual vol. I, AT&T 1986; 798 pages.
FreeBSDGeneral Commands Manual, FreeBSD Man pp. 2000; 7 pages.
Petition for Inter Partes Review of U.S. Patent. No. 7,161,506, filed in *Teradata Operations, Inc. v. Realtime Data LLC d/b/a IXO*, Case No. IPR2017-00806 (P.T.A.B.), filed Jan. 30, 2016; 57 pages.
Declaration of Charles D. Creusere, filed in *Teradata Operations, Inc. v. Realtime Data LLC d/b/a IXO*, Case No. IPR2017-00806 (P.T.A.B.), filed Jan. 30, 2016; 102 pages.
Realtime's Appeal Brief Under 37 C.F.R. § 41.67, filed in Inter Partes Reexamination of U.S. Pat. No. 7,161,506, Control No. 95/000,479, mailed Apr. 21, 2011; 53 pages.
Excerpts from Microsoft Press Computer Dictionary, Third Edition, Microsoft Corporation 1997; pp. 71, 162, 307, 383, 485.
Verdict Form, filed in *Realtime Data LLC d/b/a IXO v. T-Mobile U.S.A., Inc.*, Case No. 6:10-cv-00493-RC-JDL filed Feb. 11, 2013; 9 pages.
Jury Instructions, filed in *Realtime Data LLC d/b/a IXO v. T-Mobile U.S.A., Inc.*, Case No. 6:10-cv-00493-RC-JDL, filed Feb. 11, 2013; 34 pages.
Transcript of Jury Trial for *Realtime Data Llc d/b/a IXO v. T-Mobile U.S.A., Inc.*, Case No. 6:10-cv-00493-RC-JDL, dated Feb. 8, 2013; 319 pages.

Order Granting in part Plaintiff's Motion for Judgement as a Matter of Law as to invalidity, filed in *Realtime Data LLC d/b/a IXO v. T-Mobile U.S.A., Inc.*, Case No. 6:10-cv-00493-RC-JDL, filed Mar. 4, 2013; 17 pages.
Declaration of Scott Bennett, filed in *Teradata Operations, Inc. v. Realtime Data LLC d/b/a IXO*, Case No. IPR2017-00806 (P.T.A.B.), filed Jan. 30, 2016; 158 pages.
Petition for Inter Partes Review of U.S. Pat. No. 9,054,728, filed in *Teradata Operations, Inc. v. Realtime Data LLC d/b/a IXO*, Case No. IPR2017-00808 (P.T.A.B.), filed Jan. 30, 2016; 66 pages.
Declaration of Charles D. Creusere, filed in *Teradata Operations, Inc. v. Realtime Data LLC d/b/a IXO*, Case. No. IPR2017-00808 (P.T.A.B.), filed Jan. 30, 2016; 114 pages.
Excerpts from Merriam-Webster's Collegiate Dictionary, Tenth Edition, Merriam-Webster Inc. 2000; pp. 12, 53, 56, 913, 918.
Excerpts from Merriam-Webster's Collegiate Dictionary, Deluxe Edition, Merriam-Webster Inc. 1998; pp. 19, 81, 86, 1436, 1444.
Oracle's Reply to Patent Owner's Response to the Petition, filed in *Oracle America, Inc. v. Realtime Data LLC*, Case No. IPR2016-00373 (P.T.A.B.), filed Feb. 2, 2017; 28 pages.
Transcript of Markman Hearing in *Realtime Data LLC v. CME Group Inc., et al.*, Case No. 1.11-cv-06697-KBF (S.D. New York), filed May 14, 2012; 200 pages.
Deposition of Kenneth A. Zeger, Ph.D., filed in *Oracle America v. Realtime Data LLC.*, Case No. IPR2016-00373 (P.T.A.B.), filed Feb. 2, 2017; 94 pages.
Oracle's Reply to Patent Owner's Response to the Petition, filed in *Oracle America, Inc. v. Realtime Data LLC*, Case No. IPR2016-00374 (P.T.A.B.), filed Feb. 2, 2017; 34 pages.
Supplemental Declaration of Professor James A. Storer, Ph.D., filed in *Oracle America, Inc. v. Realtime Data LLC*, Case No. IPR2016-00374 (P.T.A.B.), filed Feb. 2, 2017; 3 pages.
Patent Owner's Response, filed in *Riverbed Technology, Inc. et al. v. Realtime Data LLC*, Case No. IPR2016-00980 (P.T.A.B.), filed Feb. 8, 2017; 51 pages.
Declaration of Kenneth A. Zeger, Ph.D., filed in *Riverbed Technology, Inc. et al. v. Realtime Data LLC*, Case No. IPR2016-00980 (P.T.A.B.), filed Feb. 8, 2017; 59 pages.
Sachs, "Using Curves and Histograms," Digital Light and Color 1996; 19 pages.
Oral Deposition of Charles D. Creusere, Ph.D., filed in *Riverbed Technology, Inc. et al. v. Realtime Data LLC*, Case No. IPR2016-00980 (P.T.A.B.), filed Feb. 8, 2017; 110 pages.
Patent Owner's Response, filed in *Riverbed Technology, Inc. et al. v. Realtime Data LLC*, Case No. IPR2016-00978 (P.T.A.B.), filed. Feb. 8, 2017; 58 pages.
Declaration of Kenneth a. Zeger, Ph.D., filed in *Riverbed Technology, Inc. et al. v. Realtime Data LLC*, Case No. IPR2016-00978 (P.T.A.B.), filed Feb. 8, 2017; 72 pages.
Excerpt from The American Heritage Dictionary of the English Language, Third Edition, Houghton Mifflin Company 1992; p. 1782.
Excerpt from Webster's New World College Dictionary, Fourth Edition, Macmillian USA 1999; p. 1421.
Excerpts from Microsoft Computer Dictionary, Fourth Edition, Microsoft Corporation 1999; pp. 126.
Corrected Patent Owner's Response, filed in *Dell, Inc. et al. v. Realtime Data LLC*, Case No. IPR2016-00972 (P.T.A.B.), filed Feb. 14, 2017; 60 pages.
Oral Deposition of Charles D. Creusere, Ph.D., filed in *Dell, Inc. et al. v. Realtime Data LLC*, Case No. IPR2016-00972 (P.T.A.B.), filed Feb. 8, 2017; 65 pages.
Excerpts from Newton's Telecom Dictionary, Eleventh Edition, Harry Newton 1996; pp. 423 and 682.
Declaration of Kenneth A. Zeger, Ph.D., filed in *Dell, Inc. et al. v. Realtime Data LLC*, Case No. IPR2016-00972 (P.T.A.B.), filed Feb. 8, 2017; 156 pages.
Corrected Patent Owner's Response, filed in *Dell, Inc. et al. v. Realtime Data LLC*, Case No. IPR2016-01002 (P.T.A.B.), filed Feb. 14, 2017; 55 pages.
Declaration of Kenneth A. Zeger, Ph.D., filed in *Dell, Inc. et al. v. Realtime Data LLC*, Case No. IPR2016-01002 (P.T.A.B.), filed Feb. 14, 2017; 135 pages.

(56) References Cited

OTHER PUBLICATIONS

Decision Institution of Inter Partes Review, filed in *Oracle America, Inc.* v. *Realtime Data LLC*, Case No. IPR2016-01671 (P.T.A.B.), filed Mar. 8, 2017; 11 pages.
Petition for Inter Partes Review of U.S. Pat. No. 7,415,530 under 35 U.S.C. §§ 311-319 and 37 C.F.R. § 42.100 et seq., filed in *NetApp Inc.* v. *Realtime Data LLC*, Case No. IPR2017-01195 (P.T.A.B.), filed Mar. 30, 2017; 74 pages.
Declaration of Daniel Hirschberg, filed in *NetApp Inc.* v. *Realtime Data LLC*, Case No. IPR2017-01195 (P.T.A.B.), filed Mar. 30, 2017; 63 pages.
Lelewer et al., "Data Compression," ACM Computing Surveys, vol. 19, No. 3, Sep. 1987; 36 pages.
Petition for Inter Partes Review of U.S. Pat. No. 9,116,908 under 35 U.S.C. §§ 311-319 and 37 C.F.R. § 42.100 et seq.,filed in *NetApp Inc.* v. *Realtime Data LLC*, Case No. IPR2017-01196 (P.T.A.B.), filed Mar. 30, 2017; 75 pages.
Declaration of Daniel Hirschberg, filed in *NetApp Inc.* v. *Realtime Data LLC*, Case No. IPR2017-01196 (P.T.A.B.), filed Mar. 30, 2017; 60 pages.
HPE, HPES, and Teradata's Reply to Patent Owner's Response to the Petition, filed in *HPE et al.* v. *Realtime Data LLC*, Case No. IPR2016-00783 (P.T.A.B.), filed. Apr. 5, 2017; 35 pages.
Supplemental Declaration of Charles D. Creusere in Support of HPE, HPES, and Teradata's Reply to Patent Owner's Response to the Petition, filed in *HPE et al.* v. *Realtime Data LLC*, Case No. IPR2016-00783 (P.T.A.B.), filed Apr. 5, 2017; 5 pages.
Transcript of Feb. 23, 2017 Deposition of Leonard Laub, filed in *HPE et al.* v. *Realtime Data LLC*, Case No. IPR2016-00783 (P.T.A.B.), filed Apr. 5, 2017; 151 pages.
Patent Owner Realtime Data, LLC d/b/a IXO's Response, filed in *Apple, Inc.* v. *Realtime Data, LLC d/b/a IXO*, Case No. IPR2016-01366, filed Apr. 6, 2017; 58 pages.
Expert Declaration of Dr. Godmar Back in Support of the Patent Owner's Response, filed in *Apple, Inc.* v. *Realtime Data, LLC d/b/a IXO*, Case No. IPR2016-01366, filed Apr. 6, 2017; 53 pages.
Excerpt from The American Heritage Dictionary, Second College Edition, Boston, MA, Houghton Mifflin Company: 1982; p. 499.
Excerpts from Dictionary of Computer and Internet Words: An A to Z Guide to Hardware, Software, and Cyberspace, Boston, MA, Houghton Mifflin Company: 2001; pp. 161, 259.
Excerpts from IEEE Standard Computer Dictionary: A Compilation of IEEE Standard Computer Glossaries, The Institute of Electrical and Electronics Engineers: 1990; pp. 87, 122, 192.
Excerpt from IEEE Standard Glossary of Computer Hardware Terminology, The Institute of Electrical and Electronics Engineers: 1994; p. 71.
Excerpt from IEEE Standard Glossary of Software Engineering Terminology, The Institute of Electrical and Electronics Engineers: 1990; pp. 33, 44, 71.
Excerpts from Microsoft Computer Dictionary, Fifth Edition, Redmond, WA, Microsoft Corporation: 2002; pp. 210, 315, 499.
Excerpts from Oxford Dictionary of Computing, Oxford University Press, Market House Books Ltd.: 2004; pp. 262-263.
Excerpt from McKusick et al., "The Design and Implementation of the 4.4BSD Operating System," Addison-Wesley Longman, Inc.: 1996; p. 535.
Update Court Docket History for *Realtime Data LLC d/b/a IXO* v. *Actian Corporation, et al.*, Case No. 6:.15-cv-00463 (E.D. Texas), downloaded Apr. 3, 2017, 50 pages.
Updated Court Docket History for *Realtime Data LLC d/b/a IXO* v. *Hewlett Packard Enterprise Co., et al.*, No. 6:16-cv-00086 (E.D. Texas), downloaded Apr. 3, 2017, 11 pages.
Updated Court Docket History for *Realtime Data LLC d/b/a IXO* v. *Oracle America, Inc.*, No. 6:16-cv-00088 (E.D. Texas), downloaded Apr. 3, 2017; 15 pages.
Updated Court Docket History for *Realtime Data LLC d/b/a IXO* v. *CenturyLink, Inc., et al.*, No. 6:16-cv-00087 (E.D. Texas), downloaded Apr. 3, 2017; 11 pages.
Updated Court Docket History for *Realtime Data LLC d/b/a IXO* v. *Dell, Inc., et al.*, No. 6:16-cv-00089 (Ed. Texas), downloaded Apr. 3, 2017; 12 pages.
Updated Court Docket History for *Realtime Data LLC d/b/a IXO* v. *Teradata Operations, Inc.*, Case No. 2:16-cv-02743 (C.D. Cal), downloaded Apr. 3, 2017; 7 pages.
Updated Court Docket History for *Realtime Data LLC d/b/a IXO* v. *Rackspace US, Inc., et al.*, No. 6:16-cv-00961 (E.D. Texas), downloaded Apr. 3, 2017; 13 pages.
Updated Court Docket History for *Realtime Data LLC d/b/a IXO* v. *Fujitsu America, Inc., et al.*, No. 6:16-cv-01035 (E.D. Texas), downloaded Apr. 3, 2017; 6 pages.
Updated Court Docket History for *Realtime Data LLC d/b/a IXO* v. *Vembu Technologies, Inc.*, No. 6:16-cv-01037 (E.D. Texas), downloaded Apr. 3, 2017; 4 pages.
Updated Court Docket History for *Realtime Data LLC d/b/a IXO* v. *Apple, Inc.*, Case No. 6:15-cv-00885 (E.D. Texas), downloaded Sep. 22, 2016, 4 pages.
Non-Final Office Action for U.S. Appl. No. 14/936,312, dated Apr. 26, 2017; 11 pages.
Final Office Action for U.S. Appl No. 14/794,201, dated Jun. 1, 2017; 10 pages.
Petition for Inter Partes Review of U.S. Pat. No. 9,054,728, filed in *NetApp, Inc. et al.* v. *Realtime Data LLC*, Case No. IPR2017-01354 (P.T.A.B.), filed May 2, 2017; 69 pages.
Declaration of Daniel Hirschberg, filed in *NetApp, Inc. et al.*v. *Realtime Data LLC*, Case No. IPR2017-01354 (P.T.A.B.), filed May 2, 2017; 59 pages.
Reply to Office Action in Inter Partes Reexamination of U.S. Pat. No. 7,161,506, Control No. 95/000,479, filed Mar. 15, 2010, 23 pgs.
Unix Command Webpage, retrieved from http://web-beta.archive.org/web/web/20010810082609/; 14 pages.
Petitioners' Reply, filed in *Riverbed Technology, Inc. et al.*v. *Realtime Data LLC*, Case No. IPR2016-00980 (P.T.A.B.), filed May 10, 2017; 22 pages.
Deposition Transcript of Kenneth A. Zeger held Apr. 19, 2017, filed in *Riverbed Technology, Inc. et al.* v. *Realtime Data LLC*, Case No. IPR2016-00980 (P.T.A.B.), filed May 10, 2017; 102 pages.
Petitioners' Reply, filed in *Dell, Inc. et al.* v. *Realtime Data LLC*, Case No. IPR2016-01002 (P.T.A.B.), filed May 10, 2017; 31 pages.
Deposition Transcript of Kenneth A. Zeger held Apr. 10, 2017, filed in *Dell, Inc. et al.* v. *Realtime Data LLC*,Case No. IPR2016-01002 (P.T.A.B.), filed May 10, 2017; 216 pages.
Exhibit 1 to the Apr. 10, 2017 Deposition of Kenneth A. Zeger, filed in *Dell, Inc. et al.* v. *Realtime Data LLC*, Case No. IPR2016-01002 (P.T.A.B.), filed May 10, 2017; 1 page.
Exhibit 2 to the Apr. 10, 2017 Deposition of Kenneth A. Zeger, filed in *Dell, Inc. et al.* v. *Realtime Data LLC*, Case No. IPR2016-01002 (P.T.A.B.), filed May 10, 2017; 1 page.
Petitioners' Reply, filed in *Riverbed Technology, Inc. et al.* v. *Realtime Data LLC*, Case No. IPR2016-00978 (P.T.A.B.), filed May 10, 2017; 34 pages.
Excerpt from Newton's Telecom Dictionary, Eleventh Edition, Harry Newton 1996; p. 145.
Petitioners' Reply, filed in *Dell Inc. et al.* v. *Realtime Data LLC*, Case No. IPR2016-00972 (P.T.A.B.), filed May 10, 2017; 35 pages.

\* cited by examiner

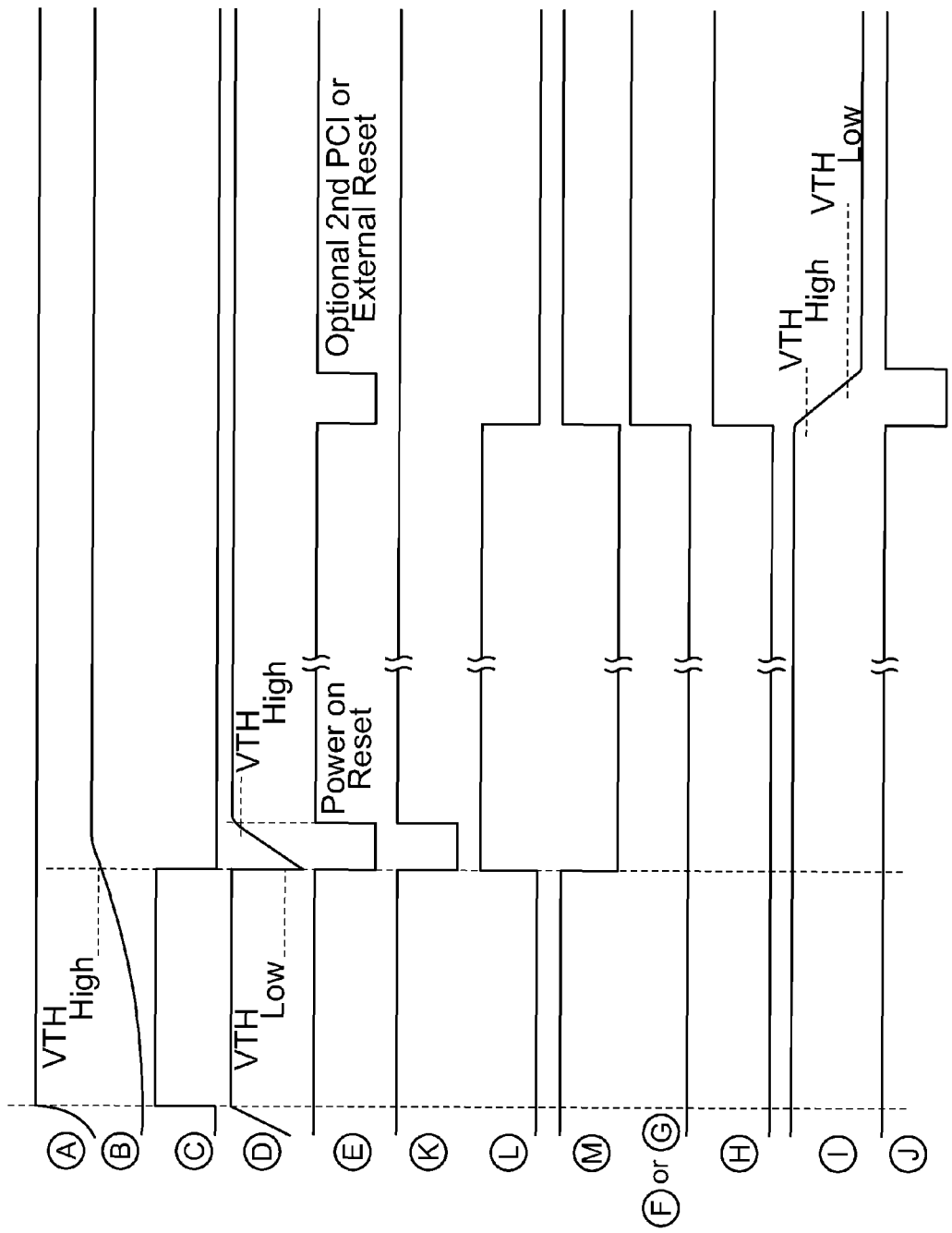

SYSTEM AND METHOD FOR ELECTRICAL BOOT-DEVICE-RESET SIGNALS

CROSS REFERENCE TO RELATED APPLICATIONS

This application is a continuation of U.S. patent application Ser. No. 13/118,122, filed on May 27, 2011, now U.S. Pat. No. 8,880,862, which is a continuation of U.S. patent application Ser. No. 11/551,211, filed on Oct. 19, 2006, now U.S. Pat. No. 8,112,619, which is a continuation of U.S. patent application Ser. No. 09/776,267, filed on Feb. 2, 2001, now U.S. Pat. No. 7,181,608, which claims the benefit of U.S. Provisional Application Ser. No. 60/180,114, filed on Feb. 3, 2000, all of which are fully incorporated herein by reference in their entirety.

BACKGROUND

1. Technical Field

The present invention relates generally to systems and methods for providing accelerated loading of operating system and application programs upon system boot or application launch and, more particularly, to data storage controllers employing lossless and/or lossy data compression and decompression to provide accelerated loading of operating systems and application programs.

2. Description of the Related Art

Modern computers utilize a hierarchy of memory devices. To achieve maximum performance levels, modern processors utilize onboard memory and on board cache to obtain high bandwidth access to both program and data. Limitations in process technologies currently prohibit placing a sufficient quantity of onboard memory for most applications. Thus, in order to offer sufficient memory for the operating system(s), application programs, and user data, computers often use various forms of popular off-processor high speed memory including static random access memory (SRAM), synchronous dynamic random access memory (SDRAM), synchronous burst static ram (SBSRAM). Due to the prohibitive cost of the high-speed random access memory, coupled with their power volatility, a third lower level of the hierarchy exists for non-volatile mass storage devices.

Furthermore, mass storage devices offer increased capacity and fairly economical data storage. Mass storage devices (such as a "hard disk") typically store the operating system of a computer system, as well as applications and data and rapid access to such data is critical to system performance. The data storage and retrieval bandwidth of mass storage devices, however, is typically much less as compared with the bandwidth of other elements of a computing system. Indeed, over the last decade, although computer processor performance has improved by at least a factor of 50, magnetic disk storage performance has only improved by a factor of 5. Consequently, memory storage devices severely limit the performance of consumer, entertainment, office, workstation, servers, and mainframe computers for all disk and memory intensive operations.

The ubiquitous Internet combined with new multimedia applications has put tremendous emphasis on storage volumetric density, storage mass density, storewidth, and power consumption. Specifically, storage density is limited by the number of bits that are encoded in a mass storage device per unit volume. Similarly mass density is defined as storage bits per unit mass. Storewidth is the data rate at which the data may be accessed. There are various ways of categorizing storewidth in terms, several of the more prevalent metrics include sustained continuous storewidth, burst storewidth, and random access storewidth, all typically measured in megabytes/sec. Power consumption is canonically defined in terms of power consumption per bit and may be specified under a number of operating modes including active (while data is being accessed and transmitted) and standby mode. Hence one fairly obvious limitation within the current art is the need for even more volume, mass, and power efficient data storage.

Magnetic disk mass storage devices currently employed in a variety of home, business, and scientific computing applications suffer from significant seek-time access delays along with profound read/write data rate limitations. Currently the fastest available disk drives support only a sustained output data rate in the tens of megabytes per second data rate (MB/sec). This is in stark contrast to the modern Personal Computer's Peripheral Component Interconnect (PCI) Bus's low end 32 bit/33 Mhz input/output capability of 264 MB/sec and the PC's internal local bus capability of 800 MB/sec.

Another problem within the current art is that emergent high performance disk interface standards such as the Small Computer Systems Interface (SCSI-3), Fibre Channel, AT Attachment UltraDMA/66/100, Serial Storage Architecture, and Universal Serial Bus offer only higher data transfer rates through intermediate data buffering in random access memory. These interconnect strategies do not address the fundamental problem that all modern magnetic disk storage devices for the personal computer marketplace are still limited by the same typical physical media restrictions. In practice, faster disk access data rates are only achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus another problem with modern data storage systems utilizing RAID systems is that a linear increase in data bandwidth requires a proportional number of added disk storage devices.

Another problem with most modern mass storage devices is their inherent unreliability. Many modern mass storage devices utilize rotating assemblies and other types of electromechanical components that possess failure rates one or more orders of magnitude higher than equivalent solid-state devices. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various trade-offs between data bandwidth and data reliability.

Standard types of RAID systems currently available include RAID Levels 0, 1, and 5. The configuration selected depends on the goals to be achieved. Specifically data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data. Thus another problem with RAID systems is that low cost improved bandwidth requires a significant decrease in reliability.

RAID Level 1 utilizes disk mirroring where data is duplicated on an independent disk subsystem. Validation of data amongst the two independent drives is possible if the data is simultaneously accessed on both disks and subsequently compared. This tends to decrease data bandwidth from even that of a single comparable disk drive. In systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on disk remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes.

Thus another problem with redundant modern mass storage devices is the degradation of data bandwidth when a storage device fails. Additional problems with bandwidth limitations and reliability similarly occur within the art by all other forms of sequential, pseudo-random, and random access mass storage devices. These and other limitations within the current art are addressed by the present invention.

SUMMARY OF THE INVENTION

The present invention is directed to systems and methods for providing accelerated loading of operating system and application programs upon system boot or application launch and, more particularly, to data storage controllers employing lossless and/or lossy data compression and decompression to provide accelerated loading of operating systems and application programs.

In one aspect of the present invention, a method for providing accelerated loading of an operating system comprises the steps of: maintaining a list of boot data used for booting a computer system; preloading the boot data upon initialization of the computer system; and servicing requests for boot data from the computer system using the preloaded boot data. The boot data may comprise program code associated with an operating system of the computer system, an application program, and a combination thereof. In a preferred embodiment, the boot data is retrieved from a boot device and stored in a cache memory device.

In another aspect, the method for accelerated loading of an operating system comprises updating the list of boot data during the boot process. The step of updating comprises adding to the list any boot data requested by the computer system not previously stored in the list and/or removing from the list any boot data previously stored in the list and not requested by the computer system.

In yet another aspect, the boot data is stored in a compressed format on the boot device and the preloaded boot data is decompressed prior to transmitting the preloaded boot data to the requesting system.

In another aspect, a method for providing accelerated launching of an application program comprises the steps of maintaining a list of application data associated with an application program; preloading the application data upon launching the application program; and servicing requests for application data from a computer system using the preloaded application data.

In yet another aspect, a boot device controller for providing accelerated loading of an operating system of a host system comprises: a digital signal processor (DSP); a programmable logic device, wherein the programmable logic device is programmed by the digital signal processor to (i) instantiate a first interface for operatively interfacing the boot device controller to a boot device and to (ii) instantiate a second interface for operatively interfacing the boot device controller to the host system; and a non-volatile memory device, for storing logic code associated with the DSP, the first interface and the second interface, wherein the logic code comprises instructions executable by the DSP for maintaining a list of boot data used for booting the host system, preloading the boot data upon initialization of the host system, and servicing requests for boot data from the host system using the preloaded boot data. The boot device controller further includes a cache memory device for storing the preloaded boot data.

The present invention is realized due to recent improvements in processing speed, inclusive of dedicated analog and digital hardware circuits, central processing units, (and any hybrid combinations thereof), that, coupled with advanced data compression and decompression algorithms are enabling of ultra high bandwidth data compression and decompression methods that enable improved data storage and retrieval bandwidth.

These and other aspects, features and advantages, of the present invention will become apparent from the following detailed description of preferred embodiments that is to be read in connection with the accompanying drawings.

BRIEF DESCRIPTION OF THE DRAWINGS

FIG. 16 is a timing diagram illustrating the waveforms at various nodes in the diagram of FIG. 15.

DETAILED DESCRIPTION OF PREFERRED EMBODIMENTS

Figure 1:
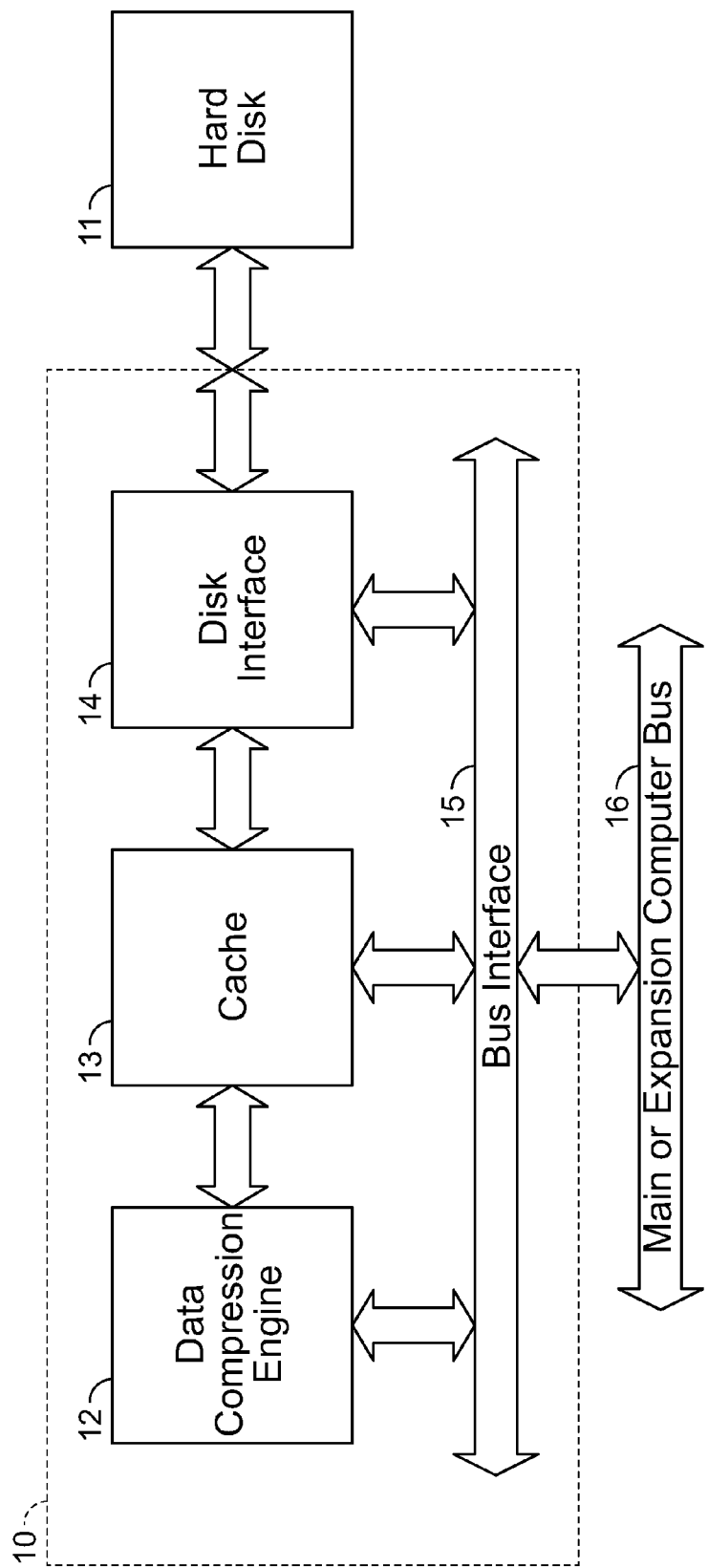
FIG. 1 is a block diagram of a data storage controller according to one embodiment of the present invention.

In the following description, it is to be understood that system elements having equivalent or similar functionality are designated with the same reference numerals in the Figures. It is to be further understood that the present invention may be implemented in various forms of hardware, software, firmware, or a combination thereof. Preferably, the present invention is implemented on a computer platform including hardware such as one or more central processing units (CPU) or digital signal processors (DSP), a random access memory (RAM), and input/output (I/O) interface(s). The computer platform may also include an operating system, microinstruction code, and dedicated processing hardware utilizing combinatorial logic or finite state machines. The various processes and functions described herein may be either part of the hardware, microinstruction code or application programs that are executed via the operating system, or any combination thereof.

It is to be further understood that, because some of the constituent system components described herein are preferably implemented as software modules, the actual system connections shown in the Figures may differ depending upon the manner in that the systems are programmed. It is to be appreciated that special purpose microprocessors, dedicated hardware, or any combination thereof may be employed to implement the present invention. Given the teachings herein, one of ordinary skill in the related art will be able to contemplate these and similar implementations or configurations of the present invention.

I. System Architectures

The present invention is directed to data storage controllers that provide increased data storage/retrieval rates that are not otherwise achievable using conventional disk controller systems and protocols to store/retrieve data to/from mass storage devices. The concept of "accelerated" data storage and retrieval was introduced in copending U.S. application Ser. No. 09/266,394, filed Mar. 11, 1999, entitled "System and Methods For Accelerated Data Storage and Retrieval," now U.S. Pat. No. 6,601,104, and copending U.S. application Ser. No. 09/481,243 filed Jan. 11, 2000, entitled "System and Methods For Accelerated Data Storage and Retrieval," now U.S. Pat. No. 6,604,158, both of which are commonly assigned and incorporated herein by reference. In general, as described in the above-incorporated applications, "accelerated" data storage comprises receiving a digital data stream at a data transmission rate which is greater than the data storage rate of a target storage device, compressing the input stream at a compression rate that increases the effective data storage rate of the target storage device and storing the compressed data in the target storage device. For instance, assume that a mass storage device (such as a hard disk) has a data storage rate of 20 megabytes per second. If a storage controller for the mass storage device is capable of compressing an input data stream with an average compression rate of 3:1, then data can be stored in the mass storage device at a rate of 60 megabytes per second, thereby effectively increasing the storage bandwidth ("storewidth") of the mass storage device by a factor of three. Similarly, accelerated data retrieval comprises retrieving a compressed digital data stream from a target storage device at the rate equal to, e.g., the data access rate of the target storage device and then decompressing the compressed data at a rate that increases the effective data access rate of the target storage device. Advantageously, accelerated data storage/retrieval mitigates the traditional bottleneck associated with, e.g., local and network disk accesses.

Referring now to FIG. 1, a high-level block diagram illustrates a data storage controller 10 according to one embodiment of the present invention. The data storage controller 10 comprises a data compression engine 12 for compressing/decompressing data (preferably in real-time or psuedo real-time) stored/retrieved from a hard disk 11 (or any other type of mass storage device) to provide accelerated data storage/retrieval. The DCE 12 preferably employs the data compression/decompression techniques disclosed in U.S. Ser. No. 09/210,491 entitled "Content Independent Data Compression Method and System," filed on Dec. 11, 1998, now U.S. Pat. No. 6,195,024, which is commonly assigned and which is fully incorporated herein by reference. It is to be appreciated that the compression and decompression systems and methods disclosed in U.S. Pat. No. 6,195, 024 are suitable for compressing and decompressing data at rates, which provide accelerated data storage and retrieval. A detailed discussion of a preferred "content independent" data compression process will be provided below.

The data storage controller 10 further comprises a cache 13, a disk interface (or disk controller) 14 and a bus interface 15. The storage controller 10 is operatively connected to the hard disk 12 via the disk controller 14 and operatively connected to an expansion bus (or main bus) 16 of a computer system via the bus interface 15. The disk interface 14 may employ a known disk interface standard such as UltraDMA, SCSI, Serial Storage Architecture, FibreChannel or any other interface that provides suitable disk access data rates. In addition, the storage controller 10 preferably utilizes the American National Standard for Information Systems (ANSI) AT Attachment Interface (ATA/ATAPI-4) to connect the data storage controller 10 to the hard disk 12. As is known in the art, this standard defines the connectors and cables for the physical interconnects between the data storage controller and the storage devices, along with the electrical and logical characteristics of the interconnecting signals.

Further, the bus interface 15 may employ a known standard such as the PCI (Peripheral Component Interconnect) bus interface for interfacing with a computer system. The use of industry standard interfaces and protocols is preferable, as it allows the storage controller 10 to be backwards compatible and seamlessly integrated with current systems.

However in new designs the present invention may be utilize any suitable computer interface or combination thereof.

It is to be understood that although FIG. 1 illustrates a hard disk 12, the storage controller 10 may be employed with any form of memory device including all forms of sequential, pseudo-random, and random access storage devices. Storage devices as known within the current art include all forms of random access memory, magnetic and optical tape, magnetic and optical disks, along with various other forms of solid-state mass storage devices. The current invention applies to all forms and manners of memory devices including, but not limited to, storage devices utilizing magnetic, optical, and chemical techniques, or any combination thereof. In addition, the cache 13 may comprise volatile or non-volatile memory, or any combination thereof. Preferably, the cache 13 is implemented in SDRAM (static dynamic random access memory).

The system of FIG. 1 generally operates as follows. When data is read from disk by the host computer, data flows from the disk 11 through the data storage controller 10 to the host computer. Data is stored in one of several proprietary compression formats on the disk 11 (e.g., "content independent" data compression). Data blocks are pre-specified in length, comprised of single or multiple sectors, and are typically handled in fractional or whole equivalents of tracks, e.g. ½ track, whole track, multiple tracks, etc. To read disk data, a DMA transfer is setup from the disk interface 14 to the onboard cache memory 13. The disk interface 14 comprises integral DMA control to allow transfer of data from the disk 11 directly to the onboard cache 13 without intervention by the DCE 12. It should be noted that the DCE 12 acts as a system level controller and sets-up specific registers within both the disk interface 14 and bus interface 15 to facilitate DMA transfers to and from the cache memory 13. To initiate a transfer from the disk 11 to the cache 13, the DMA transfer is setup via specifying the appropriate command (read disk), the source address (disk logical block number), amount of data to be transferred (number of disk logical blocks), and destination address within the onboard cache memory 13. Then, a disk data interrupt signal ("DISKINT#") is cleared (if previously set and not cleared) and the command is initiated by writing to the appropriate address space. Once data has been read from disk 11 and placed into onboard cache memory 13, the DISKINT# interrupt is asserted notifying the DCE 12 that requested data is now available in the cache memory 13. Data is then read by the DMA controller within the DCE 12 and placed into local memory for subsequent decompression. The decompressed data is then DMA transferred from the local memory of the DCE 12 back to the cache memory 13. Finally, data is DMA transferred via the bus interface controller 15 from the cache memory 13 to the bus 16. It is to be understood that in the read mode, the data storage controller acts as a bus master. A bus DMA transfer is then setup via specifying the appropriate command (write to host computer), the source address within the cache memory 13, the quantity of data words to be transferred (transfers are preferably in 4 byte increments), and the destination address on the host computer. When a bus 16 read or write transaction has completed, the appropriate interrupt signals (respectively referred to as PCIRDINT# and PCIWRINT#) are asserted to the DCE 12. Either of these interrupts are cleared by a corresponding interrupt service routines through a read or write to the appropriate address of the DCE 12.

Similarly, when data is written to the disk 11 from the host computer, data flows from the host computer through the data storage controller 10 and onto disk 11. Data is normally received from the host computer in uncompressed (raw) format and is compressed by the DCE 12 and stored on the disk 11. Data blocks from the host are pre-specified in length and are typically handled in blocks that are a fixed multiplier higher than fractional or whole equivalents of tracks, e.g. ½ track, whole track, multiple tracks, etc. This multiplier is preferably derived from the expected average compression ratio that is selected when the disk is formatted with the virtual file management system. To read host computer data, a bus DMA transfer is setup from the host bus 16 to the onboard cache memory 13. The bus interface controller 15 comprises integral DMA control that allows large block transfers from the host computer directly to the onboard cache 13 without intervention by the DCE 12. The bus interface controller 15 acts as a host computer Bus Master when executing such transfer. Once data has been read from the host and placed into onboard cache memory 13, the data is read by the onboard DMA controller (residing on the DCE 12) and placed into local memory for subsequent compression. The compressed data is then DMA transferred from the local memory of the DCE 12 back to the cache memory 13. Finally, data is DMA transferred via the disk controller 14 from the cache 13 to the disk 11.

As discussed in greater detail below, upon host computer power-up or external user reset, the data storage controller 10 initializes the onboard interfaces 14, 15 prior to release of the external host bus 16 from reset. The processor of the host computer then requests initial data from the disk 11 to facilitate the computer's boot-up sequence. The host computer requests disk data over the Bus 16 via a command packet issued from the host computer. Command packets are preferably eight words long (in a preferred embodiment, each word comprises 32 bits). Commands are written from the host computer to the data storage controller 10 with the host computer as the Bus Master and the data storage controller 10 as the slave. The data storage controller 10 includes at least one Base Address Register (BAR) for decoding the address of a command queue of the data storage controller 10. The command queue resides within the cache 13 or within onboard memory of the DCE 12.

When a command is received from the host computer, an interrupt (referred to herein as PCICMDINT#) is generated to the DCE processor. The eight-word command is read by the DCE 12 and placed into the command queue. Because the commands occupy a very small amount of memory, the location of the command queue is at the discretion of software and the associated system level performance considerations. Commands may be moved from the bus interface 16 to the command queue by wither explicit reads and writes by the DCE processor or, as explained below, by utilizing programmed DMA from an Enhanced DMA Controller (EDMA) residing on the DCE 12. This second technique may better facilitate system throughput by allowing the EDMA to automatically load commands while the highly pipelined data compression and decompression processing in the DCE is executed fully undisturbed.

The DCE 12, disk interface 14 and bus interface 15 commonly share the cache 13. As explained in detail below, the storage controller 10 preferably provides maximum system bandwidth by allowing simultaneous data transfers between the disk 12 and cache 13, the DCE 12 and the cache 13, and the expansion bus 16 and the cache 13. This is realized by employing an integral DMA (direct memory access) protocol that allows the DCE 12, disk interface 14 and bus interface 15 to transfer data without interrupting or interfering with other ongoing processes. In particular, as explained in detail below, an integral bandwidth allocation controller (or arbitrator) is preferably employed to allow the DCE 12, disk controller 14, and bus interface 15 to access the onboard cache with a bandwidth proportional to the overall bandwidth of the respective interface or processing element. The bandwidth arbitration occurs transparently and does not introduce latency in memory accesses. Bandwidth division is preferably performed with a high degree of granularity to minimize the size of requisite onboard buffers to synchronize data from the disk interface 14 and bus interface 15.

It is to be appreciated that the implementation of a storage controller according to the present invention significantly accelerates the performance of a computer system and significantly increases hard disk data storage capacity. For instance, depending on the compression rate, for personal computers running standard Microsoft Windows® based business application software, the storage controller provides: (1) an increase of n:1 in disk storage capacity (for example, assuming a compression ration of 3:1, a 20 gigabyte hard drive effectively becomes a 60 gigabyte hard drive) (2) a significant decrease in the computer boot-up time (turn-on and operating system load) and the time for loading application software and (3) User data storage and retrieval is increased by a factor of n:1.

Figure 2:
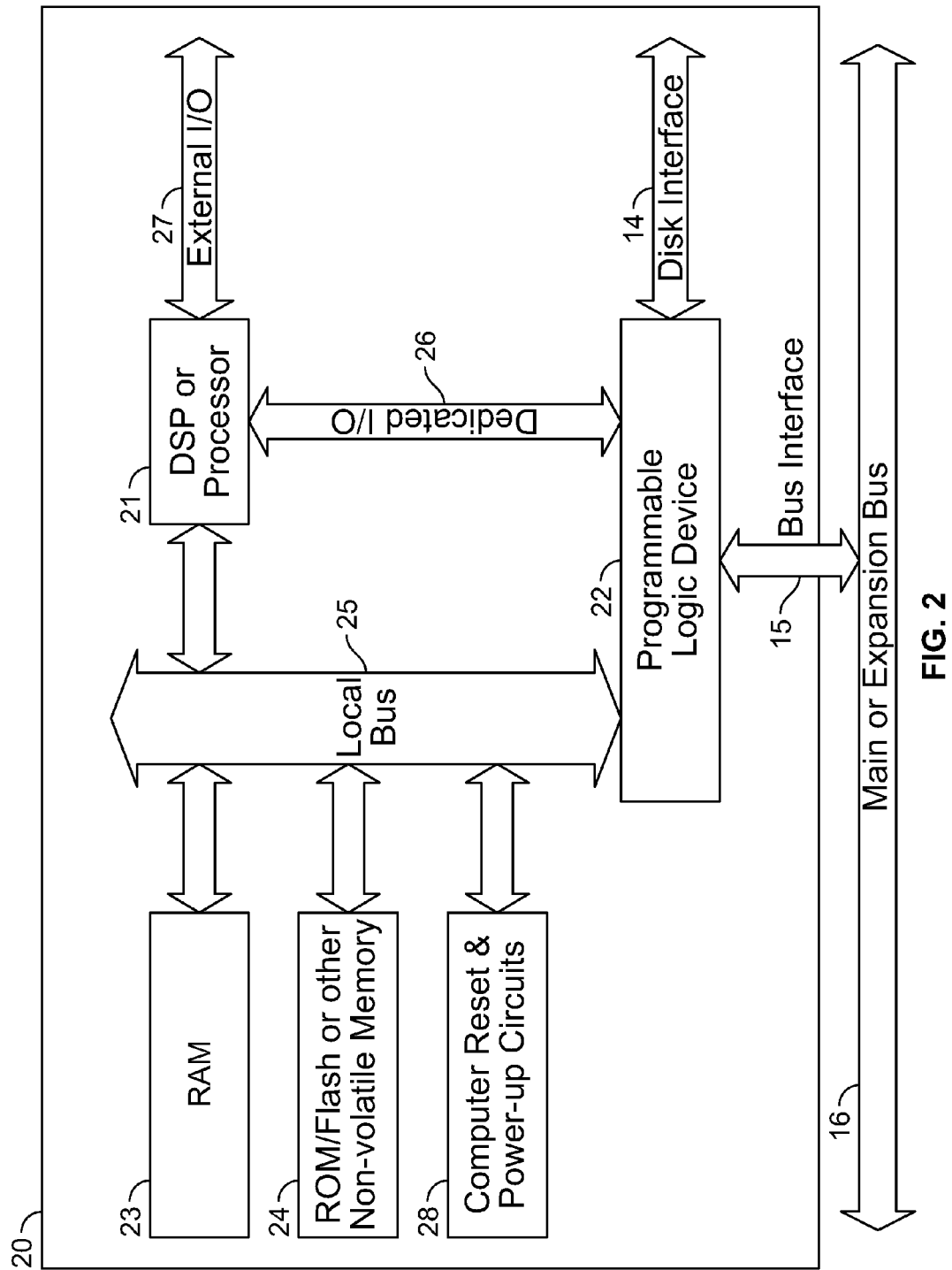
FIG. 2 is a block diagram of a data storage controller according to another embodiment of the present invention.

Referring now to FIG. 2, a block diagram illustrates a data storage controller 20 according to another embodiment of the present invention. More specifically, FIG. 2 illustrates a PCB (printed circuit board) implementation of the data storage controller 10 of FIG. 1. The storage controller 20 comprises a DSP (digital signal processor) 21 (or any other micro-processor device) that implements the DCE 12 of FIG. 1. The storage controller 21 further comprises at least one programmable logic device 22 (or volatile logic device). The programmable logic device 22 preferably implements the logic (program code) for instantiating and driving both the disk interface 14 and the bus interface 15 and for providing full DMA capability for the disk and bus interfaces 14, 15. Further, as explained in detail below, upon host computer power-up and/or assertion of a system-level "reset" (e.g., PCI Bus reset), the DSP 21 initializes and programs the programmable logic device 22 before of the completion of initialization of the host computer. This advantageously allows the data storage controller 20 to be ready to accept and process commands from the host computer (via the bus 16) and retrieve boot data from the disk (assuming the data storage controller 20 is implemented as the boot device and the hard disk stores the boot data (e.g., operating system, etc.)).

The data storage controller 20 further comprises a plurality of memory devices including a RAM (random access memory) device 23 and a ROM (read only memory) device 24 (or FLASH memory or other types of non-volatile memory). The RAM device 23 is utilized as on-board cache and is preferably implemented as SDRAM (preferably, 32 megabytes minimum). The ROM device 24 is utilized for non-volatile storage of logic code associated with the DSP 21 and configuration data used by the DSP 21 to program the programmable logic device 22. The ROM device 24 preferably comprises a one time (erasable) programmable memory (OTP-EPROM) device.

The DSP 21 is operatively connected to the memory devices 23, 24 and the programmable logic device 22 via a local bus 25. The DSP 21 is also operatively connected to the programmable logic device 22 via an independent control bus 26. The programmable logic device 22 provides data flow control between the DSP 21 and the host computer system attached to the bus 16, as well as data flow control between the DSP 21 and the storage device. A plurality of external I/O ports 27 are included for data transmission and/or loading of one programmable logic devices. Preferably, the disk interface 14 driven by the programmable logic device 22 supports a plurality of hard drives.

The storage controller 20 further comprises computer reset and power up circuitry 28 (or "boot configuration circuit") for controlling initialization (either cold or warm boots) of the host computer system and storage controller 20. A preferred boot configuration circuit and preferred computer initialization systems and protocols are described in U.S. patent application Ser. No. 09/775,897, published as United States Patent Application Publication No. 2001-0047473 incorporated herein by reference as well as Section VIII below. Preferably, the boot configuration circuit 28 is employed for controlling the initializing and programming the programmable logic device 22 during configuration of the host computer system (i.e., while the CPU of the host is held in reset). The boot configuration circuit 28 ensures that the programmable logic device 22 (and possibly other volatile or partially volatile logic devices) is initialized and programmed before the bus 16 (such as a PCI bus) is fully reset.

In particular, when power is first applied to the boot configuration circuit 28, the boot configuration circuit 28 generates a control signal to reset the local system (e.g., storage controller 20) devices such as a DSP, memory, and I/O interfaces. Once the local system is powered-up and reset, the controlling device (such as the DSP 21) will then proceed to automatically determine the system environment and configure the local system to work within that environment. By way of example, the DSP 21 of the disk storage controller 20 would sense that the data storage controller 20 is on a PCI computer bus (expansion bus) and has attached to it a hard disk on an IDE interface. The DSP 21 would then load the appropriate PCI and IDE interfaces into the programmable logic device 22 prior to completion of the host system reset. It is to be appreciated that this can be done for all computer busses and boot device interfaces including: PCI, NuBus, ISA, Fiber Channel, SCSI, Ethernet, DSL, ADSL, IDE, DMA, Ultra DMA, and SONET. Once the programmable logic device 22 is configured for its environment, the boot device controller is reset and ready to accept commands over the computer/expansion bus 16. Details of the boot process using a boot device comprising a programmable logic device will be provided below.

It is to be understood that the data storage controller 20 may be utilized as a controller for transmitting data (compressed or uncompressed) to and from remote locations over the DSP I/O ports 27 or system bus 16, for example. Indeed, the I/O ports 27 of the DSP 21 may be used for transmitting data (compressed or uncompressed) that is either retrieved from the disk 11 or received from the host system via the bus 16, to remote locations for processing and/or storage. Indeed, the I/O ports may be operatively connected to other data storage controllers or to a network communication channels. Likewise, the data storage controller 20 may receive data (compressed or uncompressed) over the I/O ports 27 of the DSP 21 from remote systems that are connected to the I/O ports 27 of the DSP, for local processing by the data storage controller 20. For instance, a remote system may remotely access the data storage controller (via the I/O ports of the DSP or system bus 16) to utilize the data compression, in which case the data storage controller would transmit the compressed data back to the system that requested compression.

The DSP 21 may comprise any suitable commercially available DSP or processor. Preferably, the data storage controller 20 utilizes a DSP from Texas Instruments' 320 series, C62x family, of DSPs (such as TMS320C6211GFN-150), although any other DSP or processor comprising a similar architecture and providing similar functionalities may be employed. The preferred DSP is capable of up to 1.2 billion instructions per second. Additional features of the preferred DSP include a highly parallel eight processor single cycle instruction execution, onboard 4K byte UP Program Cache, 4K L1D Data Cache, and 64K byte Unified L2 Program/Data Cache. The preferred DSP further comprises a 32 bit External Memory Interface (EMIF) that provides for a glueless interface to the RAM 23 and the non-volatile memory 24 (ROM). The DSP further comprises two multi-channel buffered serial ports (McBSPs) and two 32 bit general purpose timers. Preferably, the storage controller disables the I/O capability of these devices and utilizes the I/O ports of the DSP as general purpose I/O for both programming the programmable logic device 22 using a strobed eight bit interface and signaling via a Light Emitting Diode (LED). Ancillary DSP features include a 16 bit Host Port Interface and full JTAG emulation capability for development support.

The programmable logic device 22 may comprise any form of volatile or non-volatile memory. Preferably, the programmable logic device 22 comprises a dynamically reprogrammable FPGA (field programmable gate array) such as the commercially available Xilinx Spartan Series XCS4OXL-PQ240-5 FPGA. As discussed in detail herein, the FPGA instantiates and drives the disk and bus interfaces 14, 15.

The non-volatile memory device 24 preferably comprises a 128 Kbyte M27W101-80K one time (erasable) programmable read only memory, although other suitable non-volatile storage devices may be employed. The non-volatile memory device 24 is decoded at a designated memory space in the DSP 21. The non-volatile memory device 24 stores the logic for the DSP 21 and configuration data for the programmable logic device 22. More specifically, in a preferred embodiment, the lower 80 Kbytes of the nonvolatile memory device 24 are utilized for storing DSP program code, wherein the first 1 k bytes are utilized for the DSP's boot loader. Upon reset of the DSP 21 (via boot configuration circuit 28), the first 1K of memory of the non-volatile memory device 24 is copied into an internal RAM of the DSP 21 by e.g., the DSP's Enhanced DMA Controller (EDMA). Although the boot process begins when the CPU of the host system is released from external reset, the transfer of the boot code into the DSP and the DSP's initialization of the programmable logic device actually occurs while the CPU of the host system is held in reset. After completion of the 1K block transfer, the DSP executes the boot loader code and continues thereafter with executing the remainder of the code in non-volatile memory device to program the programmable logic device 22.

More specifically, in a preferred embodiment, the upper 48K bytes of the non-volatile memory device 24 are utilized for storing configuration data associated with the programmable logic device 22. If the data storage controller 20 is employed as the primary boot storage device for the host computer, the logic for instantiating and driving the disk and bus interfaces 14, 15 should be stored on the data storage controller 20 (although such code may be stored in remotely accessible memory locations) and loaded prior to release of the host system bus 16 from "reset". For instance, revision 2.2 of the PCI Local Bus specification calls for a typical delay of 100 msec from power-stable before release of PCI Reset. In practice this delay is currently 200 msec although this varies amongst computer manufacturers. A detailed discussion of the power-on sequencing and boot operation of the data storage controller 20 will be provided below.

Figure 3:
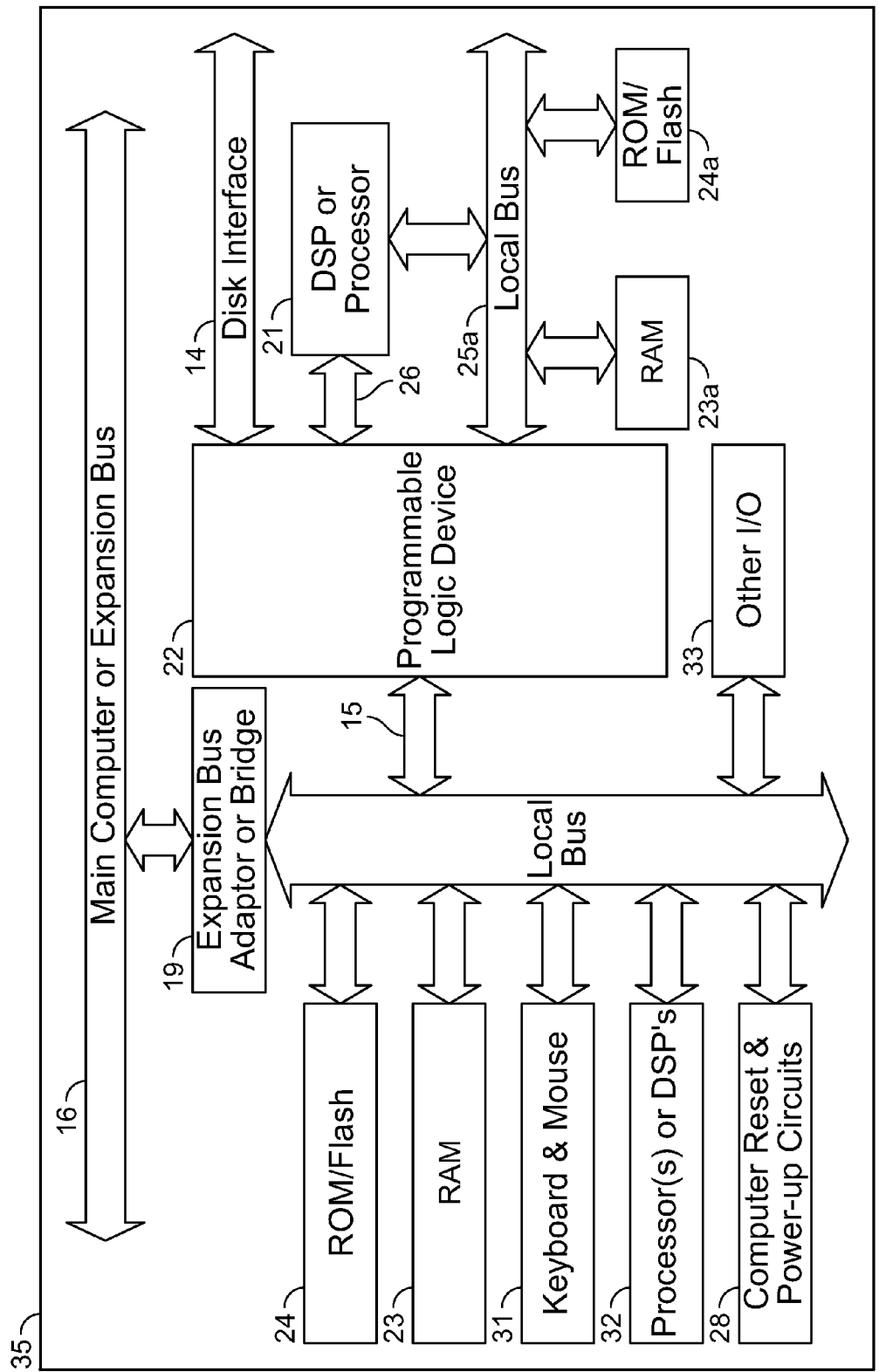
FIG. 3 is a block diagram of a data storage controller according to another embodiment of the present invention.

FIG. 3 illustrates another embodiment of a data storage controller 35 wherein the data storage controller 35 is embedded within the motherboard of the host computer system. This architecture provides the same functionality as the system of FIG. 2, and also adds the cost advantage of being embedded on the host motherboard. The system comprises additional RAM and ROM memory devices 23a, 24a, operatively connected to the DSP 21 via a local bus 25a.

Figure 4:
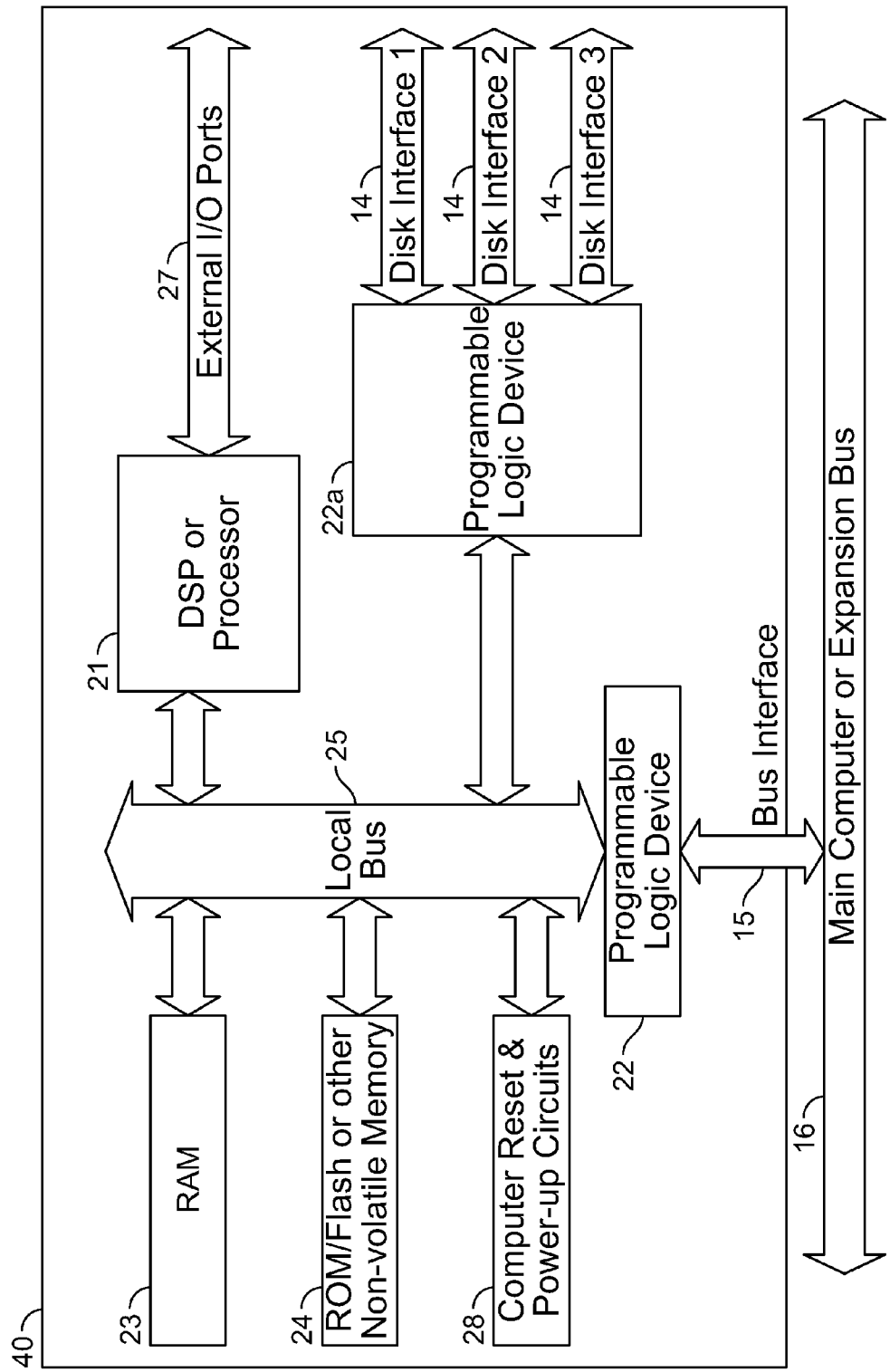
FIG. 4 is a block diagram of a data storage controller according to another embodiment of the present invention.

FIG. 4 illustrates another embodiment of a data storage controller. The data storage controller 40 comprises a PCB implementation that is capable of supporting RAID levels 0, 1 and 5. This architecture is similar to those of FIGS. 1 and 2, except that a plurality of programmable logic devices 22, 22a are utilized. The programmable logic device 22 is dedicated to controlling the bus interface 15. The programmable logic device 22a is dedicated to controlling a plurality of disk interfaces 14, preferably three interfaces. Each disk interface 14 can connect up to two drives. The DSP in conjunction with the programmable logic device 22a can operate at RAID level 0, 1 or 5. At RAID level 0, which is disk striping, two interfaces are required. This is also true for RAID level 1, which is disk minoring. At RAID level 5, all three interfaces are required.

Figure 5:
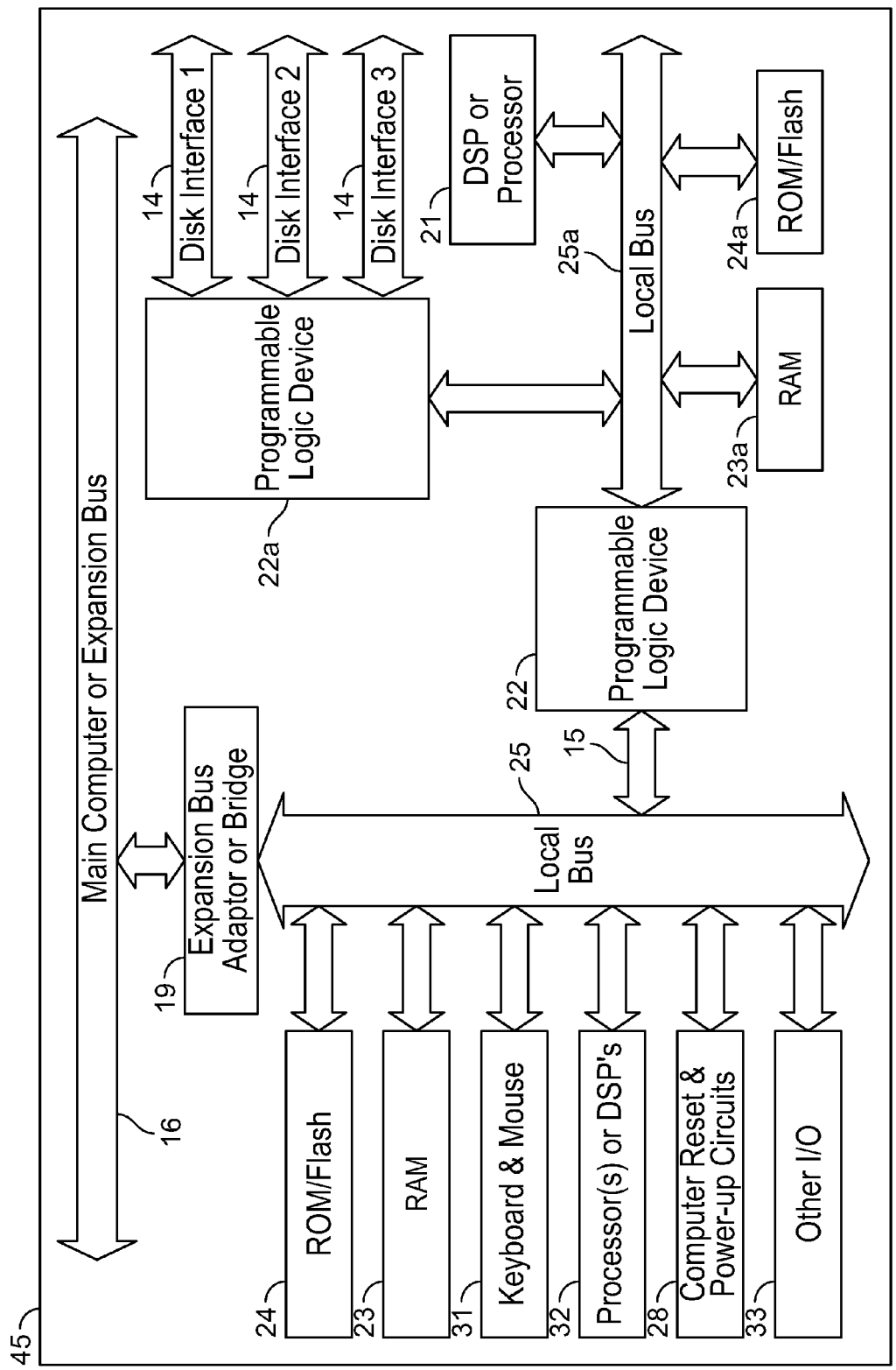
FIG. 5 is a block diagram of a data storage controller according to another embodiment of the present invention.

FIG. 5 illustrates another embodiment of a data storage controller according to the present invention. The data storage controller 45 provides the same functionality as that of FIG. 4, and has the cost advantage of being embedded within the computer system motherboard.

II. Initializing a Programmable Logic Device

As discussed above with reference to FIG. 2, for example, the data storage controller 20 preferably employs an onboard Texas Instruments TMS320C6211 Digital Signal Processor (DSP) to program the onboard Xilinx Spartan Series XCS4OXL FPGA upon power-up or system level PCI reset. The onboard boot configuration circuit 28 ensures that from system power-up and/or the assertion of a bus reset (e.g., PCI reset), the DSP 21 is allotted a predetermined amount of time (preferably a minimum of 10 msec) to boot the DSP 21 and load the programmable logic device 22. Because of a potential race condition between either the host computer power-up or assertion of PCI Bus reset and configuration of the programmable logic device 20 (which is used for controlling the boot device and accepting PCI Commands), an "Express Mode" programming mode for configuring the SpartanXL family XCS4OXL device is preferably employed. The XCS4OXL is factory set to byte-wide Express-Mode programming by setting both the M1/M0 bits of the XCS4OXL to OxO. Further, to accommodate express mode programming of the programmable logic device 22, the DSP 21 is programmed to utilize its serial ports reconfigured as general purpose I/O. However, after the logic device 22 is programmed, the DSP 21 may then reconfigure its serial ports for use with other devices. Advantageously, using the same DSP ports for multiple purposes affords greater flexibility while minimizing hardware resources and thus reducing product cost.

The volatile nature of the logic device 22 effectively affords the ability to have an unlimited number of hardware interfaces. Any number of programs for execution by the programmable logic device 22 can be kept in an accessible memory location (EPROM, hard disk, or other storage device). Each program can contain new disk interfaces, interface modes or subsets thereof. When necessary, the DSP 21 can clear the interface currently residing in the logic device 22 and reprogram it with a new interface. This feature allows the data storage controller 20 to have compatibility with a large number of interfaces while minimizing hardware resources and thus reducing product cost.

A preferred protocol for programming the programmable logic device can be summarized in the following steps: (1) Clearing the configuration memory; (2) Initialization; (3) Configuration; and (4) Start-Up. When either of three events occur: the host computer is first powered-up or a power failure and subsequent recovery occurs (cold boot), or a front panel computer reset is initiated (warm boot), the host computer asserts RST# (reset) on the PCI Bus. As noted above, the data storage controller 20 preferably comprises a boot configuration circuit 28 that senses initial host computer power turn-on and/or assertion of a PCI Bus Reset ("PCI RST#"). It is important to note that assuming the data storage controller 20 is utilized in the computer boot-up sequence, it should be available exactly 5 clock cycles after the PCI RST# is deasserted, as per PCI Bus Specification Revision 2.2. While exact timings vary from computer to computer, the typical PCI bus reset is asserted for approximately 200 msec from initial power turn-on.

In general, PCI RST# is asserted as soon as the computer's power exceeds a nominal threshold of about 1 volt (although this varies) and remains asserted for 200 msec thereafter. Power failure detection of the 5 volt or 3.3 volt bus typically resets the entire computer as if it is an initial power-up event (i.e., cold boot). Front panel resets (warm boots) are more troublesome and are derived from a debounced push-button switch input. Typical front panel reset times are a minimum of 20 msec, although again the only governing specification limit is 1 msec reset pulse width.

As discussed in detail below, it may not be necessary to reload the programmable logic device 22 each time the DSP is reset. The boot configuration circuit 20 preferably comprises a state machine output signal that is readable by the DSP 21 to ascertain the type of boot process requested. For example, with a front-panel reset (warm boot), the power remains stable on the PCI Bus, thus the programmable logic device 22 should not require reloading.

Figure 6A:
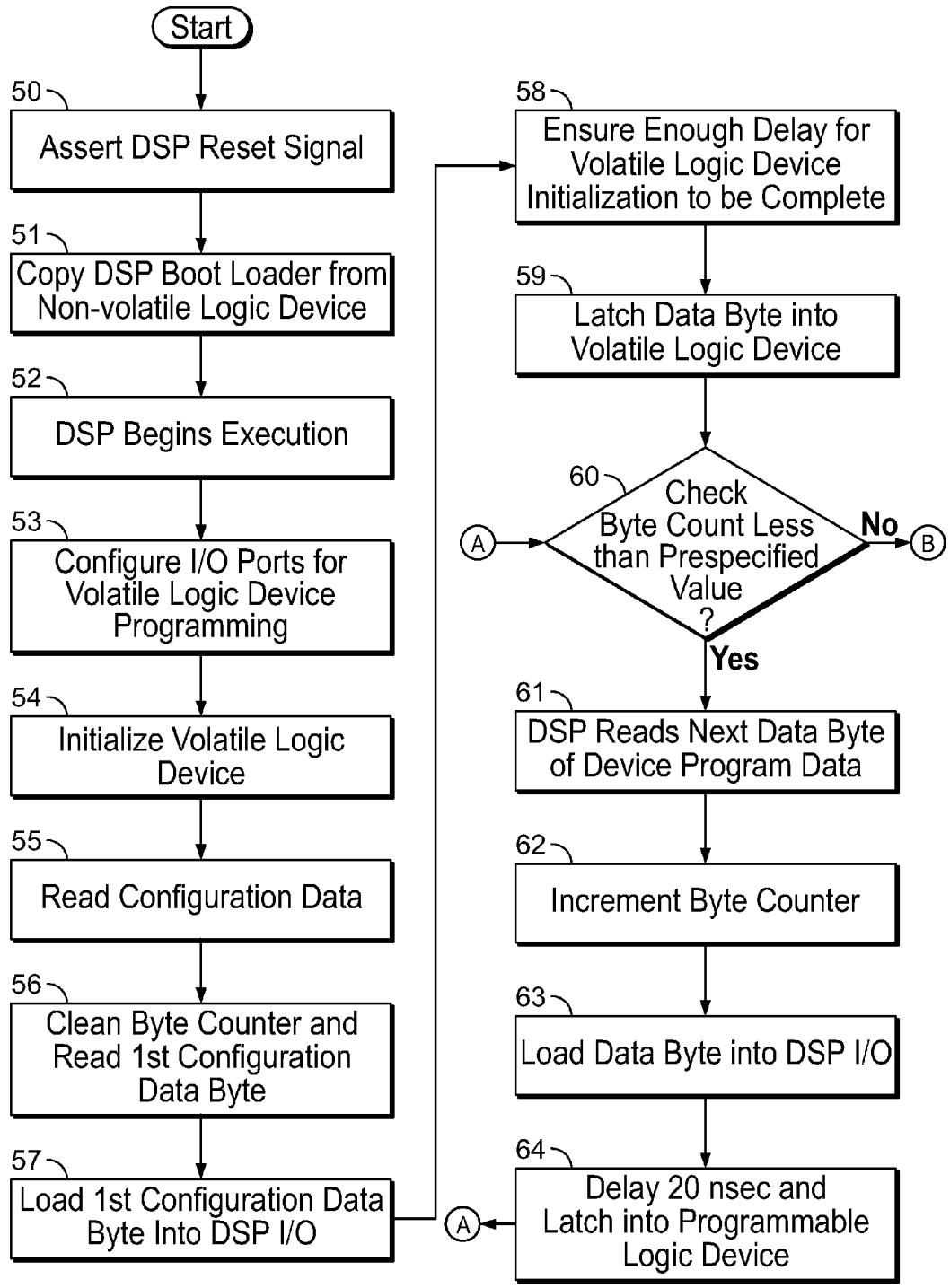
FIGS. 6a and 6b comprise a flow diagram of a method for initializing a data storage controller according to one aspect of the present invention.

Referring now to FIG. 6, a flow diagram illustrates a method for initializing the programmable logic device 22 according to one aspect of the invention. In the following discussion, it is assumed that the programmable logic device 22 is always reloaded, regardless of the type of boot process. Initially, in FIG. 6a, the DSP 21 is reset by asserting a DSP reset signal (step 50). Preferably, the DSP reset signal is generated by the boot circuit configuration circuit 28 (as described in the above-incorporated U.S. patent application Ser. No. 09/775,897, published as United States Patent Application Publication No. 2001-0047473, as well as Section VIII below). While the DSP reset signal is asserted (e.g., active low), the DSP is held in reset and is initialized to a prescribed state. Upon deassertion of the DSP Reset signal, the logic code for the DSP (referred to as the "boot loader") is copied from the non-volatile logic device 24 into memory residing in the DSP 21 (step 51). This allows the DSP to execute the initialization of the programmable logic device 22. In a preferred embodiment, the lower 1K bytes of EPROM memory is copied to the first 1 k bytes of DSP's low memory (0x0000 0000 through 0x0000 03FF). As noted above, the memory mapping of the DSP 21 maps the CE1 memory space located at 0x9000 0000 through 0x9001 FFFF with the OTP EPROM. In a preferred embodiment using the Texas Instrument DSP TMS320c6211GFN-150, this ROM boot process is executed by the EDMA controller of the DSP. It is to be understood, however, that the EDMA controller may be instantiated in the programmable logic device (Xilinx), or shared between the DSP and programmable logic device.

After the logic is loaded in the DSP 21, the DSP 21 begins execution out of the lower 1K bytes of memory (step 52). In a preferred embodiment, the DSP 21 initializes with at least the functionality to read EPROM Memory (CE 1) space. Then, as described above, the DSP preferably configures its serial ports as general purpose I/O (step 53).

Next, the DSP 21 will initialize the programmable logic device 22 using one or more suitable control signals. (step 54). After initialization, the DSP 21 begins reading the configuration data of the programmable logic device 22 from the non-volatile memory 24 (step 55). This process begins with clearing a Data Byte Counter and then reading the first data byte beginning at a prespecified memory location in the non-volatile memory 24 (step 56). Then, the first output byte is loaded into the DSP's I/O locations with LSB at DO and MSB at D7 (step 57). Before the first byte is loaded to the logic device 22, a prespecified time delay (e.g., 5 usec) is provided to ensure that the logic device 22 has been initialized (step 58). In particular, this time delay should be of a duration at least equal to the internal setup time of the programmable logic device 22 from completion of initialization. Once this time delay has expired, the first data byte in the I/O bus 26 of the DSP 21 is latched into the programmable logic device 22 (step 59).

Next, a determination is made as to whether the Data Byte Counter is less than a prespecified value (step 60). If the Data Byte Counter is less than the prespecified value (affirmative determination in step 60), the next successive data byte for the programmable logic device 22 is read from the non-volatile memory 24 (step 61) and the Data Byte Counter is incremented (step 62).

Next, the read data byte is loaded into the I/O of the DSP (step 63). A time delay of, e.g., 20 nsec is allowed to expire before the data byte is latched to the programmable logic device to ensure that a minimum data set-up time to the programmable logic device 21 is observed (step 64) and the process is repeated (return to step 60). It is to be appreciated that steps 60-64 may be performed while the current data byte is being latched to the programmable logic device. This provides "pipeline" programming of the logic device 22 and minimizes programming duration.

Figure 6B:
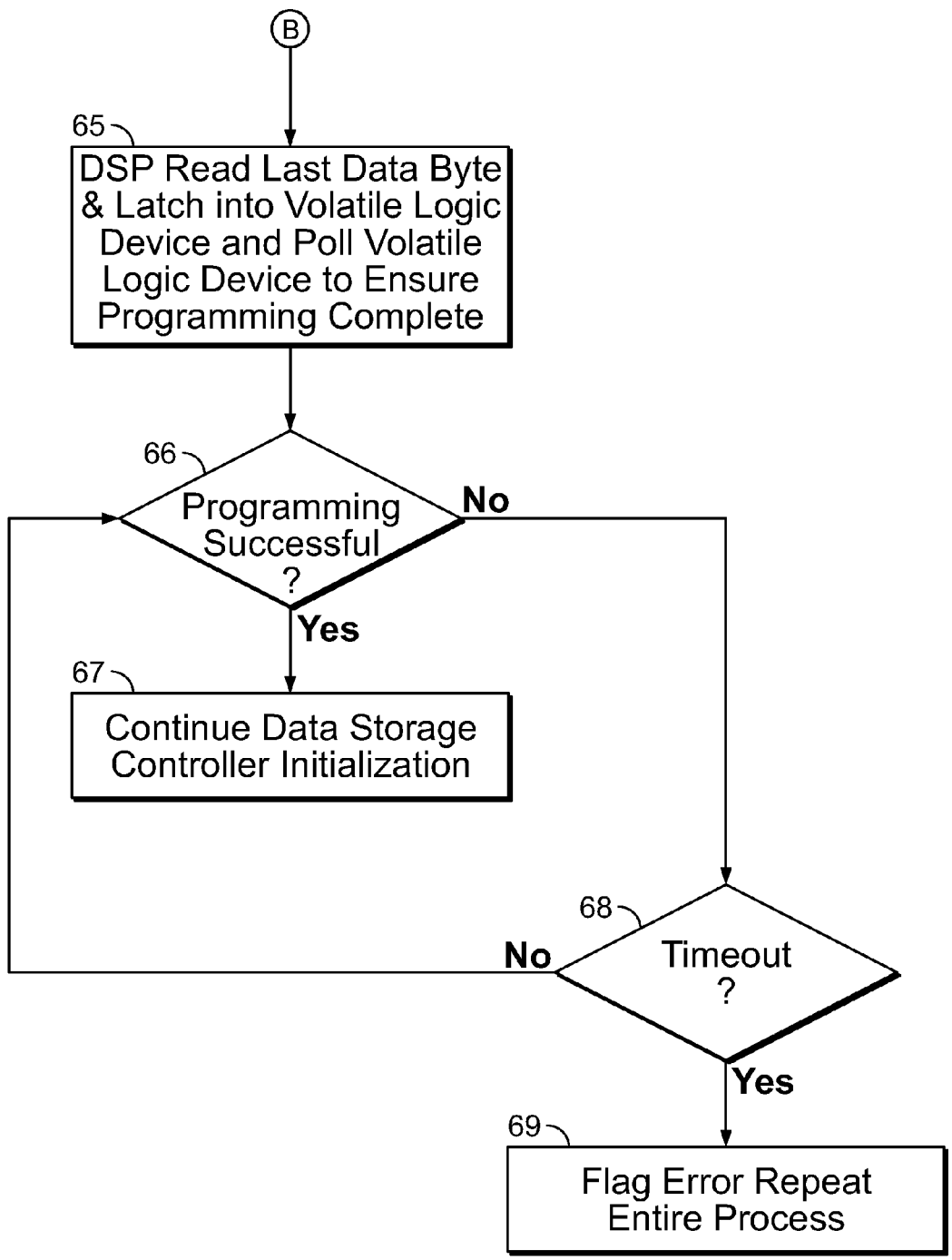

When the Data Byte Counter is not less than the prespecified count value negative determination in step 60), as shown in FIG. 6b, the last data byte is read from the non-volatile memory and latched to the programmable logic device 22, and the DSP 21 will then poll a control signal generated by the programmable logic device 22 to ensure that the programming of the logic device 22 is successful (step 65). If programming is complete (affirmative determination in step 66), the process continues with the remainder of the data storage controller initialization (step 67). Otherwise, a timeout occurs (step 68) and upon expiration of the timeout, an error signal is provided and the programming process is repeated (step 69).

III. Data Storage and Retrieval Protocols

A detailed discussion of operational modes of a data storage controller will now be provided with reference to the embodiment of FIG. 2 (although it is to be understood that the following discussion is applicable to all the above-described embodiments). The data storage controller 20 utilizes a plurality of commands to implement the data storage, retrieval, and disk maintenance functions described herein. Each command preferably comprises eight thirty-two bit data words stored and transmitted in little endian format. The commands include: Read Disk Data; Write Disk Data; and Copy Disk Data, for example. For example, a preferred format for the "Read Disk Data" command is:

| 31 | 16 | 15 | 8 | 7 | 0 | |
|---|---|---|---|---|---|---|
| Command Packet Number 0000h to FFFFh | | Command Type 00h | | Command Parameters (00h) | | 00h |
| Starting Block Address (Least Significant Word) | | | | | | 04h |
| Starting Block Address (Most Significant Word) | | | | | | 08h |
| Number of Blocks (Least Significant Word) | | | | | | 0Ch |
| Number of Blocks (Most Significant Word) | | | | | | 10h |
| Destination Address (Least Significant Word) | | | | | | 14h |
| Destination Address 'Most Significant Word) | | | | | | 18h |
| Checksum | | | | Reserved | | 1Ch |

The host computer commands the data storage controller 20 over the PCI Bus 16, for example. Upon computer power-up or reset, the host computer issues a PCI Bus Reset with a minimum pulse width of 100 msec (in accordance with PCI Bus Specification Revision 2.2). Upon completion of the PCI Bus reset, the data storage controller 20 is fully initialized and waiting for completion of the PCI configuration cycle. Upon completion of the PCI configuration cycles, the data storage controller will wait in an idle state for the first disk command.

During operation, the host operating system may issue a command to the data storage controller 20 to store, retrieve, or copy specific logical data blocks. Each command is transmitted over the PCI Bus 16 at the Address assigned to the Base Address Register (BAR) of the data storage controller 20.

The commands issued by the host system to the data storage controller and the data transmitted to and from the data storage controller are preferably communicated via a 32 bit, 33 MHz, PCI Data Bus. As noted above, the PCI Interface is preferably housed within the onboard Xilinx Spartan XCS4OXL-5 40,000 field programmable gate array which instantiates a PCI 32, 32 Bit, 33 MHz PCI Bus Interface (as per PCI Bus Revision 2.2).

The PCI Bus interface operates in Slave Mode when receiving commands and as a Bus Master when reading or writing data. The source and destination for all data is specified within each command packet. When setting up data transfers, the Enhanced Direct Memory Access (EDMA) Controller of the DSP (or the Xilinx) utilizes two Control Registers, a 16 Word Data Write to PCI Bus FIFO, a 16 Word Data Read From PCI Bus FIFO, and a PCI Data Interrupt (PCIDATINT). The 32 Bit PCI Address Register holds either the starting Source Address for data storage controller Disk Writes where data is read from the PCI Bus, or the starting Destination Address for data storage controller Disk Reads where data is written to the PCI Bus. The second control register is a PCI Count Register that specifies the direction of the data transfer along with the number of 32 bit Data words to be written to or from the PCI bus.

Data is written to the PCI Bus from the DSP via a 16 Word PCI Data Write FIFO located within a prespecified address range. Data writes from the DSP to anywhere within the address range place that data word in the next available location within the FIFO. Data is read from the PCI Bus to the DSP via a 16 Word PCI Data Read FIFO located within a prespecified address range and data read by the DSP from anywhere within this address range provides the next data word from the FIFO.

After completion of the Xilinx initialization by the DSP and subsequent negation of the PCI Bus Reset signal (RST#) by the host computer's PCI Bridge, the data storage controller is ready to accept commands from the host computer via the PCI Bus. When accepting commands it should be noted that the data storage controller is a PCI Target (Slave) Device. Commands are preferably fixed in length at exactly 8 (thirty-two bit) words long. Commands are written from the host computer to the data storage controller via the PCI Bus utilizing the data storage controller's Base Address Register 0 (BAR0). The PCI Bus Reset initially sets the Command FIFO's Counter to zero and also signals the Xilinx's PCI Bus State Controller that the Command FIFO is empty and enable to accept a command.

Whenever a data write occurs within the valid data range of BAR0, the data word is accepted from PCI Bus and placed in the next available memory position within the Command FIFO. When the last of the 8 thirty-two bit data words is accepted by the PCI Bus (thus completing the command, i.e. last word for the command FIFO to be full), the PCI Bus State Controller is automatically set to Target Abort (within same PCI Transaction) or Disconnect Without Data for all subsequent PCI transactions that try to writes to BAR0. This automatic setting is the responsibility of the Xilinx PCI Data Interface.

The PCI Command FIFO State Controller then asserts the Command Available Interrupt to the DSP. The DSP services the Command Available Interrupt by reading the command data from a prespecified address range. It should be noted that the command FIFO is read sequentially from any data access that reads data within such address range. It is the responsibility of the DSP to understand that the data is read sequentially from any order of accesses within the data range and should thus be stored accordingly.

Upon completion of the Command Available Interrupt Service Routine the DSP executes a memory read or write to desired location within the PCI Control Register Space mapped into the DSP's CE3 (Xilinx) memory space. This resets the Command FIFO Counter back to zero. Next, the DSP executes a memory read or write to location in the DSP Memory Space that clears the Command Available Interrupt. Nested interrupts are not possible since the PCI Bus State Machine is not yet able to accept any Command Data at BAR0. Once the Command Available Interrupt routine has cleared the interrupt and exited, the DSP may then enable the PCI State Machine to accept a new command by reading or writing to PCI Command Enable location within the PCI Command FIFO Control Register Space.

A preferred architecture has been selected to enable the data storage controller to operate on one command at a time or to accept multiple prioritized commands in future implementations. Specifically, the decoupling of the Command Available Interrupt Service Routine from the PCI State Machine that accepts Commands at BAR0 enables the DSP's "operating system kernel" to accept additional commands at any time by software command. In single command operation, a command is accepted, the Command Available Interrupt Cleared, and the Command executed by the data storage controller in PCI Master Mode prior to the enabling of the PCI State machine to accept new commands.

In a prioritized multi-command implementation, the "operating system kernel" may elect to immediately accept new commands or defer the acceptance of new commands based upon any software implemented decision criteria. In one embodiment, the O/S code might only allow a pre-specified number of commands to be queued. In another embodiment, commands might only be accepted during processor idle time or when the DSP is not executing time critical (i.e. highly pipelined) compress/decompress routines. In yet another embodiment, various processes are enabled based upon a pre-emptive prioritized based scheduling system.

As previously stated, the data storage controller retrieves commands from the input command FIFO in 8 thirty-two bit word packets. Prior to command interpretation and execution, a command's checksum value is computed to verify the integrity of the data command and associated parameters. If the checksum fails, the host computer is notified of the command packet that failed utilizing the Command Protocol Error Handler. Once the checksum is verified the command type and associated parameters are utilized as an offset into the command "pointer" table or nay other suitable command/data structure that transfers control to the appropriate command execution routine.

Commands are executed by the data storage controller with the data storage controller acting as a PCI Master. This is in direct contrast to command acceptance where the data storage controller acts as a PCI Slave. When acting as a PCI Bus Master, the data storage controller reads or writes data to the PCI Bus utilizing a separate PCI Bus Data FIFO (distinct & apart from the Command FIFO). The PCI Data FIFO is 64 (thirty-two bit) words deep and may be utilized for either data reads or data writes from the DSP to the PCI Bus, but not both simultaneously.

For data to be written from the data storage controller to the Host Computer, the DSP must first write the output data to the PCI Bus Data FIFO. The Data FIFO is commanded to PCI Bus Data Write Mode by writing to a desired location within the Xilinx (CE3) PCI Control Register Space. Upon PCI Bus Reset the default state for the PCI Data FIFO is write mode and the PCI Data FIFO Available Interrupt is cleared. The PCI Data FIFO Available Interrupt should also be software cleared by writing to a prespecified location. Preferably, the first task for the data storage controller is for system boot-up or application code to be downloaded from disk. For reference, PCI Data Read Mode is commanded by writing to location BFFO 0104. The PCI Bus Reset initializes the Data FIFO Pointer to the first data of the 64 data words within the FIFO. However this pointer should always be explicitly initialized by a memory write to location BFFO 0108. This ensures that the first data word written to the FIFO by the DSP performing the data write anywhere in address range B000 0000 to B000 01FF is placed at the beginning of the FIFO. Each subsequent write to any location within this address range then places one thirty-two bit data word into the next available location within the PCI Data FIFO. The FIFO accepts up to 64 thirty-two bit data words although it should be clearly understood that not all data transfers to and from the PCI Bus will consist of a full FIFO. Counting the number of thirty-two bit data words written to the PCI Data FIFO is the responsibility of the DSP Code. It is envisioned that the DSP will, in general, use 64 word DMA data transfers, thus alleviating any additional processor overhead.

When the data has been transferred from the DSP to the PCI Data FIFO, the PCI Bus Controller also needs the address of the PCI Target along with the number of data words to be transmitted. In the current data storage controller implementation, the PCI Bus Address is thirty-two bits wide, although future PCI bus implementations may utilize multiword addressing and/or significantly larger (64 bit & up) address widths. The single thirty-two bit address word is written by the DSP to memory location aaaa+0x10 in the PCI Control Register Space.

Finally, the PCI Bus Data Write transaction is initiated by writing the PCI Data FIFO word count to a prespecified memory address. The word count value is always decimal 64 or less (0x3F). When the count register is written the value is automatically transferred to the PCI Controller for executing the PCI Bus Master writes.

When the PCI Bus has completed the transfer of all data words within the PCI Data FIFO the PCI Data FIFO Available Interrupt is set. The DSP PCI Data FIFO Available Interrupt handler will then check to see if additional data is waiting or expected to be written to the PCI Data Bus. If additional data is required the interrupt is cleared and the data transfer process repeats. If no additional data is required to be transferred then the interrupt is cleared and the routine must exit to a system state controller. For example, if the command is complete then master mode must be disabled and then slave mode (command mode) enabled—assuming a single command by command execution data storage controller.

For data to be read by the data storage controller from the Host Computer, the DSP must command the PCI Bus with the address and quantity of data to be received.

The PCI Data FIFO is commanded to PCI Bus Data Read Mode by writing to a desired location within the Xilinx (CE3) PCI Control Register Space. Upon PCI Bus Reset the default state for the PCI Data FIFO is Write Mode and the PCI Data FIFO Full Interrupt is cleared. The PCI Data FIFO Full Interrupt should also be cleared via software by writing to such location. The PCI Bus Reset also initializes the PCI Data FIFO Pointer to the first data word of the available 64 data words within the FIFO. However this pointer should always be explicitly initialized by a memory write to pre-specified location.

For data to be read from the PCI Bus by the data storage controller, the Xilinx PCI Bus Controller requires the address of the PCI Target along with the number of data words to be received. In the current data storage controller implementation, the PCI Bus Address is thirty-two bits wide, although future PCI bus implementations may utilize multiword addressing and/or significantly larger (64 bit & up) address widths. The single thirty-two bit address word is written by the DSP to prespecified memory location in the PCI Control Register Space.

Finally, the PCI Bus Data Read transaction is initiated by writing the PCI Data FIFO word count to prespecified memory address. The word count value is always decimal 64 or less (0x3F). When the count register is written the value is automatically transferred to the PCI Controller for executing the PCI Bus Master Read.

When the PCI Bus has received all the requested data words PCI Data FIFO Full Interrupt is set. The DSP PCI Data FIFO Full Interrupt handler will then check to see if additional data is waiting or expected to be read from the PCI Data Bus. If additional data is required the interrupt is cleared and the data receipt process repeats. If no additional data is required to be transferred, then the interrupt is cleared and the routine exits to a system state controller. For example, if the command is complete then master mode must be disabled and then slave mode (command mode) enabled—assuming a single command by command execution data storage controller.

It is clearly understood that there are other techniques for handling the PCI Data transfers. The current methodology has been selected to minimize the complexity and resource utilization of the Xilinx Gate Array. It should also be understood that the utilization of asynchronous memory reads and writes to initialize system states and synchronize events at a software level aids in both hardware and system level debug at the expense of increase software overhead. Subsequent embodiments of the gate array may automate resource intensive tasks if system level performance mandates.

IV. Memory Bandwidth Allocation

The onboard cache of the data storage controller is shared by the DSP, Disk Interface, and PCI Bus. The best case, maximum bandwidth for the SDRAM memory is 70 megawords per second, or equivalently, 280 megabytes per second. The 32 bit PCI Bus interface has a best case bandwidth of 132 megabytes per second, or equivalently 33 megawords per second. In current practice, this bandwidth is only achieved in short bursts. The granularity of PCI data bursts to/from the data storage controller is governed by the PCI Bus interface data buffer depth of sixteen words (64 bytes). The time division multiplexing nature of the current PCI Data Transfer Buffering methodology cuts the sustained PCI bandwidth down to 66 megabytes/second.

Data is transferred across the ultraDMA disk interface at a maximum burst rate of 66 megabytes/second. It should be noted that the burst rate is only achieved with disks that contain onboard cache memory. Currently this is becoming more and more popular within the industry. However assuming a disk cache miss, the maximum transfer rates from current disk drives is approximately six megabytes per second. Allotting for technology improvements over time, the data storage controller has been designed for a maximum sustained disk data rate of 20 megabytes second (5 megawords/second). A design challenge is created by the need for continuous access to the SDRAM memory. Disks are physical devices and it is necessary to continuously read data from disk and place it into memory, otherwise the disk will incur a full rotational latency prior to continuing the read transaction. The maximum SDRAM access latency that can be incurred is the depth of the each of the two disk FIFO s or sixteen data. Assuming the FIFO is sixteen words deep the maximum latency time for emptying the other disk FIFO and restoring it to the disk interface is sixteen words at 5 megawords per second or (16×3.2 usec)=1 usec. Each EMIF clock cycle is 14.2857 nsec, thus the maximum latency translates to 224 clock cycles. It should be noted that transfers across the disk interface are 16 bits wide, thus the FPGA is required to translate 32 bit memory transfers to 16 bit disk transfers, and vice-versa.

The DSP services request for its external bus from two requestors, the Enhanced Direct Memory Access (EDMA) Controller and an external shared memory device controller. The DSP can typically utilize the full 280 megabytes of bus bandwidth on an 8 k through 64K byte (2 k word through 16 k word) burst basis. It should be noted that the Data Storage and Retreival Application (DSRA) does not utilize the SDRAM memory for interim processing storage, and as such only utilizes bandwidth in direct proportion to disk read and write commands.

For a single read from disk transaction data is transferred from and DMA transfer into SDRAM memory. This data is then DMA transferred by the DSP into onboard DSP memory, processed, and re transferred back to SDRAM in decompressed format (3 words for every one word in). Finally the data is read from SDRAM by the PCI Bus Controller and placed into host computer memory. This equates to eight SDRAM accesses, one write from disk, one read by the DSP, three writes by the DSP and three by the PCI Bus. Disk write transactions similarly require eight SDRAM accesses, three from the PCI, three DSP reads, one DSP write, and one to the disk.

Neglecting overhead for setting up DMA transfers, arbitration latencies, and memory wait states for setting up SDRAM transactions, the maximum DSRA theoretical SDRAM bandwidth limit for disk reads or writes is 280/8 megabytes second or 35 megabytes second. It should be noted that the best case allocation of SDRAM bandwidth would be dynamic dependent upon the data compression and decompression ratios. Future enhancements to the data storage controller will utilize a programmable timeslice system to allocate SDRAM bandwidth, however this first embodiment will utilize a fixed allocation ratio as follows:

| If all three requestors require SDRAM simultaneously: | |
|---|---|
| PCI Bus Interface | 3/8 |
| DSP Accesses | 4/8 |
| UltraDMA Disk Interface | 1/8 |
| If only the PCI Bus and DSP require SDRAM: | |
| PCI Bus Interface | 4/8 |
| DSP Accesses | 4/8 |
| If only the DSP and Disk require SDRAM: | |
| DSP Accesses | 6/8 |
| UltraDMA Disk Interface | 2/8 |
| If only the PCI Bus and Disk require SDRAM: | |
| PCI Bus Interface | 6/8 |
| UltraDMA Disk Interface | 2/8 |

If only one device requires SDRAM it receives the full SDRAM bandwidth. It should be noted that different ratios may be applied based upon the anticipated or actual compression and/or decompression ratios. For example in the case of all three requestors active the following equation applies. Assume that data storage accelerator achieves a compression ratio A:B for example 3:1. The Numerator and denominators of the various allocations are defined as follows:

| PCI Bus Interface | $A/K$ |
|---|---|
| DSP Accesses | $(A + B)/K$ |
| UltraDMA Disk Interface | $B/K$ |

Where Further define a sum K equal to the sum of the numerators of the PCI Bus interface fraction, the DSP Access fraction, and the UltraDMA Disk Interfaces, i.e. $K=2(A+B)$. Similarly:

| If only the PCI Bus and DSP require SDRAM: | |
|---|---|
| PCI Bus Interface | $(A + B)/K$ |
| DSP Accesses | $(A + B)/K$ |
| If only the DSP and Disk require SDRAM: | |
| DSP Accesses | $2A/K$ |
| UltraDMA Disk Interface | $2B/K$ |
| If only the PCI Bus and Disk require SDRAM: | |
| PCI Bus Interface | $2A/K$ |
| UltraDMA Disk Interface | $2B/K$ |

It should be noted that the resultant ratios may all be scaled by a constant in order to most effectively utilize the bandwidths of the internal busses and external interfaces. In addition each ratio can be scale by an adjustment factor based upon the time required to complete individual cycles. For example if PCI Bus interface takes 20% longer than all other cycles, the PCI time slice should be adjusted longer accordingly.

V. Instant Boot Device for Operating System, Application Program and Loading

Typically, with conventional boot device controllers, after reset, the boot device controller will wait for a command over the computer bus (such as PCI). Since the boot device controller will typically be reset prior to bus reset and before the computer bus starts sending commands, this wait period is unproductive time. The initial bus commands inevitably instruct the boot device controller to retrieve data from the boot device (such as a disk) for the operating system. Since most boot devices are relatively slow compared to the speed of most computer busses, a long delay is seen by the computer user. This is evident in the time it takes for a typical computer to boot.

It is to be appreciated that a data storage controller (having an architecture as described herein) may employ a technique of data preloading to decrease the computer system boot time. Upon host system power-up or reset, the data storage controller will perform a self-diagnostic and program the programmable logic device (as discussed above) prior to completion of the host system reset (e.g., PCI bus reset) so that the logic device can accept PCI Bus commands after system reset. Further, prior to host system reset, the data storage controller can proceed to pre-load the portions of the computer operating system from the boot device (e.g., hard disk) into the on-board cache memory. The data storage controller preloads the needed sectors of data in the order in which they will be needed. Since the same portions of the operating system must be loaded upon each boot process, it is advantageous for the boot device controller to preload such portions and not wait until it is commanded to load the operating system. Preferably, the data storage controller employs a dedicated JO channel of the DSP (with or without data compression) to pre-load computer operating systems and applications.

Once the data is preloaded, when the computer system bus issues its first read commands to the data storage controller seeking operating system data, the data will already be available in the cache memory of the data storage controller. The data storage controller will then be able to instantly start transmitting the data to the system bus. Before transmission to the bus, if the data was stored in compressed format on the boot device, the data will be decompressed. The process of preloading required (compressed) portions of the operating system significantly reduces the computer boot process time.

In addition to preloading operating system data, the data storage controller could also preload other data that the user would likely want to use at startup. An example of this would be a frequently used application such as a word processor and any number of document files.

There are several techniques that may be employed in accordance with the present invention that would allow the data storage controller to know what data to preload from the boot device. One technique utilizes a custom utility program that would allow the user to specify what applications/data should be preloaded.

Figure 7A:
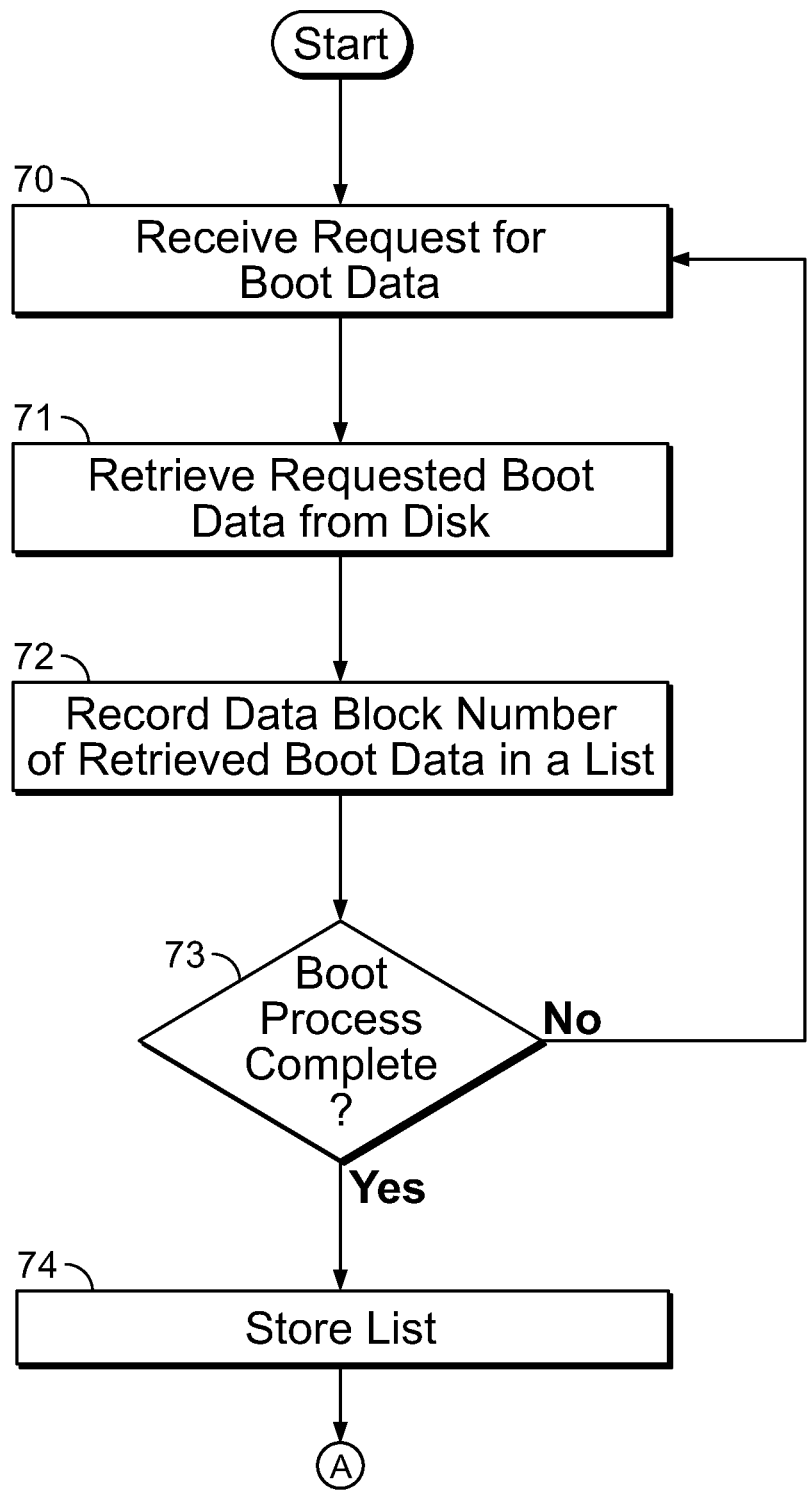
FIGS. 7a and 7b comprise a flow diagram of a method for providing accelerated loading of an operating system and/or application programs upon system boot, according to one aspect of the present invention.
Figure 7B:
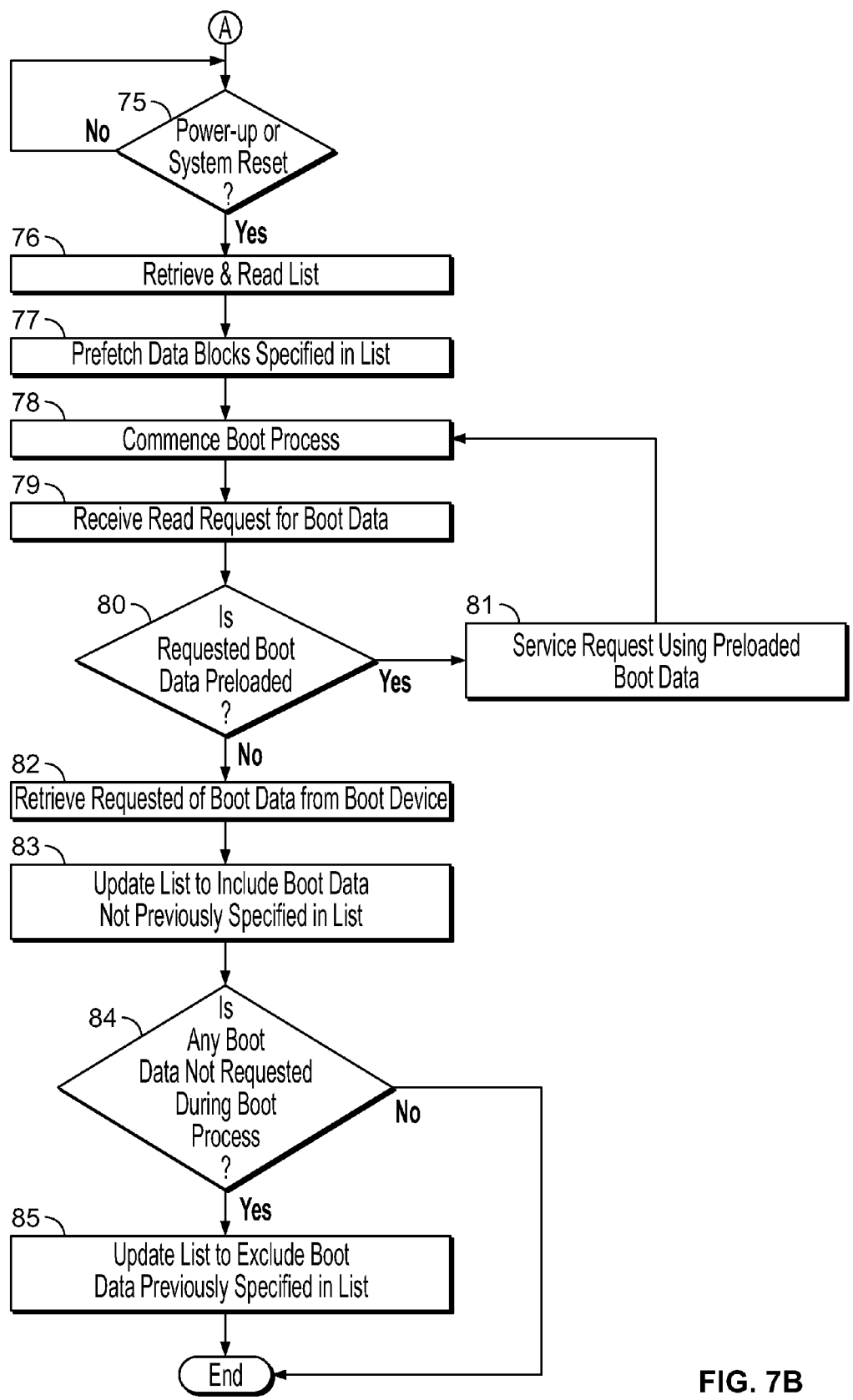

Another technique (illustrated by the flow diagram of FIGS. 7a and 7b) that may be employed comprises an automatic process that requires no input from the user. With this technique, the data storage controller maintain a list comprising the data associated with the first series of data requests received by the data storage controller by the host system after a power-on/reset. In particular, referring to FIG. 7a, during the computer boot process, the data storage controller will receive requests for the boot data (step 70). In response, the data storage controller will retrieve the requested boot data from the boot device (e.g., hard disk) in the local cache memory (step 71). For each requested data block, the data storage controller will record the requested data block number in a list (step 72). The data storage controller will record the data block number of each data block requested by the host computer during the boot process (repeat steps 70-72). When the boot process is complete (affirmative determination in step 73), the data storage controller will store the data list on the boot device (or other storage device) (step 74).

Then, upon each subsequent power-on/reset (affirmative result in step 75), the data storage controller would retrieve and read the stored list (step 76) and proceed to preload the boot data specified on the list (i.e., the data associated with the expected data requests) into the onboard cache memory (step 77). It is to be understood that the depending on the resources of the given system (e.g., memory, etc.), the preloading process may be completed prior to commencement of the boot process, or continued after the boot process begins (in which case booting and preloading are performed simultaneously).

When the boot process begins (step 78) (i.e., the storage controller is initialized and the system bus reset is deasserted), the data storage controller will receive requests for boot data (step 79). If the host computer issues a request for boot data that is pre-loaded in the local memory of the data storage controller (affirmative result in step 80), the request is immediately serviced using the preloaded boot data (step 81). If the host computer issues a request for boot data that is not preloaded in the local memory of the data storage controller (negative determination in step 80), the controller will retrieve the requested data from the boot device, store the data in the local memory, and then deliver the requested boot data to the computer bus (step 82). In addition, the data storage controller would update the boot data list by recording any changes in the actual data requests as compared to the expected data requests already stored in the list (step 83). Then, upon the next boot sequence, the boot device controller would pre-load that data into the local cache memory along with the other boot data previously on the list.

Further, during the boot process, if no request is made by the host computer for a data block that was pre-loaded into the local memory of the data storage controller (affirmative result in step 84), then the boot data list will be updated by removing the non-requested data block from the list (step 85). Thereafter, upon the next boot sequence, the data storage controller will not pre-load that data into local memory.

VI. Quick Launch for Operating System, Application Program, and Loading

It is to be appreciated that the data storage controller (having an architecture as described herein) may employ a technique of data preloading to decrease the time to load application programs (referred to as "quick launch"). Conventionally, when a user launches an application, the file system reads the first few blocks of the file off the disk, and then the portion of the loaded software will request via the file system what additional data it needs from the disk. For example, a user may open a spreadsheet program, and the program may be configured to always load a company spreadsheet each time the program is started. In addition, the company spreadsheet may require data from other spreadsheet files.

In accordance with the present invention, the data storage controller may be configured to "remember" what data is typically loaded following the launch of the spreadsheet program, for example. The data storage controller may then proceed to preload the company spreadsheet and all the necessary data in the order is which such data is needed. Once this is accomplished, the data storage controller can service read commands using the preloaded data. Before transmission to the bus, if the preloaded data was stored in compressed format, the data will be decompressed. The process of preloading (compressed) program data significantly reduces the time for launching an application.

Preferably, a custom utility program is employed that would allow the user to specify what applications should be made ready for quick launch.

Figure 8A:
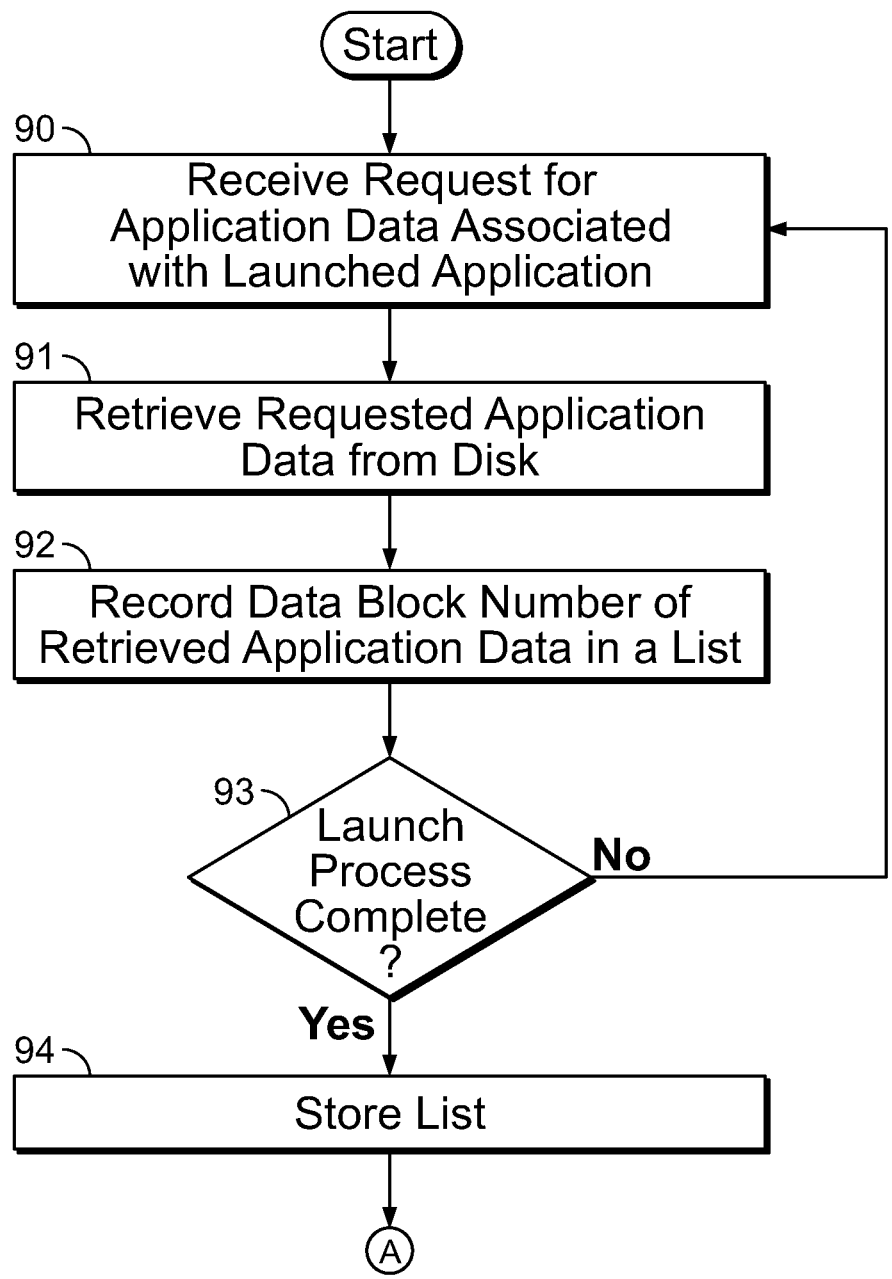
FIGS. 8a and 8b comprise a flow diagram of a method for providing accelerated loading of application programs according to one aspect of the present invention.
Figure 8B:
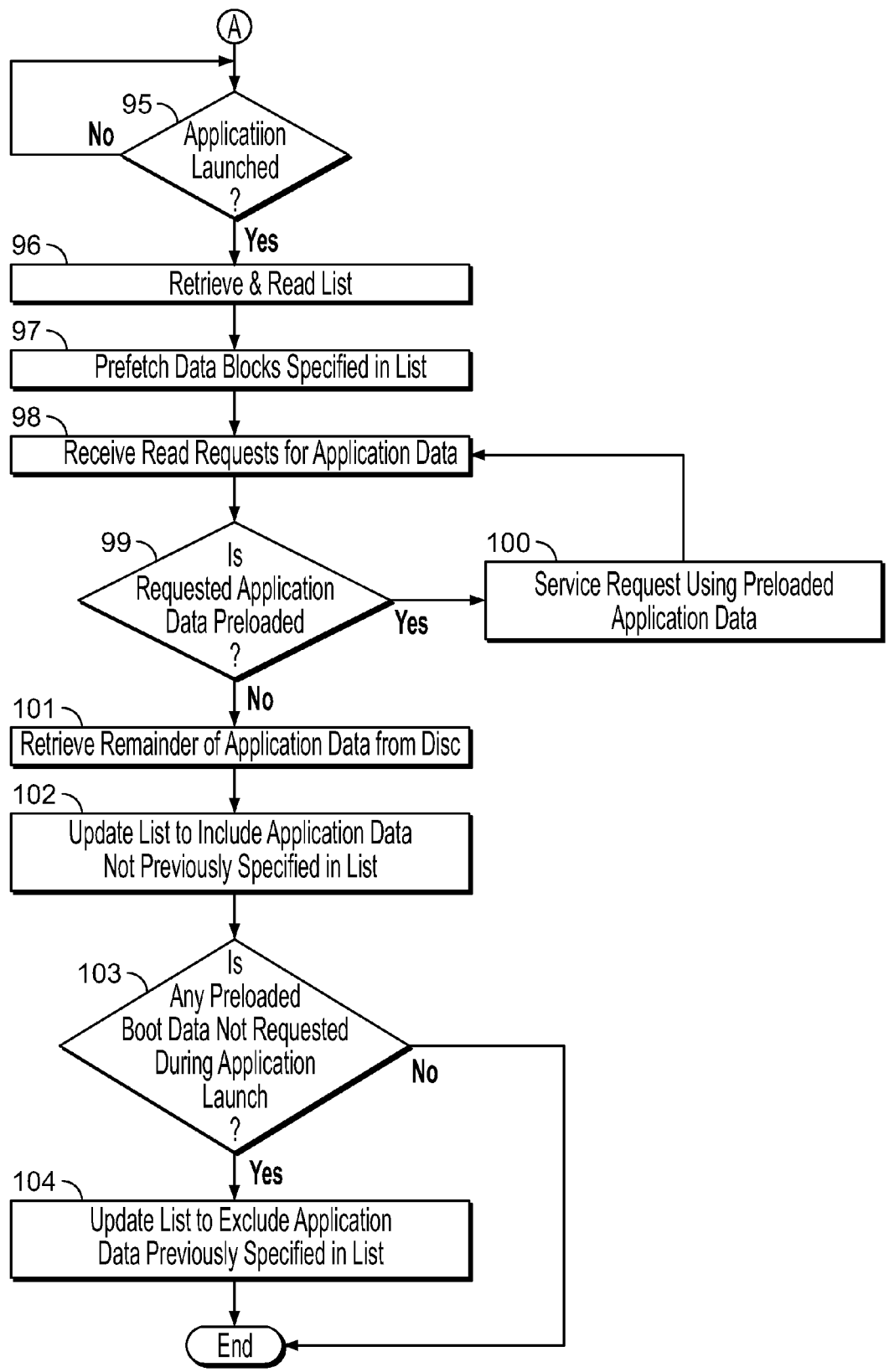

FIGS. 8a and 8b comprise a flow diagram of a quick launch method according to one aspect of the present invention. With this technique, the data storage controller maintains a list comprising the data associated with launching an application. In particular, when an application is first launched, the data storage controller will receive requests for the application data (step 90). In response, the data storage controller will retrieve the requested application data from memory (e.g., hard disk) and store it in the local cache memory (step 91). The data storage controller will record the data block number of each data block requested by the host computer during the launch process (step 92). When the launch process is complete (affirmative determination in step 93), the data storage controller will store the data list in a designated memory location (step 94).

Then, referring to FIG. 8b, upon each subsequent launch of the application (affirmative result in step 95), the data storage controller would retrieve and read the stored list (step 96) and then proceed to preload the application data specified on the list (i.e., the data associated with the expected data requests) into the onboard cache memory (step 97). During the application launch process, the data storage controller will receive requests for application data (step 98). If the host computer issues a request for application data that is pre-loaded in the local memory of the data storage controller (affirmative result in step 99), the request is immediately serviced using the preloaded data (step 100). If the host computer issues a request for application data that is not preloaded in the local memory of the data storage controller (negative result in step 99), the controller will retrieve the requested data from the hard disk memory, store the data in the local memory, and then deliver the requested application data to the computer bus (step 101). In addition, the data storage controller would update the application data list by recording any changes in the actual data requests as compared to the expected data requests already stored in the list (step 102).

Further, during the launch process, if no request is made by the host computer for a data block that was pre-loaded into the local memory of the data storage controller (affirmative result in step 103), then the application data list will be updated by removing the non-requested data block from the list (step 104). Thereafter, upon the next launch sequence for the given application, the data storage controller will not pre-load that data into local memory.

It is to be understood that the quick boot and quick launch methods described above are preferably implemented by a storage controller according to the present invention and may or may not utilize data compression/decompression by the DSP. However, it is to be understood that the quick boot and quick launch methods may be implemented by a separate device, processor, or system, or implemented in software.

VII. Content Independent Data Compression

It is to be understood that any conventional compression/decompression system and method (which comply with the above mentioned constraints) may be employed in the data storage controller for providing accelerated data storage and retrieval in accordance with the present invention. Preferably, the present invention employs the data compression/decompression techniques disclosed in the above-incorporated U.S. Pat. No. 6,195,024.

Figure 9:
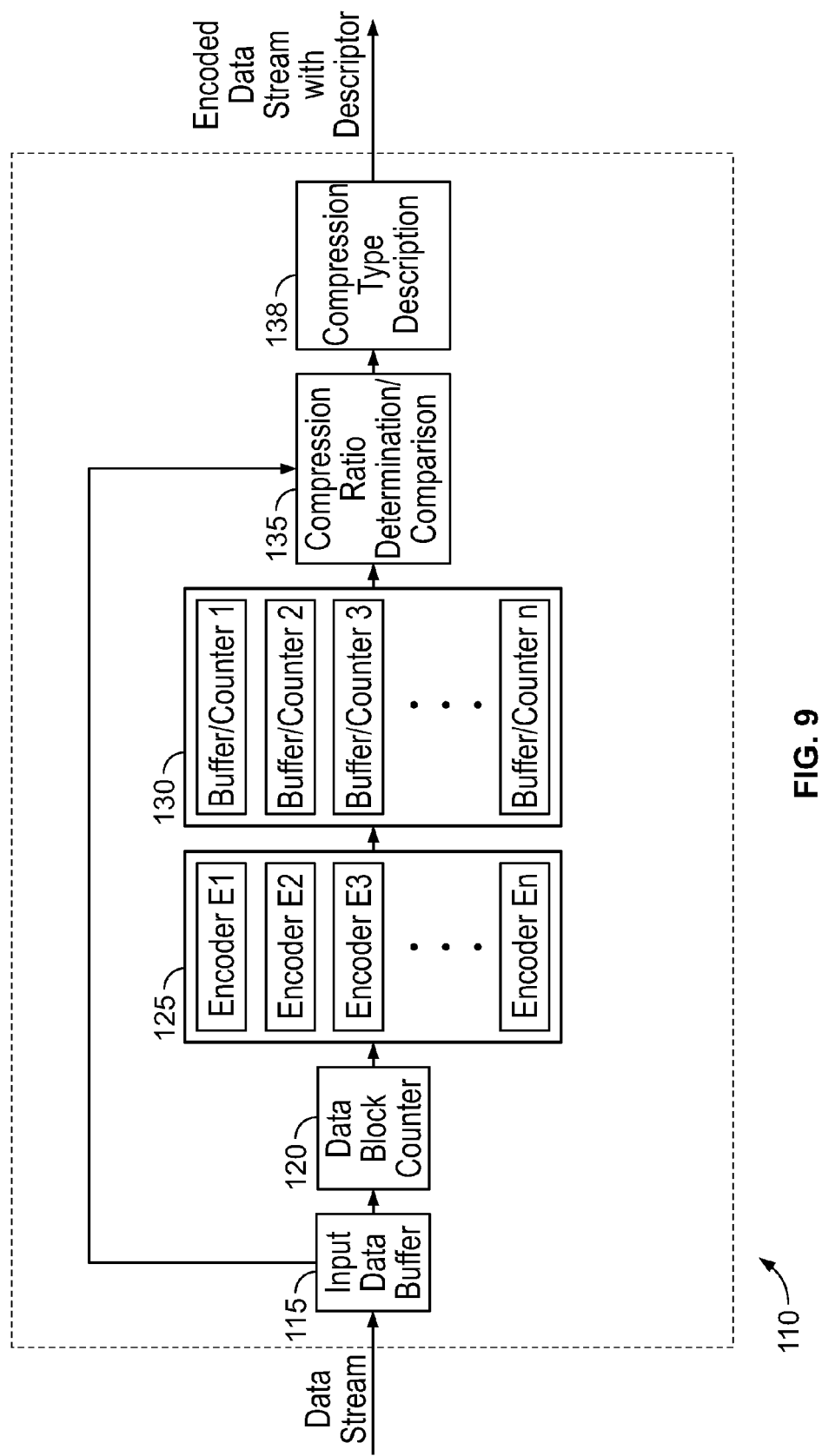
FIG. 9 is a diagram of an exemplary data compression system that may be employed in a data storage controller according to the present invention.

Referring to FIG. 9, a detailed block diagram illustrates an exemplary data compression system 110 that may be employed herein. Details of this data compression system are provided in U.S. Pat. No. 6,195,024. In this embodiment, the data compression system 110 accepts data blocks from an input data stream and stores the input data block in an input buffer or cache 115. It is to be understood that the system processes the input data stream in data blocks that may range in size from individual bits through complete files or collections of multiple files. Additionally, the input data block size may be fixed or variable. A counter 120 counts or otherwise enumerates the size of input data block in any convenient units including bits, bytes, words, and double words. It should be noted that the input buffer 115 and counter 120 are not required elements of the present invention. The input data buffer 115 may be provided for buffering the input data stream in order to output an uncompressed data stream in the event that, as discussed in further detail below, every encoder fails to achieve a level of compression that exceeds an a priori specified minimum compression ratio threshold.

Data compression is performed by an encoder module 125 which may comprise a set of encoders E1, E2, E3 . . . En. The encoder set E1, E2, E3 . . . En may include any number "n" (where n may=1) of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 125 successively receives as input each of the buffered input data blocks (or unbuffered input data blocks from the counter module 120). Data compression is performed by the encoder module 125 wherein each of the encoders E1 . . . En processes a given input data block and outputs a corresponding set of encoded data blocks. It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 125 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 130 is operatively connected to the encoder module 125 for buffering and counting the size of each of the encoded data blocks output from encoder module 125. Specifically, the buffer/counter 130 comprises a plurality of buffer/counters BC1, BC2, BC3 . . . BCn, each operatively associated with a corresponding one of the encoders E1 . . . En. A compression ratio module 135, operatively connected to the output buffer/counter 130, determines the compression ratio obtained for each of the enabled encoders E1 . . . En by taking the ratio of the size of the input data block to the size of the output data block stored in the corresponding buffer/counters BC1 BCn. In addition, the compression ratio module 135 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 138, operatively coupled to the compression ratio module 135, appends a corresponding compression type descriptor to each encoded data block which is selected for output so as to indicate the type of compression format of the encoded data block. A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal. If there are no encoded data blocks having a compression ratio that exceeds the compression ratio threshold limit, then the original unencoded input data block is selected for output and a null data compression type descriptor is appended thereto. A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal.

Again, it is to be understood that the embodiment of the data compression engine of FIG. 9 is exemplary of a preferred compression system which may be implemented in the present invention, and that other compression systems and methods known to those skilled in the art may be employed for providing accelerated data storage in accordance with the teachings herein. Indeed, in another embodiment of the compression system disclosed in the above-incorporated U.S. Pat. No. 6,195,024, a timer is included to measure the time elapsed during the encoding process against an a priori-specified time limit. When the time limit expires, only the data output from those encoders (in the encoder module 125) that have completed the present encoding cycle are compared to determine the encoded data with the highest compression ratio. The time limit ensures that the real-time or pseudo real-time nature of the data encoding is preserved. In addition, the results from each encoder in the encoder module 125 may be buffered to allow additional encoders to be sequentially applied to the output of the previous encoder, yielding a more optimal lossless data compression ratio. Such techniques are discussed in greater detail in the above-incorporated U.S. Pat. No. 6,195,024.

Figure 10:
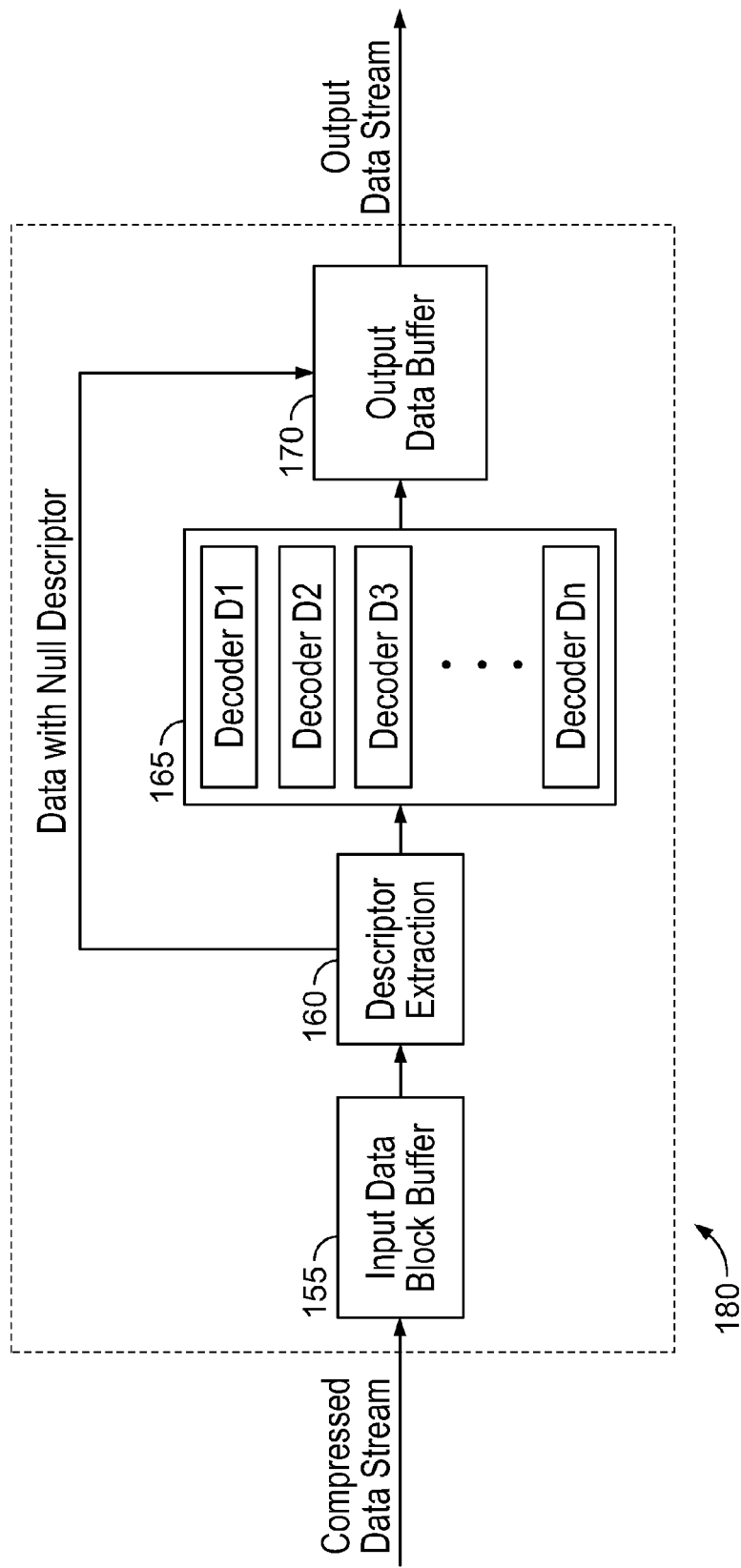
FIG. 10 is a diagram of an exemplary data decompression system that may be employed in a data storage controller according to the present invention.

Referring now to FIG. 10, a detailed block diagram illustrates an exemplary decompression system that may be employed herein or accelerated data retrieval as disclosed in the above-incorporated U.S. Pat. No. 6,195,024. In this embodiment, the data compression engine 180 retrieves or otherwise accepts compressed data blocks from one or more data storage devices and inputs the data via a data storage interface. It is to be understood that the system processes the input data stream in data blocks that may range in size from individual bits through complete files or collections of multiple files. Additionally, the input data block size may be fixed or variable.

The data decompression engine 180 comprises an input buffer 155 that receives as input an uncompressed or compressed data stream comprising one or more data blocks. The data blocks may range in size from individual bits through complete files or collections of multiple files. Additionally, the data block size may be fixed or variable. The input data buffer 55 is preferably included (not required) to provide storage of input data for various hardware implementations. A descriptor extraction module 160 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 165 includes one or more decoders D 1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source.

As with the data compression systems discussed in U.S. Pat. No. 6,195,024, the decoder module 165 may include multiple decoders of the same type applied in parallel so as to reduce the data decoding time. An output data buffer or cache 170 may be included for buffering the decoded data block output from the decoder module 165. The output buffer 170 then provides data to the output data stream. It is to be appreciated by those skilled in the art that the data compression system 180 may also include an input data counter and output data counter operatively coupled to the input and output, respectively, of the decoder module 165. In this manner, the compressed and corresponding decompressed data block may be counted to ensure that sufficient decompression is obtained for the input data block.

Again, it is to be understood that the embodiment of the data decompression system 180 of FIG. 10 is exemplary of a preferred decompression system and method which may be implemented in the present invention, and that other data decompression systems and methods known to those skilled in the art may be employed for providing accelerated data retrieval in accordance with the teachings herein.

Figure 11:
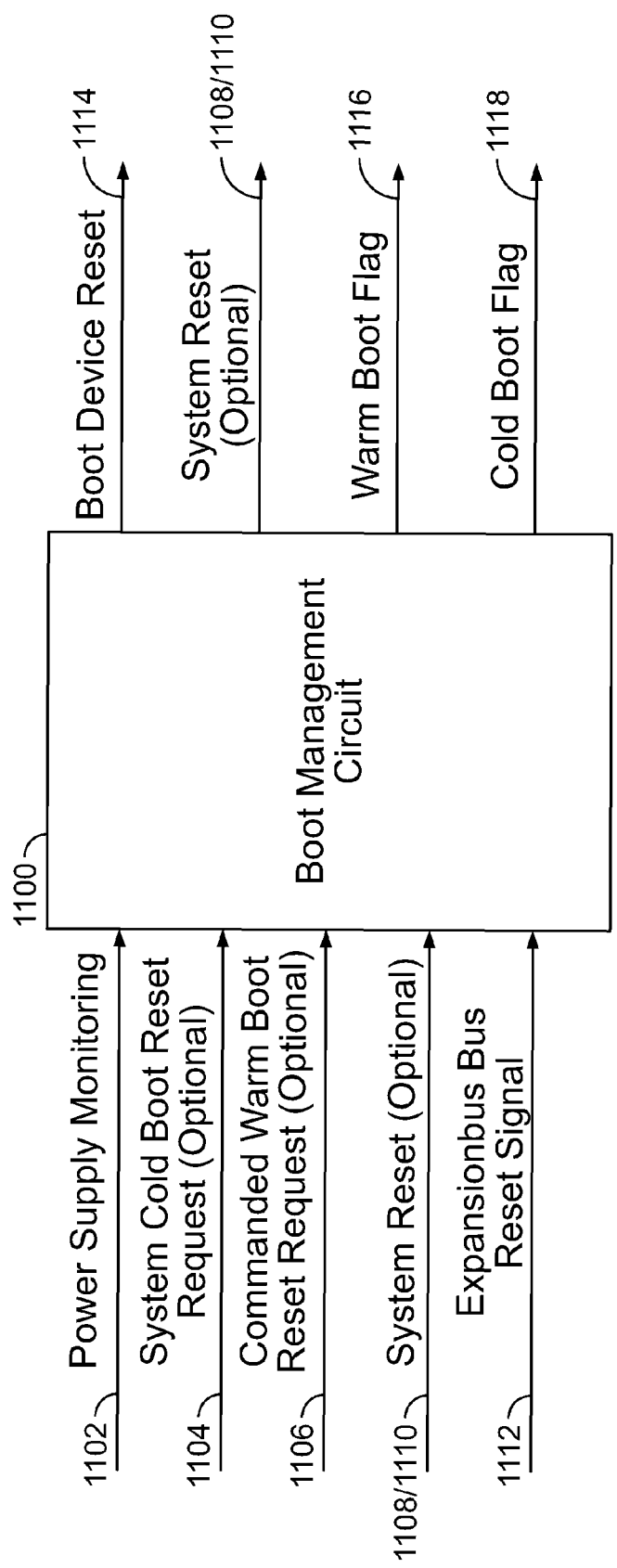
FIG. 11 is a high-level block diagram of a boot management circuit according to an embodiment of the present invention.

VIII. Boot Configuration Circuit and Computer Initialization Systems and Protocols FIG. 11 illustrates a high-level block diagram of a boot management circuit 1100 according to an embodiment of the present invention. In general, a preferred architecture of the boot management circuit 1100 comprises a component for sensing power-up and user/system commanded reset requests and a component for generating control signals in response to such power-up and commanded requests for causing logic code to be loaded into one or more programmable logic devices in advance of use of such programmable logic devices in a boot process. Furthermore, a preferred boot management circuit comprises a component for determining the type of boot process that was initiated (e.g., power-up or commanded reset) and providing an indication of such boot process.

The exemplary boot management circuit 1100 of FIG. 11 comprises a plurality of inputs for receiving a power-supply-monitoring signal 1102, an optional system-coldboot-reset-request signal 1104, an optional commanded-warm-boot-reset-request signal 1106, (optionally) a legacy system-reset signal 1108/1110; and optionally an expansionbus-reset-signal 1112.

In future system implementations (i.e. non-legacy) utilizing the present invention, a preferred implementation is to employ either the power-supply-monitoring signal 1102 and/or the system-cold-boot-reset-request signal 1104 for determining cold boot requests. Similarly the commanded-warm-boot-reset-request signal 1106 is utilized to sense warm boot requests.

In existing (i.e., legacy) computer architectures, signals such as the system-coldboot-reset-request signal 1104 and the commanded-warm-boot-reset-request signal 1106 are typically not available from the current hardware/software implementation, thus only existent signals must be utilized that are generated by the computer or expansion bus. Hence, preferably, for implementations within a legacy system, the power-supply-monitoring signal 1102 coupled to either the power supply or the expansion bus power is utilized in conjunction with either the expansionbus-bus-reset signal 1112 or the system-reset signal 1108/1110 to distinguish between a cold and warm boot. It should be noted that in legacy systems, the expansionbus-bus-reset signal 1112 is typically derived from the system-reset signal 1108/1110, usually with appropriate buffering or some other form of signal conditioning. Thus, when the boot management circuit 1100 is implemented in a legacy system, the system-reset signal 1108/1110 or expansionbus-bus-reset signal 1112 is preferably monitored along with power-supply-monitoring signal 1102. If the system-reset signal 1108/1110 or the expansionbus-bus-reset signal 1112 is asserted and the power-supply-monitoring signal 1102 is above the specified threshold (deemed power supply valid), then the boot process is a warm boot. However, if the system-reset signal 1108/1110 or the expansionbus-bus-reset signal 1112 is asserted and the power-supply-monitoring signal 1102 is below the specified threshold (deemed power supply invalid), then the boot process is a cold boot.

The exemplary boot management circuit 1100 further comprises a plurality of output pins for outputting a boot-device-reset signal 1114, a system-reset signal 1108/1110 (depending if a cold or warm boot process is initiated), and (optionally) indicator signals such as a warm-boot-flag indicator 1116 and/or a cold-boot-flag indicator 1118.

For non-legacy systems, it may be advantageous to generate the optional system-reset signal 1108/1110 signal from the logical OR of the system-cold-boot-reset-request signal 1104 and the commanded-warm-boot-reset-request signal 1106 to minimize logic circuitry. In the case of non-legacy systems the system-reset 1108/1110 is not an input to the boot management circuit 1100 but is an output generated by the boot management circuit 1100. The non-legacy use of the system-reset 1108/1110 is similar to its use in legacy systems where the signal 1108/1110 may be utilized to reset processors, peripherals, and all other non-volatile elements of the boot device. For non-legacy systems the warm-boot-flag signal 1050 and the cold-boot-flag signal 1040 may be derived from their respective input request signals 1104 and 1106. For legacy systems the previously specified logic is preferably applied. It is to be appreciated that the boot management circuit 1100 according to the present invention can be readily employed in all existing and future platform architectures. As such, it is to be further understood that the input signals 1102, 1104, 1106, 1108/1110, 1112 and output signals 1114, 1108/1110, 1116, and 1118 are labeled with names that describe their associated functions, and that, depending on the platform, system or application, other signals providing corresponding functions of the signals depicted in FIG. 11 may be applied.

It is to be further appreciated that the boot-device-reset signal 1114 provides a mechanism for initiating the loading of the programmable logic device in advance of the use of the programmable logic device in the boot process. The cold-boot-flag indicator 1118 and the warm-boot-flag indicator 1116 indicate which type boot process has been commanded. Advantageously, the output flags 1116 and 1118 provide an indication that allows additional logic that is implemented in either hardware, software, or any combination thereof, to elect to either load or reload program code in the programmable logic device, or leave intact the current programming of the programmable logic device.

Indeed, depending on the application, it may or may not be advantageous to reload the programmable logic devices. The system-reset output 1108/1110, typically resets either all or a portion of the PC components, appliance components, or system components. It should be noted that while singular input signals are shown, the input signals are indicative of a signal type and may each occur in pluralities. For example, the power-supply-monitoring signal 1102 may comprise a plurality of power senses. Typically, the individual senses that may be utilized include +5 volts, +3.3 volts, +1.8 volts, +1.5 volts, +12 volts, and −12 volts, although any suitable voltage or combination thereof may be implemented. The power-supply-monitoring signal 1102 may be monitored and logically combined using any suitable conventional logic equation to provide a power sense. Certain power supply voltages are used for specific functions. For example +5 and +3.3 volts may be utilized for logic input and output while lower voltages such as +1.5 volts may be utilized for internal logic cores of high-density logic devices and processors. The process of monitoring voltages is application specific to a number of parameters including the specific logic implementation, system functionality, and/or processors utilized in the computer or appliance. Further, the ordering may be sensed to ensure that the power has been applied in the proper sequence, i.e., the logic cores are powered before I/O devices to avoid latch up).

Figure 12:
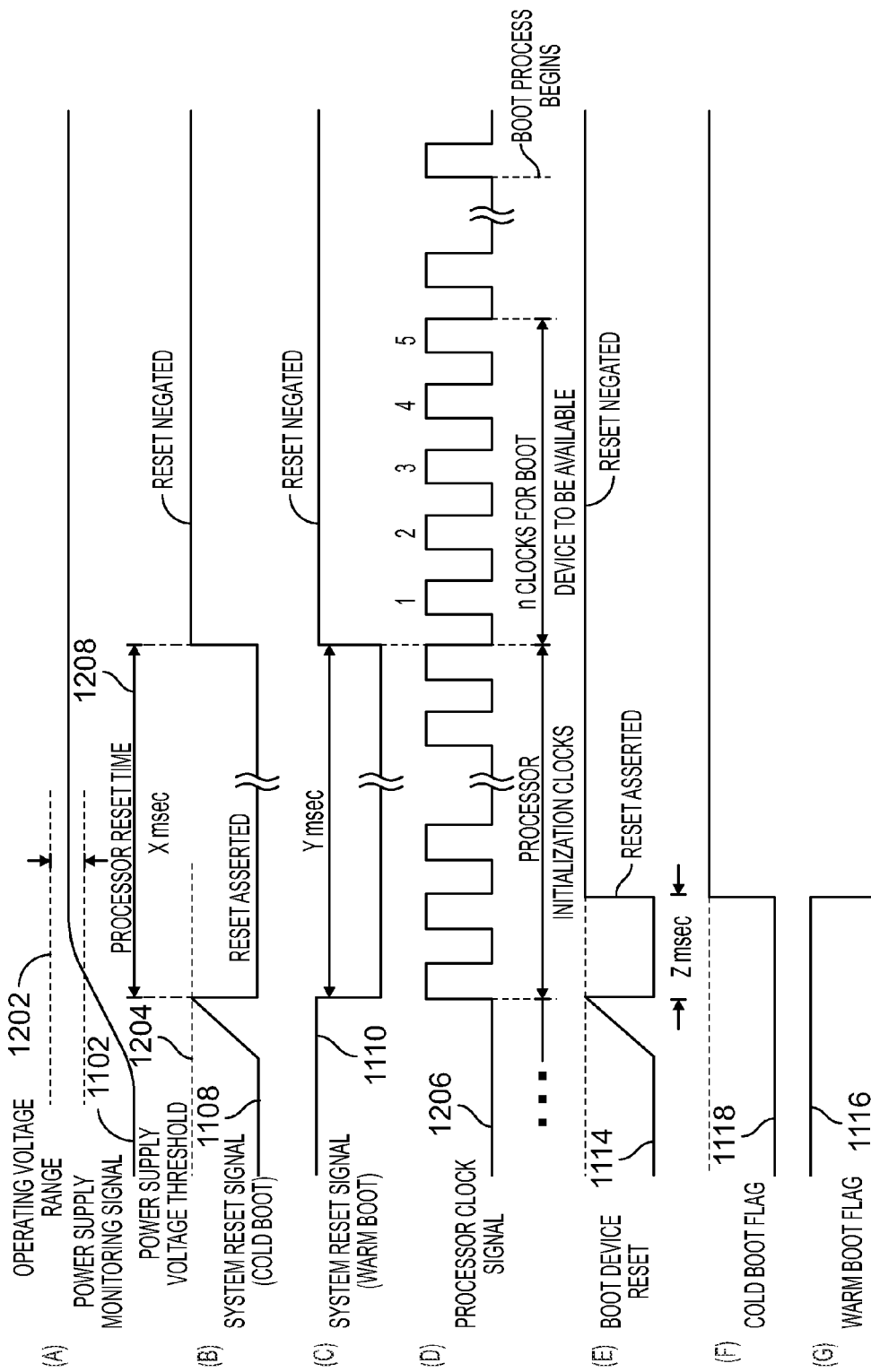
FIG. 12 illustrates timing diagrams of a boot process according to one aspect of the present invention implementing the boot management circuit of FIG. 11 in a legacy computer system.

Referring now to FIG. 12, a plurality of timing diagrams are shown depicting both cold and warm boot process for implementation of the boot management circuit 1100 in a legacy system. In FIG. 12(a), upon power-up of the system, a power-supply-monitoring signal 1102 reaches a stable and acceptable voltage operating range 1202 within a given time period. The phase lag associated with the power-supply-monitoring signal 1102 may vary based upon factors such as the source impedance and load condition of the input source and the internal functioning of the power supply, topology, analog or switching, frequency of switching, capacity, etc. Then, as illustrated in FIG. 12(b), the system-reset signal 1108 for a cold boot is generated, which typically approximates the power-supply-monitoring signal 1102 until a minimum threshold voltage 1204 is reached so as to enable proper logic operation. Once the minimum threshold voltage 1204 is reached, (with a cold boot process), the system-reset signal 1108 is asserted for X milliseconds. Although the time period X is typically 200 milliseconds, any suitable value for X may be implemented in the present invention, as the present invention is not specific to any given value. Indeed, it is anticipated that this time period with grow smaller in future systems. Additionally, it is not required that the system-reset signal 1108 follow the power-supply-monitoring signal 1102. Indeed, the system-reset signal 410 may remain continuously asserted until it is negated.

For a warm boot process, in FIG. 12(c) (which is similar to FIG. 12(b), the system-reset signal 1110 is asserted for Y milliseconds, wherein Y may be any suitable time period. It is to be understood that notwithstanding that FIG. 12(c) illustrates that Y, their values may be different depending on the application. For instance, warm boot processes may benefit from a reduced time Y since certain system elements may not require initialization or since there are less transients within a system that is already powered (pre-charged capacitances and inductances).

In FIG. 12(d), the system processor clock generates the clock signal 1206, which typically begins operation once the input power has reached an acceptable operating level. While it is possible that the clock signal 1206 is held in reset until the system-reset signal 1108/1110 is negated, it is often preferable to allow the clock signal 1206 to operate during the time interval X, (or Y) to aid the system logic and/or initializing the processor into a known state. For example, many general-purpose processors and digital signal processors typically require a number of input clocks to properly operate when released from the reset state. It is to be understood that the clock signal 1206 is shown for pedagogical purposes and is not a required element of the present invention. Again, a maximum delay from reset negation to boot device availability may be implemented based on, e.g., a maximum number n of clock cycles (or some other pre-specified time interval). For example, in the Personal Computer Interface Specification Revision 2.2, the boot device must be available 5 clock cycles after the negation of reset on the bus, or the system may crash. At the current system clock rates of 33 and 66 megahertz, this approximately corresponds to maximum times of 150 and 75 nanoseconds, respectively. Again, the maximum delay from reset negation to boot device availability may be anywhere from zero to some maximum specified time value delineated in any convenient units including multiples of clock periods.

As further illustrated in FIG. 12(e), in a cold boot process, the boot-device-reset signal 1114 preferably follows the power-supply-monitoring signal 1102, although this is not essential for implementing a boot process according to this invention. With a warm boot process, the boot-device-reset signal 1114 will change from a negated state to an asserted state upon the system-reset signal 1110 being asserted. When the system-reset signal 1108 is asserted to active low, the boot-device-reset signal 1114 is asserted to active low for Z msec, where Z comprises a number that is shorter than the respective X or Y time periods for cold and warm boots respectively. In general, the period of time X-Z (or Y-Z with a warm boot) should be sufficient to load and activate the programmable logic device elements necessary for boot, which may comprise of a portion of one programmable logic device or one or more programmable logic devices. This time period may be shortened, for instance when reloading of the volatile logic device is not necessary.

Further, an optional internal state machine is set to provide an indication of the mechanism that is responsible for initiating the boot process. Preferably, this mechanism comprises either asserting or negating the cold-boot-flag indicator 1118 along with the complementary warm-boot-flag indicator 1116. In particular, as shown in FIGS. 12(f) and (g), in a preferred embodiment, the warm-boot-flag indicator 1116 and the cold-boot-flag indicator 1118 change state when the boot-device-reset signal 1114 is negated. It is to be appreciated that in other embodiments of the present invention, the state machine and indicator signals may be valid earlier than negation of the boot-device-reset signal 1114, if so desired.

Figure 13:
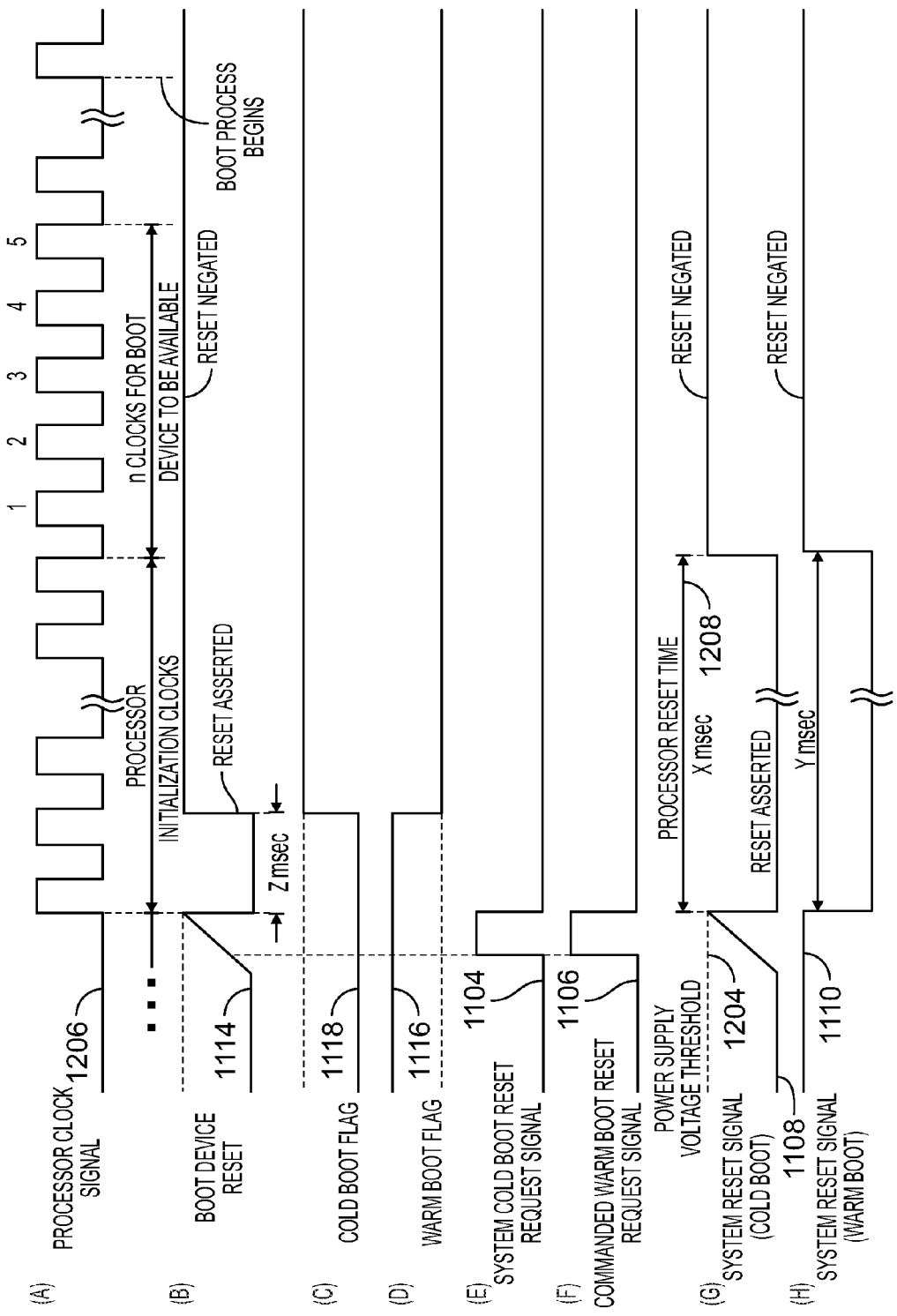
FIG. 13 illustrates timing diagrams of a boot process according to one aspect of the present invention implementing the boot management circuit of FIG. 11 in a non-legacy computer system.

Referring now to FIG. 13, a plurality of timing diagrams are shown depicting both cold and warm boot process for implementation of the boot management circuit 1100 in a non-legacy system. These timing diagrams are similar to the corresponding timing diagrams of FIG. 12, expect that in FIG. 13, the system-cold-boot-reset-request signal 1104 in FIG. 13(e) and the commanded-warm-boot-reset-request signal 1106 signal in FIG. 13(f) are utilized directly as the cold and warm boot requests, as opposed to their derivation in legacy applications as described herein.

Figure 14A:
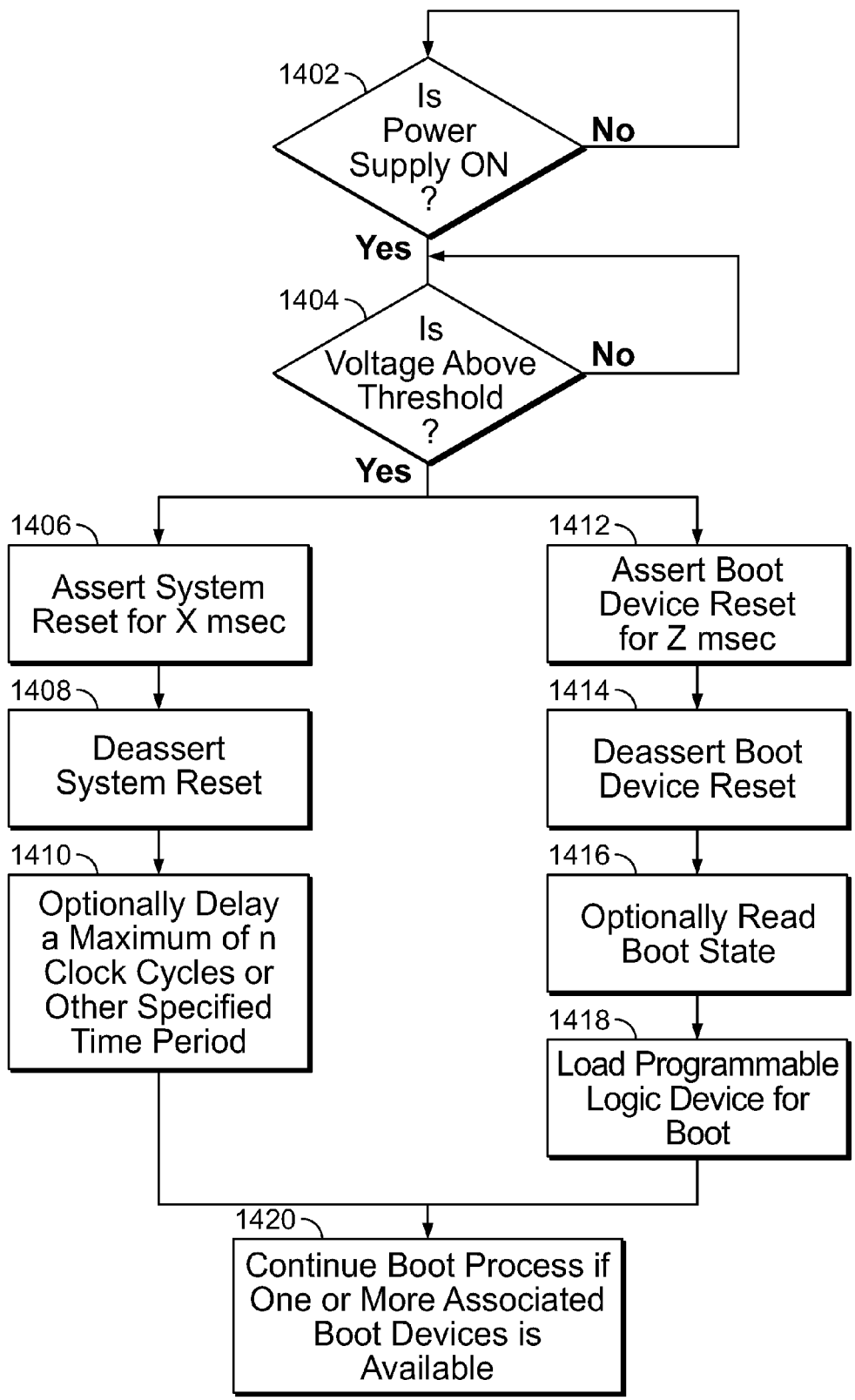
FIGS. 14*a* and 14*b* respectively comprise flow diagrams of a "cold" and "warm" boot process according to one aspect of the present invention.
Figure 14B:
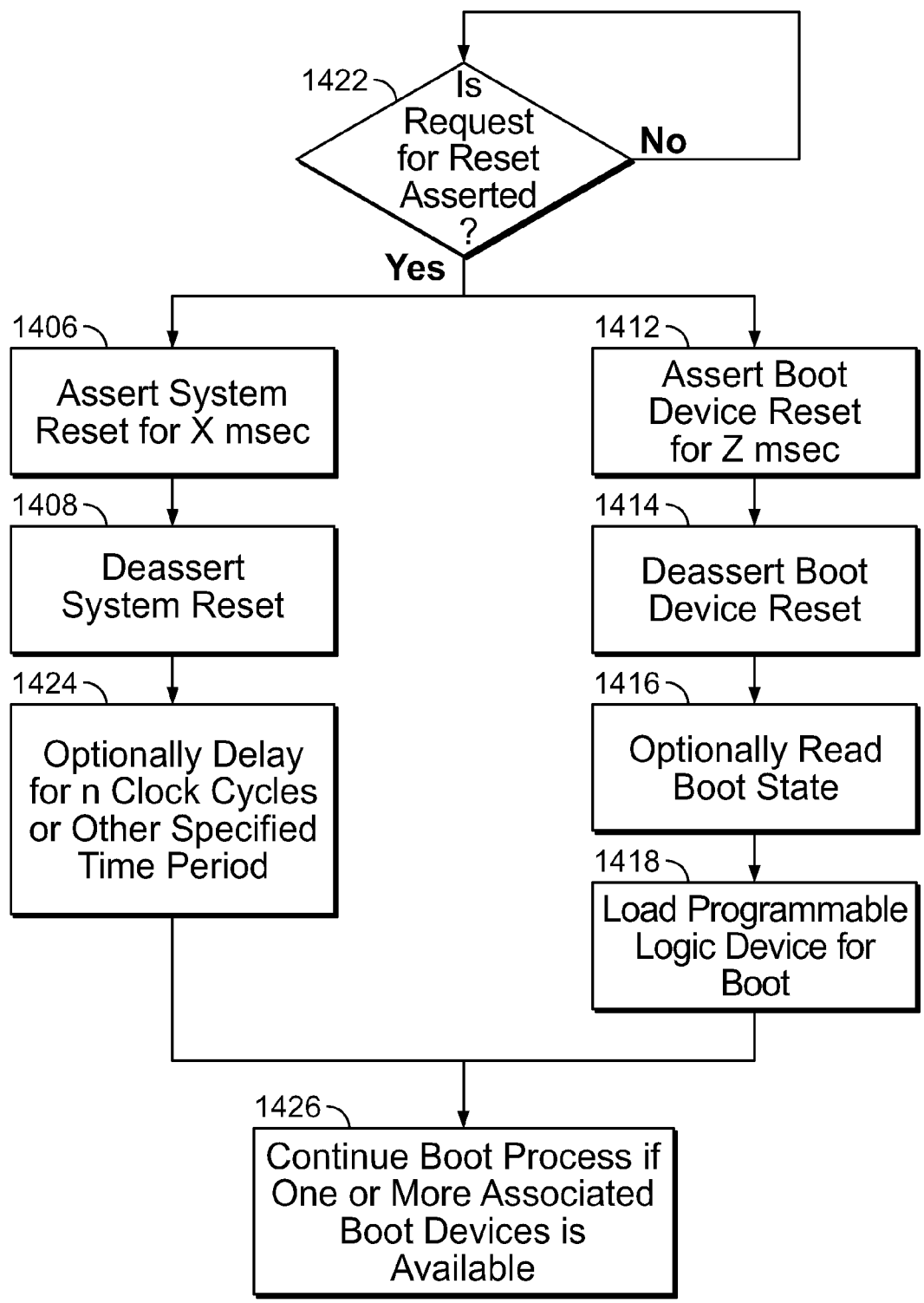

Referring now to FIGS. 14a and 14b, flow diagrams respectfully illustrate a "cold" and "warm" boot process according to one aspect of the present invention. More specifically, with a preferred cold boot process as illustrated in FIG. 14a, a test or other check is continuously performed to determine whether the power supply has been turned on (step 1402). If power has been applied (affirmative determination in step 1402), a determination is then made as to whether as to whether the voltage, current, and/or aggregate power from one or more supply voltages has met a predetermined threshold (step 1404). Furthermore, in the case of under-damped or critically damped supplies, it may also be desirable to test both high and low voltage rails to ensure that the power supply has settled. This process may also include a time delay to ensure that the supply is not in the process of oscillating above and below the thresholds, inducing a false power supply valid indication. Multiple senses (and the order thereof) may be combined to derive the most reliable or otherwise optimal indication of power supply validity, if so desired.

Upon power supply validity (affirmative determination in step 1404), preferably, two parallel processes occur (i.e., a first parallel process comprising steps 1406, 1408, and 1410, and a second parallel process comprising steps 1412, 1414, 1416, and 1418). More specifically, the first parallel process initiates with the system-reset signal 1108 being asserted for X msec (step 1406), or some other prespecified time period. Then, after expiration of the time period X, the system-reset signal 1108 is deasserted (step 1408). Then, a time delay 540

(shown in FIG. 13(n) as n clock cycles) is optionally inserted before the boot process 1420 begins.

In the second parallel process, the boot-device-reset signal 1114 is asserted (substantially concurrently with the assertion of the system-reset signal 1108) for Z msec (step 1412), wherein Z<X During the time period Z, any logic devices utilized on the 15 boot storage adapter or processors may be reset including those utilized to load the volatile logic device including the boot storage device. At the expiration of Z, the boot-device-reset signal 1114 is deasserted (step 1414). Then, the boot state indicator is optionally read to ensure the appropriate boot process and loading of the correct logic code into the programmable logic device (step 1416). Next, the programmable logic device is loaded (step 1418). It is to be noted that a delay may then be encountered waiting for completion of the first parallel process. Finally, the boot process begins (step 1420).

With a preferred "warm" boot process as depicted in FIG. 14b, a test or other check is continuously performed to determine whether a request for reset (e.g., user, system, application, etc.) has been asserted (step 1422). If so (affirmative determination in step 1422), two parallel processes occur (a first parallel process comprising steps 1406, 1408, and 1410, and a second parallel process comprising steps 1412, 1414, 1416, and 1418). The first parallel process initiates with system-reset signal 1110 (master reset) being asserted active low for time period of Y msec (step 1406), wherein Y may be equal to any suitable time period. After the system-reset signal 1110 has been asserted for the prespecified time period Y, the system-reset signal 1110 is deasserted (step 1408) and a maximum time delay of n clock cycles is optionally mandated (step 1424) for the availability of the boot device. The boot process begins (step 1426) if the boot device is available. In the second parallel processes, the boot-device-reset signal 1114 is asserted for Z msec (step 1412), wherein Z<Y. After the expiration of Y, the boot-device-reset signal 1114 is deasserted (step 1414). Then, the boot state indicator is optionally read to ensure the appropriate boot process and loading of the correct logic code into the programmable logic device (step 1416). Next, the programmable logic device is loaded (step 1418). It is to be noted that a delay may then be encountered waiting for completion of the first process. Finally, the boot process begins (step 1426).

Figure 15:
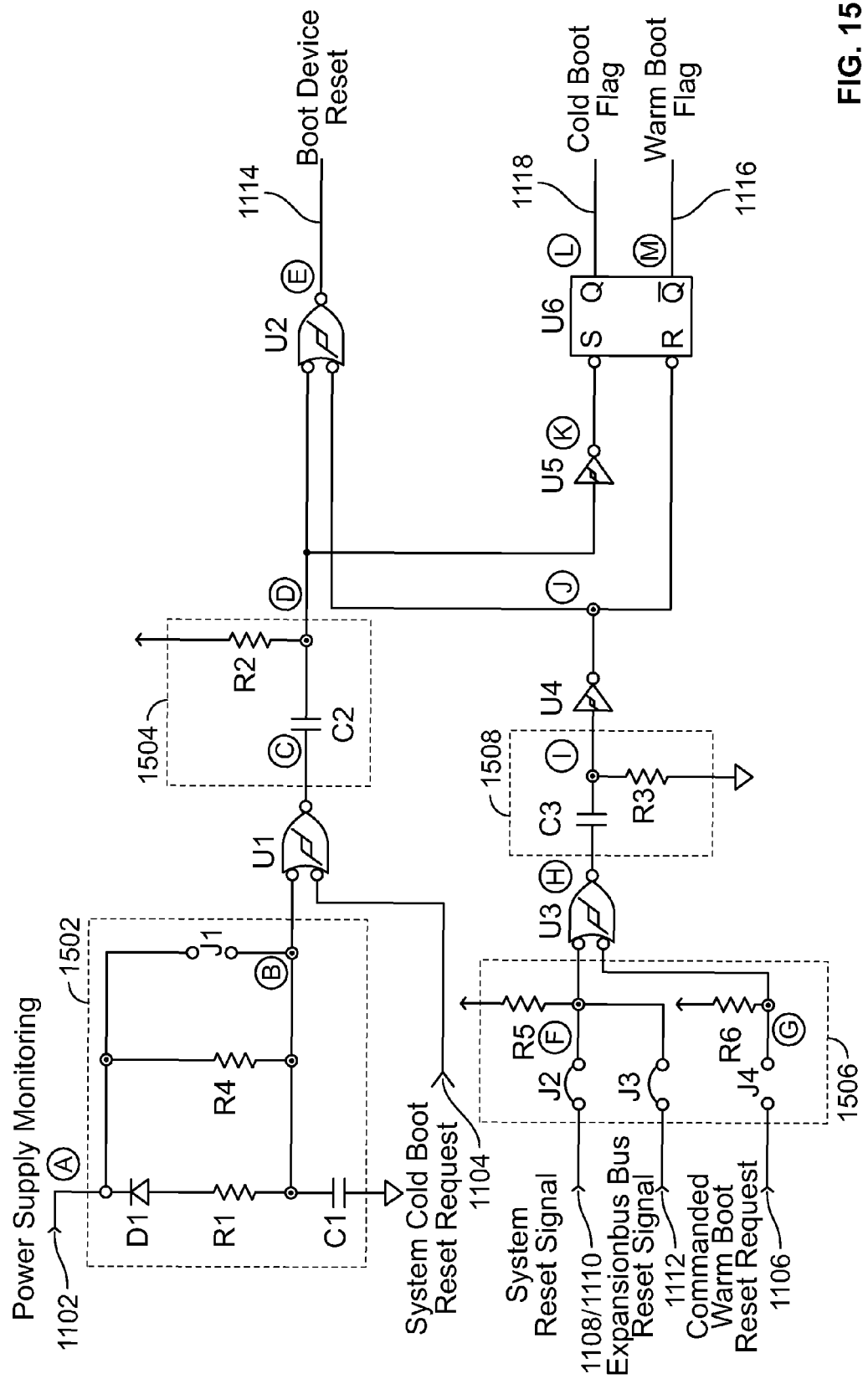
FIG. 15 is a schematic diagram of a boot management circuit according to an embodiment of the present invention.

FIG. 15 illustrates a schematic circuit diagram of a boot management circuit 1100 (FIG. 11) according to a preferred embodiment of the present invention. In the illustrated embodiment, the boot management circuit 1100 comprises a power supply sense circuit 1502 comprising an input node A, a diode D1, resistors R1 and R4, a capacitor C1, a jumper J1 and output node B. Preferably, R1 is at least one order of magnitude lower than the resistance R4. The power supply sense circuit 1502 is essentially a dual time constant integrator with R4 and C1 defining the charge time constant and R1 and C1 defining the discharge time constant. While it is preferable that D1 have a low forward bias voltage such as those found in Schottky diodes, it is not necessary as R4 bleeds out residual charge at a low rate for voltages below and the forward bias of the diode D1 when the power supply sense voltage (at node A) drops below the forward bias of the diode D1. The jumper J1 may be used to short-circuit the other components of the power supply sense circuit 1502 to eliminate the effect of the charge/discharge time constants in the event that the power supply provides the needed characteristics.

The boot management circuit 1100 further comprises a Schmidt inverter U1, operatively connected to the power sensor power supply sense circuit 1502 at node B, and operatively connected to an input of a falling edge differentiator 1504 at node C. The falling edge differentiator 1504 preferably comprises a capacitor C2 and resistor R2. The Schmidt inverter U1 is employed in conjunction with the falling edge differentiator 1504 to generate a pulse (at node D) that is utilized to create a boot-device-reset signal 1114 (at node E) by means of a two input Schmidt AND gate U2 (which operates as an active low in, active low out, OR gate).

The boot management circuit 1100 further comprises a system reset circuit 1506 comprising a jumper J2 and resistor R5, for processing the legacy system-reset signal 1108/1110, a jumper J3 again with resistor R5, for processing the expansionbus-bus-rest signal 1112, and a jumper J4 and resistor R6 for processing the commanded-warm-boot-reset-request signal 1106. By inclusion of jumpers J2, J3, or J4, and an appropriately asserted reset-request signal at the respective input, a boot-device-reset signal 1114 (at node E) will be generated. It should be noted that each of the jumpers J1-J4 illustrated in FIG. 15 may comprise any suitable conventional switching device, including, but not limited to, passive or active, or static or dynamic, switching devices. When jumpers J2, J3 and J4 are not installed, resistors R5 and R6 are utilized as logic pull-ups to default the system and external reset requests to the inactive state.

Next, an AND gate U3 is utilized to combine the system and user reset request signals into one combined request (output at node H). A differentiator circuit 1508, comprising a capacitor C3 and a resistor R3, acts as a rising edge differentiator whose output (at node I) is then supplied to a Schmidt inverter U4 for waveshaping the reset request pulse (output to node J). It is to be noted that the values of C3 and R3 are preferably selected based on the desired pulse width time of the signal output at node J. U2 is again utilized to logically OR the power-up system reset, and external reset request. An SIR flip-flop U6 implements a state machine that asserts and negates the appropriate warm-boot and cold boot-flags, 1116, 1118. A Schmidt inverter U5 is utilized to convert the polarity of the power-up reset for appropriate operation of the state machine. As previously noted, the ability for a computer or computer appliance to inquire about the boot initiator is advantageous, as it provides a mechanism for rebooting of only those system and reloading of those programmable logic devices that are required or desired.

FIG. 16 comprises a plurality of timing diagrams illustrating the state of the signals located at each node (A-J) of the boot manager circuit illustrated in FIG. 15. More specifically, the letter designations A-J correspond to the waveforms generated as a function of time at the associated nodes labeled in the schematic diagram of FIG. 15. Signal A illustrates a typical turn-on transient of a power supply of a computer or a computer appliance. With computers comprising low cost switching power supplies that operate with the power consumption of hundreds of watts, this time is typically 5 msecs. This time and the actual profile vary significantly based on the design and individual system tolerances. It is expected that as power supplies continue to become more efficient and faster, the switching frequencies will increase causing a shorter turn on profile. The present embodiment does not rely on any specified time or wave shape for the turn on profile.

Further, Signal B depicts the voltage waveform input to U1 as generated by Signal A (power supply sense input) charging the C1 with time constant R4C1. The Schmidt trigger U1 provides threshold hysteresis, affording a higher level of nose immunity. It is to be noted that U1 is not a necessary component of the invention.

Signal C is the output of the Schmidt trigger inverter U1, and Signal D is the output as processed the falling edge differentiator 1504. Signal D is input to the Schmidt AND gate U2 to generate the boot-device-reset signal 1114 as illustrated Signal E. Signal D is also input to the Schmidt inverter U5, which outputs Signal K. Signal K is input to S/R flip-flop U6 which then sets the indicator cold-boot-flag indicator 1118 shown as Signal L. The complementary output indicator warm-boot-flag indicator 1116 is simultaneously negated as shown Signal M.

The system-reset signal 1108/1110 and commanded-warm-boot-reset-request signal 1106 are shown disabled by the removal of jumpers J2 and J4, respectively. Both requests are shown active low and Signals F or G show individual requests. The Schmidt AND gate U3 logically ORs the request and generates Signal H as an input to the rising edge differentiator circuit 1508. The output of the differentiator circuit 1508, Signal I, is the input to Schmidt inverter U4 which generates signal J that is input to both U2 and U6.

A boot-device-reset signal 1114 is then generated and the S/R flip-flop U6 is set to the warm-boot-flag indicator 1116 as indicated by Signal M. As before, the use of Schmidt function provides additional noise margin through the logic's hysteresis and is optional to all logic functions in the present invention.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A system for creating an electrical boot-device-reset signal in advance of an electrical system-reset signal, the system comprising:
   a first input configured to receive a power-supply-monitoring signal; and
   a second input configured to receive the electrical system-reset signal;
   wherein the system is configured to:
      electrically differentiate the power-supply-monitoring signal to create the electrical boot-device-reset signal in advance of the electrical system-reset signal.

2. The system of claim 1, wherein a first time constant to differentiate the power-supply-monitoring signal is less than a second time constant to differentiate the electrical system-reset signal.

3. The system of claim 1, further comprising:
   a logical gate configured to perform a logic OR operation between an electrical cold-boot-reset request signal and the power-supply-monitoring signal.

4. The system of claim 1, further comprising:
   a logical gate configured to perform a logic OR operation between an electrical expansion bus signal and the electrical system-reset signal.

5. The system of claim 1, further comprising:
   a logical gate configured to perform a logic OR operation between an electrical warm boot signal and the electrical system-reset signal.

6. The system of claim 1, wherein the system is further configured to generate an electrical cold boot identification signal flag.

7. The system of claim 1, wherein the system is further configured to generate an electrical warm boot identification signal flag.

8. The system of claim 1, wherein the system is further configured to form a connection to pass the power-supply-monitoring signal.

9. The system of claim 1, wherein the system is further configured to form a connection to pass an electrical expansion bus signal.

10. The system of claim 1, wherein the system is further configured to form a connection to pass an electrical warm boot signal bypass.

11. A method for creating an electrical boot-device-reset signal in advance of an electrical system-reset signal, the method comprising:
    receiving a power-supply-monitoring signal;
    receiving the electrical system-reset signal; and
    electrically differentiating the power-supply-monitoring signal to create the electrical boot-device-reset signal in advance of the electrical system-reset signal.

12. The method of claim 11, wherein a first time constant to differentiate the power-supply-monitoring signal is less than a second time constant to differentiate the electrical system-reset signal.

13. The method of claim 11, further comprising:
    performing a logic OR operation between an electrical cold-boot-reset request signal and the power-supply-monitoring signal.

14. The method of claim 11, further comprising:
    performing a logic OR operation between an electrical expansion bus signal and the electrical system-reset signal.

15. The method of claim 11, further comprising:
    performing a logic OR operation between an electrical warm boot signal and the electrical system-reset signal.

16. The method of claim 11, further comprising:
    generating an electrical cold boot identification signal flag.

17. The method of claim 11, further comprising:
    generating an electrical warm boot identification signal flag.

18. The method of claim 11, further comprising:
    forming a connection to pass the power-supply-monitoring signal.

19. The method of claim 11, further comprising:
    forming a connection to pass an electrical expansion bus signal.

20. The method of claim 11, further comprising:
    forming a connection to pass an electrical warm boot signal.

* * * * *